(12) United States Patent
Chang et al.

(10) Patent No.: US 12,069,939 B2
(45) Date of Patent: Aug. 20, 2024

(54) METHOD FOR PATTERNING A COATING ON A SURFACE AND DEVICE INCLUDING A PATTERNED COATING

(71) Applicant: OTI LUMIONICS INC., Mississauga (CA)

(72) Inventors: Yi-Lu Chang, Mississauga (CA); Qi Wang, Mississauga (CA); Dong Gao, Mississauga (CA); Scott Nicholas Genin, Mississauga (CA); Michael Helander, Mississauga (CA); Jacky Qiu, Mississauga (CA); Zhibin Wang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 0 days.

(21) Appl. No.: 18/157,786

(22) Filed: Jan. 20, 2023

(65) Prior Publication Data

US 2023/0165124 A1 May 25, 2023

Related U.S. Application Data

(63) Continuation of application No. 16/608,794, filed as application No. PCT/IB2018/052881 on Apr. 26, 2018, now Pat. No. 11,581,487.

(Continued)

(51) Int. Cl.
*H10K 71/00* (2023.01)
*H10K 50/824* (2023.01)
(Continued)

(52) U.S. Cl.
CPC ......... *H10K 71/621* (2023.02); *H10K 50/824* (2023.02); *H10K 50/828* (2023.02);
(Continued)

(58) Field of Classification Search
CPC .................................................. H10K 71/621
(Continued)

(56) References Cited

U.S. PATENT DOCUMENTS

| 3,094,536 A | 6/1963 | Kenney et al. |
| 3,597,457 A | 8/1971 | Robinson et al. |

(Continued)

FOREIGN PATENT DOCUMENTS

| CA | 2074331 A1 | 1/1993 |
| CA | 2544380 C | 1/2014 |

(Continued)

OTHER PUBLICATIONS

"Forrest, James A. ""Reductions of the glass transition temperature in thin polymer films: Probing the length scale of cooperative dynamics."" Physical Review E 61.1 (2000): R53-6."

(Continued)

*Primary Examiner* — Ajay Arora
(74) *Attorney, Agent, or Firm* — Foley & Lardner LLP

(57) ABSTRACT

An opto-electronic device includes: (1) a substrate including a first region and a second region; and (2) a conductive coating covering the second region of the substrate. The first region of the substrate is exposed from the conductive coating, and an edge the conductive coating adjacent to the first region of the substrate has a contact angle that is greater than about 20 degrees.

31 Claims, 71 Drawing Sheets

Related U.S. Application Data

(60) Provisional application No. 62/573,028, filed on Oct. 16, 2017, provisional application No. 62/521,499, filed on Jun. 18, 2017, provisional application No. 62/490,564, filed on Apr. 26, 2017.

(51) Int. Cl.
  *H10K 50/828* (2023.01)
  *H10K 59/12* (2023.01)
  *H10K 85/30* (2023.01)
  *H10K 85/60* (2023.01)
  *H10K 102/00* (2023.01)

(52) U.S. Cl.
  CPC .............. *H10K 59/12* (2023.02); *H10K 71/00* (2023.02); *H10K 85/324* (2023.02); *H10K 85/342* (2023.02); *H10K 85/615* (2023.02); *H10K 85/631* (2023.02); *H10K 85/654* (2023.02); *H10K 85/6565* (2023.02); *H10K 85/6572* (2023.02); *H10K 2102/00* (2023.02); *H10K 2102/3026* (2023.02)

(58) Field of Classification Search
  USPC .......................................................... 257/40
  See application file for complete search history.

(56) References Cited

U.S. PATENT DOCUMENTS

| | | |
|---|---|---|
| 3,928,480 A | 12/1975 | Tabushi et al. |
| 3,978,030 A | 8/1976 | Resnick |
| 4,022,928 A | 5/1977 | Piwcyzk |
| 4,119,635 A | 10/1978 | Omodei-Sale et al. |
| 4,188,486 A | 2/1980 | Tsukamoto et al. |
| 4,379,155 A | 4/1983 | Omodei-Sale et al. |
| 4,431,786 A | 2/1984 | Squire |
| 4,512,997 A | 4/1985 | Meier et al. |
| 4,594,399 A | 6/1986 | Anderson et al. |
| 4,622,179 A | 11/1986 | Eda |
| 4,749,637 A | 6/1988 | Hayashida et al. |
| 4,803,005 A | 2/1989 | Juhlke et al. |
| 4,832,983 A | 5/1989 | Nagatomi et al. |
| 4,927,735 A | 5/1990 | Era et al. |
| 4,960,538 A | 10/1990 | Itoh et al. |
| 5,009,986 A | 4/1991 | Kawaguchi et al. |
| 5,015,758 A | 5/1991 | Pilgrim et al. |
| 5,034,309 A | 7/1991 | Tai et al. |
| 5,061,596 A | 10/1991 | Albert et al. |
| 5,075,203 A | 12/1991 | Katayose et al. |
| 5,219,706 A | 6/1993 | Tai et al. |
| 5,232,635 A | 8/1993 | Van Moer et al. |
| 5,260,435 A | 11/1993 | Sawada et al. |
| 5,378,589 A | 1/1995 | Sawada et al. |
| 5,399,936 A | 3/1995 | Namiki et al. |
| 5,420,301 A | 5/1995 | Ackermann et al. |
| 5,428,152 A | 6/1995 | Hayashida et al. |
| 5,446,142 A | 8/1995 | Itoh et al. |
| 5,512,095 A | 4/1996 | Sens et al. |
| 5,484,685 A | 6/1996 | Tai et al. |
| 5,550,290 A | 8/1996 | Mizuta et al. |
| 5,652,285 A | 7/1997 | Coggio et al. |
| 5,824,799 A | 10/1998 | Buechler et al. |
| 5,834,130 A | 11/1998 | Kido |
| 5,883,177 A | 3/1999 | Colaianna et al. |
| 5,895,228 A | 4/1999 | Biebuyck et al. |
| 5,916,481 A | 6/1999 | Willey |
| 5,935,721 A | 8/1999 | Shi et al. |
| 6,016,033 A | 1/2000 | Jones et al. |
| 6,171,715 B1 | 1/2001 | Sato et al. |
| 6,251,687 B1 | 6/2001 | Buechler et al. |
| 6,285,039 B1 | 9/2001 | Kobori et al. |
| 6,329,490 B1 | 12/2001 | Yamashita et al. |
| 6,361,886 B2 | 3/2002 | Shi et al. |
| 6,407,408 B1 | 6/2002 | Zhou et al. |
| 6,465,115 B2 | 10/2002 | Shi et al. |
| 6,468,590 B2 | 10/2002 | Biebuyck et al. |
| 6,472,468 B1 | 10/2002 | Omura |
| 6,517,958 B1 | 2/2003 | Sellinger et al. |
| 6,538,374 B2 | 3/2003 | Hosokawa |
| 6,608,009 B2 | 8/2003 | Akada et al. |
| 6,635,364 B1 | 10/2003 | Igarashi |
| 6,638,644 B2 | 10/2003 | Zheng |
| 6,682,785 B2 | 1/2004 | Wingen et al. |
| 6,787,468 B2 | 9/2004 | Kim et al. |
| 6,835,950 B2 | 12/2004 | Brown et al. |
| 6,852,429 B1 | 2/2005 | Li et al. |
| 6,878,469 B2 | 4/2005 | Yoon et al. |
| 6,899,963 B1 | 5/2005 | Zheng et al. |
| 6,900,470 B2 | 5/2005 | Kobayashi et al. |
| 6,927,270 B2 | 8/2005 | Lichtenhan et al. |
| 6,953,653 B2 | 10/2005 | Smith et al. |
| 6,995,035 B2 | 2/2006 | Cok et al. |
| 7,018,713 B2 | 3/2006 | Padiyath |
| 7,056,601 B2 | 6/2006 | Cosimbescu et al. |
| 7,099,299 B2 | 8/2006 | Liang et al. |
| 7,105,298 B2 | 9/2006 | Liu et al. |
| 7,166,240 B2 | 1/2007 | Ishida et al. |
| 7,169,482 B2 | 1/2007 | Aziz |
| 7,173,276 B2 | 2/2007 | Choi et al. |
| 7,175,815 B2 | 2/2007 | Yamasaki et al. |
| 7,192,659 B2 | 3/2007 | Ricks et al. |
| 7,193,015 B1 | 3/2007 | Mabry et al. |
| 7,252,893 B2 | 8/2007 | Ricks et al. |
| 7,259,267 B2 | 8/2007 | Pleschke et al. |
| 7,280,731 B2 | 10/2007 | Rantala |
| 7,319,129 B2 | 1/2008 | Yoshida et al. |
| 7,326,371 B2 | 2/2008 | Conley et al. |
| 7,361,796 B2 | 4/2008 | Ikeda et al. |
| 7,363,308 B2 | 4/2008 | Dillon et al. |
| 7,373,060 B2 | 5/2008 | Satake et al. |
| 7,402,948 B2 | 7/2008 | Yamazaki et al. |
| 7,427,783 B2 | 9/2008 | Lee et al. |
| 7,449,509 B2 | 11/2008 | Marks et al. |
| 7,470,315 B2 | 12/2008 | Vonwiller et al. |
| 7,479,462 B2 | 1/2009 | Rantala et al. |
| 7,491,975 B2 | 2/2009 | Kubota |
| 7,495,389 B2 | 2/2009 | Noguchi et al. |
| 7,504,526 B2 | 3/2009 | Kubota et al. |
| 7,532,389 B2 | 5/2009 | Li et al. |
| 7,579,304 B2 | 8/2009 | Liu et al. |
| 7,651,787 B2 | 1/2010 | Seo et al. |
| 7,670,695 B2 | 3/2010 | Wakabayashi et al. |
| 7,674,914 B2 | 3/2010 | Egawa et al. |
| 7,701,132 B2 | 4/2010 | Oh |
| 7,728,510 B2 | 6/2010 | Oh |
| 7,733,009 B2 | 6/2010 | Kondakov et al. |
| 7,776,457 B2 | 8/2010 | Lee et al. |
| 7,790,892 B2 | 9/2010 | Ikeda et al. |
| 7,816,667 B2 | 10/2010 | Park et al. |
| 7,816,861 B2 | 10/2010 | Choi et al. |
| 7,833,632 B2 | 11/2010 | Kawamura et al. |
| 7,839,074 B2 | 11/2010 | Ikeda et al. |
| 7,839,083 B2 | 11/2010 | Kubota |
| 7,851,071 B2 | 12/2010 | Yamamoto et al. |
| 7,867,629 B2 | 1/2011 | Yamamoto et al. |
| 7,887,931 B2 | 2/2011 | Cosimbescu |
| 7,910,687 B2 | 3/2011 | Busing et al. |
| 7,947,519 B2 | 5/2011 | Lee et al. |
| 7,956,351 B2 | 6/2011 | Choi |
| 7,973,306 B2 | 7/2011 | Kim et al. |
| 7,986,672 B2 | 7/2011 | Tiedemann et al. |
| 7,998,540 B2 | 8/2011 | Goulding et al. |
| 7,999,459 B2 | 8/2011 | Chun et al. |
| 8,004,180 B2 | 8/2011 | Seo |
| 8,025,815 B2 | 9/2011 | Kawamura et al. |
| 8,030,838 B2 | 10/2011 | Kwak et al. |
| 8,044,580 B2 | 10/2011 | Yamazaki et al. |
| 8,071,226 B2 | 12/2011 | Je et al. |
| 8,076,839 B2 | 12/2011 | Kuma et al. |
| 8,089,066 B2 | 1/2012 | Yamazaki et al. |
| 8,097,349 B2 | 1/2012 | Yamamoto et al. |
| 8,101,771 B2 | 1/2012 | Nomura et al. |
| 8,115,376 B2 | 2/2012 | Fujioka et al. |

(56) References Cited

U.S. PATENT DOCUMENTS

| | | |
|---|---|---|
| 8,174,185 B2 | 5/2012 | Park et al. |
| 8,217,570 B2 | 7/2012 | Kawamura et al. |
| 8,222,634 B2 | 7/2012 | Lee |
| 8,232,350 B2 | 7/2012 | Fujita et al. |
| 8,237,351 B2 | 8/2012 | Sung et al. |
| 8,257,620 B2 | 9/2012 | Cranor et al. |
| 8,278,378 B2 | 10/2012 | Jung et al. |
| 8,310,149 B2 | 11/2012 | Lifka et al. |
| 8,318,995 B2 | 11/2012 | Kubota et al. |
| 8,319,095 B2 | 11/2012 | Sharma |
| 8,343,637 B2 | 1/2013 | Parham et al. |
| 8,346,024 B2 | 1/2013 | Vonwiller et al. |
| 8,362,469 B2 | 1/2013 | Suh |
| 8,383,932 B2 | 2/2013 | Jung et al. |
| 8,530,596 B2 | 9/2013 | Sano et al. |
| 8,541,113 B2 | 9/2013 | Je et al. |
| 8,568,902 B2 | 10/2013 | Kubota et al. |
| 8,568,965 B2 | 10/2013 | Kitamura et al. |
| 8,586,202 B2 | 11/2013 | Imai et al. |
| 8,586,689 B2 | 11/2013 | Jung et al. |
| 8,586,703 B2 | 11/2013 | Yang et al. |
| 8,592,053 B2 | 11/2013 | Kawakami |
| 8,629,222 B2 | 1/2014 | Takizawa et al. |
| 8,679,647 B2 | 3/2014 | Pflumm et al. |
| 8,679,656 B2 | 3/2014 | Kobayashi et al. |
| 8,729,530 B2 | 5/2014 | Nagao et al. |
| 8,759,818 B2 | 6/2014 | Lecloux |
| 8,766,306 B2 | 7/2014 | Lifka et al. |
| 8,779,655 B2 | 7/2014 | Nishimura |
| 8,795,422 B2 | 8/2014 | Ganapathiappan et al. |
| 8,795,847 B2 | 8/2014 | Heil et al. |
| 8,795,855 B2 | 8/2014 | Klubek et al. |
| 8,809,838 B2 | 8/2014 | Jeong et al. |
| 8,816,117 B2 | 8/2014 | Marciniec et al. |
| 8,852,756 B2 | 10/2014 | Vestweber et al. |
| 8,853,675 B2 | 10/2014 | Kubota et al. |
| 8,872,206 B2 | 10/2014 | Chung et al. |
| 8,877,356 B2 | 11/2014 | Spindler et al. |
| 8,883,324 B2 | 11/2014 | Yabunouchi et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,987,516 B2 | 3/2015 | Umemoto |
| 8,993,123 B2 | 3/2015 | Buesing et al. |
| 8,994,010 B2 | 3/2015 | Choi et al. |
| 8,999,534 B2 | 4/2015 | Shimokawa et al. |
| 9,006,565 B2 | 4/2015 | Abusleme et al. |
| 9,018,621 B2 | 4/2015 | Park et al. |
| 9,024,301 B2 | 5/2015 | Kawamura et al. |
| 9,024,307 B2 | 5/2015 | Lee |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,113,536 B2 | 8/2015 | Oka et al. |
| 9,126,970 B2 | 9/2015 | Pflumm |
| 9,169,274 B2 | 10/2015 | Mizuki et al. |
| 9,214,636 B2 | 12/2015 | Takashima et al. |
| 9,219,234 B2 | 12/2015 | Kubota et al. |
| 9,231,030 B2 | 1/2016 | Choi et al. |
| 9,245,934 B2 | 1/2016 | Chung et al. |
| 9,246,105 B2 | 1/2016 | Sun |
| 9,246,123 B2 | 1/2016 | Kim et al. |
| 9,257,654 B2 | 2/2016 | Kawakami |
| 9,276,220 B2 | 3/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,353,027 B2 | 5/2016 | Kawamura et al. |
| 9,444,064 B2 | 9/2016 | Kaiser et al. |
| 9,450,027 B2 | 9/2016 | Pang et al. |
| 9,471,172 B2 | 10/2016 | Sirois |
| 9,478,591 B2 | 10/2016 | Nam et al. |
| 9,487,724 B2 | 11/2016 | Xu et al. |
| 9,515,280 B2 | 12/2016 | Yun |
| 9,548,456 B2 | 1/2017 | Lee et al. |
| 9,570,471 B2 | 2/2017 | Heo et al. |
| 9,583,716 B2 | 2/2017 | Ikeda |
| 9,595,681 B2 | 3/2017 | Mujica-Fernaud |
| 9,608,207 B2 | 3/2017 | Takaku et al. |
| 9,624,193 B2 | 4/2017 | Aihara |
| 9,660,195 B2 | 5/2017 | Kawamura et al. |
| 9,666,812 B2 | 5/2017 | Lee et al. |
| 9,680,108 B2 | 6/2017 | Ito et al. |
| 9,711,734 B2 | 7/2017 | Kim |
| 9,711,751 B2 | 7/2017 | Prushinskiy et al. |
| 9,728,726 B2 | 8/2017 | Takaku |
| 9,748,318 B2 | 8/2017 | Shim et al. |
| 9,755,165 B2 | 9/2017 | Nishide et al. |
| 9,786,846 B2 | 10/2017 | Kubota |
| 9,793,491 B2 | 10/2017 | Hwang et al. |
| 9,831,457 B2 | 11/2017 | Kang et al. |
| 9,859,520 B2 | 1/2018 | Kim |
| 9,882,140 B2 | 1/2018 | Han et al. |
| 9,890,181 B2 | 2/2018 | Jiang et al. |
| 9,896,621 B2 | 2/2018 | Kim et al. |
| 9,954,039 B2 | 4/2018 | Im et al. |
| 9,960,216 B2 | 5/2018 | Lee et al. |
| 9,966,554 B2 | 5/2018 | Lee et al. |
| 10,026,906 B2 | 7/2018 | Jung et al. |
| 10,032,843 B2 | 7/2018 | Lee et al. |
| 10,062,850 B2 | 8/2018 | Jung et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,153,450 B2 | 12/2018 | Kawamura |
| 10,174,059 B2 | 1/2019 | Warner et al. |
| 10,177,206 B2 | 1/2019 | Jung et al. |
| 10,181,573 B2 | 1/2019 | Im |
| 10,186,568 B2 | 1/2019 | Kim et al. |
| 10,205,101 B2 | 2/2019 | Kubota et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,442,823 B2 | 10/2019 | Warner et al. |
| 10,683,313 B2 | 1/2020 | Choi et al. |
| 10,584,137 B2 | 3/2020 | Warner |
| 10,700,304 B2 | 6/2020 | Helander et al. |
| 11,008,350 B2 | 5/2021 | Diao et al. |
| 11,046,885 B2 | 6/2021 | Kim et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2003/0219625 A1 | 11/2003 | Wolk et al. |
| 2004/0018383 A1 | 1/2004 | Aziz et al. |
| 2004/0058193 A1 | 3/2004 | Hatwar |
| 2005/0070196 A1 | 3/2005 | Colombo et al. |
| 2005/0181232 A1 | 8/2005 | Ricks et al. |
| 2005/0211958 A1 | 9/2005 | Conley et al. |
| 2005/0271899 A1 | 12/2005 | Brown et al. |
| 2006/0019116 A1 | 1/2006 | Conley et al. |
| 2006/0043858 A1 | 3/2006 | Ikeda et al. |
| 2006/0078757 A1 | 4/2006 | Boerner |
| 2006/0125390 A1 | 6/2006 | Oh |
| 2006/0147747 A1 | 7/2006 | Yamamoto et al. |
| 2006/0154105 A1 | 7/2006 | Yamamoto et al. |
| 2006/0182993 A1 | 8/2006 | Ogata et al. |
| 2006/0210830 A1 | 9/2006 | Funahashi et al. |
| 2006/0246315 A1 | 11/2006 | Begley et al. |
| 2007/0003785 A1 | 1/2007 | Slusarek et al. |
| 2007/0077349 A1 | 4/2007 | Newman et al. |
| 2007/0252517 A1 | 11/2007 | Owczarczyk et al. |
| 2007/0252521 A1 | 11/2007 | Kondakov et al. |
| 2008/0001123 A1 | 1/2008 | Inoue et al. |
| 2008/0012475 A1 | 1/2008 | Oyamada et al. |

(56) References Cited

U.S. PATENT DOCUMENTS

| | | |
|---|---|---|
| 2008/0093986 A1 | 4/2008 | Inoue et al. |
| 2008/0103315 A1 | 5/2008 | Egawa et al. |
| 2008/0105865 A1 | 5/2008 | Oyamada et al. |
| 2008/0166593 A1 | 7/2008 | Stoessel et al. |
| 2008/0203905 A1 | 8/2008 | Je et al. |
| 2008/0286607 A1 | 11/2008 | Nomura et al. |
| 2008/0286610 A1 | 11/2008 | Deaton et al. |
| 2008/0303422 A1 | 12/2008 | Vestweber et al. |
| 2009/0066239 A1 | 3/2009 | Yabunouchi |
| 2009/0145483 A1 | 6/2009 | Kim et al. |
| 2009/0153037 A1 | 6/2009 | Kim et al. |
| 2009/0153039 A1 | 6/2009 | Kim et al. |
| 2009/0153040 A1 | 6/2009 | Kim et al. |
| 2009/0159130 A1 | 6/2009 | Eum et al. |
| 2009/0165860 A1 | 7/2009 | Kim et al. |
| 2009/0174316 A1 | 7/2009 | Kim et al. |
| 2009/0179196 A1 | 7/2009 | Adachi et al. |
| 2009/0179555 A1 | 7/2009 | Kim et al. |
| 2009/0184631 A1 | 7/2009 | Kim et al. |
| 2009/0199903 A1 | 8/2009 | Oyamada et al. |
| 2009/0200926 A1 | 8/2009 | Lee et al. |
| 2009/0233125 A1 | 9/2009 | Choi et al. |
| 2009/0236973 A1 | 9/2009 | Yabe et al. |
| 2009/0252990 A1 | 10/2009 | Kim et al. |
| 2010/0019657 A1 | 1/2010 | Eum et al. |
| 2010/0052526 A1 | 3/2010 | Je et al. |
| 2010/0078628 A1 | 4/2010 | Chi et al. |
| 2010/0080903 A1 | 4/2010 | Tamitsuji et al. |
| 2010/0089621 A1 | 4/2010 | Stoss et al. |
| 2010/0108997 A1 | 5/2010 | Kim et al. |
| 2010/0113767 A1 | 5/2010 | Gessner et al. |
| 2010/0117028 A1 | 5/2010 | Takeshima et al. |
| 2010/0151180 A1 | 6/2010 | Bravet et al. |
| 2010/0193768 A1 | 8/2010 | Habib |
| 2010/0244197 A1 | 9/2010 | Arena et al. |
| 2010/0286407 A1 | 11/2010 | Kimura et al. |
| 2010/0314615 A1 | 12/2010 | Mizuki et al. |
| 2010/0327240 A1 | 12/2010 | Cranor et al. |
| 2011/0006289 A1 | 1/2011 | Mizuki et al. |
| 2011/0091508 A1 | 4/2011 | Esfand et al. |
| 2011/0094889 A1 | 4/2011 | Shin et al. |
| 2011/0156016 A1 | 6/2011 | Kawamura et al. |
| 2011/0186820 A1 | 8/2011 | Kim et al. |
| 2011/0198582 A1 | 8/2011 | Horiuchi et al. |
| 2011/0204772 A1 | 8/2011 | Egawa |
| 2011/0207300 A1 | 8/2011 | Brown et al. |
| 2011/0220886 A1 | 9/2011 | Takeshima et al. |
| 2011/0285276 A1 | 11/2011 | Kadoma et al. |
| 2011/0297923 A1 | 12/2011 | Mizuki et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0023556 A1 | 1/2012 | Schultz et al. |
| 2012/0043533 A1 | 2/2012 | Mizuki et al. |
| 2012/0056165 A1 | 3/2012 | Kawamura et al. |
| 2012/0091885 A1 | 4/2012 | Kim et al. |
| 2012/0104422 A1 | 5/2012 | Lee et al. |
| 2012/0112169 A1 | 5/2012 | Mizuki et al. |
| 2012/0146030 A1 | 6/2012 | You et al. |
| 2012/0181520 A1 | 7/2012 | Kim et al. |
| 2012/0181922 A1 | 7/2012 | Kawamura et al. |
| 2012/0187541 A1 | 7/2012 | Arena et al. |
| 2012/0235169 A1* | 9/2012 | Seko ............... H01L 33/60 257/E33.059 |
| 2012/0313099 A1 | 12/2012 | Chung et al. |
| 2013/0020561 A1 | 1/2013 | Suzuki et al. |
| 2013/0026526 A1 | 1/2013 | Lahijani |
| 2013/0049024 A1 | 2/2013 | Choi et al. |
| 2013/0056784 A1 | 3/2013 | Lee et al. |
| 2013/0153878 A1 | 6/2013 | Mizuki et al. |
| 2013/0161656 A1 | 6/2013 | Choi et al. |
| 2013/0175509 A1 | 7/2013 | Kim et al. |
| 2013/0187143 A1 | 7/2013 | Nishimura et al. |
| 2013/0221338 A1 | 8/2013 | Kawamura et al. |
| 2014/0014925 A1 | 1/2014 | Jung et al. |
| 2014/0070236 A1 | 3/2014 | Chen et al. |
| 2014/0110680 A1 | 4/2014 | Choe |
| 2014/0145152 A1 | 5/2014 | Chung et al. |
| 2014/0145156 A1 | 5/2014 | Choi et al. |
| 2014/0148877 A1 | 5/2014 | Pan et al. |
| 2014/0159011 A1 | 6/2014 | Suzuki et al. |
| 2014/0183500 A1 | 7/2014 | Ikeda et al. |
| 2014/0186983 A1 | 7/2014 | Kim et al. |
| 2014/0225085 A1 | 8/2014 | Hayashi et al. |
| 2014/0231761 A1 | 8/2014 | Kim et al. |
| 2014/0239273 A1 | 8/2014 | Mizutani et al. |
| 2014/0246657 A1 | 9/2014 | Kim et al. |
| 2014/0291653 A1 | 10/2014 | Ikeda et al. |
| 2014/0299866 A1 | 10/2014 | Ruske et al. |
| 2014/0319511 A1 | 10/2014 | Mizuki et al. |
| 2014/0326985 A1 | 11/2014 | Mizuki et al. |
| 2014/0332772 A1 | 11/2014 | Han et al. |
| 2014/0346406 A1 | 11/2014 | Lee et al. |
| 2014/0346482 A1 | 11/2014 | Mizuki et al. |
| 2014/0353601 A1 | 12/2014 | Cho et al. |
| 2014/0353611 A1 | 12/2014 | Choi et al. |
| 2014/0367654 A1 | 12/2014 | Kim et al. |
| 2015/0028298 A1 | 1/2015 | Chung et al. |
| 2015/0048335 A1 | 2/2015 | Chung et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0171337 A1 | 6/2015 | Jung et al. |
| 2015/0284580 A1 | 10/2015 | Kawakami et al. |
| 2015/0287846 A1* | 10/2015 | Helander ............. H01L 31/18 427/256 |
| 2015/0303336 A1 | 10/2015 | Lefebvre et al. |
| 2015/0333266 A1 | 11/2015 | Ito et al. |
| 2015/0376768 A1 | 12/2015 | Veres et al. |
| 2016/0005976 A1 | 1/2016 | Mizuki et al. |
| 2016/0013438 A1 | 1/2016 | Im et al. |
| 2016/0043325 A1 | 2/2016 | Gorohmaru et al. |
| 2016/0079543 A1 | 3/2016 | Park et al. |
| 2016/0099411 A1 | 4/2016 | Kim et al. |
| 2016/0104859 A1 | 4/2016 | Kim et al. |
| 2016/0126490 A1 | 5/2016 | Kon |
| 2016/0133846 A1 | 5/2016 | Ishii et al. |
| 2016/0149156 A1 | 5/2016 | Kim et al. |
| 2016/0155952 A1 | 6/2016 | Hwang et al. |
| 2016/0180763 A1 | 6/2016 | Park et al. |
| 2016/0181527 A1 | 6/2016 | Mizuki et al. |
| 2016/0181543 A1 | 6/2016 | Ito et al. |
| 2016/0211454 A1 | 7/2016 | Kim et al. |
| 2016/0211458 A1 | 7/2016 | Ito et al. |
| 2016/0211459 A1 | 7/2016 | Ito et al. |
| 2016/0222295 A1 | 8/2016 | Lo et al. |
| 2016/0225992 A1 | 8/2016 | Ito et al. |
| 2016/0233437 A1 | 8/2016 | Suzuki et al. |
| 2016/0260901 A1 | 9/2016 | Kim et al. |
| 2016/0268520 A1 | 9/2016 | Mizuki et al. |
| 2016/0284998 A1 | 9/2016 | Kawamura et al. |
| 2016/0293888 A1 | 10/2016 | Shim et al. |
| 2016/0307874 A1* | 10/2016 | Oggioni ............... H01L 24/16 |
| 2016/0308137 A1 | 10/2016 | Park et al. |
| 2016/0343612 A1 | 11/2016 | Wang et al. |
| 2016/0351638 A1 | 12/2016 | Im et al. |
| 2016/0351818 A1 | 12/2016 | Kim et al. |
| 2016/0372524 A1 | 12/2016 | Yun et al. |
| 2016/0380198 A1 | 12/2016 | Mizuki et al. |
| 2017/0012221 A1 | 1/2017 | Buesing et al. |
| 2017/0018733 A1 | 1/2017 | Jin et al. |
| 2017/0033246 A1 | 2/2017 | Shim et al. |
| 2017/0062755 A1 | 3/2017 | Im et al. |
| 2017/0100607 A1 | 4/2017 | Pan et al. |
| 2017/0104166 A1 | 4/2017 | Jeong et al. |
| 2017/0117469 A1 | 4/2017 | Ito et al. |
| 2017/0125495 A1 | 5/2017 | Lee et al. |
| 2017/0125506 A1 | 5/2017 | Kim |
| 2017/0125687 A1 | 5/2017 | Ikeda et al. |
| 2017/0125703 A1 | 5/2017 | Suzuki et al. |
| 2017/0155078 A1 | 6/2017 | Lee |
| 2017/0170246 A1 | 6/2017 | Im et al. |
| 2017/0179397 A1 | 6/2017 | Kim et al. |
| 2017/0179402 A1 | 6/2017 | Kim et al. |

(56) References Cited

U.S. PATENT DOCUMENTS

| | | |
|---|---|---|
| 2017/0183291 A1 | 6/2017 | Ito et al. |
| 2017/0186831 A1 | 6/2017 | Nam et al. |
| 2017/0222155 A1 | 8/2017 | Cha et al. |
| 2017/0237023 A1 | 8/2017 | Kim et al. |
| 2017/0256722 A1 | 9/2017 | Shim et al. |
| 2017/0309822 A1 | 10/2017 | Mizuki et al. |
| 2017/0313650 A1 | 11/2017 | Stoessel et al. |
| 2017/0317154 A1 | 11/2017 | Heo |
| 2017/0317284 A1 | 11/2017 | Mizuki et al. |
| 2017/0324045 A1 | 11/2017 | Takahashi et al. |
| 2017/0338438 A1 | 11/2017 | Kwon et al. |
| 2017/0342318 A1 | 11/2017 | Kim et al. |
| 2018/0006239 A1 | 1/2018 | Yokoyama et al. |
| 2018/0006264 A1 | 1/2018 | Lee et al. |
| 2018/0019398 A1 | 1/2018 | Mizuki et al. |
| 2018/0019408 A1 | 1/2018 | Ko |
| 2018/0040685 A1 | 2/2018 | Yeo et al. |
| 2018/0061323 A1 | 3/2018 | Kwon et al. |
| 2018/0062088 A1 | 3/2018 | Cho et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123054 A1 | 5/2018 | Gorohmaru et al. |
| 2018/0123055 A1 | 5/2018 | Park et al. |
| 2018/0123078 A1 | 5/2018 | Byun et al. |
| 2018/0127385 A1 | 5/2018 | Jung et al. |
| 2018/0130949 A1 | 5/2018 | Kim et al. |
| 2018/0145262 A1 | 5/2018 | Zeng et al. |
| 2018/0148586 A1 | 5/2018 | Reichert et al. |
| 2018/0158881 A1 | 6/2018 | Lim et al. |
| 2018/0166518 A1 | 6/2018 | Kim |
| 2018/0197927 A1 | 7/2018 | Tan et al. |
| 2018/0198076 A1 | 7/2018 | Takahashi et al. |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0240990 A1 | 8/2018 | Choi et al. |
| 2018/0261797 A1 | 9/2018 | Lee |
| 2018/0273563 A1 | 9/2018 | Choi et al. |
| 2018/0294436 A1 | 10/2018 | Choi et al. |
| 2018/0309058 A1 | 10/2018 | Mizuki et al. |
| 2018/0309064 A1 | 10/2018 | Aldred et al. |
| 2018/0309071 A1 | 10/2018 | Jeon et al. |
| 2018/0309085 A1 | 10/2018 | Park et al. |
| 2018/0315934 A1 | 11/2018 | Nakata et al. |
| 2018/0315936 A1 | 11/2018 | Hirade et al. |
| 2018/0323377 A1 | 11/2018 | Mizuki et al. |
| 2018/0337219 A1 | 11/2018 | Rhee et al. |
| 2018/0340032 A1 | 11/2018 | Campbell et al. |
| 2018/0342682 A1 | 11/2018 | Park et al. |
| 2018/0366678 A1 | 12/2018 | Chi et al. |
| 2019/0013342 A1 | 1/2019 | Kato et al. |
| 2019/0081111 A1 | 3/2019 | Lee et al. |
| 2019/0088204 A1 | 3/2019 | Zhang et al. |
| 2019/0127328 A1 | 5/2019 | Orimoto et al. |
| 2019/0130822 A1 | 5/2019 | Jung et al. |
| 2019/0135827 A1 | 5/2019 | Altenbach et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |

FOREIGN PATENT DOCUMENTS

| | | |
|---|---|---|
| CA | 2890253 A1 | 5/2014 |
| CN | 1745487 A | 3/2006 |
| CN | 101299419 A | 11/2008 |
| CN | 100526288 C | 8/2009 |
| CN | 101617064 A | 12/2009 |
| CN | 101730938 A | 6/2010 |
| CN | 101932618 A | 12/2010 |
| CN | 1625552 B | 9/2011 |
| CN | 1696124 B | 2/2012 |
| CN | 1784388 B | 2/2012 |
| CN | 101812021 B | 12/2012 |
| CN | 103155204 A | 6/2013 |
| CN | 103467396 A | 12/2013 |
| CN | 101267022 B | 8/2014 |
| CN | 104037359 A | 9/2014 |
| CN | 104769149 A | 7/2015 |
| CN | 101503393 B | 8/2015 |
| CN | 105094451 A | 11/2015 |
| CN | 105097877 A | 11/2015 |
| CN | 105206650 A | 12/2015 |
| CN | 105206753 A | 12/2015 |
| CN | 105793982 A | 7/2016 |
| CN | 106206995 A | 12/2016 |
| CN | 106317025 A | 1/2017 |
| CN | 103788087 B | 5/2017 |
| CN | 104558016 B | 6/2017 |
| CN | 106992267 A | 7/2017 |
| CN | 107154392 A | 9/2017 |
| CN | 107564945 A | 1/2018 |
| CN | 107808895 A | 3/2018 |
| CN | 105849930 B | 6/2018 |
| CN | 108376019 A | 8/2018 |
| CN | 108389878 A | 8/2018 |
| CN | 108418928 A | 8/2018 |
| CN | 105359289 B | 9/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 106432200 B | 7/2019 |
| CN | 110112182 A | 8/2019 |
| CN | 110144551 A | 8/2019 |
| CN | 110265474 A | 9/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |

(56) References Cited

FOREIGN PATENT DOCUMENTS

| | | |
|---|---|---|
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| DE | 19748109.6 A1 | 5/1999 |
| EP | 0 375 967 B1 | 3/1994 |
| EP | 0 357 360 B1 | 6/1994 |
| EP | 0 444 822 B1 | 9/1994 |
| EP | 0 464 959 B1 | 1/1995 |
| EP | 1 299 913 B | 4/2003 |
| EP | 1 465 874 A2 | 10/2004 |
| EP | 1 551 206 A1 | 7/2005 |
| EP | 1 213 337 B1 | 11/2005 |
| EP | 1 816 114 A1 | 8/2007 |
| EP | 2 055 709 A2 | 5/2009 |
| EP | 2 055 710 A1 | 5/2009 |
| EP | 2 067 766 A1 | 6/2009 |
| EP | 2 067 767 A1 | 6/2009 |
| EP | 2 075 309 A2 | 7/2009 |
| EP | 2 080 795 A1 | 7/2009 |
| EP | 2 175 005 A1 | 4/2010 |
| EP | 2 066 150 B1 | 5/2010 |
| EP | 2 182 040 A2 | 5/2010 |
| EP | 2 202 283 A1 | 6/2010 |
| EP | 2 062 958 B1 | 7/2010 |
| EP | 1 602 648 B1 | 4/2013 |
| EP | 2 028 249 B1 | 5/2013 |
| EP | 2 605 300 | 6/2013 |
| EP | 1 621 597 B1 | 9/2013 |
| EP | 2 722 350 A1 | 4/2014 |
| EP | 2 270 897 B1 | 12/2014 |
| EP | 1 009 044 B1 | 7/2015 |
| EP | 2 473 564 B1 | 2/2016 |
| EP | 2 462 203 B1 | 3/2016 |
| EP | 2 998 997 A1 | 3/2016 |
| EP | 3 089 232 A1 | 11/2016 |
| EP | 2 197 979 B1 | 12/2016 |
| EP | 3 182 477 A1 | 6/2017 |
| EP | 3 185 325 A1 | 6/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 2 434 558 B1 | 7/2018 |
| EP | 3 396 728 A1 | 10/2018 |
| EP | 3 499 576 A1 | 6/2019 |
| EP | 3 149 012 B1 | 10/2020 |
| GB | 1 096 600 A | 12/1967 |
| GB | 1 188 212 A | 4/1970 |
| IN | 229083 B | 8/2007 |
| JP | 2002-212163 A | 7/2002 |
| JP | 3588978 B2 | 11/2004 |
| JP | 2005-041843 A | 2/2005 |
| JP | 2006-510210 A | 3/2006 |
| JP | 2006-194926 A | 7/2006 |
| JP | 2007-188854 A | 7/2007 |
| JP | 4025111 B2 | 12/2007 |
| JP | 4025136 B2 | 12/2007 |
| JP | 4025137 B2 | 12/2007 |
| JP | 2008-117697 A | 5/2008 |
| JP | 2008-133263 A | 6/2008 |
| JP | 4185097 B2 | 11/2008 |
| JP | 2008-291006 A | 12/2008 |
| JP | 4308663 B2 | 8/2009 |
| JP | 2009-535813 A | 10/2009 |
| JP | 2010-258410 A | 11/2010 |
| JP | 4655790 B2 | 3/2011 |
| JP | 2011-173972 A | 9/2011 |
| JP | 4846982 B2 | 12/2011 |
| JP | 4970934 B2 | 7/2012 |
| JP | 4972844 B2 | 7/2012 |
| JP | 2012-253015 | 12/2012 |
| JP | 2012-531426 A | 12/2012 |
| JP | 5093879 B2 | 12/2012 |
| JP | 5166961 B2 | 3/2013 |
| JP | 5198657 B2 | 5/2013 |
| JP | 5233074 B2 | 7/2013 |
| JP | 2013-533602 A | 8/2013 |
| JP | 2013-173771 A | 9/2013 |
| JP | 2013-219278 A | 10/2013 |
| JP | 5381748 B2 | 1/2014 |
| JP | 2014-107268 A | 6/2014 |
| JP | 5572134 B2 | 8/2014 |
| JP | 2014-240374 | 12/2014 |
| JP | 5645849 B2 | 12/2014 |
| JP | 2016-502734 | 1/2016 |
| JP | 2018-533183 A | 11/2018 |
| JP | 6786081 B2 | 11/2020 |
| KR | 100691543 B1 | 3/2007 |
| KR | 100826364 B1 | 5/2008 |
| KR | 100858816 B1 | 9/2008 |
| KR | 1020090128427 A | 12/2009 |
| KR | 1020100041043 A | 4/2010 |
| KR | 1020100054630 A | 5/2010 |
| KR | 1020100066424 A | 6/2010 |
| KR | 1020100123735 A | 11/2010 |
| KR | 100998838 B1 | 12/2010 |
| KR | 101020350 B1 | 3/2011 |
| KR | 101036391 B1 | 5/2011 |
| KR | 1020110123701 A | 11/2011 |
| KR | 1020130077276 A | 7/2013 |
| KR | 101317511 B1 | 10/2013 |

(56) References Cited

FOREIGN PATENT DOCUMENTS

| | | |
|---|---|---|
| KR | 1020140062258 A | 5/2014 |
| KR | 1020140126108 A | 10/2014 |
| KR | 101530266 B1 | 6/2015 |
| KR | 1020150103510 A | 9/2015 |
| KR | 101561479 B1 | 10/2015 |
| KR | 1020150120906 A | 10/2015 |
| KR | 1020150127368 A | 11/2015 |
| KR | 101640772 B1 | 7/2016 |
| KR | 101661925 B1 | 10/2016 |
| KR | 1020170030168 A | 3/2017 |
| KR | 1020170075865 A | 7/2017 |
| KR | 1020180115655 A | 10/2018 |
| KR | 1020180121304 A | 11/2018 |
| KR | 1020190020930 A | 3/2019 |
| TW | I227655 B | 2/2005 |
| TW | 201105775 A | 2/2011 |
| TW | I363054 B | 5/2012 |
| TW | I485137 B | 5/2015 |
| TW | I499653 B | 9/2015 |
| TW | 201929219 A | 7/2019 |
| WO | WO-95/33732 A1 | 12/1995 |
| WO | WO-02/096913 A1 | 12/2002 |
| WO | WO-2006/070711 A1 | 7/2006 |
| WO | WO-2006/070712 A1 | 7/2006 |
| WO | WO-2008/010377 A1 | 1/2008 |
| WO | WO-2008/069586 A1 | 6/2008 |
| WO | WO-2008/105294 A1 | 9/2008 |
| WO | WO-2009/099133 A1 | 8/2009 |
| WO | WO-2009/102054 A1 | 8/2009 |
| WO | WO-2010/050778 A1 | 5/2010 |
| WO | WO-2010/064871 A1 | 6/2010 |
| WO | WO-2010/094378 A1 | 8/2010 |
| WO | WO-2010/114256 A2 | 10/2010 |
| WO | WO-2010/114263 A2 | 10/2010 |
| WO | WO-2010/122810 A1 | 10/2010 |
| WO | WO-2010/134350 A1 | 11/2010 |
| WO | WO-2010/151006 A1 | 12/2010 |
| WO | WO-2011/012212 A1 | 2/2011 |
| WO | WO-2011/049284 A1 | 4/2011 |
| WO | WO-2011/074252 A1 | 6/2011 |
| WO | WO-2011/074253 A1 | 6/2011 |
| WO | WO-2011/115378 A1 | 9/2011 |
| WO | WO-2011/129096 A1 | 10/2011 |
| WO | WO-2012/070535 A1 | 5/2012 |
| WO | WO-2013/109030 A1 | 7/2013 |
| WO | WO-2013/100724 A4 | 10/2013 |
| WO | WO-2013/180456 A1 | 12/2013 |
| WO | WO-2013/183851 A1 | 12/2013 |
| WO | WO-2013/187007 A1 | 12/2013 |
| WO | WO-2014/024880 A1 | 2/2014 |
| WO | WO-2014/071518 A1 | 5/2014 |
| WO | WO-2014/104144 A1 | 7/2014 |
| WO | WO-2014/163228 A1 | 10/2014 |
| WO | WO-2014/199741 | 12/2014 |
| WO | WO-2015/005440 A1 | 1/2015 |
| WO | WO-2015/033559 A1 | 3/2015 |
| WO | WO-2015/041352 A1 | 3/2015 |
| WO | WO-2016/042781 A1 | 3/2016 |
| WO | WO-2016/056364 A1 | 4/2016 |
| WO | WO-2017/072678 A1 | 5/2017 |
| WO | WO-2018/103747 A1 | 6/2018 |
| WO | WO-2018/206575 A1 | 11/2018 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A1 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/191889 A1 | 10/2020 |
| WO | WO-2020/192051 A1 | 10/2020 |
| WO | WO-2020/199445 A1 | 10/2020 |
| WO | WO-2020/226383 A1 | 11/2020 |
| WO | WO-2020/261191 A1 | 12/2020 |

OTHER PUBLICATIONS

Abraham, Michael H., et al. "Determination of molar refractions and Abraham descriptors for tris(acetylacetonato)chromium(III), tris(acetylacetonato)iron(III) and tris(acetylacetonato)cobalt(III)." New Journal of Chemistry 41.23 (2017): 14259-14265.

Amano, Akio, et al. "49.4 L: Late-News Paper: Highly Transmissive One Side Emission OLED Panel for Novel Lighting Applications." SID Symposium Digest of Technical Papers. Vol. 44. No. 1. Oxford, UK: Blackwell Publishing Ltd, 2013.

Amat, Miguel A., et al. "Liquid-vapor equilibria and interfacial properties of -alkanes and perfluoroalkanes by molecular simulation." The Journal of chemical physics 132.11 (2010): 114704.

Aqra, Fathi, and Ahmed Ayyad. "Surface free energy of alkali and transition metal nanoparticles." Applied surface science 314 (2014): 308-313.

Aubouy, Miguel, et al. "Interfacial Properties of Polymeric Liquids." Physical Review Letters. 84.21 (2000): 4858-4861.

Baek, Jang-Yeol, et al. "New asymmetrical limb structured blue emitting material for OLED." Optical Materials Express 4.6 (2014): 1151-1158.

Baek, Seungin, et al. "74-2: Diffracted Image Retrieving with Deep Learning."?SID Symposium Digest of Technical Papers. Vol. 51. No. 1. 2020.

Balague, J., et al. "Synthesis of fluorinated telomers. Part 1. Telomerization of vinylidene fluoride with perfluoroalkyl iodides." Journal of Fluorine Chemistry 70.2 (1995): 215-223.

Bechtolsheim, C. V., V. Zaporojtchenko, and F. Faupel. "Interface structure and formation between gold and trimethylcyclohexane polycarbonate." Journal of materials research 14.9 (1999): 3538-3543.

Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.

Ben'kovskii, V.G., et al. "Density, surface tension and refractive index of aromatic hydrocarbons at low temperatures." Chemistry and Technology of Fuels and Oils 2.1 (1966): 23-26.

Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.

Bézière, Nicolas, and Ntziachristos, Vasilis. "Optoacoustic Imaging of Naphthalocyanine: Potential for Contrast Enhancement and Therapy Monitoring." Naphthalocyanine In Optoacoustic Imaging 56.2 (2015): 323-328.

Casas-Solvas, Juan M., et al. "Synthesis of substituted pyrenes by indirect methods." Organic & Biomolecular Chemistry 12.2 (2014): 212-232.

Chambrier, Isabelle, et al. "Synthesis of Porphyrin-CdSe Quantum Dot Assemblies: Controlling Ligand Binding by Substituent Effects." Inorganic chemistry 54.15 (2015): 7368-7380.

Chang, Li, et al. "A smart surface with switchable wettability by an ionic liquid." Nanoscale?9.18 (2017): 5822-5827.

Chen, Hsiao-Fan, et al. "1,3,5-Triazine?derivatives as new electron transport-type host materials for highly efficient green phosphorescent OLEDs." Journal of Materials Chemistry 19.43 (2009): 8112-8118.

(56) References Cited

OTHER PUBLICATIONS

Chen, Yu-Hung, et al. "58.2: High-Performance Large-Size OLED Tv with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
CN Office Action for CN Appl. Ser. No. 201880042206.7 dated Dec. 3, 2021 (7 pages).
CN Office Action for CN Appl. Ser. No. 201880042206.7 dated Jul. 5, 2022 (11 pages).
Condorelli, Guglielmo G., et al. "Engineering of molecular architectures of ß-diketonate precursors toward new advanced materials." Coordination chemistry reviews 251.13-14 (2007): 1931-1950.
Crowder, Gene A., et al. "Vapor pressures and triple point temperatures for several pure fluorocarbons." Journal of Chemical and Engineering Data 12.4 (1967): 481-485.
Cuny, Philippe, et al. "Phenanthrene degradation, emulsification and surface tension activities of a pseudomonas putida strain isolated from a coastal oil contaminated microbial mat." Ophelia, 58.3 (2004), 283-287.
Dalvi, Vishwanath H., Rossky, Peter J. "Molecular origins of fluorocarbon hydrophobicity." Proceedings of the National Academy of Sciences of the United States of America 107.31 (2010): 13603-13607.
Dams, Rudy, and Hintzer, Klaus. "Chapter 1:Industrial Aspects of Fluorinated Oligomers and Polymers." Fluorinated Polymers: vol. 2: Applications (2016): 1-31.
Das, Prajwalita, et al. "Recent advancements in the synthesis of pentafluorosulfanyl (SF5)-containing heteroaromatic compounds." Tetrahedron Letters 58.52 (2017): 4803-4815.
David, Robert, Neumann, A. Wilhelm. "A Theory for the Surface Tensions and Contact Angles of HydrogenBonding Liquids." Langmuir 30.39 (2014):11634-11639.
Dawood, Kamal M., et al. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
Devaux, Didier, et al. "Crosslinked perfluoropolyether solid electrolytes for lithium ion transport." Solid State Ionics 310 (2017): 71-80.
Dikarev, Evgeny V., et al. "Heterometallic Bismuth-Transition Metal Homoleptic ß-Diketonates." Journal of the American Chemical Society 127.17 (2005): 6156-6157.
Dolbier, William R. Jr., and Kanishchev, Oleksandr S. "Chapter One—SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Drake, Simon R., et al. "Lanthanide ß-diketonate glyme complexes exhibiting unusual co-ordination modes." Journal of the Chemical Society, Dalton Transactions 15 (1993): 2379-2386.
Drelich, Jaroslaw, et al. "Hydrophilic and Superhydrophilic Surfaces and Materials." Soft Matter, 7.21 (2011): 9804-9828.
Du, Libin, et al. "Fluoropolymer synthesis in supercritical carbon dioxide." The Journal of Supercritical Fluids 47.3 (2009): 447-457.
Dubrovskii, Vladimir. "Fundamentals of Nucleation Theory." Nucleation Theory and Growth of Nanostructures. Springer, Berlin, Heidelberg, 2014. 1-73.
Ebnesajjad, S. "Fluoroplastics: vol. 1: Non-Melt Processible Fluoroplastics. 2000." Plastics Design Library: United States of America, Norwich, NY, Chapter 11.
Ebnesajjad, Sina. "Chapter 4: Introduction to Fluoropolymers." Applied Plastics Engineering Handbook. William Andrew Publishing, Oxford 2011: 49-60.
Edrissi, M., et al. "Novel Method for the Preparation of Copper Phthalocyanin Blue Nanoparticles in an Electrochemical Cell Irradiated by Microwave (Research Note)". International Journal of Engineering, 20.3 (2007): 257-262.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols :? A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Ellison, A. H., et al. "Wetting of Fluorinated Solids by Hydrogen-Bonding Liquids." The Journal of Physical Chemistry 57.7 (1953): 622-627.
Emerton, Neil, David Ren, and Tim Large. "28-1: Image Capture Through TFT Arrays." SID Symposium Digest of Technical Papers. vol. 51. No. 1. 2020.
Evers, Robert C. "Low glass transition temperature fluorocarbon ether bibenzoxazole polymers." Journal of Polymer Science: Polymer Chemistry Edition 16.11 (1978): 2833-2848.
Farrow, Darcie A., et al. "Polarized pump-probe measurements of electronic motion via a conical intersection." The Journal of Chemical Physics 128.14 (2008): 144510.
Faupel, F., et al. "Nucleation, growth, interdiffusion, and adhesion of metal films on polymers."?AIP Conference Proceedings. vol. 491. No. 1. American Institute of Physics, 1999.
Feng, Zhengyu, et al. "28-3: Pixel Design for Transparent MicroLED Display with Low Blurring."?SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Formica, Nadia, et al. "Ultrastable and Atomically Smooth Ultrathin Silver Films Grown on a Copper Seed Layer." ACS Applied Materials & Interfaces 5.8 (2013): 3048-3053.
Fowkes, Frederick M. "Attractive Forces at Interfaces." Industrial and Engineering Chemistry 56.12 (1964): 40-52.
Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Fusella, Michael A., et al. "Plasmonic enhancement of stability and brightness in organic light-emitting devices." Nature 585.7825 (2020): 379-382.
Gao, Lichao, et al. "Teflon is Hydrophilic. Comments on Definitions of Hydrophobic, Shear versus Tensile Hydrophobicity, and Wettability Characterization." Langmuir 24.17 (2008): 9183-9188.
Garrick, Lloyd M. "Novel , New Aromatic SF 5 Derivatives ! Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Golemme, Gianni, et al. "Perfluoropolymer/Molecular Sieve Mixed-Matrix Membranes." Membranes 9.2 (2019): 19.
Golovin, Kevin, et al. "Low-interfacial toughness materials for effective large-scale deicing." Science 364.6438 (2019): 371-375.
Graham, Paul, et al. "Fluoropolymers with very low surface energy characteristics." Journal of Fluorine Chemistry 104.1 (2000): 29-36.
Gray, Victor, et al. "Photophysical characterization of the 9,10-disubstituted anthracene chromophore and its applications in triplet-triplet annihilation photon upconversion." Journal of Materials Chemistry C 3.42 (2015): 11111-11121.
Green, Mark. "The nature of quantum dot capping ligands." Journal of Materials Chemistry 20.28 (2010): 5797-5809.

(56) References Cited

OTHER PUBLICATIONS

Grzyll, Lawrence R., et al. "Density, Viscosity, and Surface Tension of Liquid Quinoline, Naphthalene, Biphenyl, Decafluorobiphenyl, and 1,2-Diphenylbenzene from 300 to 400 ?C." Journal of Chemical & Engineering Data 41.3 (1996): 446-450.
Guo, X. Andrew, et al. "Preparation and characterization of acrylates and polyacrylates having variable fluorine contents and distributions." Journal of Polymer Science Part A: Polymer Chemistry 32.1 (1994): 47-56.
Hammer, Nathan I., et al. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Heaney, James B. "Evaluation of commercially supplied silver coated Teflon for spacecraft temperature control usage." (1974).
Heinrich, Darina, et al. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B-methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hoene, Joan Von, et al. "Thermal Decomposition of Metal Acetylacetonates: Mass Spectrometer Studies." The Journal of Physical Chemistry 62.9 (1958): 1098-1101.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hughes, Russell P., Trujillo, Hernando A. "Selective Solubility of Organometallic Complexes in Saturated Fluorocarbons. Synthesis of Cyclopentadienyl Ligands with Fluorinated Ponytails." Organometallics 15.1 (1996): 286-294.
Hwang, Hyeon-Deuk, Kim, Hyun-Joong. "UV-curable low surface energy fluorinated polycarbonate-based polyurethane dispersion." Journal of Colloid and Interface Science 362.2 (2011): 274-284.
Hyre, Ariel S., Doerrer, Linda H. "A structural and spectroscopic overview of molecular lanthanide complexes with fluorinated O-donor ligands." Coordination Chemistry Reviews 404 (2020): 213098.
International Search Report and Written Opinion for PCT Appl. Ser. No. PCT/IB2018/052881 dated Jul. 25, 2018 (10 pages).
Jain, Akash, et al. "Estimation of Melting Points of Organic Compounds." Industrial & engineering chemistry research 43.23 (2004): 7618-7621.
Jarvis N.L., Zisman W.A. "Surface Chemistry of Fluorochemicals." U.S. Naval Research Laboratory (NRL); Washington, DC, USA, 1965.
Jean G. Riess. "Understanding the Fundamentals of Perfluorocarbons and Perfluorocarbon Emulsions Relevant to In Vivo Oxygen Delivery." Artificial Cells, Blood Substitutes, and Biotechnology 33.1 (2005): 47-63.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Johnson, P.G., Tittle, B. "The preparation of perfluorinated carboxylic esters and perfluoro carbonates." Journal of Fluorine Chemistry 3.1 (1973): 1-6.
Joliton, Adrien, and Carreira, Erick M. "Ir-Catalyzed Preparation of SF5-Substituted Potassium Aryl Trifluoroborates via C—H Borylation and Their Application in the Suzuki-Miyaura Reaction." Organic Letters 15.20 (2013): 5147-5149.
JP Office Action for JP Appl. Ser. No. 2019-557779 dated Jun. 29, 2022 (10 pages).
JP Office Action for JP Appl. Ser. No. 2019-557779 dated Oct. 4, 2021 (10 pages).
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning."?SID Symposium Digest of Technical Papers. vol. 46. No. 1. 2015.
Ke, L., et al. "Panchromatic ternary/quaternary polymer/fullerene BHJ solar cells based on novel silicon naphthalocyanine and silicon phthalocyanine dye sensitizers." Journal of Materials Chemistry A 5.6 (2017): 2550-2562.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kim, Beomjin, et al. "Synthesis and electroluminescence properties of highly efficient blue fluorescence emitters using dual core chromophores." Journal of Materials Chemistry C 1.3 (2013): 432-440.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays."?SID Symposium Digest of Technical Papers. vol. 51. No. 1. 2020.
Kim, S.K.,et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan.?Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions."?The Journal of Physical Chemistry? 79.12 (1975): 1183-1190.
Koma, N. et al. "44.2: Novel Front-light System Using Fine-pitch Patterned OLED." SID Symposium Digest of Technical Papers, 39: 655-658. 2008.
Korich, Andrew L., and Iovine, Peter M. "Boroxine chemistry and applications: A perspective." Dalton Transactions 39.6 (2010): 1423-1431.
Kota, Arun K. et al. "The design and applications of superomniphobic surfaces." NPG Asia Materials 6.7 (2014): e109-e109.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance?" Advances in Colloid and Interface Science 210 (2014): 65-71.
Kwak, Sang Woo, et al. "Synthesis and Electroluminescence Properties of 3-(Trifluoromethyl)phenyl-Substituted 9,10-Diarylanthracene Derivatives for Blue Organic Light-Emitting Diodes." Applied Sciences 7.11 (2017): 1109-1120.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.

(56) References Cited

OTHER PUBLICATIONS

Lee, Donggu, et al. "The influence of sequential ligand exchange and elimination on the performance of P3HT: CdSe quantum dot hybrid solar cells." Nanotechnology 26.46 (2015): 465401.

Lee, Sangwha, et al. "The Wettability of Fluoropolymer Surfaces: Influence of Surface Dipoles." Langmuir 24.9 (2008): 4817-4826.

Li, Chong, et al. "Photocontrolled Intramolecular Charge/Energy Transfer and Fluorescence Switching of Tetraphenylethene-Dithienylethene-Perylenemonoimide Triad with Donor-Bridge-Acceptor Structure." Chem. Asian J., 9.1 (2014): 104-109.

Li, Lu, et al. "Fluorinated anthracene derivatives as deep-blue emitters and host materials for highly efficient organic light-emitting devices." RSC Advances 5.73 (2015): 59027-59036.

Lifka, H. et al. "P-169: Single Side Emitting Transparent OLED Lamp." SID Symposium Digest of Technical Papers, 42: 1737-1739. 2011.

Lim, Sehoon, et al. "74-1: Image Restoration for Display-Integrated Camera." SID Symposium Digest of Technical Papers. vol. 51. No. 1. 2020.

Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.

Liu, Yang, et al. "P-168: Top Emission WOLED for High Resolution OLED TV." SID Symposium Digest of Technical Papers. vol. 49. No. 1. 2018.

Liu, Yunfei, et al. "P-202: High Transmittance Top Conductive Electrodes of OLEDs by Using Conductive Interface Layer." SID Symposium Digest of Technical Papers. vol. 51. No. 1. 2020.

Lo, Angel S. W. and Horváth, István. T. "Fluorous Ethers." Green Chemistry 17.10 (2015): 4701-4714.

Lu, Changqing, et al. "Synthesis of perfluoro-t-butyl trifluorovinyl ether and its copolymerization with TFE." Journal of Fluorine Chemistry 131.1 (2010): 17-20.

Lund, L. G., et al. "514. Phosphonitrilic derivatives. Part I. The preparation of cyclic and linear phosphonitrilic chlorides." Journal of the Chemical Society (Resumed) (1960): 2542-2547.

Maderna, A., et al. "The Syntheses of Amphiphilic Camouflaged Carboranes as Modules for Supramolecular Construction." J. Am. Chem. Soc. 123. 42 (2001): 10423-10424.

Magda van Leeuwen, et al. "The photochemistry and photophysics of a series of alpha octa(alkyl-substituted) silicon, zinc and palladium phthalocyanines." Photochemical & Photobiological Sciences 13.1 (2014): 62-69.

Maissel, Leon I., and Maurice H. Francombe. An introduction to thin films. CRC Press, 1973. pp. 61-83, 198, 199.

Malandrino, Graziella, et al. "New Thermally Stable and Highly Volatile Precursors for Lanthanum MOCVD: Synthesis and Characterization of Lanthanum ß-Diketonate Glyme Complexes." Inorganic Chemistry 34.25 (1995): 6233-6234.

Marchon, B., et al. "Fomblin Multidentate Lubricants for Ultra-Low Magnetic Spacing." IEEE Transactions on Magnetics 42.10 (2006): 2504-2506.

McDowell, Matthew, et al. "Semiconductor Nanocrystals Hybridized with Functional Ligands: New Composite Materials with Tunable Properties." Materials 3.1 (2010): 614-637.

McIntosh, Thomas J., et al. "Structure and Interactive Properties of Highly Fluorinated Phospholipid Bilayers." Biophysical Journal 71.4 (1996): 1853-1868.

Meinders, Marcel BJ, William Kloek, and Ton van Vliet. "Effect of surface elasticity on Ostwald ripening in emulsions." Langmuir 17.13 (2001): 3923-3929.

Michele Ricks. Advanced OLED Materials Enabling Large-Size OLED Displays by Ink Jet Printing. OLEDs World Summit, Sep. 2020.

Mishra, Shashank, and Daniele, Stephane. "Metal-Organic Derivatives with Fluorinated Ligands as Precursors for Inorganic Nanomaterials." Chemical Reviews 115.16 (2015): 8379-8448.

Mittal, Kashmiri Lal, ed. "Metallized plastics 3: fundamental and applied aspects." Springer Science & Business Media, 2012.

Morgenstern, Karina, Georg Rosenfeld, and George Comsa. "Decay of two-dimensional Ag islands on Ag (111)." Physical review letters 76.12 (1996): 2113.

Mucur, S.P., et al. "Conventional and inverted organic light emitting diodes based on bright green emmisive polyfluorene derivatives." Polymer 151.12 (2018): 101-107.

Murano, Sven, et al. "30.3: Invited Paper: AMOLED Manufacturing-Challenges and Solutions from a Material Makers Perspective."? SID Symposium Digest of Technical Papers. vol. 45. No. 1. 2014.

Murotani, Eisuke, et al. "Synthesis and polymerization of a novel perfluorinated monomer." Journal of Fluorine Chemistry 128.10 (2007): 1131-1136.

Nakamura, Daiki, et al. "68-4: Top-emission OLED Kawara-type Multidisplay with Auxiliary Electrode." SID Symposium Digest of Technical Papers. vol. 49. No. 1. 2018.

Navarrini, Walter, et al. "Low surface energy coatings covalently bonded on diamond-like carbon films." Diamond & Related Materials 19.4 (2010): 336-341.

Nittler, Laurent, et al. "Morphology study of small amounts of evaporated gold on polymers." Surface and interface analysis 44.8 (2012): 1072-1075.

Ohring, Milton. Materials science of thin films. Elsevier, 2001.

Okamoto, Yoshiyuki, et al. "New amorphous perfluoro polymers: perfluorodioxolane polymers for use as plastic optical fibers and gas separation membranes." Polymers for Advanced Technologies 27.1 (2016): 33-41.

Okuyama, Kentaro, et al.? "79-4L:?Late-News Paper: Highly Transparent LCD using New Scattering-type Liquid Crystal with Field Sequential Color Edge Light."?SID Symposium Digest of Technical Papers,?48, 2017.

Pandharkar, Riddhish, et al. "A Computational Study of AlF3 and ACF Surfaces." Inorganics 6.4 (2018): 124.

Park, Chan II, et al. "54-1: Distinguished Paper: World 1st Large Size 77-inch Transparent Flexible OLED Display."?SID Symposium Digest of Technical Papers. vol. 49. No. 1. 2018.

Park, Eun Ji, et al. "Fabrication of conductive, transparent and superhydrophobic thin films consisting of multi-walled carbon nanotubes." RSC Advances 4.57 (2014): 30368-30374.

Park, Jongwoong, et al. "8-1: The Method to Compensate IR-Drop of AMOLED Display." SID Symposium Digest of Technical Papers. vol. 50. No. 1. 2019.

Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.

Peters, Richard D., et al. "Using Self-Assembled Monolayers Exposed to X-rays To Control the Wetting Behavior of Thin Films of Diblock Copolymers." Langmuir 16.10 (2000): 4625-4631.

Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.

Pittman, Allen G., et al. "Polymers derived from fluoroketones. II. Wetting properties of fluoroalkyl acrylates and methacrylates." Journal of Polymer Science Part A-1: Polymer Chemistry 6.6 (1968): 1729-1740.

Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.

Quast, Matthew J., et al. "Synthesis and Physical Properties of Highly Branched Perfluorinated Polymers from AB and AB2 Monomers." Journal of Polymer Science Part A: Polymer Chemistry 53.16 (2015): 1880-1894.

Ren, Zhongjie, and Yan, Shouke. "Polysiloxanes for optoelectronic applications." Progress in Materials Science 83 (2016): 383-416.

Roitman, James N., Pittman, Allen G. "Wetting properties of acrylic polymers containing perfluoro-t-butyl side chains." Polymer Letters 10.7 (1972): 499-503.

Roitman, James N., Pittman, Allen G. "Wetting properties of bis(trifluoromethyl)carbinyl acrylate polymers." Journal of Polymer Science: Polymer Chemiatry Edition 12.7 (1974): 1421-1436.

(56) References Cited

OTHER PUBLICATIONS

Rokni-Fard, Mahroo, and Quanmin Guo. "Biased Ostwald ripening in site-selective growth of two-dimensional gold clusters." The Journal of Physical Chemistry C 122.14 (2018): 7801-7805.
Romack, T. J., et al. "Synthesis of Tetrafluoroethylene-Based, Nonaqueous Fluoropolymers in Supercritical Carbon Dioxide." Macromolecules 28.24 (1995): 8429-8431.
Rumyant?ev, R.V., Fukin, G.K. "Intramolecular C—F?Ln dative interactions in lanthanide complexes with fluorinated ligands." Russian Chemical Bulletin 66.9 (2017): 1557-1562.
Safonov, Alexey I., et al. "Deposition of thin composite films consisting of fluoropolymer and silver nanoparticles having surface plasmon resonance." Thin Solid Films 603 (2016): 313-316.
Sakka, Tetsuo, et al. "Surface tension of fluoroalkanes in a liquid phase." Journal of Fluorine Chemistry 126.3 (2005): 371-375.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Senaweera, Sameera M., and Weaver, Jimmie D., "Selective Perfluoro- and Polyfluoroarylation of Meldrum's Acid". The Journal of Organic Chemistry 79.21 (2014): 10466-10476.
Shen, Mingmin, et al. "Destabilization of Ag nanoislands on Ag (100) by adsorbed sulfur." The Journal of chemical physics 135.15 (2011): 154701.
Shen, Xiao-Min, et al. "Highly photostable silicon(IV) phthalocyanines containing adamantane moieties: synthesis, structure, and properties." Tetrahedron 66.46 (2010): 9041-9048.
Shi, Shiming, et al. "56-1: Invited Paper: Research on Commercial Foldable AMOLED and Relevant Technologies."?SID Symposium Digest of Technical Papers. vol. 51. No. 1. 2020.
Shin, Dong-Youn, and Inyoung Kim. "Self-patterning of fine metal electrodes by means of the formation of isolated silver nanoclusters embedded in polyaniline."?Nanotechnology?20.41 (2009): 415301.
Shirasaki, Yasuhiro. Efficiency loss mechanisms in colloidal quantum-dot light-emitting diodes. Diss. Massachusetts Institute of Technology, 2013.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." Asle Transactions 14.3 (1971): 237-242.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Syafiq, A., et al. "Superhydrophilic Smart Coating for Self-Cleaning Application on Glass Substrate." Journal of Nanomaterials 2018 (2018).
Szab?, D?nes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
T?pper, Tino, et al. "Siloxane-based thin films for biomimetic low-voltage dielectric actuators." Sensors and Actuators A: Physical 233 (2015): 32-41.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903.
Thurston, John H., et al. "Toward a General Strategy for the Synthesis of Heterobimetallic Coordination Complexes for Use as Precursors to Metal Oxide Materials:? Synthesis, Characterization, and Thermal Decomposition of Bi2(Hsal)6?M(Acac)3 (M=Al, Co, V, Fe, Cr)." Inorganic chemistry 43.10 (2004): 3299-3305.
Tsai, Yu-Hsiang, et al. "P-202: A Flexible Transparent OLED Display with FlexUPTM Technology."?SID Symposium Digest of Technical Papers. vol. 48. No. 1. 2017.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tu, Kuan-Heng, et al. "A cyano-rich small molecule dopant for organic thermoelectrics." Organic Electronics 87 (2020): 105978.
Umemoto, Teruo, et al. "Discovery of practical production processes for arylsulfur pentafluorides and their higher homologues, bis- and tris(sulfur pentafluorides): Beginning of a new era of 'super-trifluoromethyl' arene chemistry and its industry." Beilstein Journal of Organic Chemistry 8 (2012): 461-471.
Van de Grampel, Robert Dirk. "Surfaces of fluorinated polymer systems." Eindhoven: Technische Universiteit Eindhoven, 2002.
Varagnolo, Silvia, et al. "Embedded-grid silver transparent electrodes fabricated by selective metal condensation."?Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vitos, Levente, et al. "The surface energy of metals." Surface science 411.1-2 (1998): 186-202.
Wadley, Maurice L., et al. "Solvent Dependence of the Morphology of Spin-Coated Thin Films of Polydimethylsiloxane-Rich Polystyrene-block-Polydimethylsiloxane Copolymers." Macromolecules 45.13 (2012): 5538-5545.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, Hailiang, et al. "P-132: An Under-Display Camera Optical Structure for Full-Screen LCD."?SID Symposium Digest of Technical Papers. vol. 51. No. 1. 2020.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Weimer, P. K. "Physics of Thin Films, vol. 2.". Academic Press, (1964).

(56) References Cited

OTHER PUBLICATIONS

Wheeler, Bob L., et al. "A silicon phthalocyanine and a silicon naphthalocyanine: synthesis, electrochemistry, and electrogenerated chemiluminescence." Journal of the American Chemical Society 106.24 (1984): 7404-7410.

Wolf, Florian F., et al. "Hydrogen-bonding cyclodiphosphazanes: superior effects of 3,5-(CF3)2-substitution in anion-recognition and counter-ion catalysis." New Journal of Chemistry 42.7 (2018): 4854-4870.

Wolfgang Decker, Vast Films, Ltd. "Pattern Metallization: Selective Deposition of Metals on Polymer Films for Functional Applications" AIMCAL Fall Conference 2005.

Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.

Xia, Z. Y., et al. "High performance organic light-emitting diodes based on tetra(methoxy)-containing anthracene derivatives as a hole transport and electron-blocking layer." Journal of Materials Chemistry 20.38 (2010): 8382-8388.

Xu, Hua, et al. "Transparent AMOLED Display Derived by Metal Oxide Thin Film Transistor with Praseodymium Doping." Proceedings of the International Display Workshops vol. 26 (IDW '19). 2019.

Xu, Pengyun, et al. "Superhydrophobic ceramic coating: Fabrication by solution precursor plasma spray and investigation of wetting behavior." Journal of Colloid and Interface Science 523 (2018): 35-44.

Yamada, Toshikazu, et al. "Nanoparticle chemisorption printing technique for conductive silver patterning with submicron resolution." Nature communications 7.1 (2016): 1-9.

Yang, Jun-Yu, et al. "32-3: AMOLED IR Drop Compensation for Channel Length Modulation." SID Symposium Digest of Technical Papers. vol. 51. No. 1. 2020.

Yang, Min K., et al. "Optical properties of Teflon AF amorphous fluoropolymers." Journal of Micro/Nanolithography, MEMS, and MOEMS 7.3 (2008): 033010.

Yao, Pan, et al. "Highly soluble and thermally stable copolyimides modified with trifluoromethyl and siloxane." Journal of Applied Polymer Science 132.13 (2015): 41713.

Yao, Wenqiang, et al. "Fluorinated poly(meth)acrylate: Synthesis and properties." Polymer?55.24 (2014): 6197-6211.

Yeung, Leo W.Y., et al. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.

Yu, Jun Ho, et al. "64-2: Fabrication of Auxiliary Electrodes using Ag Inkjet Printing for OLED Lighting." SID Symposium Digest of Technical Papers. vol. 49. No. 1. 2018.

Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.

Zaporojtchenko, V., et al. "Controlled growth of nano-size metal clusters on polymers by using VPD method."?Surface science?532 (2003): 300-305.

Zaporojtchenko, V., et al. "Determination of condensation coefficients of metals on polymer surfaces."?Surface science?454 (2000): 412-416.

Zaporojtchenko, V., et al. "Formation of metal-polymer interfaces by metal evaporation: influence of deposition parameters and defects." Microelectronic engineering 50.1-4 (2000): 465-471.

Zaporojtchenko, V., et al. "Metal/polymer interfaces with designed morphologies." Journal of Adhesion Science and Technology 14.3 (2000): 467-490.

Zeng, Yang, et al. "28-4: Investigation of Moir? Interference in Pinhole Matrix Fingerprint on Display Technology." SID Symposium Digest of Technical Papers. vol. 51. No. 1. 2020.

Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.

Zhang, Hao, et al. "P-131: A Design of Under-screen Face Recognition based on Screen Miniature Blind Apertures." SID Symposium Digest of Technical Papers. vol. 51. No. 1. 2020.

Zhang, Tianzhan, et al. "Bio-inspired superhydrophilic coatings with high anti-adhesion against mineral scales." NPG Asia Materials 10.3 (2018): e471-e471.

Zhang, Xuan, et al. "Synthesis of extended polycyclic aromatic hydrocarbons by oxidative tandem spirocyclization and 1, 2-aryl migration." Nature communications 8.1 (2017): 1-8.

Zhang, Zhenhua. "74-3: Image Deblurring of Camera Under Display by Deep Learning."?SID Symposium Digest of Technical Papers. vol. 51. No. 1. 2020.

Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.

Zhao, Xuan, et al. "P-233: Late-News-Poster: Color Shift Improvement of AMOLED Device with Color Filter." SID Symposium Digest of Technical Papers. vol. 51. No. 1. 2020.

Zheng, Bi-Yuan, et al. "Synthesis and antifungal photodynamic activities of a series of novel zinc(II) phthalocyanines substituted with piperazinyl moieties." Dyes and Pigments 99.1 (2013): 185-191.

Zheng, Dongxiao, et al. "Non-conjugated and p-conjugated functional ligands on semiconductive quantum dots." Composites Communications 11 (2019): 21-26.

Foreign Action other than Search Report on Japanese Application dated Nov. 8, 2022.

Abroshan, H. et al. "66-3: Active Learning for the Design of Novel OLED Materials." SID Symposium Digest of Technical Papers. 53.1 (2022).

Alhadid A. et al., "Design of Deep Eutectic Systems: A Simple Approach for Preselecting Eutectic Mixture Constituents", Molecules, 25.5 (2020): 1077.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H.R. "Phosphorus-nitrogen Compounds", pp. 400-407, Academic Press (1972).

Allcock, H.R. and Walsh, E.J., "Phosphonitrilic Compounds. XIV. Basic Hydrolysis of Aryloxy-and Spiroarylenedioxycyclophosphazenes", J. Amer. Chem. Soc., 94.13 (1972):4538-4545.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star-and Dumbbell-Shaped POSS Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

(56) References Cited

OTHER PUBLICATIONS

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.
Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baradie, B et al. "Synthesis and characterization of novel polysiloxane-grafted fluoropolymers." Canadian journal of chemistry 83.6-7 (2005): 553-558.
Barry, B., "Routes to Silsesquioxanes Functionalization—Capping of DDSQs for the Synthesis of Asymmetric POSS Compounds", Masters Thesis, Michigan State University (2019).
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphosphazenes Bearing a P-NH Group", 40.19 (2011): 5307.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F. Sputtering and Plasma Polymerization in Inert and Active Gas", Thin Solid Films, 41.3 (1977): 329-339.
Blanchet, G.B., "Deposition of Amorphous Fluoropolymers Thin Films by Laser Ablation", Appl. Phys. Lett. 62 (1993):479-481.
Blanco, I., "The Rediscovery of POSS: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly [(vinyloxy) cyclophosphazenes]." Macromolecules 34.9 (2001): 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Camino, G. et al., "Polydimethylsiloxane Thermal Degradation Part 1. Kinetic Aspects", Polymer, 42.6 (2001):2395-2402.
Chaiprasert, T. et al. "Vinyl-functionalized Janus ring siloxane: potential precursors to hybrid functional materials." Materials 14.8 (2021): 2014.
Chan, E.P. et al. "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chen, G. K. J., and J. Chen. "Flexible displays: Flexible AMOLED manufacturing." Handbook of Visual Display Technology; Chen, J., Cranton, W., Fihn, M., Eds (2016).
Chen, W. et al., "Highly Thermal Stable Phenolic Resin Based on Double-Decker-Shaped POSS Nanocomposites for Supercapacitors", Polymers, 12.9 (2020):2151-2165.

Cho, H.U. et al. "17-1: Invited Paper: Enhancement of Current Efficiency for OLED Devices Using Meta-Heuristic Algorithm." SID Symposium Digest of Technical Papers. 52.1 (2021).
Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010):13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ellison, A. H., H. W. Fox, and W. A. Zisman. "Wetting of fluorinated solids by hydrogen-bonding liquids." The Journal of Physical Chemistry 57.7 (1953): 622-627.
Feher, F.J. and Budzichowski, T.A., "Silasesquioxanes as Ligands in Inorganic and Organometallic Chemistry", Polyhedron, 14.22 (1995):3239-3253.
Fox, H.W. et al., "Polyorganosiloxanes. . .Surface Active Properties", Ind. Eng. Chem., 39.11 (1947):1401-1409.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., An Overview of the Uses of Per-and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.

(56) References Cited

OTHER PUBLICATIONS

Gritsenko, K.P. and Krasovsky, A.M., "Thin-Film Deposition of Polymers by Vacuum Degradation", Chem. Rev., 103.9 (2003):3607-3649.

Grytsenko, K. "Vacuum-deposited fluoropolymer films for organic electronics" International Symposium on Plastics Electronics (Part of Semicon Europe—2015) at Dresden, Germany (2015).

Grytsenko, K.P. et al., "Protective Applications of Vacuum-Deposited Perfluoropolymer Films", Semiconductor Physics, Quantum Electronics & Optoelectronics, 19.2 (2016):139-148.

Hoge, J. "Novel Benzoxazine Resin System for Flame Retardant Aircraft Interior Applications" The Sixth Triennial International Aircraft Fire and Cabin Safety Research (2010).

Holland, L. et al., "Sputtered and Plasma Polymerized Fluorocarbon Films", Thin Solid Films, 35 (1976): L19-L21.

Hwang, S. et al., "ChemInform Abstract: Dendritic Macromolecules for Organic Light-Emitting Diodes", Chemical Society Reviews, 37.11 (2008):2543-2557.

Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).

Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.

Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.

Ikonnikov, D.A., "Controlling Multiple Diffraction with Quasiperiodic Gratings", Laser Phys. Lett., 16.12 (2019):126202.

Imoto, H. et al., "Corner-and Side-Opened Cage Silsesquioxanes: Structural Effects on the Materials Properties", European Journal of Inorganic Chemistry, 2020.9 (2020):737-742.

Imoto, H. et al., "Tripodal Polyhedral Oligomeric Silsesquioxanes as a Novel Class of Three-Dimensional Emulsifiers", Polymer Journal, 47 (2015):609-615.

Ito, Hitoshi, et al. "Synthesis and Thermal Properties of Fully Aromatic Polysilarylenesiloxanes." Polymer Journal 38.2 (2006): 109-116.

Ivleva, E.A. et al., "Synthesis of Adamantane Functional Derivatives Basing on N-[(Adamantan-1- yl)alkyl]acetamides", Russian Journal of Organic Chemistry, 52.11 (2016):1558-1564.

Iwamori, S. et al., "Adsorption Properties of Fluorocarbon Thin Films Prepared by Physical Vapor Deposition Methods", Surface & Coatings Technology, 204:16-17 (2010):2803-2807.

Iwamori, S., "Adhesion and Friction Properties of Fluorocarbon Polymer Thin Films Coated onto Metal Substrates", Key Engineering Materials, 384 (2008):311-320.

Jang, Sang Eok, et al. "Thermally stable fluorescent blue organic light-emitting diodes using spirobifluorene based anthracene host materials with different substitution position." Synthetic metals 160.11-12 (2010): 1184-1188.

Jarvis, N.L. and Zisman, W.A., "Surface Chemistry of Fluorochemicals", Defense Technical Information Center (1965):1-37.

Jin, Y. et al. "Two-Tier Ensemble Deep Learning Model for Anomaly Detection in OLED Encapsulation Process" The 21st International Meeting on Information Display, Seoul, Korea (2021).

Jung, W. et al. "High-precision laser glass cutting for future display" Journal of the Society for Information Display 30.5 (2022): 462-470.

Kaesler, K., "The hidden defenders : Silane and siloxane impregnation protects construction materials", European coatings journal, 3 (2006):36-41.

Khanin, D. A., et al. "New hybrid materials based on cyclophosphazene and polysiloxane precursors: Synthesis and properties." Polymer 186 (2020): 122011.

Kim, Chiwoo, et al. "Fine metal mask material and manufacturing process for high-resolution active- matrix organic light-emitting diode displays." Journal of the Society for Information Display 28.8 (2020): 668-679.

Kim, G. et al. "Multiscale Calculation of Carrier Mobility in Organic Solids Through the Fine-Tuned Kinetic Monte Carlo Method" The 21st International Meeting on Information Display, Seoul, Korea (2021).

Kim, H. et al. "83-2: Reliability Characterization of Luminance Degradation of OLED Mobile Display Considering Color Difference Index Based on Usage Patterns." SID Symposium Digest of Technical Papers 51.1 (2020).

Kim, J. et al. "Design of Stable Blue Phosphorescent OLEDs Using State Interaction between Exciplex and Component Host" The 21st International Meeting on Information Display, Seoul, Korea (2021).

Kim, J.H. et al., "Thickness and Composition Dependence of the Glass Transition Temperature in Thin Homogeneous Polymer Blend Films", Macromolecules, 35.1 (2002):311-313.

Kim, J.H. et al., "Thickness Dependence of the Glass Transition Temperature in Thin Polymer Films", Langmuir, 17.9 (2001):2703-2710.

Kim, J.H et al., "Thickness Dependence of the Melting Temperature of Thin Polymer Films", Macromol. Rapid Commun. 22.6 (2001):386-389.

Kim, Kyu-Sung, et al. "Blue light-emitting OLED using new spiro [fluorene-7, 9'-benzofluorene] host and dopant materials." Organic Electronics 9.5 (2008): 797-804.

Kim, S et al. "25-3: Machine-Learning-Assisted Materials Discovery of Blue Emitter for More Efficient and Durable OLED Device." SID Symposium Digest of Technical Papers. 52.1 (2021).

Kim, S. "40-2: Invited Paper: Prolonging Device Lifetime of Blue Organic Light-Emitting Diodes." SID Symposium Digest of Technical Papers 53.1 (2022).

Kim, S. et al. "Autonomous Materials Design for More Efficient OLED Devices using Machine Learning" The 21st International Meeting on Information Display, Seoul, Korea (2021).

Kim, S. et al., "Origin of Macroscopic Adhesion in Organic Light-Emitting Diodes Analyzed at Different Length Scales", Scentific Reports, 8.6391 (2018): 1-7.

Kim, T. et al., "Electrical Injection and Transport in Teflon-Diluted Hole Transport Materials", Organic Electronics, 83 (2020):105754.

Kim, Y. "AI & Simulation Technology for Displays", SID 2021 Short Course, SID Display Week, virtual (2021).

Kim, Y. et al. "17-2: Invited Paper: Simulation Based Artificial Intelligence for Displays." SID Symposium Digest of Technical Papers. 52.1 (2021).

Kiskan, B., "Adapting Benzoxazine Chemistry for Unconventional Applications", Reactive and Functional Polymers, 129 (2018):76-88.

Koh, K et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.

Kota, Arun K., Gibum Kwon, and Anish Tuteja. "The design and applications of superomniphobic surfaces." NPG Asia Materials 6.7 (2014): e109.

Kovacik, P. et al., "Vacuum-Deposited Planar Heterojunction Polymer Solar Cells", ACS Appl. Mater. Interfaces, 3.1 (2011):11-15.

Krishnan, S. et al., "Fluorinated Polymers: Liquid Crystalline Properties and Applications in Lithography", The Chemical Record, 4.5 (2004):315-330.

Kunthom, R. et al., "Synthesis and Characterization of Unsymmetrical Double-Decker Siloxane (Basket Cage)", Molecules, 24.23 (2019):4252.

Kuo, S. et al., "Preparing Low-Surface-Energy Polymer Materials by Minimizing Intermolecular Hydrogen-Bonding Interactions", J. Phys. Chem. C, 113.48 (2009):20666-20673.

Lanoux, S. and Mas, R.H., "Reactions of the Hydrolyzed Phosphazene N3P3(OCH2CF3)5ONa", Phosphorus and Sulfur and the Related Elements, 26.2 (1986):139-142.

(56) References Cited

OTHER PUBLICATIONS

Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).

Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.

Lee, S. et al. "20-2: High Efficiency and Long Device Lifetime Green Organic Light Emitting Diodes using a Pt Complex." SID Symposium Digest of Technical Papers 51.1 (2020).

Li, L. et al., "Synthesis and Properties of Microporous Organic Polymers Based on Adamantane", Progress in Chemistry, 32 (2020):190-203.

Li, P. et al. "Preparation and application of fluorinated-siloxane protective surface coating material for stone inscriptions." Journal of Polymer Engineering 35.6 (2015): 511-522.

Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).

Liu, C. et al., "Mechanistic Studies on Ring-Opening Polymerization of Benzoxazines: A Mechanistically Based Catalyst Design", Macromolecules, 44.12 (2011):4616-4622.

Liu, F. et al. "Syntheses and structure of the first eight-membered fluoro and chloro hafnium siloxane complexes" Zeitschrift für anorganische und allgemeine Chemie 622.5 (1996): 819-822.

Liu, Z. et al., "Two-Dimensional Gratings of Hexagonal Holes for High Order Diffraction Suppression", Optics Express, 25.2 (2017): 1339-1349.

Lowe, R.D. et al., "Deposition of Dense Siloxane Monolayers from Water and Trimethoxyorganosilane Vapor", Langmuir, 27.16 (2011):9928-9935.

Lu, H. and Nutt, S., "Restricted Relaxation in Polymer Nanocomposites near the Glass Transition", Macromolecules, 36.11 (2003):4010-4016.

Lu, T. et al., "Blended Hybrids Based on Silsesquioxane—OH and Epoxy Resins", Journal of Applied Polymer Science, 106.6 (2007):4117-4123.

Lysien, M. et al. "55-1: Deposition of Conductive and Insulating Materials at Micrometer Scale for Display-Component Prototyping." SID Symposium Digest of Technical Papers 53.1 (2022).

Mabry, J.M. et al., "Fluorinated Polyhedral Oligomeric Silsesquioxanes (F-POSS)", Angew. Chem. Int. Ed., 47.22 (2008):4137-4140.

Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.

Mackus, A.J.M. et al. "From the bottom-up: toward area-selective atomic layer deposition with high selectivity" Chemistry of Materials 31.1 (2018): 2-12.

Majhy, B. et al., "Facile Fabrication and Mechanistic Understanding of a Transparent Reversible Superhydrophobic-Superhydrophilic Surface", Scientific Reports, 8 (2018):18018.

Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.

Marzari, N. et al. "Electronic-structure methods for materials design." Nature materials 20.6 (2021):736-749.

Mikhaylov, D.Y. and Budnikova, Y.H., "Fluoroalkylation of Organic Compounds", Russian Chemical Reviews, 82.9 (2013):835-864.

Mugisawa, M. et al., "Synthesis and Application of Novel Fluoroalkyl End-Capped Cooligomers Having Adamantane as a Pendant Group", Colloid Polym Sci, 285 (2007):737-744.

Murray, M. et al., "NMR Studies of Hydrolysis and Rearrangement Reactions of Cyclophosphazenes", Phosphorus, Sulfur, and Silicon and the Related Elements, 65.1-4 (1992):83-86.

Nason, T.C. et al., "Deposition of Amorphous Fluoropolymer Thin Films by Thermolysis of Teflon Amorphous Fluoropolymer", Appl. Phys. Lett. 60 (1992):1866-1868.

Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.

Nicolas, G. and Spiegelmann, F., "Theoretical Study of Ethylene-Noble Metal Complexes", J. Am. Chem. Soc., 112 (1990):5410-5419.

Nishino, T. et al., "The Lowest Surface Free Energy Based on-CF3 Alignment", Langmuir, 15 (1999):4321-4323.

Niu, J. et al., "High Order Diffraction Suppression by Quasi-Periodic Two-Dimensional Gratings", Optical Materials Express, 7.2 (2017):366-375.

Ohnishi Y. et al., "Optical Characteristics of Poly(tetrafluoroethylene) Thin Film Prepared by a Vacuum Evaporation", Jpn. J. Appl. Phys., 55:2S (2016):02BB04.

Oka, M. and Satoshi, H. "Synthesis of photoresponsive cyclic poly (dimethyl siloxane) s from monodisperse linear precursors" Reactive and functional polymers 158 (2021): 104800.

Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.

Olejnik, A. et al., "Silsesquioxanes in the Cosmetics Industry—Applications and Perspectives", Materials, 15.3 (2022):1126-1143.

Owen, M. J. "A review of significant directions in fluorosiloxane coatings" Surface Coatings International Part B: Coatings Transactions 87:B2 (2004).

Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.

Pham, J.Q. and Green, P.F., "The Glass Transition of Thin Film Polymer/Polymer Blends: Interfacial Interactions and Confinement", J. Chem. Phys., 116.13 (2002):5801-5806.

Pu, T. et al., "Effects of Structure Parameters on High-Order Diffraction Suppression of Quasi-Periodic Gratings", Journal of the Optical Society of America B, 35.4 (2018):711-717.

Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.

Reichert, V.R. and Mathias, L.J., "Expanded Tetrahedral Molecules from 1,3,5,7-Tetraphenyladamantane", Macromolecules, 27.24 (1994):7015-7023.

Riberiro, P et al., "Optics, Photonics and Laser Technology 2017", Chapters 2 and 3, Springer (2019).

Ringe, E., "Shapes, Plasmonic Properties, and Reactivity of Magnesium Nanoparticles", J. Phys, Chem. C, 124 (2020):15665.

Roy, M.R., "Surface Properties of Hard Fluorinated Amorphous Carbon Films Deposited by Pulsed-DC Discharges", Doctoral Thesis, Universitat de Barcelona (2012).

Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.

Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.

Seebauer, E.G. and Allen, C.E., "Estimating Surface Diffusion Coefficients", Progress in Surface Science, 49.3 (1995): 265-330.

Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.

Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.

Sessler, C.D. et al., "CF2H, a Hydrogen Bond Donor", J. Am. Chem. Soc., 139.27 (2017):9325-9332.

Shen, Wen-Jian, et al. "Spirobifluorene-linked bisanthracene: An efficient blue emitter with pronounced thermal stability." Chemistry of materials 16.5 (2004): 930-934.

Shen. Y, et al. "32.1: Research of Nanocomposite Materials with High Refractive Index for HLEMS Application" SID Symposium Digest of Technical Papers 54 (2023).

(56) References Cited

OTHER PUBLICATIONS

Shevlin, S. et al. "Computational materials design." Nature Materials 20.6 (2021): 727-727.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Sohn, I et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997):1564-1566.
Takele, H. et al., "Plasmonic Properties of Ag Nanoclusters in Various Polymer Matrices", Nanotechnology, 17.14 (2006):3499-3505.
Tao, C. et al., "Highly Icephobic Properties on Slippery Surfaces Formed From Polysiloxane and Fluorinated POSS", Progress in Organic Coatings, 103 (2017):48-59.
Thran, A., et al. "Condensation coefficients of Ag on polymers." Physical review letters 82.9 (1999):1903-1906.
Tokuchi. S et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, Rie Takagi, and Takahiro Shiozawa. "Light-controlled metal deposition on photochromic polymer films."? Journal of Materials Chemistry?20.43 (2010): 9623-9627.
Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Van de Grampel, R.D., "Surfaces of Fluorinated Polymer Systems", Doctoral Thesis, Technische Universiteit Eindhoven (2002).
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022):10-36.
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967):K163-K166.
Wu, Y. et al. "P-13.5: Investigation on Chromatic Dispersion of Reflection for CFOT Display" SID Symposium Digest of Technical Papers 54 (2023).
Xie, J. et al., "Regioselective Synthesis of Methyl-Substituted Adamantanes for Promoting Oxidation Stability of High-Density Fuels", Energy Fuels, 34.4 (2020):4516-4524.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, X. et al. "A Unified Spatial-Angular Structured Light for Single-View Acquisition of Shape and Reflectance" Proceedings of the IEEE/CVF Conference on Computer Vision and Pattern Recognition (2023).

(56) References Cited

OTHER PUBLICATIONS

Xu, Y. et al. "Depth Estimation by Combining Binocular Stereo and Monocular Structured-Light" Proceedings of the IEEE/CVF Conference on Computer Vision and Pattern Recognition (2022).

Yang, H. et al., "Catalyst-Controlled C-H Functionalization of Adamantanes Using Selective H-Atom Transfer", ACS Catal., 9.6 (2019):5708-5715.

Yang, J. et al. "25-4: Methodology and Correlation of AI-Based Design for OLED Materials." SID Symposium Digest of Technical Papers 52.1 (2021).

Yao, Y. et al. "P-7.12: Research on High Brightness Mode Uniformity Problem of Flexible AMOLED Mobile" SID Symposium Digest of Technical Papers 54 (2023).

Yao, Z. et al. "Inverse design of nanoporous crystalline reticular materials with deep generative models." Nature Machine Intelligence 3.1 (2021): 76-86.

Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.

Yoo, D. et al. "Retrosynthesis Planning for Thermally Activated Delayed Fluorescence Molecules" The 21st International Meeting on Information Display, Seoul, Korea (2021).

Youn, S. et al. "73-4: Novel Materials and Structures for High Efficiency and Long Lifetime Green Phosphorescent OLEDs in Automotive Applications." SID Symposium Digest of Technical Papers. 53.1 (2022).

Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).

Zalewski, K. et al., "A Review of Polysiloxanes in Terms of Their Application in Explosives", Polymers, 13.7 (2021):1080-1090.

Zhang, W. et al., "Polymer/polyhedral Oligomeric Silsesquioxane (POSS) Nanocomposites: An Overview of Fire Retardance", Progress in Polymer Science, 67 (2017):77-125.

Zhang, W. et al., "Why We Need to Look Beyond the Glass Transition Temperature to Characterize the Dynamics of Thin Supported Polymer Films", PNAS Latest Articles, 115.22 (2018):5641-5646.

Zhu, C. et al. "A novel synthetic UV-curable fluorinated siloxane resin for low surface energy coating." Polymers 10.9 (2018): 979.

Zibarov, A. et al., "AB5 Derivatives of Cyclotriphosphazene for the Synthesis of Dendrons and Their Applications", Molecules, 26.13 (2021):4017-4040.

\* cited by examiner

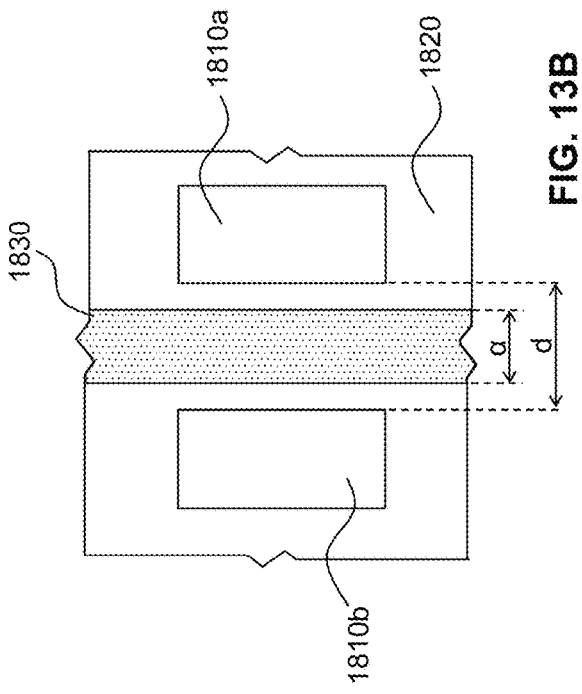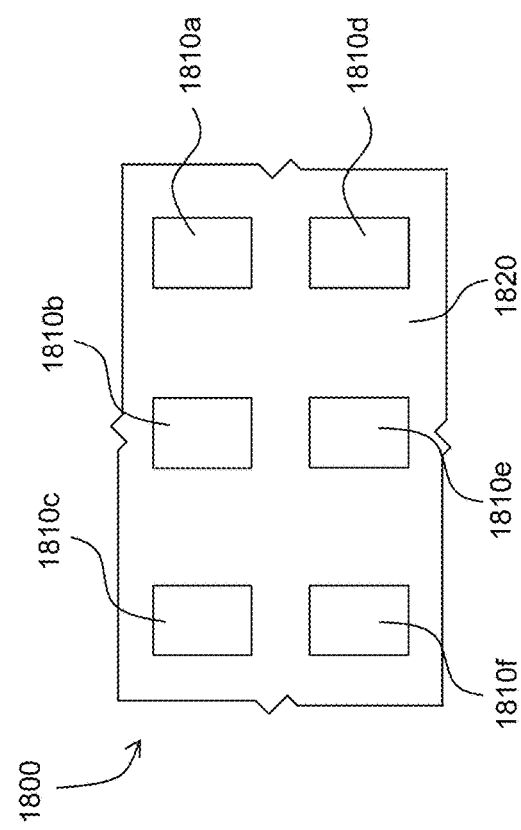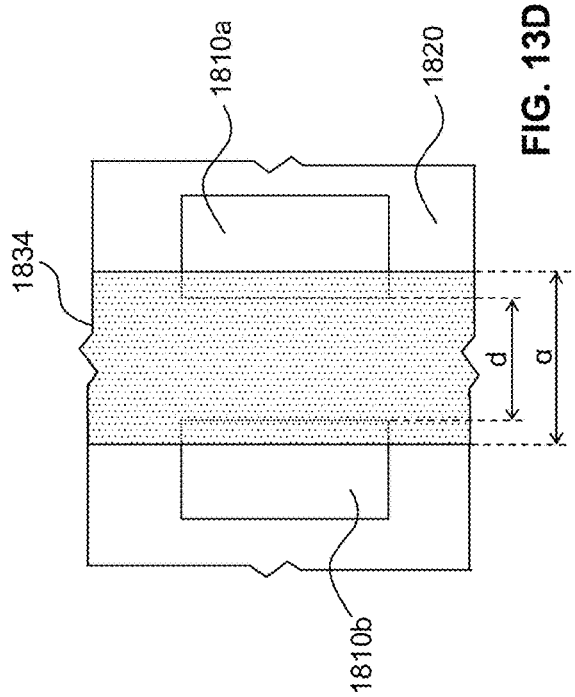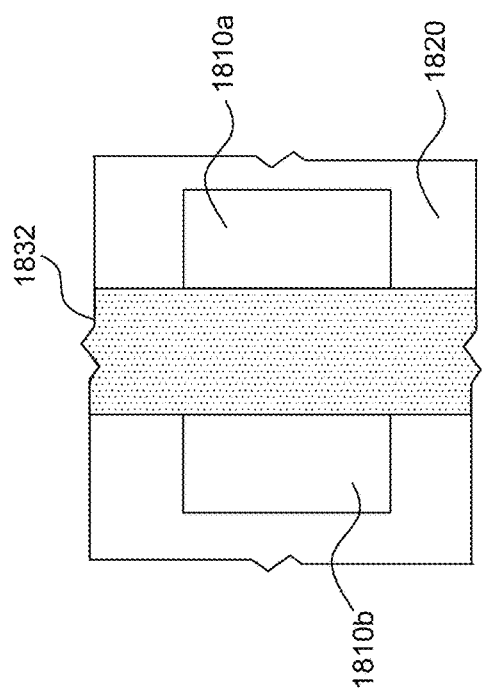

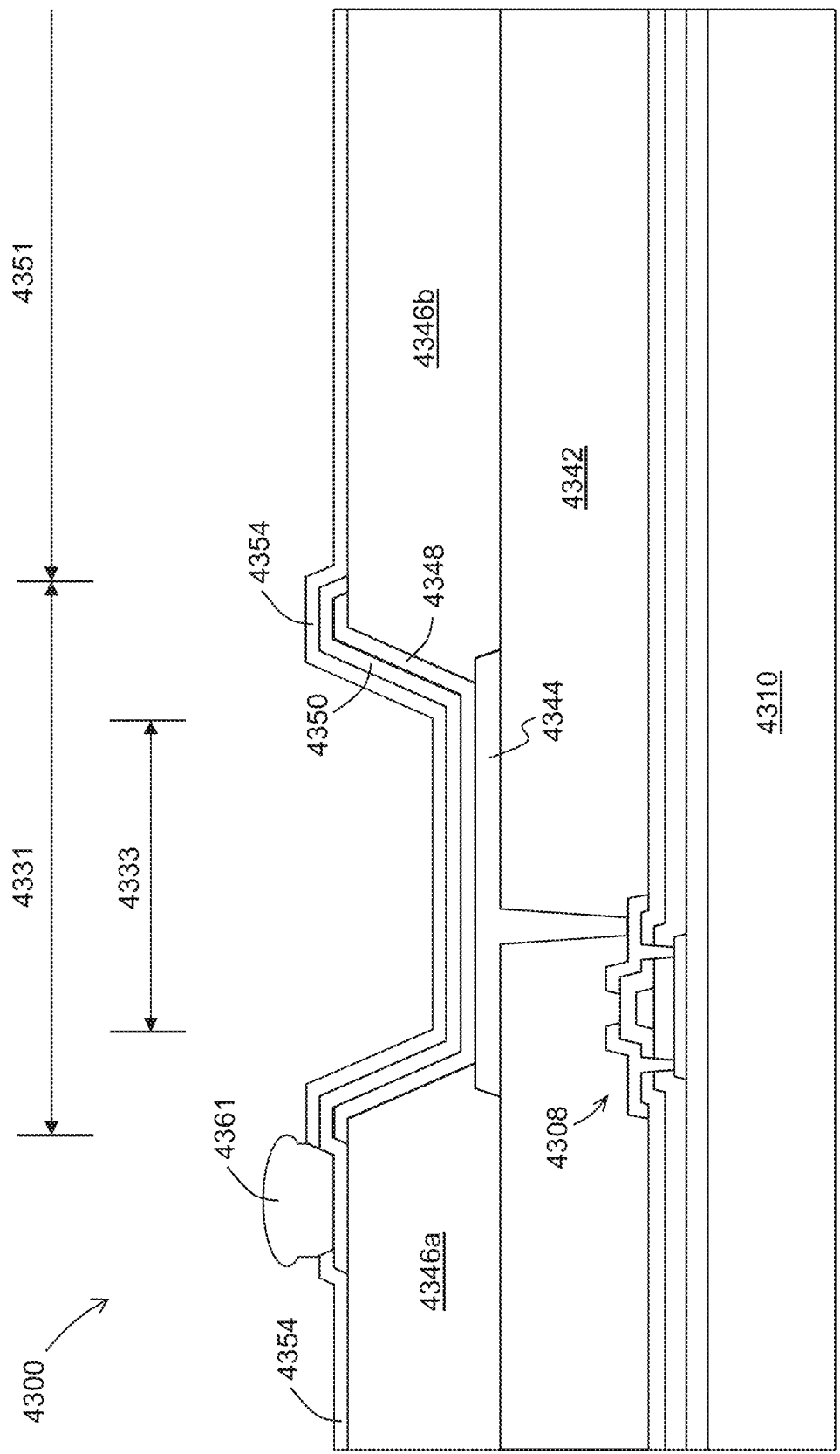

METHOD FOR PATTERNING A COATING ON A SURFACE AND DEVICE INCLUDING A PATTERNED COATING

CROSS-REFERENCE TO RELATED PATENT APPLICATIONS

This application is a continuation of U.S. patent application Ser. No. 16/608,794, filed Oct. 25, 2019, which application is a National Stage Entry of International Application No. PCT/1132018/052881, filed Apr. 26, 2018, which application claims the benefit of and priority to U.S. Provisional Application No. 62/490,564, filed Apr. 26, 2017, US Provisional Application No. 62/521,499, filed Jun. 18, 2017, and U.S. Provisional Application No. 62/573,028, filed Oct. 16, 2017, the contents of which are incorporated herein by reference in their entireties.

TECHNICAL FIELD

The following generally relates to a method for depositing an electrically conductive material on a surface. Specifically, the method relates to selective deposition of the electrically conductive material on a surface for forming an electrically conductive structure of a device.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is accompanied by an increase in its sheet resistance. An electrode with a high sheet resistance is generally undesirable for use in OLEDs, since it creates a large current-resistance (IR) drop when a device is in use, which is detrimental to the performance and efficiency of OLEDs.

The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

Since an auxiliary electrode is typically provided on top of an OLED stack including an anode, one or more organic layers, and a cathode, patterning of the auxiliary electrode is traditionally achieved using a shadow mask with mask apertures through which a conductive coating is selectively deposited, for example by a physical vapor deposition (PVD) process. However, since masks are typically metal masks, they have a tendency to warp during a high-temperature deposition process, thereby distorting mask apertures and a resulting deposition pattern. Furthermore, a mask is typically degraded through successive depositions, as a conductive coating adheres to the mask and obfuscates features of the mask. Consequently, such a mask should either be cleaned using time-consuming and expensive processes or should be disposed once the mask is deemed to be ineffective at producing the desired pattern, thereby rendering such process highly costly and complex. Accordingly, a shadow mask process may not be commercially feasible for mass production of OLED devices. Moreover, an aspect ratio of features which can be produced using the shadow mask process is typically constrained due to shadowing effects and a mechanical (e.g., tensile) strength of the metal mask, since large metal masks are typically stretched during a shadow mask deposition process.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing, which can distort a pattern of deposited structures.

In addition to the above, when a common electrode having a substantially uniform thickness is provided as the top-emission cathode in an OLED display device, the optical performance of the device cannot readily be fine tuned according to the emission spectrum associated each sub-pixel. In a typical OLED display device, red, green, and blue subpixels are provided to form the pixels of the display device. The top-emission electrode used in such OLED display device is typically a common electrode coating a plurality of pixels. For example, such common electrode may be a relatively thin conductive layer having a substantially uniform thickness across the device. While efforts have been made to tune the optical microcavity effects associated with each subpixel color by varying the thickness of organic layers disposed within different subpixels, such approach may not provide sufficient degree of tuning of the optical microcavity effects in at least some cases. In addition, such approach may be difficult to implement in an OLED display production environment.

SUMMARY OF THE INVENTION

According to some embodiments, a device (e.g., an opto-electronic device) includes: (1) a substrate including a first region and a second region; and (2) a conductive coating covering the second region of the substrate. The first region of the substrate is exposed from the conductive coating, and an edge the conductive coating adjacent to the first region of the substrate has a contact angle that is greater than about 20 degrees.

According to some embodiments, a device (e.g., an opto-electronic device) includes: (1) a substrate; (2) a nucleation inhibiting coating covering a first region of the substrate; and (3) a conductive coating covering a laterally adjacent, second region of the substrate. A surface of the nucleation inhibiting coating is characterized, with respect to a material of the conductive coating, as having a desorption activation energy greater than or equal to a diffusion activation energy of the surface, and less than or equal to about 2.5 times the diffusion activation energy of the surface.

According to some embodiments, a manufacturing method of a device (e.g., an opto-electronic device) includes: (1) providing a substrate and a nucleation inhibiting coating covering a first region of the substrate; and (2) depositing a conductive coating covering a second region of the substrate. The conductive coating includes magnesium, and a surface of the nucleation inhibiting coating is characterized, with respect to magnesium, as having a relationship between a desorption activation energy and a diffusion activation energy in which the desorption activation energy is greater than or equal to the diffusion activation energy, and less than or equal to about 2.5 times the diffusion activation energy.

BRIEF DESCRIPTION OF THE DRAWINGS

Some embodiments will now be described by way of example with reference to the appended drawings wherein:

FIG. 13A, FIG. 13B, FIGS. 13C, and 13D illustrate portions of auxiliary electrodes according to various embodiments;

FIG. 28B is a diagram illustrating a cross-sectional profile of the device according to FIG. 28A;

DETAILED DESCRIPTION

Figure 1:
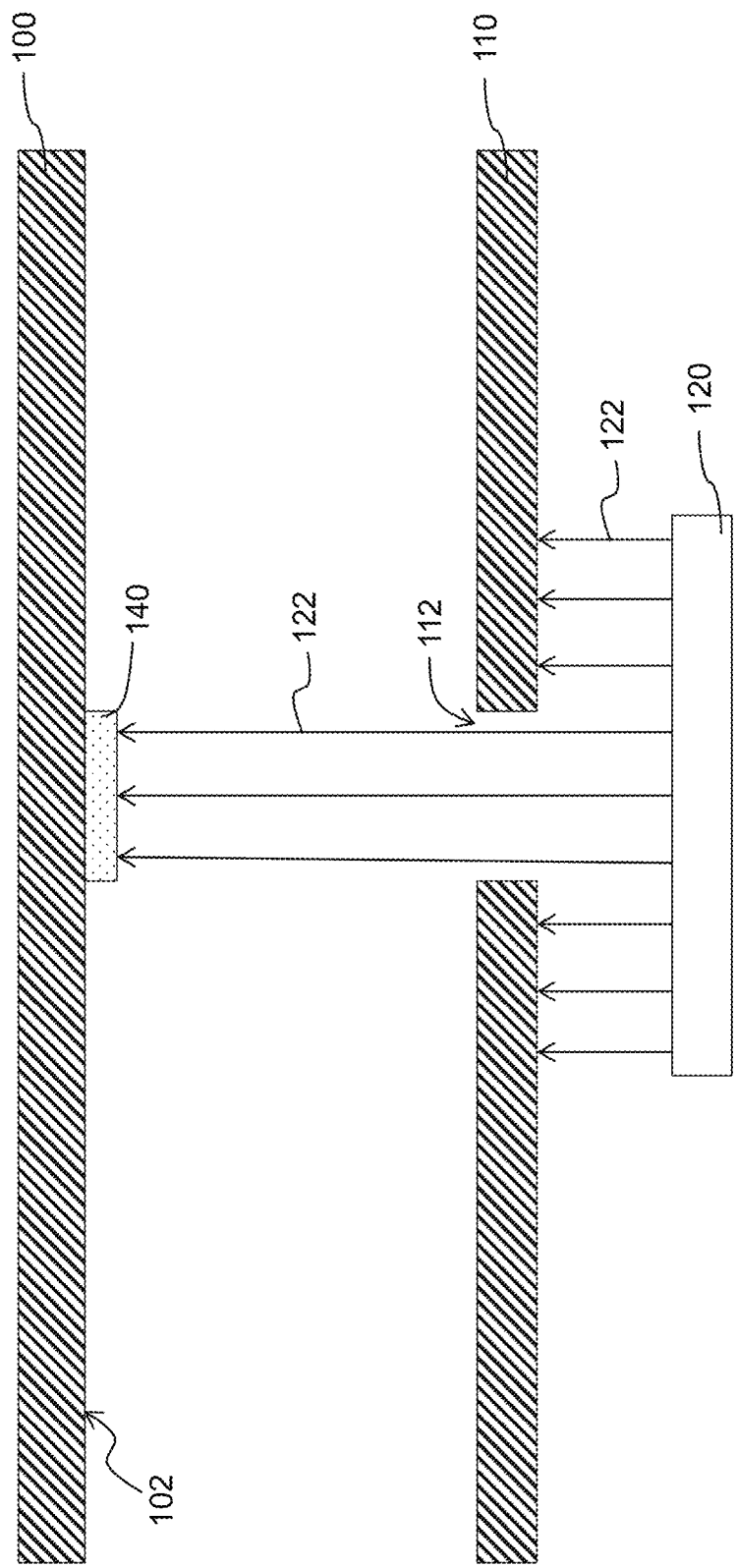
FIG. 1 is a schematic diagram illustrating a shadow mask deposition of a nucleation inhibiting coating according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

In one aspect according to some embodiments, a method for depositing an electrically conductive coating on a surface is provided. In some embodiments, the method is performed in the context of a manufacturing method of an optoelectronic device. In some embodiments, the method is performed in the context of a manufacturing method of another device. In some embodiments, the method includes depositing a nucleation inhibiting coating on a first region of a substrate to produce a patterned substrate. The patterned substrate includes the first region covered by the nucleation inhibiting coating, and a second region of the substrate that is exposed from, or is substantially free of or is substantially uncovered by, the nucleation inhibiting coating. The method also includes treating the patterned substrate to deposit the conductive coating on the second region of the substrate. In some embodiments, a material of the conductive coating includes magnesium. In some embodiments, treating the patterned substrate includes treating both the nucleation inhibiting coating and the second region of the substrate to deposit the conductive coating on the second region of the substrate, while the nucleation inhibiting coating remains exposed from, or is substantially free of or is substantially uncovered by, the conductive coating. In some embodiments, treating the patterned substrate includes performing evaporation or sublimation of a source material used to form the conductive coating, and exposing both the nucleation inhibiting coating and the second region of the substrate to the evaporated source material.

As used herein, the term "nucleation inhibiting" is used to refer to a coating or a layer of a material having a surface which exhibits a relatively low affinity towards deposition of an electrically conductive material, such that the deposition of the conductive material on the surface is inhibited, while the term "nucleation promoting" is used to refer to a coating or a layer of a material having a surface which exhibits a relatively high affinity towards deposition of an electrically conductive material, such that the deposition of the conductive material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate of an electrically conductive material, such as magnesium, on the surface relative to an initial deposition rate of the conductive material on another (reference) surface, where both surfaces are subjected or exposed to an evaporation flux of the conductive material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). Specifically regarding an electrically conductive coating, one measure of an amount of an electrically conductive material on a surface is a light transmittance, since electrically conductive materials, such as metals including magnesium, attenuate and/or absorb light. Accordingly, a surface can be deemed to be substantially free of an electrically conductive material if the light transmittance is greater than 90%, greater than 92%, greater than 95%, or greater than 98% in the visible portion of the electromagnetic spectrum. Another measure of an amount of a material on a surface is a percentage coverage of the surface by the material, such as where the surface can be deemed to be substantially free of the material if the percentage coverage by the material is no greater than 10%, no greater than 8%, no greater than 5%, no greater than 3%, or no greater than 1%. Surface coverage can be assessed using imaging techniques, such as using transmission electron microscopy, atomic force microscopy, or scanning electron microscopy.

Selective Deposition

FIG. 1 is a schematic diagram illustrating a process of depositing a nucleation inhibiting coating 140 onto a surface 102 of a substrate 100 according to one embodiment. In the embodiment of FIG. 1, a source 120 including a source material is heated under vacuum to evaporate or sublime the source material. The source material includes or substantially consists of a material used to form the nucleation inhibiting coating 140. The evaporated source material then travels in a direction indicated by arrow 122 towards the substrate 100. A shadow mask 110 having an aperture or slit 112 is disposed in the path of the evaporated source material such that a portion of a flux travelling through the aperture 112 is selectively incident on a region of the surface 102 of the substrate 100, thereby forming the nucleation inhibiting coating 140 thereon.

Figure 2B:
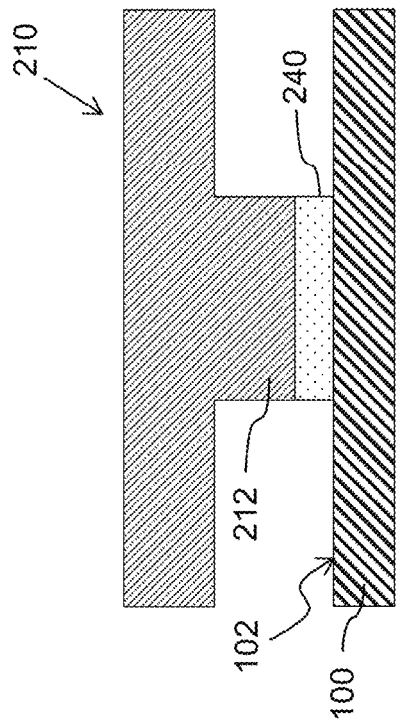
FIG. 2A, FIG. 2B, and FIG. 2C are schematic diagrams illustrating a micro-contact transfer printing process of a nucleation inhibiting coating according to one embodiment.
Figure 2A:
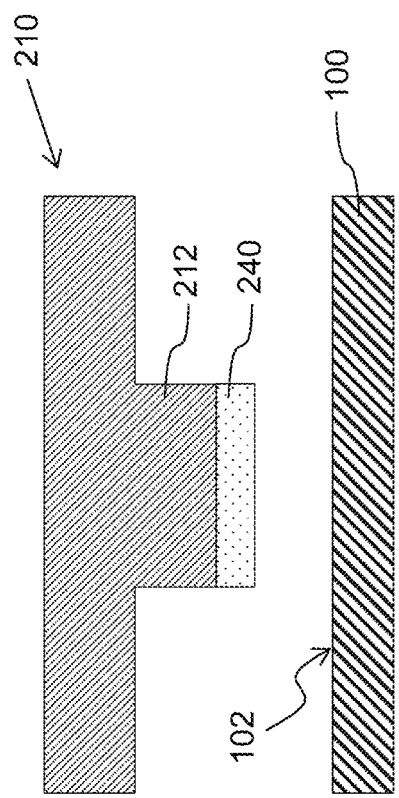
Figure 2C:
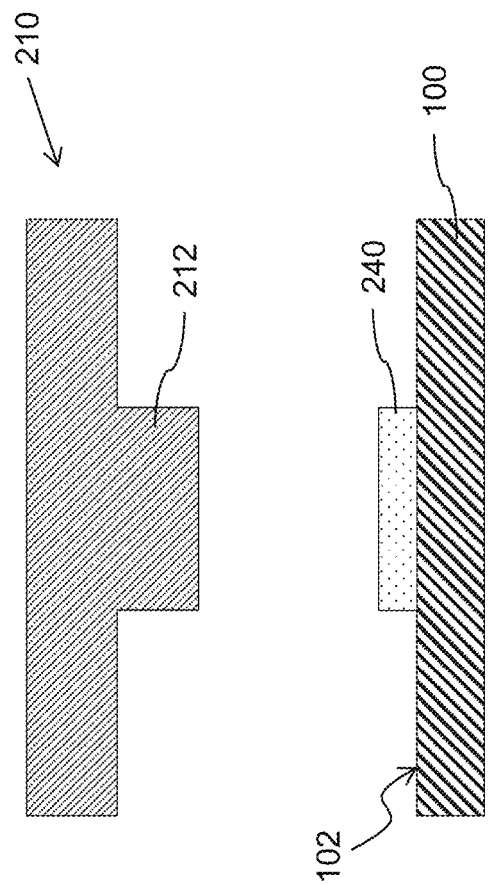

FIGS. 2A-2C illustrate a micro-contact transfer printing process for depositing a nucleation inhibiting coating on a surface of a substrate in one embodiment. Similarly to a shadow mask process, the micro-contact printing process may be used to selectively deposit the nucleation inhibiting coating on a region of a substrate surface.

FIG. 2A illustrates a first stage of the micro-contact transfer printing process, wherein a stamp 210 including a protrusion 212 is provided with a nucleation inhibiting coating 240 on a surface of the protrusion 212. As will be understood by persons skilled in the art, the nucleation inhibiting coating 240 may be deposited on the surface of the protrusion 212 using various suitable processes.

As illustrated in FIG. 2B, the stamp 210 is then brought into proximity of a substrate 100, such that the nucleation inhibiting coating 240 deposited on the surface of the protrusion 212 is in contact with a surface 102 of the substrate 100. Upon the nucleation inhibiting coating 240 contacting the surface 102, the nucleation inhibiting coating 240 adheres to the surface 102 of the substrate 100.

As such, when the stamp 210 is moved away from the substrate 100 as illustrated in FIG. 2C, the nucleation inhibiting coating 240 is effectively transferred onto the surface 102 of the substrate 100.

Figure 3:
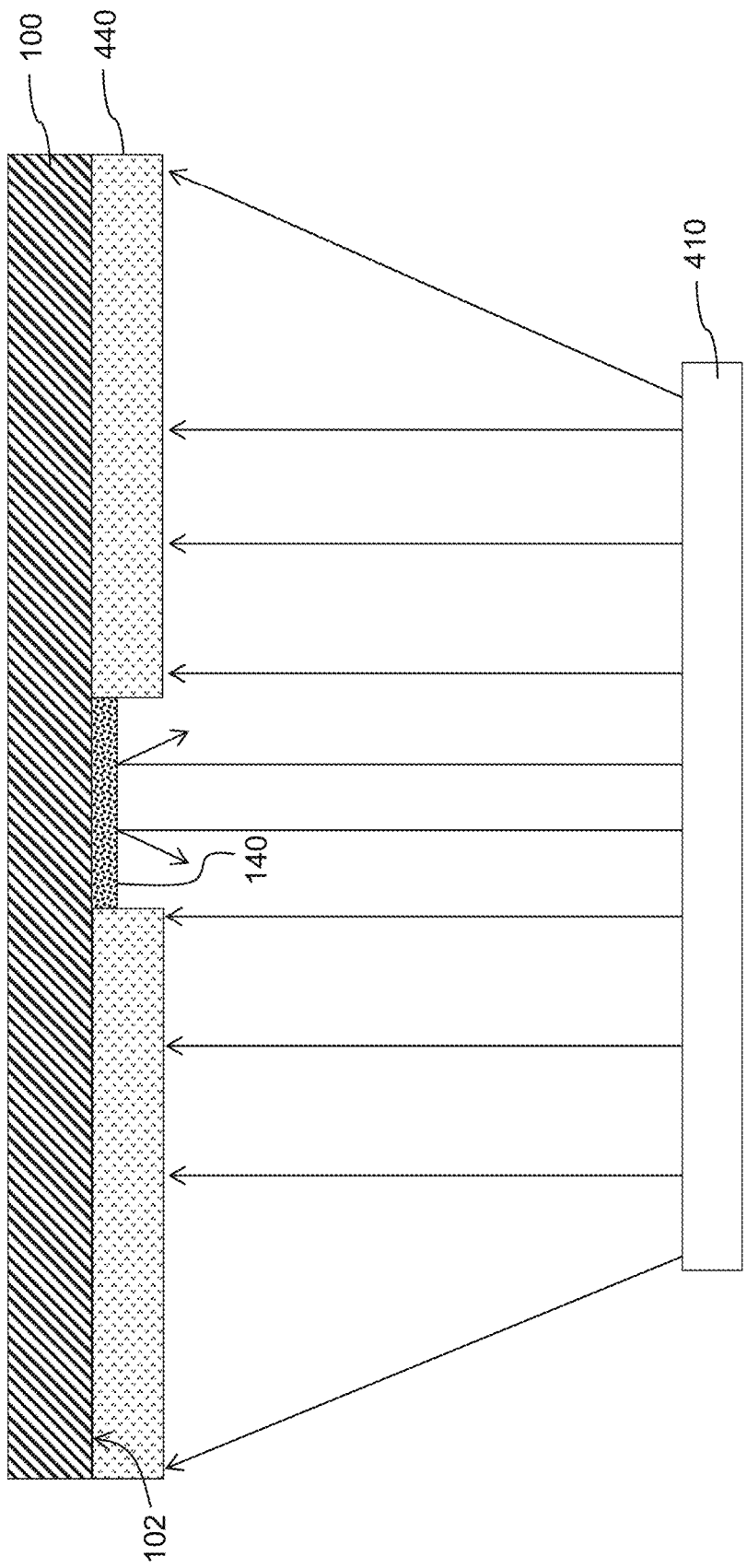
FIG. 3 is a schematic diagram illustrating the deposition of a conductive coating on a patterned surface according to one embodiment.

Once a nucleation inhibiting coating has been deposited on a region of a surface of a substrate, a conductive coating may be deposited on remaining uncovered region(s) of the surface where the nucleation inhibiting coating is not present. Turning to FIG. 3, a conductive coating source 410 is illustrated as directing an evaporated conductive material towards a surface 102 of a substrate 100. As illustrated in FIG. 3, the conducting coating source 410 may direct the evaporated conductive material such that it is incident on both covered or treated areas (namely, region(s) of the surface 102 with the nucleation inhibiting coating 140 deposited thereon) and uncovered or untreated areas of the surface 102. However, since a surface of the nucleation inhibiting coating 140 exhibits a relatively low initial sticking coefficient compared to that of the uncovered surface 102 of the substrate 100, a conductive coating 440 selectively deposits onto the areas of the surface 102 where the nucleation inhibiting coating 140 is not present. For example, an initial deposition rate of the evaporated conductive material on the uncovered areas of the surface 102 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the evaporated conductive material on the surface of the nucleation inhibiting coating 140. The conductive coating 440 may include, for example, pure or substantially pure magnesium.

It will be appreciated that although shadow mask patterning and micro-contact transfer printing processes have been illustrated and described above, other processes may be used for selectively patterning a substrate by depositing a nucleation inhibiting material. Various additive and subtractive processes of patterning a surface may be used to selectively deposit a nucleation inhibiting coating. Examples of such processes include, but are not limited to, photolithography, printing (including ink or vapor jet printing and reel-to-reel printing), organic vapor phase deposition (OVPD), and laser induced thermal imaging (LITI) patterning, and combinations thereof.

In some applications, it may be desirable to deposit a conductive coating having specific material properties onto a substrate surface on which the conductive coating cannot be readily deposited. For example, pure or substantially pure magnesium typically cannot be readily deposited onto some organic surface due to low sticking coefficients of magnesium on some organic surfaces. Accordingly, in some embodiments, the substrate surface is further treated by depositing a nucleation promoting coating thereon prior to depositing the conductive coating, such as one including magnesium.

Based on findings and experimental observations, it is postulated that fullerenes and other nucleation promoting materials, as will be explained further herein, act as nucleation sites for the deposition of a conductive coating including magnesium. For example, in cases where magnesium is deposited using an evaporation process on a fullerene treated surface, the fullerene molecules act as nucleation sites that promote formation of stable nuclei for magnesium deposition. Less than a monolayer of fullerene or other nucleation promoting material may be provided on the treated surface to act as nucleation sites for deposition of magnesium in some cases. As will be understood, treating the surface by depositing several monolayers of a nucleation promoting material may result in a higher number of nucleation sites, and thus a higher initial sticking probability.

It will also be appreciated that an amount of fullerene or other material deposited on a surface may be more, or less, than one monolayer. For example, the surface may be treated by depositing 0.1 monolayer, 1 monolayer, 10 monolayers, or more of a nucleation promoting material or a nucleation inhibiting material. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. For example, depositing 1 monolayer of a material may result in some regions of a surface being uncovered by the material, while other regions of the surface may have multiple atomic or molecular layers deposited thereon.

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Figure 4:
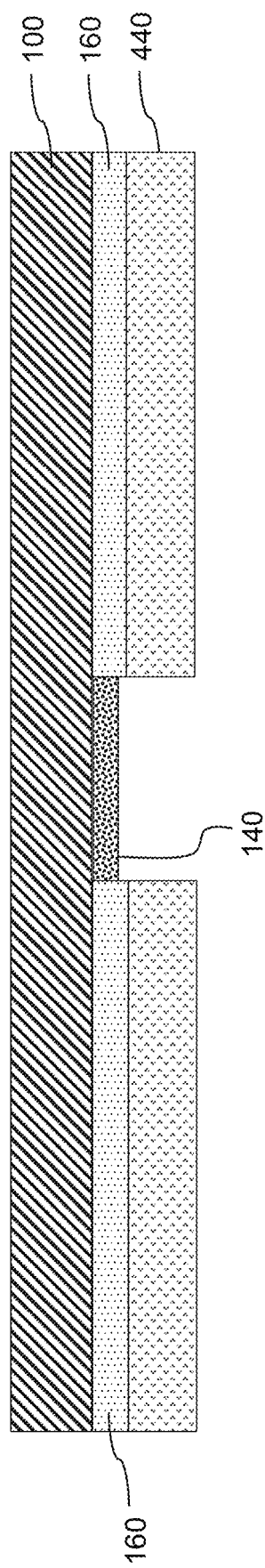
FIG. 4 is a diagram illustrating a device produced according to one embodiment of a process.

FIG. 4 illustrates an embodiment of a device in which a nucleation promoting coating 160 is deposited prior to the deposition of a conductive coating 440. As illustrated in FIG. 4, the nucleation promoting coating 160 is deposited over regions of the substrate 100 that are uncovered by a nucleation inhibiting coating 140. Accordingly, when the conductive coating 440 is deposited, the conductive coating 440 forms preferentially over the nucleation promoting coating 160. For example, an initial deposition rate of a material of the conductive coating 440 on a surface of the nucleation promoting coating 160 may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the material on a surface of the nucleation inhibiting coating 140. In general, the nucleation promoting coating 160 may be deposited on the substrate 100 prior to, or following, the deposition of the nucleation inhibiting coating 140. Various processes for selectively depositing a material on a surface may be used to deposit the nucleation promoting coating 160 including, but not limited to, evaporation (including thermal evaporation and electron beam evaporation), photolithography, printing (including ink or vapor jet printing, reel-to-reel printing, and microcontact transfer printing), OVPD, LITI patterning, and combinations thereof.

Figure 5A:
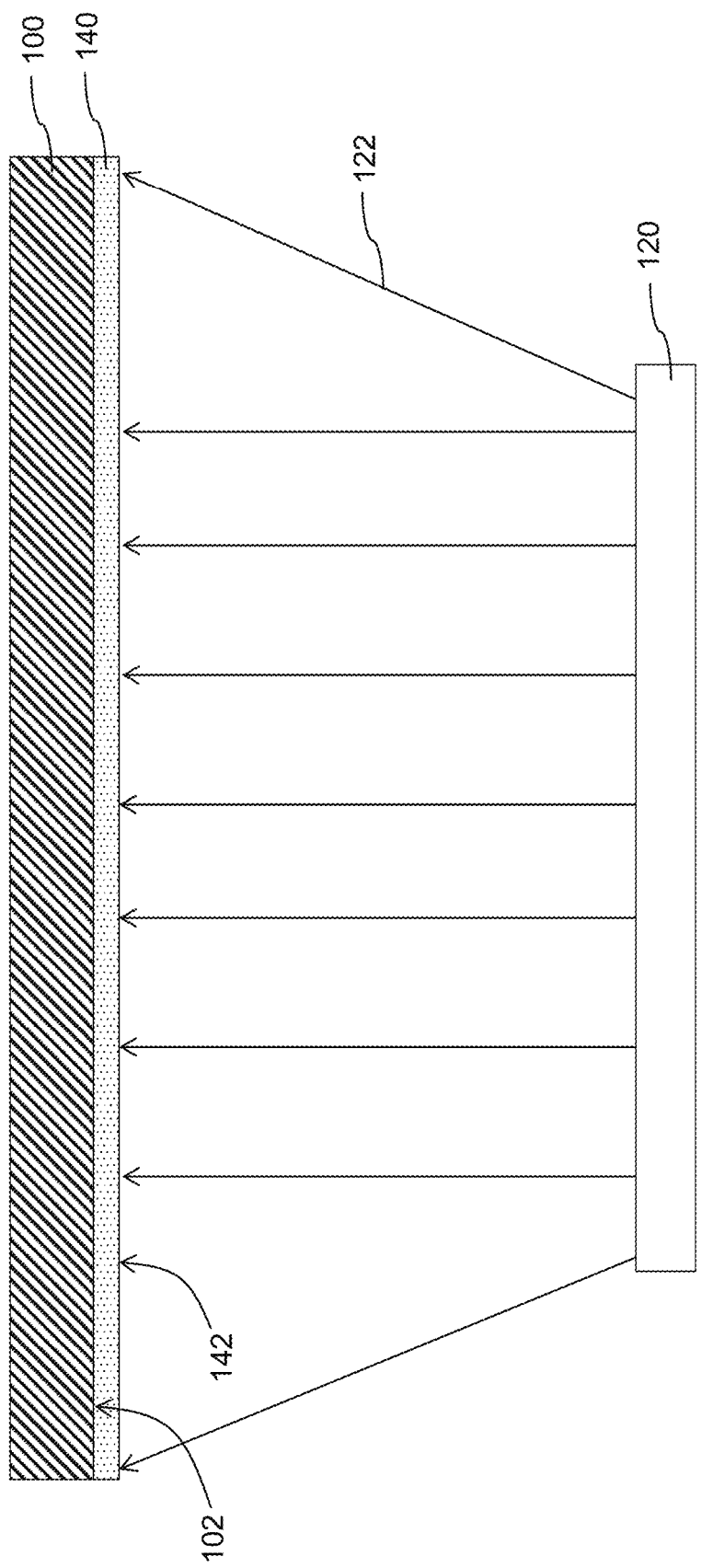
FIG. 5A, FIGS. 5B, and 5C are schematic diagrams illustrating a process for selectively depositing a conductive coating according to one embodiment.
Figure 5B:
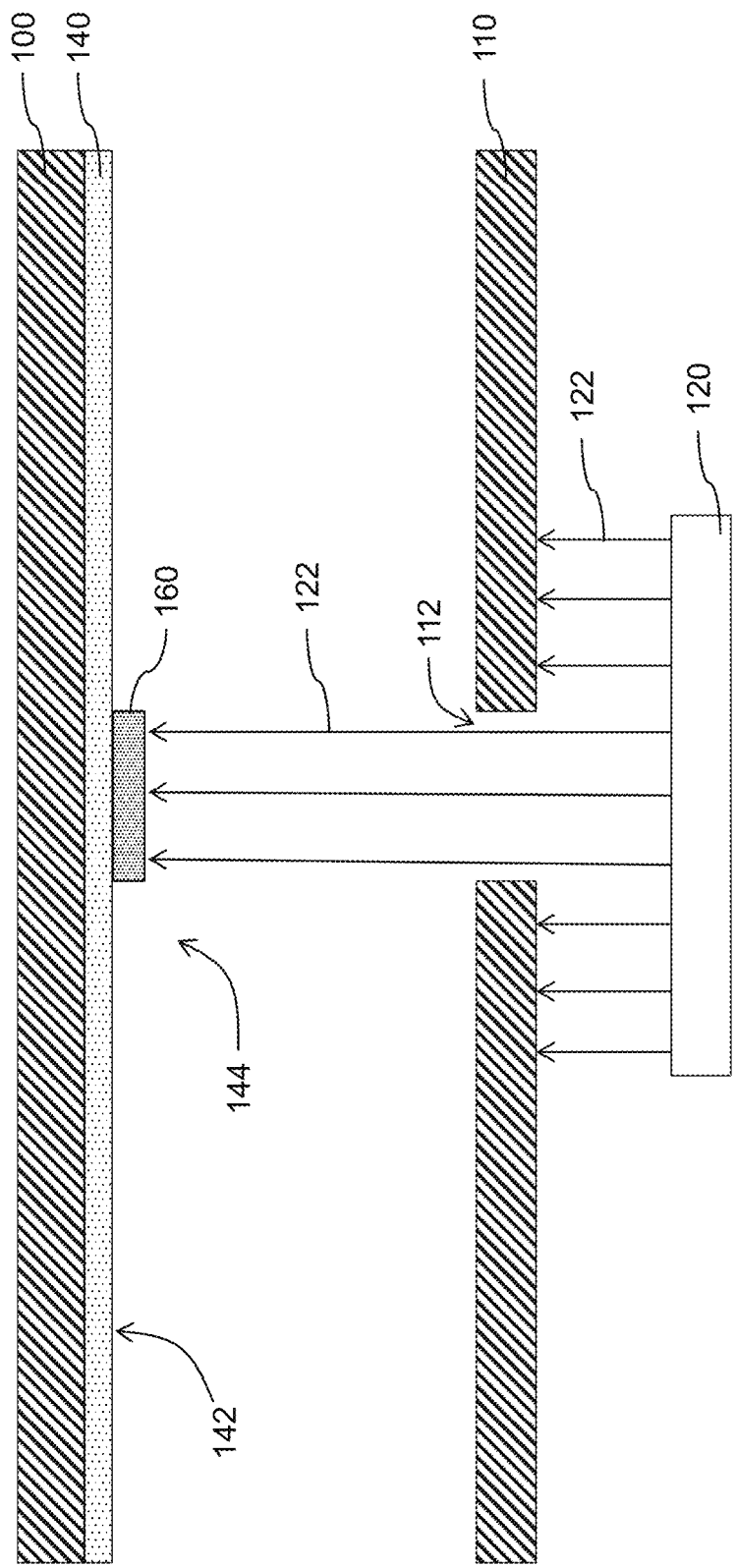
Figure 5C:
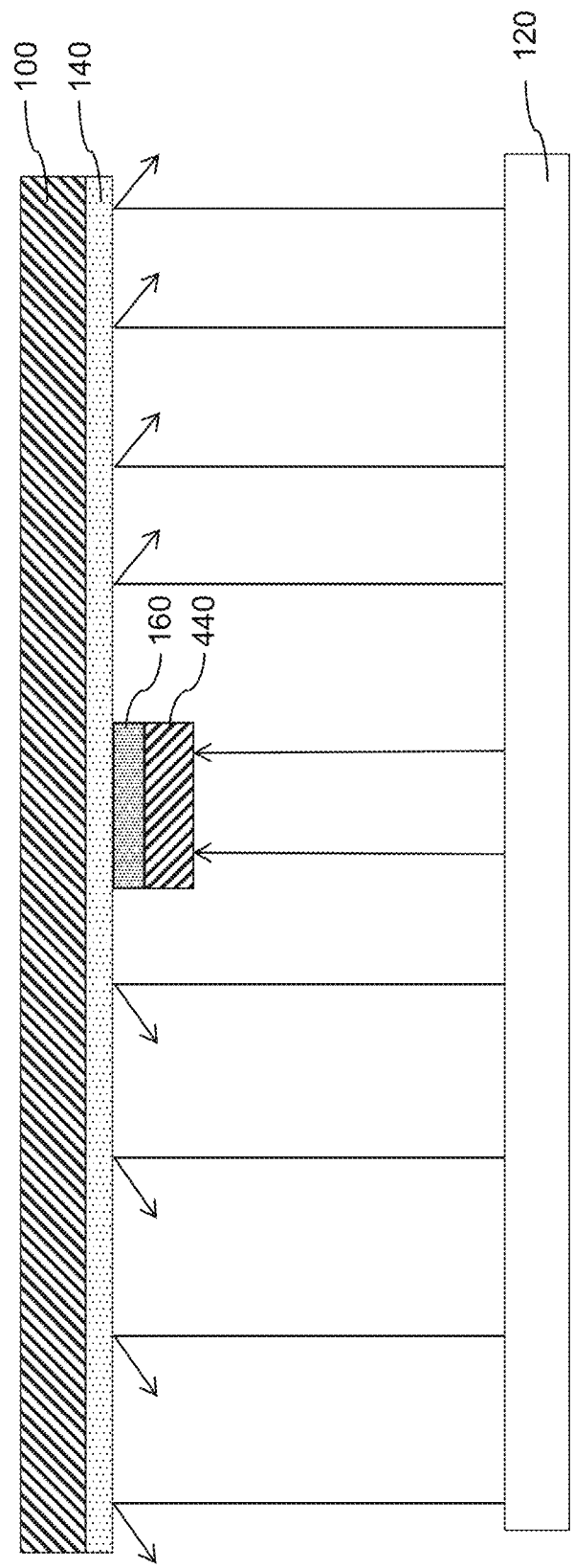

FIGS. 5A-5C illustrate a process for depositing a conductive coating onto a surface of a substrate in one embodiment.

In FIG. 5A, a surface 102 of a substrate 100 is treated by depositing a nucleation inhibiting coating 140 thereon. Specifically, in the illustrated embodiment, deposition is achieved by evaporating a source material inside a source 120, and directing the evaporated source material towards the surface 102 to be deposited thereon. The general direction in which the evaporated flux is directed towards the surface 102 is indicated by arrow 122. As illustrated, deposition of the nucleation inhibiting coating 140 may be performed using an open mask or without a mask, such that the nucleation inhibiting coating 140 substantially covers the entire surface 102 to produce a treated surface 142. Alternatively, the nucleation inhibiting coating 140 may be selectively deposited onto a region of the surface 102 using, for example, a selective deposition technique described above.

While the nucleation inhibiting coating 140 is illustrated as being deposited by evaporation, it will be appreciated that other deposition and surface coating techniques may be used, including but not limited to spin coating, dip coating, printing, spray coating, OVPD, LITI patterning, physical vapor deposition (PVD) (including sputtering), chemical vapor deposition (CVD), and combinations thereof.

In FIG. 5B, a shadow mask 110 is used to selectively deposit a nucleation promoting coating 160 on the treated surface 142. As illustrated, an evaporated source material travelling from the source 120 is directed towards the substrate 100 through the mask 110. The mask 110 includes an aperture or slit 112 such that a portion of the evaporated source material incident on the mask 110 is prevented from traveling past the mask 110, and another portion of the evaporated source material directed through the aperture 112 of the mask 110 selectively deposits onto the treated surface 142 to form the nucleation promoting coating 160. Accordingly, a patterned surface 144 is produced upon completing the deposition of the nucleation promoting coating 160.

FIG. 5C illustrates a stage of depositing a conductive coating 440 onto the patterned surface 144. The conductive coating 440 may include, for example, pure or substantially pure magnesium. As will be explained further below, a material of the conductive coating 440 exhibits a relatively low initial sticking coefficient with respect to the nucleation inhibiting coating 140 and a relatively high initial sticking coefficient with respect to the nucleation promoting coating 160. Accordingly, the deposition may be performed using an open mask or without a mask to selectively deposit the conductive coating 440 onto regions of the substrate 100 where the nucleation promoting coating 160 is present. As illustrated in FIG. 5C, an evaporated material of the conductive coating 440 that is incident on a surface of the nucleation inhibiting coating 140 may be largely or substantially prevented from being deposited onto the nucleation inhibiting coating 140.

Figure 5D:
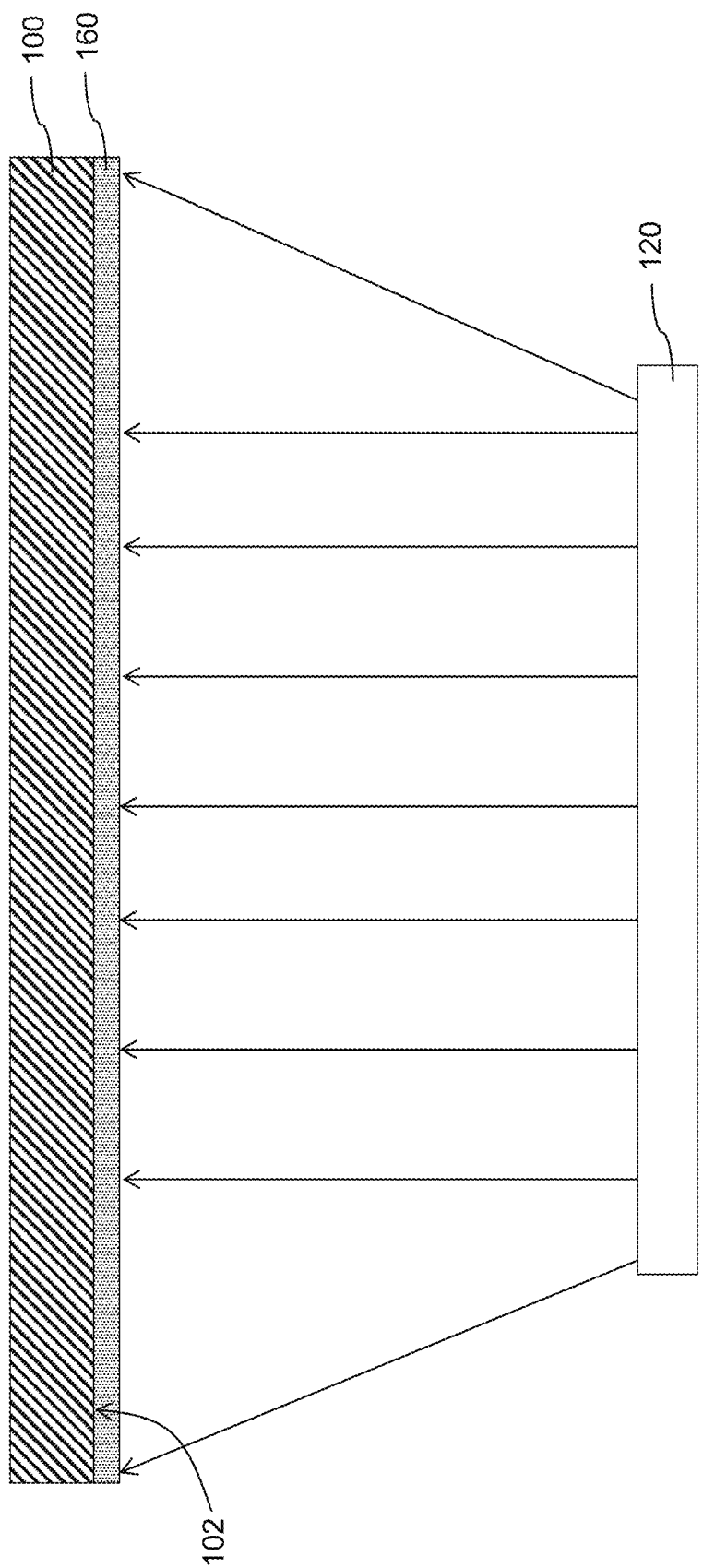
FIG. 5D, FIGS. 5E, and 5F are schematic diagrams illustrating a process for selectively depositing a conductive coating according to another embodiment.
Figure 5E:
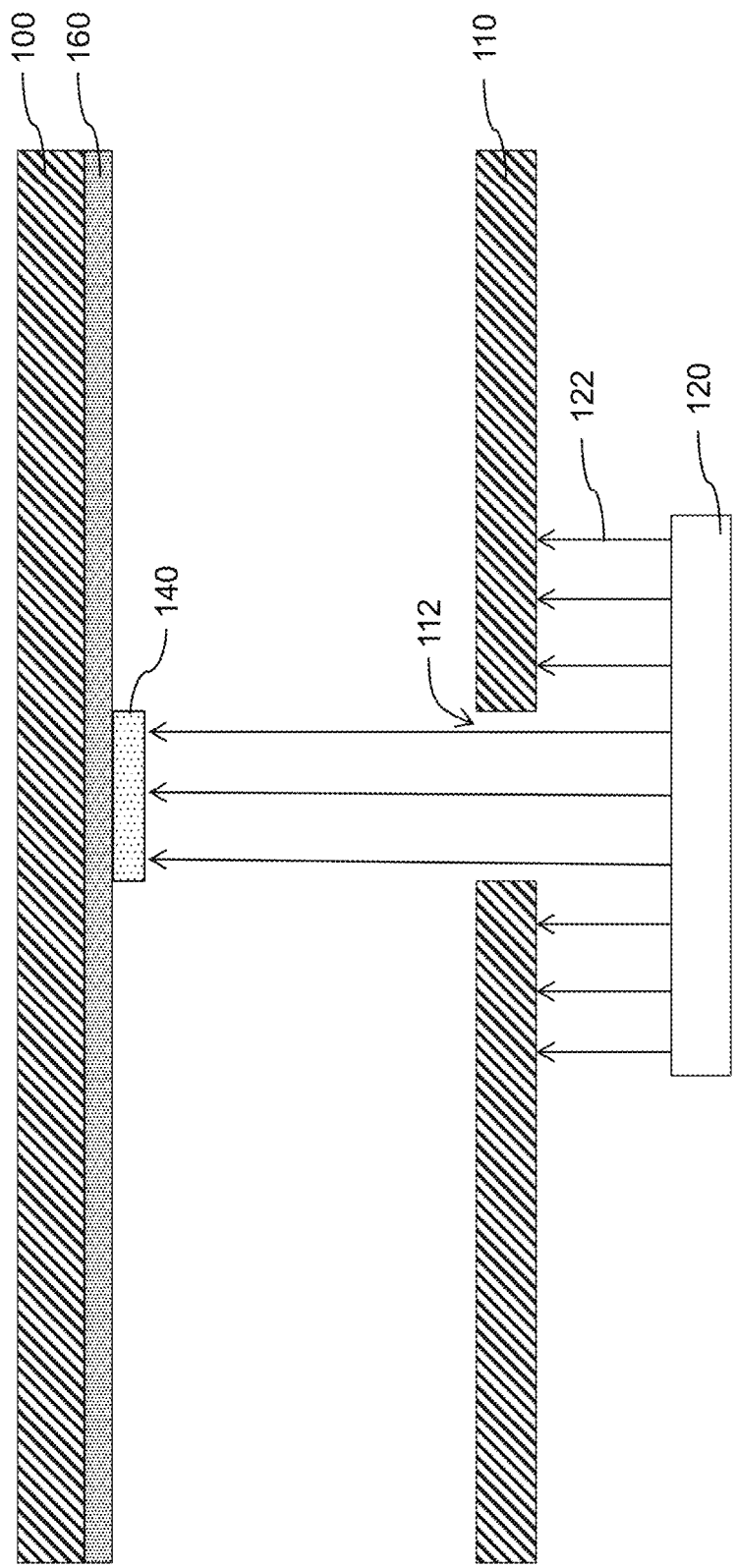
Figure 5F:
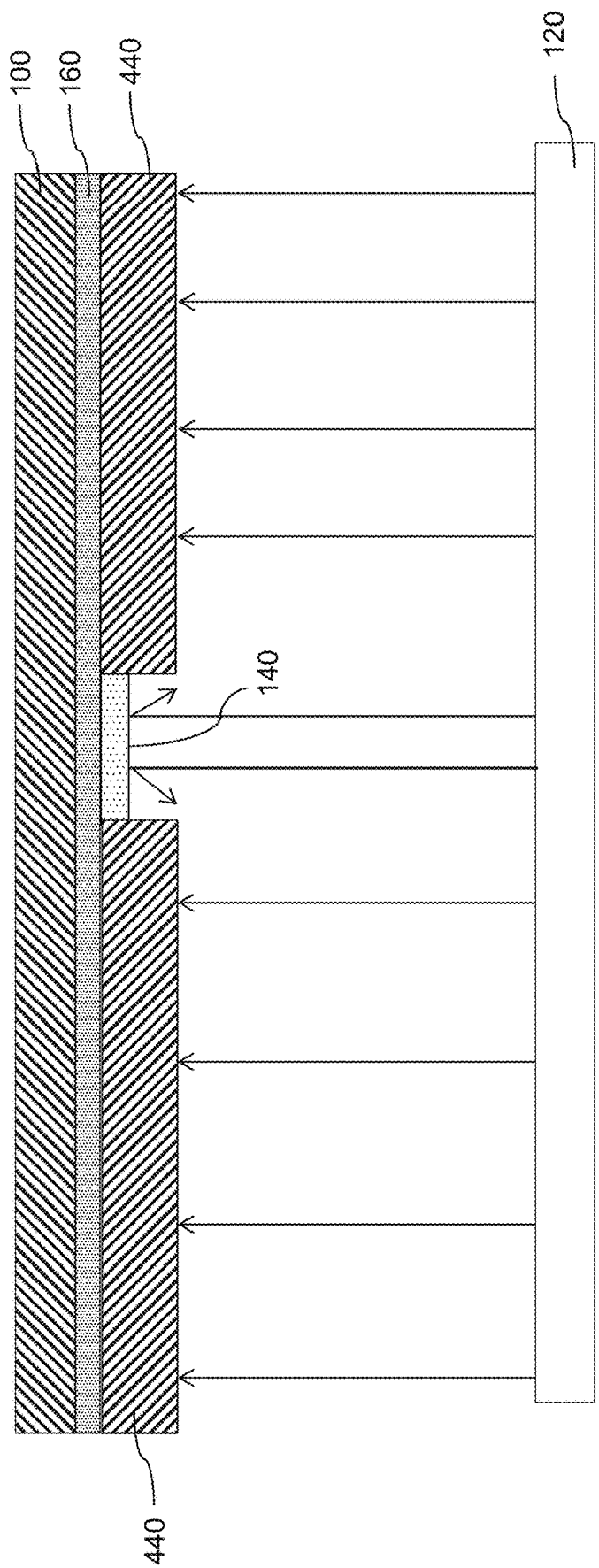

FIGS. 5D-5F illustrate a process for depositing a conductive coating onto a surface of a substrate in another embodiment.

In FIG. 5D, a nucleation promoting coating 160 is deposited on a surface 102 of a substrate 100. For example, the nucleation promoting coating 160 may be deposited by thermal evaporation using an open mask or without a mask. Alternatively, other deposition and surface coating techniques may be used, including but not limited to spin coating, dip coating, printing, spray coating, OVPD, LITI patterning, PVD (including sputtering), CVD, and combinations thereof.

In FIG. 5E, a nucleation inhibiting coating 140 is selectively deposited over a region of the nucleation promoting coating 160 using a shadow mask 110. Accordingly, a patterned surface is produced upon completing the deposition of the nucleation inhibiting coating 140. Then in FIG. 5F, a conductive coating 440 is deposited onto the patterned surface using an open mask or a mask-free deposition process, such that the conductive coating 440 is formed over exposed regions of the nucleation promoting coating 160.

In the foregoing embodiments, it will be appreciated that the conductive coating 440 formed by the processes may be used as an electrode or a conductive structure for an electronic device. For example, the conductive coating 440 may be an anode or a cathode of an organic opto-electronic device, such as an OLED device or an organic photovoltaic (OPV) device. In addition, the conductive coating 440 may also be used as an electrode for opto-electronic devices including quantum dots as an active layer material. For example, such a device may include an active layer disposed between a pair of electrodes with the active layer including quantum dots. The device may be, for example, an electroluminescent quantum dot display device in which light is emitted from the quantum dot active layer as a result of current provided by the electrodes. The conductive coating 440 may also be used as a busbar or an auxiliary electrode for any of the foregoing devices.

Accordingly, it will be appreciated that the substrate 100 onto which various coatings are deposited may include one or more additional organic and/or inorganic layers not specifically illustrated or described in the foregoing embodiments. For example, in the case of an OLED device, the substrate 100 may include one or more electrodes (e.g., an anode and/or a cathode), charge injection and/or transport layers, and an electroluminescent layer. The substrate 100 may further include one or more transistors and other electronic components such as resistors and capacitors, which are included in an active matrix or a passive matrix OLED device. For example, the substrate 100 may include one or more top-gate thin-film transistors (TFTs), one or more bottom-gate TFTs, and/or other TFT structures. A TFT may be an n-type TFT or a p-type TFT. Examples of TFT structures include those including amorphous silicon (a-Si), indium gallium zinc oxide (IGZO), and low-temperature polycrystalline silicon (LTPS).

The substrate 100 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The surface 102 of the substrate 100 may be an organic surface or an inorganic surface. For example, if the conductive coating 440 is for use as a cathode of an OLED device, the surface 102 may be provided by a surface of one or more semiconducting layers. For example, the surface 102 may be a top surface of a stack of organic layers. For example, such organic layers may include organic semiconducting layers (e.g., a surface of an electron injection layer). In another example, if the conductive coating 440 is for use as an auxiliary electrode of a top-emission OLED device, the surface 102 may be a top surface of an electrode (e.g., a common cathode). Alternatively, such an auxiliary electrode may be formed directly beneath a transmissive electrode on top of a stack of organic layers.

Figure 6:
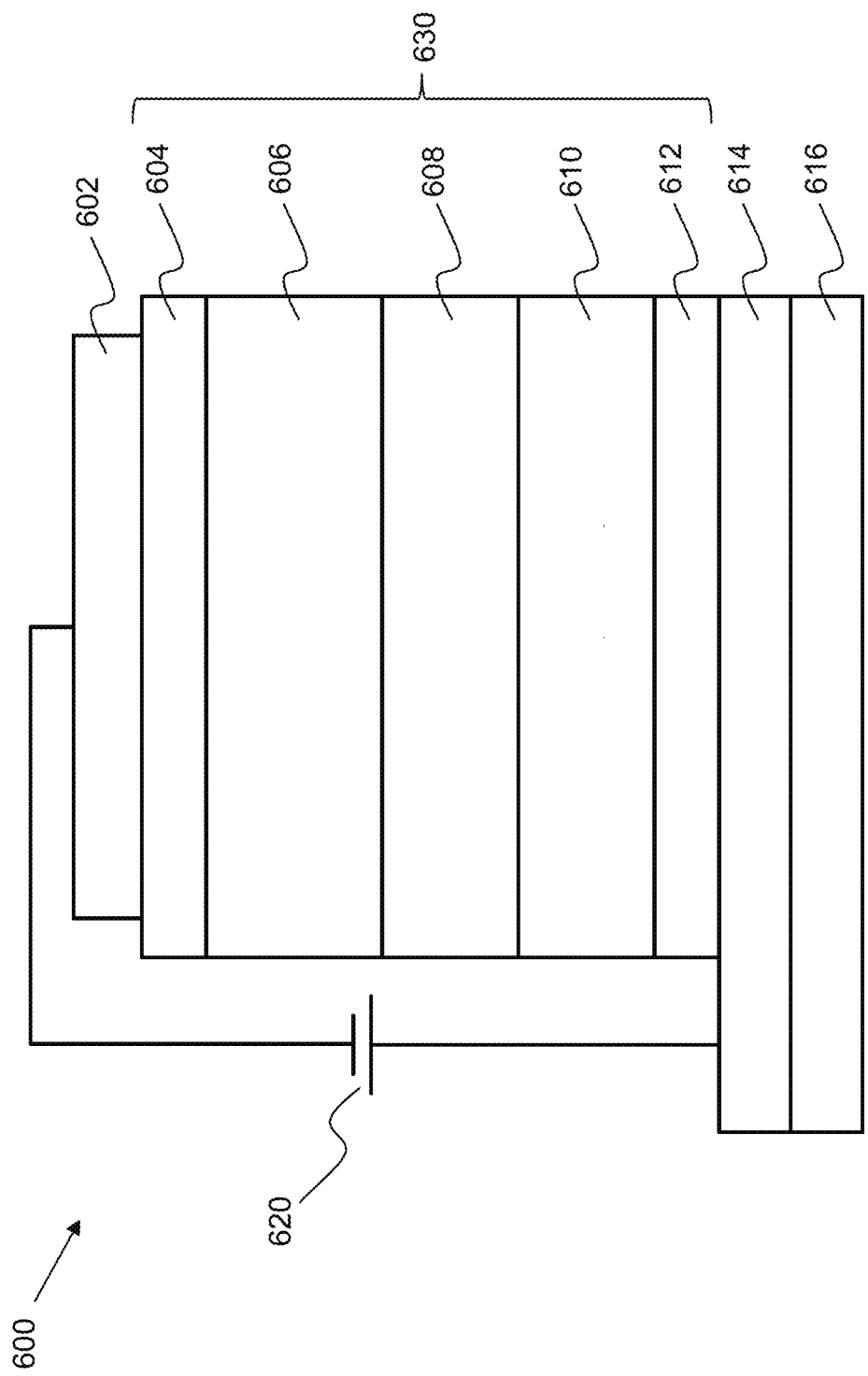
FIG. 6 is a diagram illustrating an electroluminescent device according to one embodiment.

FIG. 6 illustrates an electroluminescent (EL) device 600 according to one embodiment. The EL device 600 may be, for example, an OLED device or an electroluminescent quantum dot device. In one embodiment, the device 600 is an OLED device including a base substrate 616, an anode 614, organic layers 630, and a cathode 602. In the illustrated embodiment, the organic layers 630 include a hole injection layer 612, a hole transport layer 610, an electroluminescent layer 608, an electron transport layer 606, and an electron injection layer 604.

The hole injection layer 612 may be formed using a hole injection material which generally facilitates the injection of holes by the anode 614. The hole transport layer 610 may be formed using a hole transport material, which is generally a material that exhibits high hole mobility.

The electroluminescent layer 608 may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer 608.

The electron transport layer 606 may be formed using an electron transport material which generally exhibits high electron mobility. The electron injection layer 604 may be formed using an electron injection material, which generally acts to facilitate the injection of electrons by the cathode 602.

It will be understood that the structure of the device 600 may be varied by omitting or combining one or more layers. Specifically, one or more of the hole injection layer 612, the hole transport layer 610, the electron transport layer 606, and the electron injection layer 604 may be omitted from the device structure. One or more additional layers may also be present in the device structure. Such additional layers include, for example, a hole blocking layer, an electron blocking layer, and additional charge transport and/or injection layers. Each layer may further include any number of sub-layers, and each layer and/or sub-layer may include various mixtures and composition gradients. It will also be appreciated that the device 600 may include one or more layers containing inorganic and/or organo-metallic materials, and is not limited to devices composed solely of organic materials. For example, the device 600 may include quantum dots.

The device 600 may be connected to a power source 620 for supplying current to the device 600.

In another embodiment where the device 600 is an EL quantum dot device, the EL layer 608 generally includes quantum dots, which emit light when current is supplied.

Figure 7:
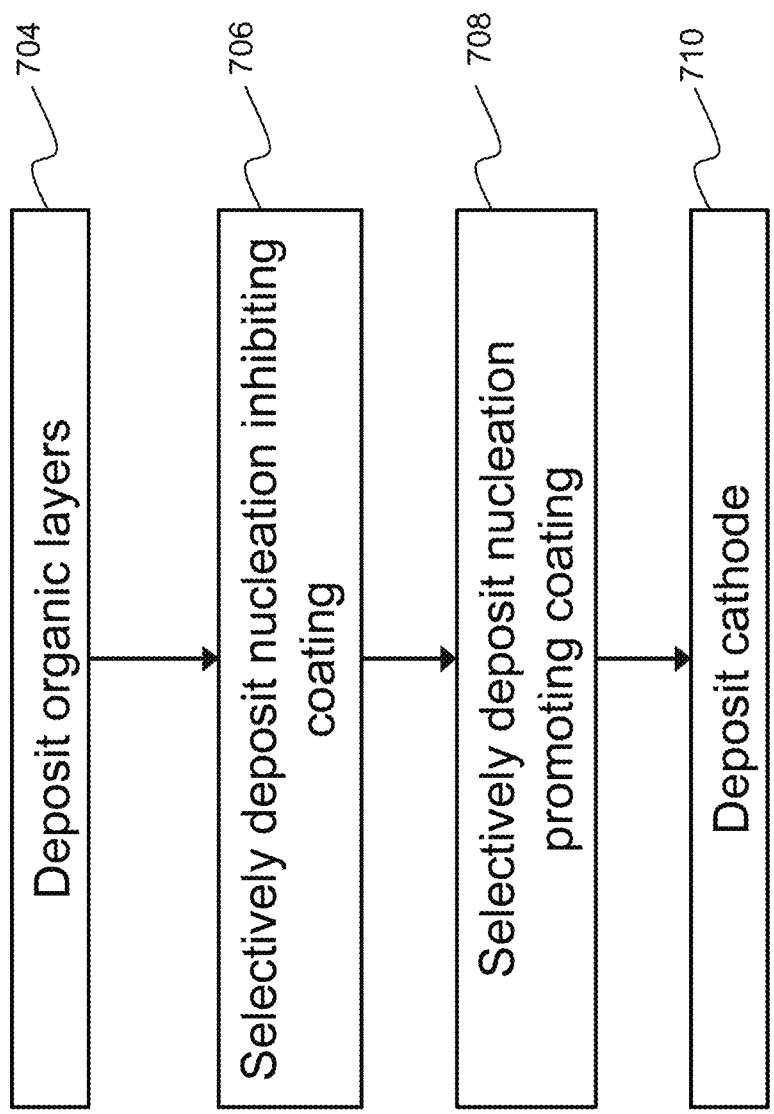
FIG. 7 is a flow diagram showing process stages according to one embodiment.

FIG. 7 is a flow diagram outlining stages of fabricating an OLED device according to one embodiment. In 704, organic layers are deposited on a target surface. For example, the target surface may be a surface of an anode that has been deposited on top of a base substrate, which may include, for example, glass, polymer, and/or metal foil. As discussed above, the organic layers may include, for example, a hole injection layer, a hole transport layer, an electroluminescence layer, an electron transport layer, and an electron injection layer. A nucleation inhibiting coating is then deposited on top of the organic layers in stage 706 using a selective deposition or patterning process. In stage 708, a nucleation promoting coating is selectively deposited on the nucleation inhibiting coating to produce a patterned surface. For example, the nucleation promoting coating and the nucleation inhibiting coating may be selectively deposited by evaporation using a mask, micro-contact transfer printing process, photolithography, printing (including ink or vapor jet printing and reel-to-reel printing), OVPD, or LITI patterning. A conductive coating is then deposited on the patterned surface using an open mask or a mask-free deposition process in stage 710. The conductive coating may serve as a cathode or another conductive structure of the OLED device.

In another embodiment, deposition of the nucleation inhibiting coating in stage 706 may be conducted using an open mask, or without a mask. In yet another embodiment, deposition of the nucleation promoting coating in step 708 may be conducted prior to deposition of the nucleation inhibiting coating in step 706. In yet another embodiment, deposition of the nucleation promoting coating in step 708 may be conducted using an open mask, or without a mask, prior to selective deposition of the nucleation inhibiting coating in step 706.

For the sake of simplicity and clarity, details of deposited materials including thickness profiles and edge profiles have been omitted from the process diagrams.

In accordance with the above-described embodiments, a conductive coating may be selectively deposited on target regions using an open mask or a mask-free deposition process, through the use of a nucleation inhibiting coating or a combination of nucleation inhibiting and nucleation promoting coatings.

It will also be appreciated that an open mask used for deposition of any of various layers or coatings, including a conductive coating, a nucleation inhibiting coating, and a nucleation promoting coating, may "mask" or prevent deposition of a material on certain regions of a substrate. However, unlike a fine metal mask (FMM) used to form relatively small features with a feature size on the order of tens of microns or smaller, a feature size of an open mask is generally comparable to the size of an OLED device being manufactured. For example, the open mask may mask edges of a display device during manufacturing, which would result in the open mask having an aperture that approximately corresponds to a size of the display device (e.g., about 1 inch for micro-displays, about 4-6 inches for mobile displays, about 8-17 inches for laptop or tablet displays, and so forth). For example, the feature size of an open mask may be on the order of about 1 cm or greater. Accordingly, an aperture formed in an open mask is typically sized to encompass a plurality of emissive regions or pixels, which together form the display device.

Figure 8A:
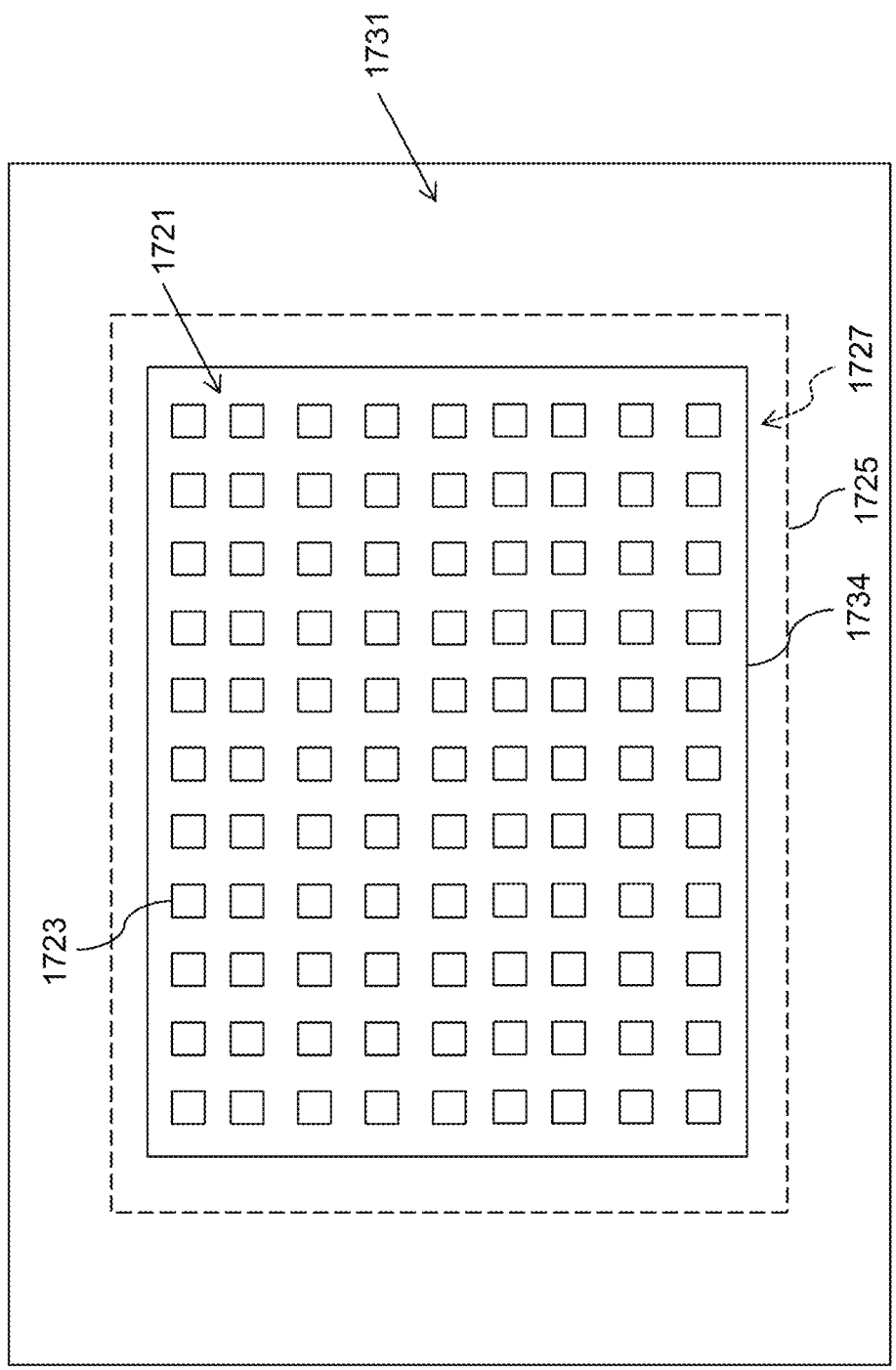
FIG. 8A is a top view illustrating an open mask according to one example.

FIG. 8A illustrates an example of an open mask 1731 having or defining an aperture 1734 formed therein. In the illustrated example, the aperture 1734 of the mask 1731 is smaller than a size of a device 1721, such that, when the mask 1731 is overlaid, the mask 1731 covers edges of the device 1721. Specifically, in the illustrated embodiments, all or substantially all emissive regions or pixels 1723 of the device 1721 are exposed through the aperture 1734, while an unexposed region 1727 is formed between outer edges 1725 of the device 1721 and the aperture 1734. As would be appreciated, electrical contacts or other device components may be located in the unexposed region 1727 such that these components remain unaffected through the open mask deposition process.

Figure 8B:
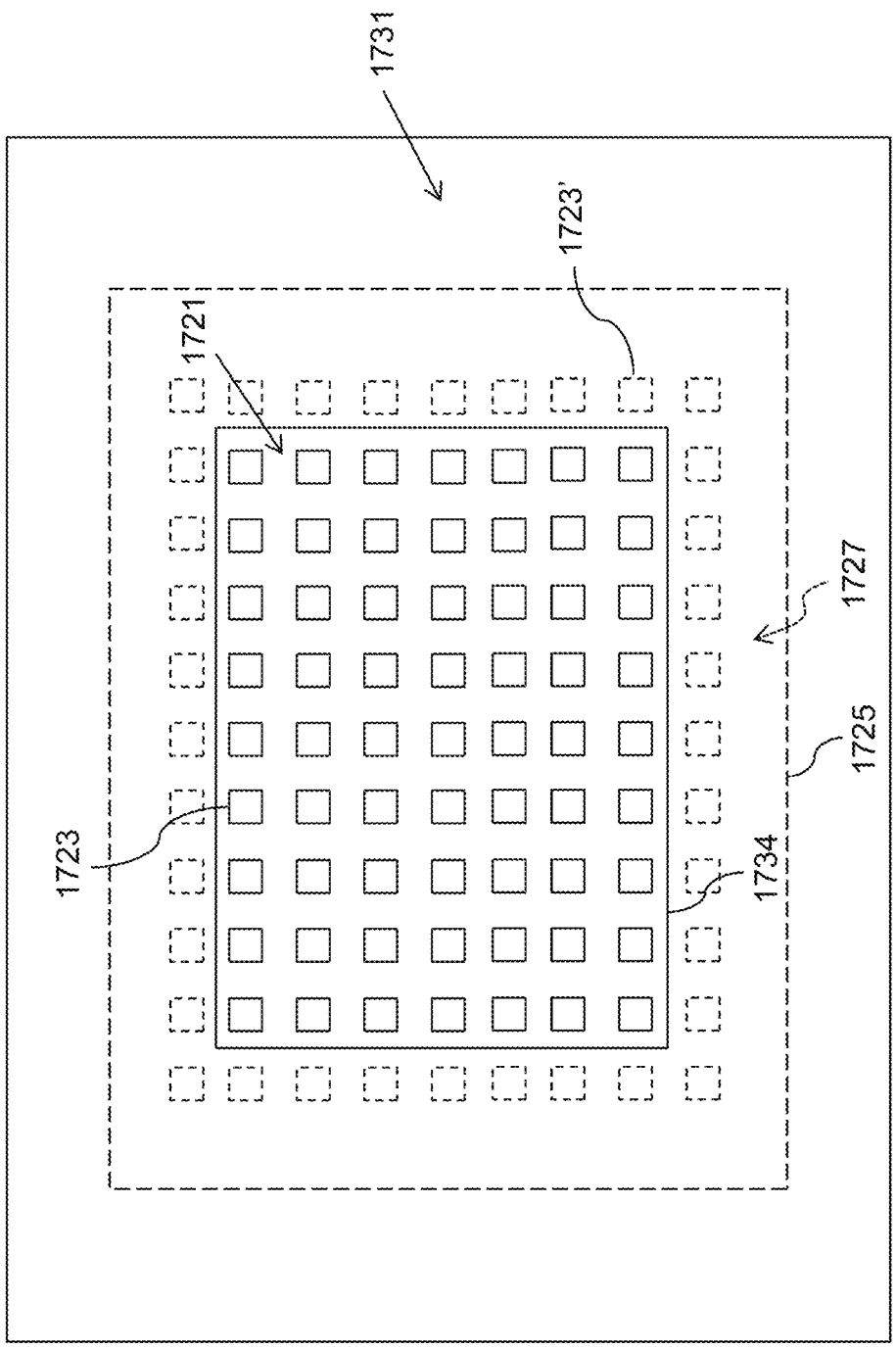
FIG. 8B is a top view illustrating an open mask according to another example.

FIG. 8B illustrates another example of an open mask 1731 where an aperture 1734 of the mask 1731 is smaller than that of FIG. 8A, such that the mask 1731 covers at least some emissive regions or pixels 1723 of a device 1721 when overlaid. Specifically, outer-most pixels 1723' are illustrated as being located within an unexposed region 1727 of the device 1721 formed between the aperture 1734 of the mask 1731 and outer edges 1725 of the device 1721.

Figure 8C:
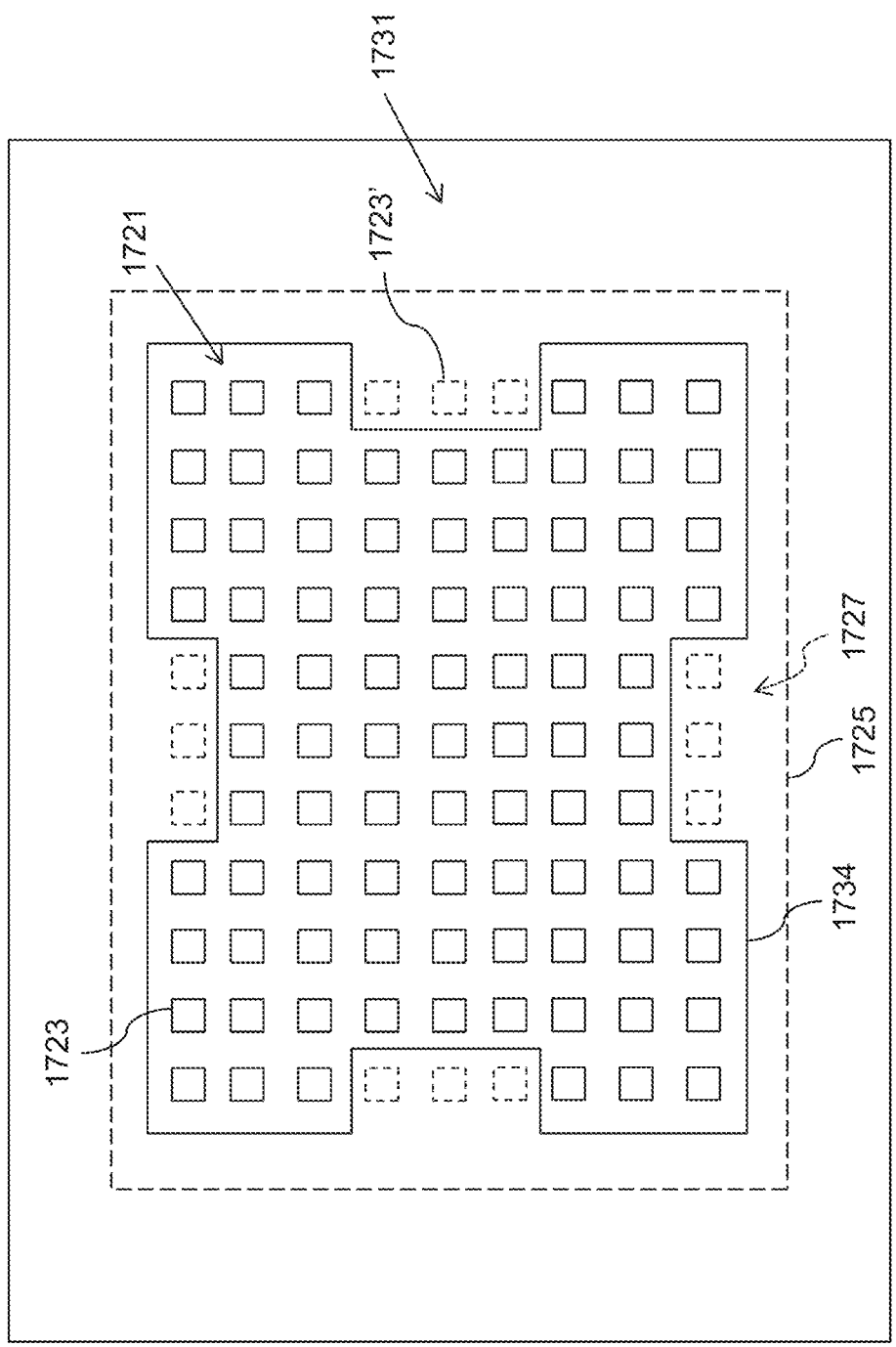
FIG. 8C is a top view illustrating an open mask according to yet another example.

FIG. 8C illustrates yet another example of an open mask 1731 wherein an aperture 1734 of the mask 1731 defines a pattern, which covers some pixels 1723' while exposing other pixels 1723 of a device 1721. Specifically, the pixels 1723' located within an unexposed region 1727 of the device 1721 (formed between the aperture 1734 and outer edges 1725) are masked during the deposition process to inhibit a vapor flux from being incident on the unexposed region 1727.

While outer-most pixels have been illustrated as being masked in the examples of FIGS. 8A-8C, it will be appreciated that an aperture of an open mask may be shaped to mask other emissive and non-emissive regions of a device. Furthermore, while an open mask has been illustrated in the foregoing examples as having one aperture, the open mask may also include additional apertures for exposing multiple regions of a substrate or a device.

Figure 8D:
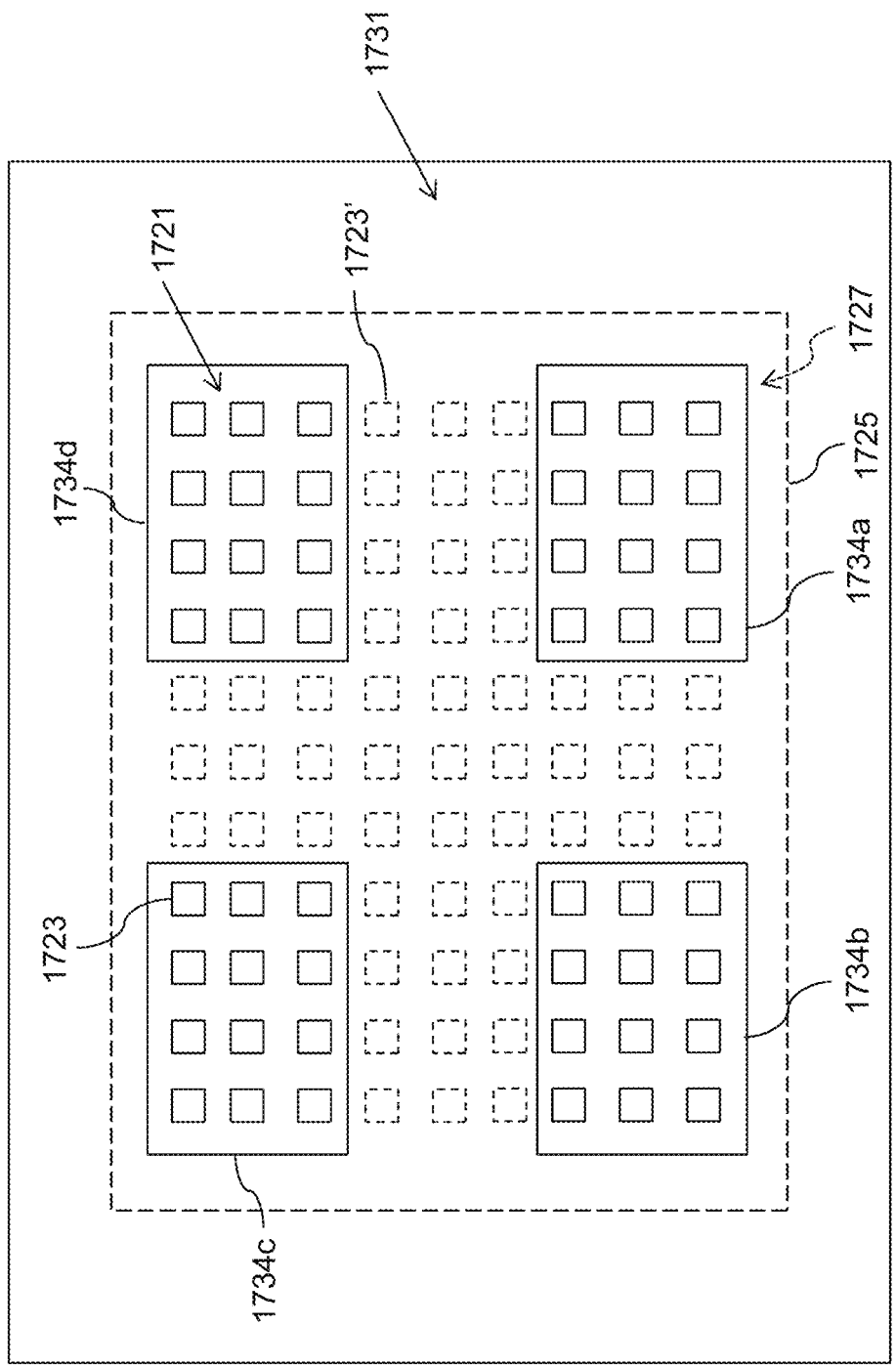
FIG. 8D is a top view illustrating an open mask according to yet another example.

FIG. 8D illustrates another example of an open mask 1731, where the mask 1731 has or defines a plurality of apertures 1734*a*-1734*d*. The apertures 1734*a*-1734*d* are positioned such that they selectively expose certain regions of a device 1721 while masking other regions. For example, certain emissive regions or pixels 1723 are exposed through the apertures 1734*a-d*, while other pixels 1723' located within an unexposed region 1727 are masked.

In various embodiments described herein, it will be understood that the use of an open mask may be omitted, if desired. Specifically, an open mask deposition process described herein may alternatively be conducted without the use of a mask, such that an entire target surface is exposed.

At least some of the above embodiments have been described with reference to various layers or coatings, including a nucleation promoting coating, a nucleation inhibiting coating, and a conductive coating, being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating. In addition, such layers or coatings may be deposited and/or patterned using other suitable processes, including photolithography, printing, OVPD, LITI patterning, and combinations thereof. These processes may also be used in combination with a shadow mask to achieve various patterns.

For example, magnesium may be deposited at source temperatures up to about 600° C. to achieve a faster rate of deposition, such as about 10 to 30 nm per second or more. Referring to Table 1 below, various deposition rates measured using a Knudsen cell source to deposit substantially pure magnesium on a fullerene-treated organic surface of about 1 nm are provided. It will be appreciated that other factors may also affect a deposition rate including, but not limited to, a distance between a source and a substrate, characteristics of the substrate, presence of a nucleation promoting coating on the substrate, the type of source used and a shaping of a flux of material evaporated from the source.

TABLE 1

Magnesium Deposition Rate by Temperature

| Sample # | Temperature (° C.) | Rate (angstroms/s) |
|---|---|---|
| 1 | 510 | 10 |
| 2 | 525 | 40 |
| 3 | 575 | 140 |
| 4 | 600 | 160 |

It will be appreciated by those skilled in the art that particular processing conditions used may vary depending on an equipment being used to conduct a deposition. It will also be appreciated that higher deposition rates are generally attained at higher source temperatures; however, other deposition conditions can be selected, such as, for example, by placing a substrate closer to a deposition source.

Although certain processes have been described with reference to evaporation for purposes of depositing a nucleation promoting material, a nucleation inhibiting material, and magnesium, it will be appreciated that various other processes may be used to deposit these materials. For example, deposition may be conducted using other PVD processes (including sputtering), CVD processes (including plasma enhanced chemical vapor deposition (PECVD)), or other suitable processes for depositing such materials. In some embodiments, magnesium is deposited by heating a magnesium source material using a resistive heater. In other embodiments, a magnesium source material may be loaded in a heated crucible, a heated boat, a Knudsen cell (e.g., an effusion evaporator source), or any other type of evaporation source.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on nucleation inhibiting and promoting coatings) compared to pure magnesium (99.99% and higher purity magnesium). For example, an initial sticking probability of substantially pure magnesium on a nucleation inhibiting coating can be within ±10% or within ±5% of an initial sticking probability of 99.99% purity magnesium on the nucleation inhibiting coating. Purity of magnesium may be about 95% or higher, about 98% or higher, about 99% or higher, or about 99.9% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

Furthermore, it will be appreciated that the processes of various embodiments may be performed on surfaces of other various organic or inorganic materials used as an electron injection layer, an electron transport layer, an electroluminescent layer, and/or a pixel definition layer (PDL) of an organic opto-electronic device. Examples of such materials include organic molecules as well as organic polymers such as those described in PCT Publication No. WO 2012/016074. It will also be understood by persons skilled in the art that organic materials doped with various elements and/or inorganic compounds may still be considered to be an organic material. It will further be appreciated by those skilled in the art that various organic materials may be used, and the processes described herein are generally applicable to an entire range of such organic materials.

It will also be appreciated that an inorganic substrate or surface can refer to a substrate or surface primarily including an inorganic material. For greater clarity, an inorganic material will generally be understood to be any material that is not considered to be an organic material. Examples of inorganic materials include metals, glasses, and minerals. Specifically, a conductive coating including magnesium may be deposited using a process according to the present disclosure on surfaces of lithium fluoride (LiF), glass and silicon (Si). Other surfaces on which the processes according to the present disclosure may be applied include those of silicon or silicone-based polymers, inorganic semiconductor materials, electron injection materials, salts, metals, and metal oxides.

It will be appreciated that a substrate may include a semiconductor material, and, accordingly, a surface of such a substrate may be a semiconductor surface. A semiconductor material may be described as a material which generally exhibits a band gap. For example, such a band gap may be formed between a highest occupied molecular orbital (HOMO) and a lowest unoccupied molecular orbital (LUMO). Semiconductor materials thus generally possess electrical conductivity that is less than that of a conductive material (e.g., a metal) but greater than that of an insulating material (e.g., a glass). It will be understood that a semiconductor material may be an organic semiconductor material or an inorganic semiconductor material.

Selective Deposition of an Electrode

Figure 9:
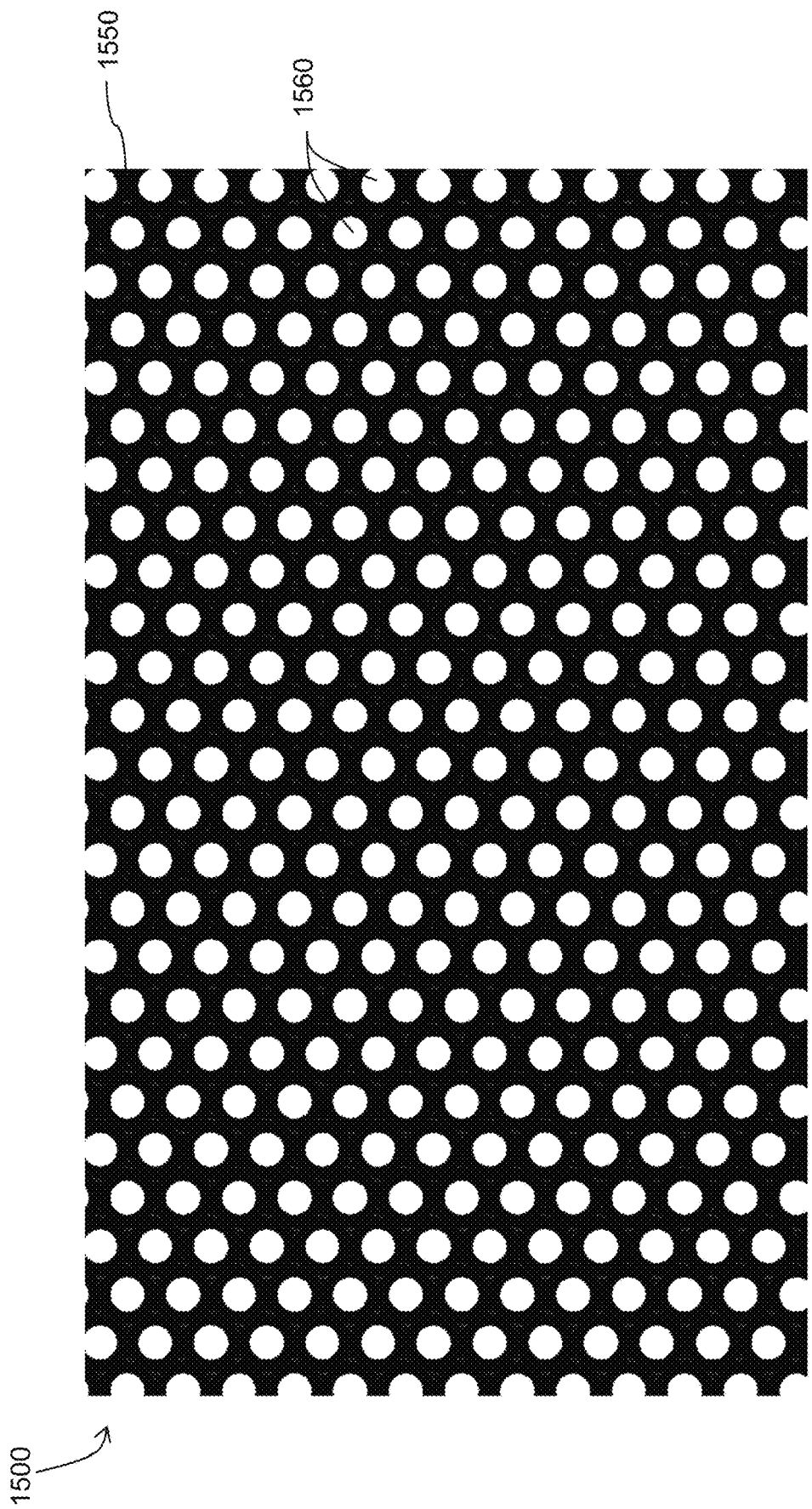
FIG. 9 is a top view of an OLED device according to one embodiment.
Figure 10:
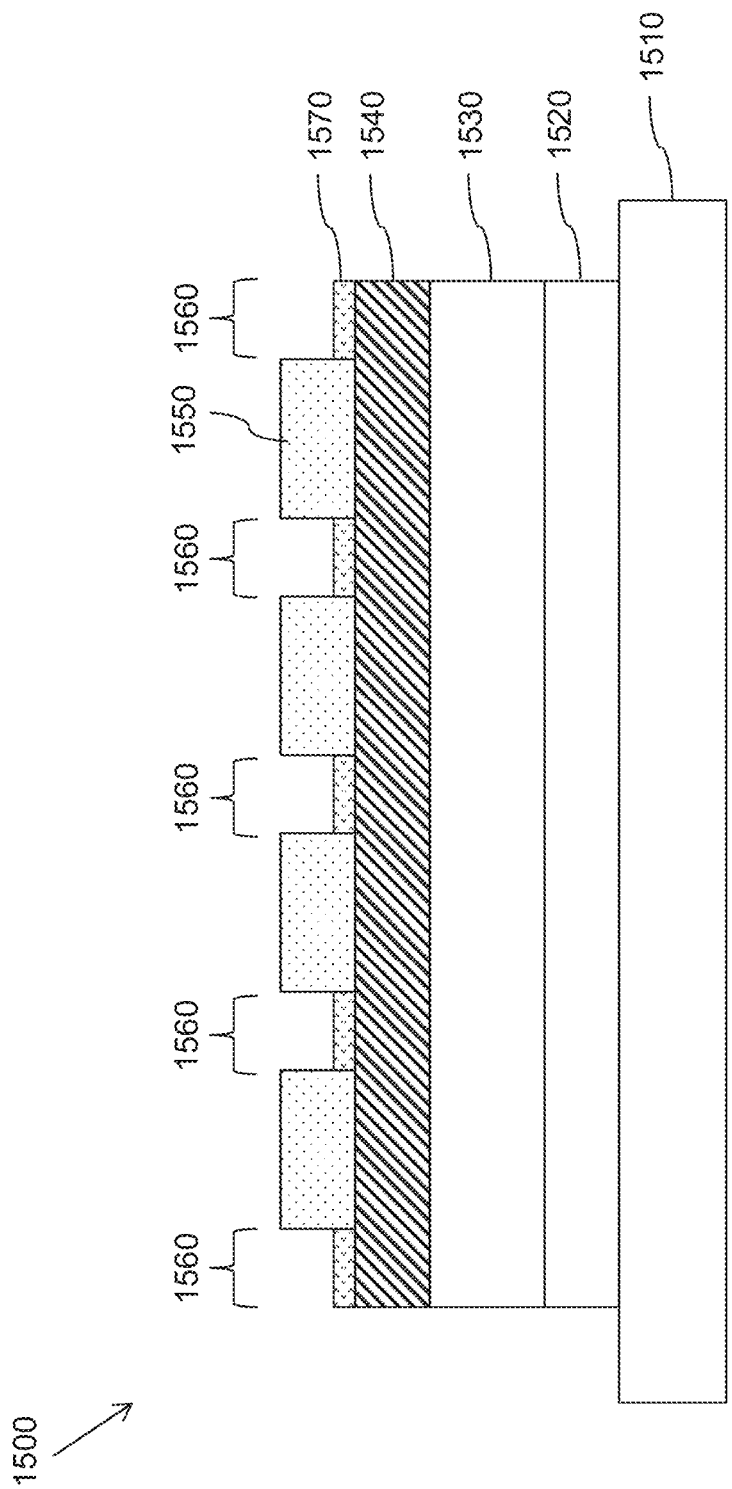
FIG. 10 is a cross-sectional view of the OLED device of FIG. 9.

FIGS. 9 and 10 illustrates an OLED device 1500 according to one embodiment. Specifically, FIG. 9 shows a top view of the OLED device 1500, and FIG. 10 illustrates a cross-sectional view of a structure of the OLED device 1500. In FIG. 9, a cathode 1550 is illustrated as a single monolithic or continuous structure having or defining a plurality of apertures or holes 1560 formed therein, which correspond to regions of the device 1500 where a cathode material was not deposited. This is further illustrated in FIG. 10, which shows the OLED device 1500 including a base substrate 1510, an anode 1520, organic layers 1530, a nucleation promoting coating 1540, a nucleation inhibiting coating 1570 selectively deposited over certain regions of the nucleation promoting coating 1540, and the cathode 1550 deposited over other regions of the nucleation promoting coating 1540 where the nucleation inhibiting coating 1570 is not present. More specifically, by selectively depositing the nucleation inhibiting coating 1570 to cover certain regions of a surface of the nucleation promoting coating 1540 during the fabrication of the device 1500, the cathode material is selectively deposited on exposed regions of the surface of the nucleation promoting coating 1540 using an open mask or a mask-free deposition process. The transparency or transmittance of the OLED device 1500 may be adjusted or modified by changing various parameters of an imparted pattern, such as an average size of the holes 1560 and a density of the holes 1560 formed in the cathode 1550. Accordingly, the OLED device 1500 may be a substantially transparent OLED device, which allows at least a portion of an external light incident on the OLED device to be transmitted therethrough. For example, the OLED device 1500 may be a substantially transparent OLED lighting panel. Such OLED lighting panel may be, for example, configured to emit light in one direction (e.g., either towards or away from the base substrate 1510) or in both directions (e.g., towards and away from the base substrate 1510).

Figure 11:
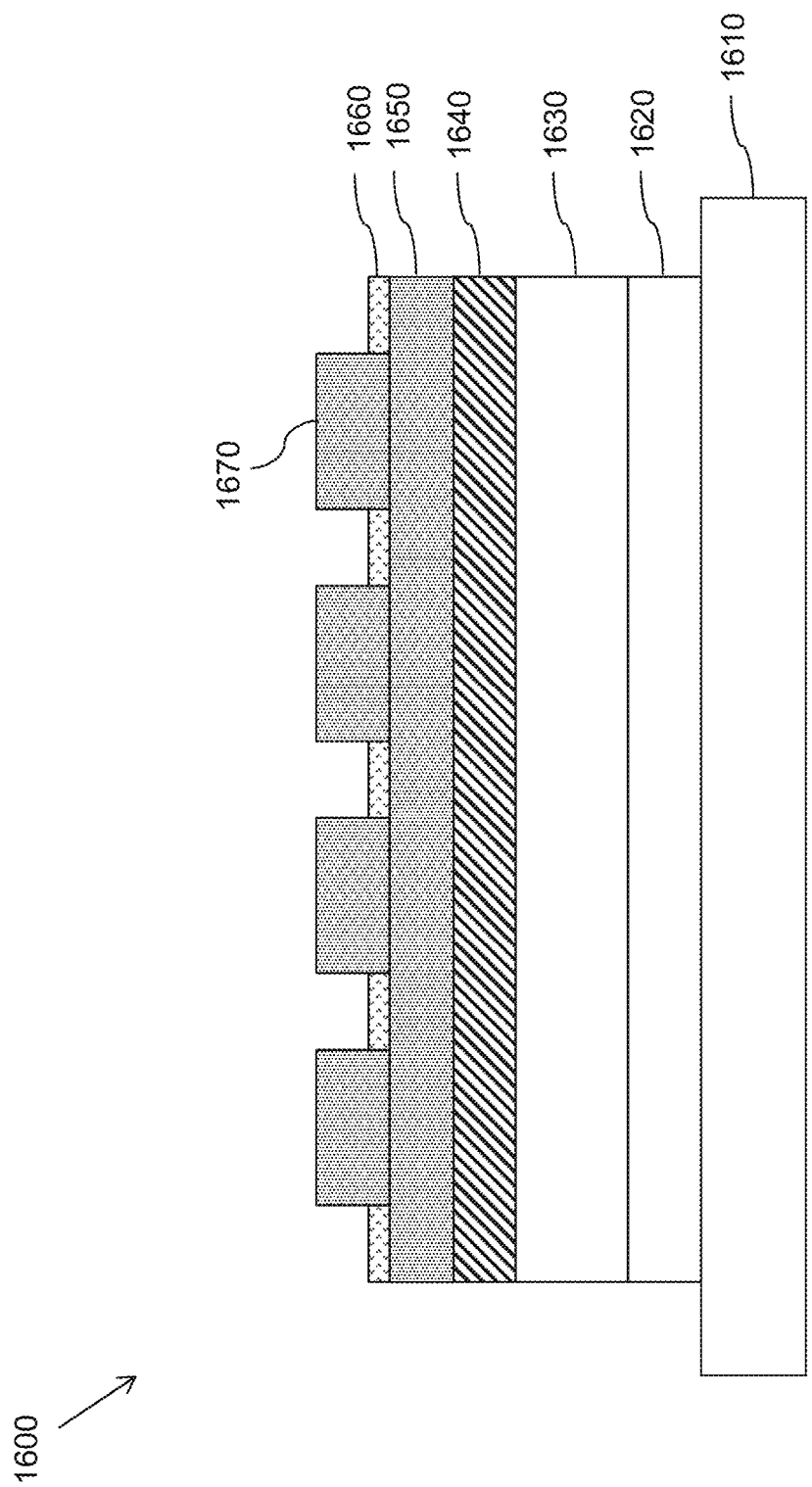
FIG. 11 is a cross-sectional view of an OLED device according to another embodiment.

FIG. 11 illustrates an OLED device 1600 according to another embodiment in which a cathode 1650 substantially covers an entire device area. Specifically, the OLED device 1600 includes a base substrate 1610, an anode 1620, organic layers 1630, a nucleation promoting coating 1640, the cathode 1650, a nucleation inhibiting coating 1660 selectively deposited over certain regions of the cathode 1650, and an auxiliary electrode 1670 deposited over other regions of the cathode 1650 where the nucleation inhibiting coating 1660 is not present.

The auxiliary electrode 1670 is electrically connected to the cathode 1650. Particularly in a top-emission configuration, it is desirable to deposit a relatively thin layer of the cathode 1650 to reduce optical interference (e.g., attenuation, reflection, diffusion, and so forth) due to the presence of the cathode 1650. However, a reduced thickness of the cathode 1650 generally increases a sheet resistance of the cathode 1650, thus reducing the performance and efficiency of the OLED device 1600. By providing the auxiliary electrode 1670 that is electrically connected to the cathode 1650, the sheet resistance and thus the IR drop associated with the cathode 1650 can be decreased. Furthermore, by selectively depositing the auxiliary electrode 1670 to cover certain regions of the device area while other regions remain uncovered, optical interference due to the presence of the auxiliary electrode 1670 may be controlled and/or reduced.

While the advantages of auxiliary electrodes have been explained in reference to top-emission OLED devices, it may also be advantageous to selectively deposit an auxiliary electrode over a cathode of a bottom-emission or double-sided emission OLED device. For example, while the cathode may be formed as a relatively thick layer in a bottom-emission OLED device without substantially affecting optical characteristics of the device, it may still be advantageous to form a relatively thin cathode. For example, in a transparent or semi-transparent display device, layers of the entire device including a cathode can be formed to be substantially transparent or semi-transparent. Accordingly, it may be beneficial to provide a patterned auxiliary electrode which cannot be readily detected by a naked eye from a typical viewing distance. It will also be appreciated that the described processes may be used to form busbars or auxiliary electrodes for decreasing a resistance of electrodes for devices other than OLED devices.

Figure 12A:
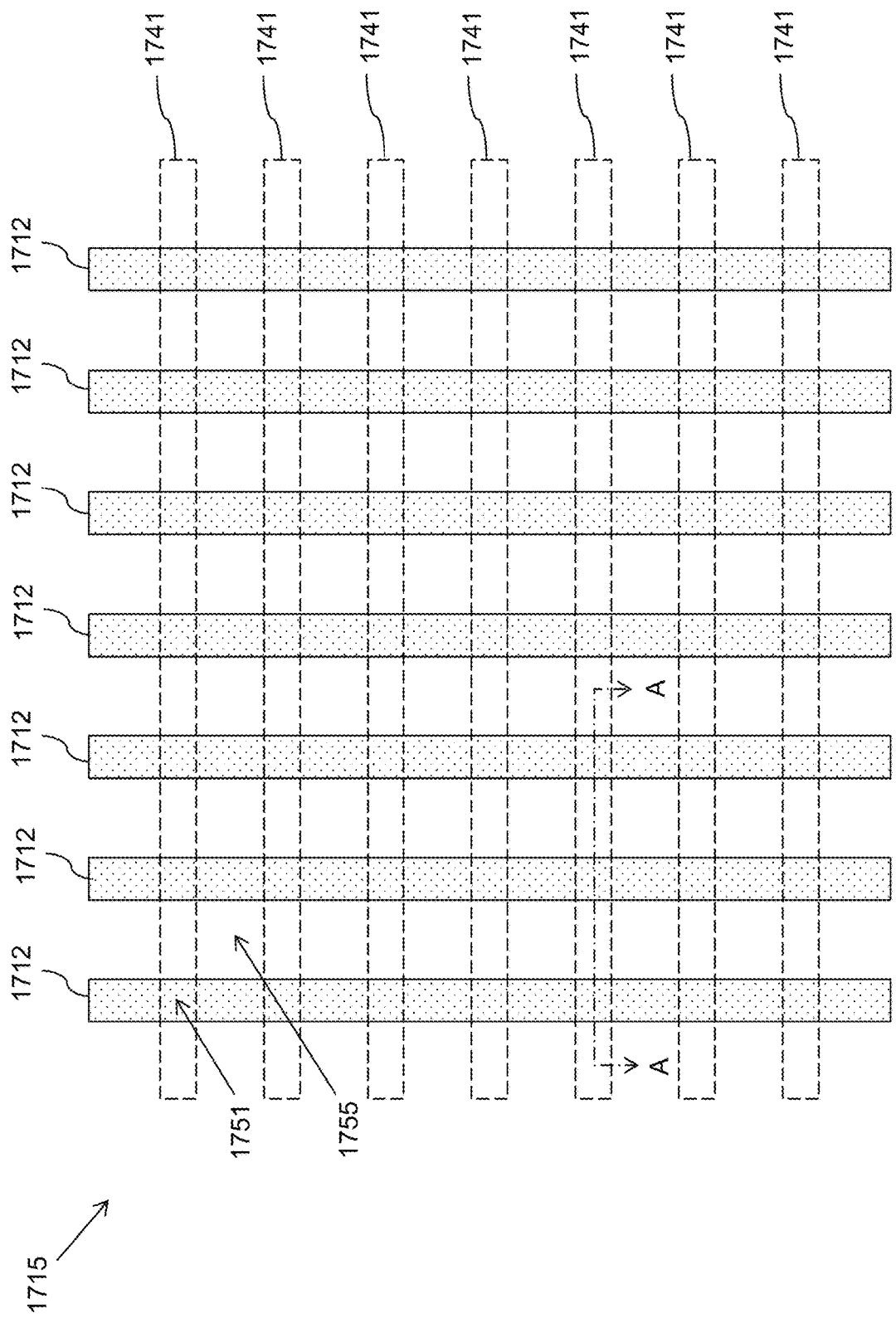
FIG. 12A is a schematic diagram illustrating a top view of a passive matrix OLED device according to one embodiment.

FIG. 12A shows a patterned cathode 1712 according to one embodiment, in which the cathode 1712 includes a plurality of spaced apart and elongated conductive strips. For example, the cathode 1712 may be used in a passive matrix OLED device (PMOLED) 1715. In the PMOLED device 1715, emissive regions or pixels are generally formed at regions where counter-electrodes overlap. Accordingly, in the embodiment of FIG. 12A, emissive regions or pixels 1751 are formed at overlapping regions of the cathode 1712 and an anode 1741, which includes a plurality of spaced apart and elongated conductive strips. Non-emissive regions 1755 are formed at regions where the cathode 1712 and the anode 1741 do not overlap. Generally, the strips of the cathode 1712 and the strips of the anode 1741 are oriented substantially perpendicular to each other in the PMOLED device 1715 as illustrated. The cathode 1712 and the anode 1741 may be connected to a power source and associated driving circuitry for supplying current to the respective electrodes.

Figure 12B:
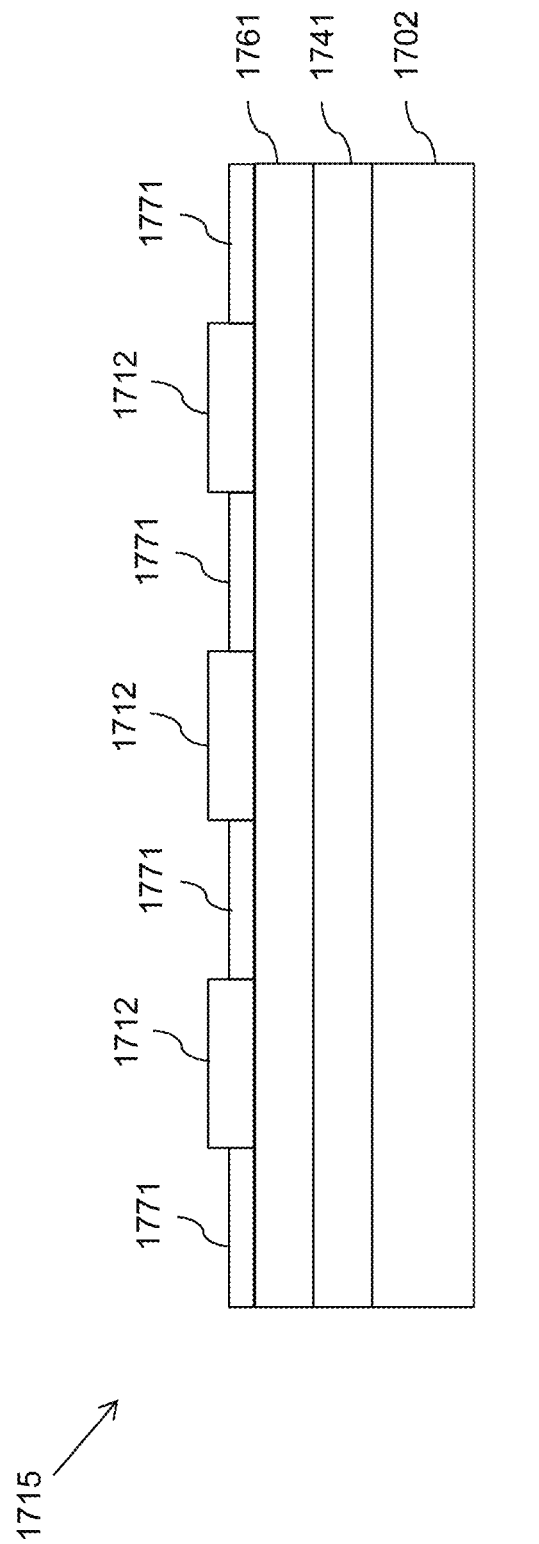
FIG. 12B is a schematic cross-sectional view of the passive matrix OLED device of FIG. 12A.

FIG. 12B illustrates a cross-sectional view taken along line A-A in FIG. 12A. In FIG. 12B, a base substrate 1702 is provided, which may be, for example, a transparent substrate. The anode 1741 is provided over the base substrate 1702 in the form of strips as illustrated in FIG. 12A. One or more organic layers 1761 are deposited over the anode 1741. For example, the organic layers 1761 may be provided as a common layer across the entire device, and may include any number of layers of organic and/or inorganic materials described herein, such as hole injection and transport layers, an electroluminescence layer, and electron transport and injection layers. Certain regions of a top surface of the organic layers 1761 are illustrated as being covered by a nucleation inhibition coating 1771, which is used to selectively pattern the cathode 1712 in accordance with the deposition processes described above. The cathode 1712 and the anode 1741 may be connected to their respective drive circuitry (not shown), which controls emission of light from the pixels 1751.

While thicknesses of the nucleation inhibiting coating 1771 and the cathode 1712 may be varied depending on the desired application and performance, at least in some embodiments, the thickness of the nucleation inhibiting coating 1771 may be comparable to, or substantially less than, the thickness of the cathode 1712 as illustrated in FIG. 12B. The use of a relatively thin nucleation inhibiting coating to achieve patterning of a cathode may be particularly advantageous for flexible PMOLED devices, since it can provide a relatively planar surface onto which a barrier coating may be applied.

Figure 12C:
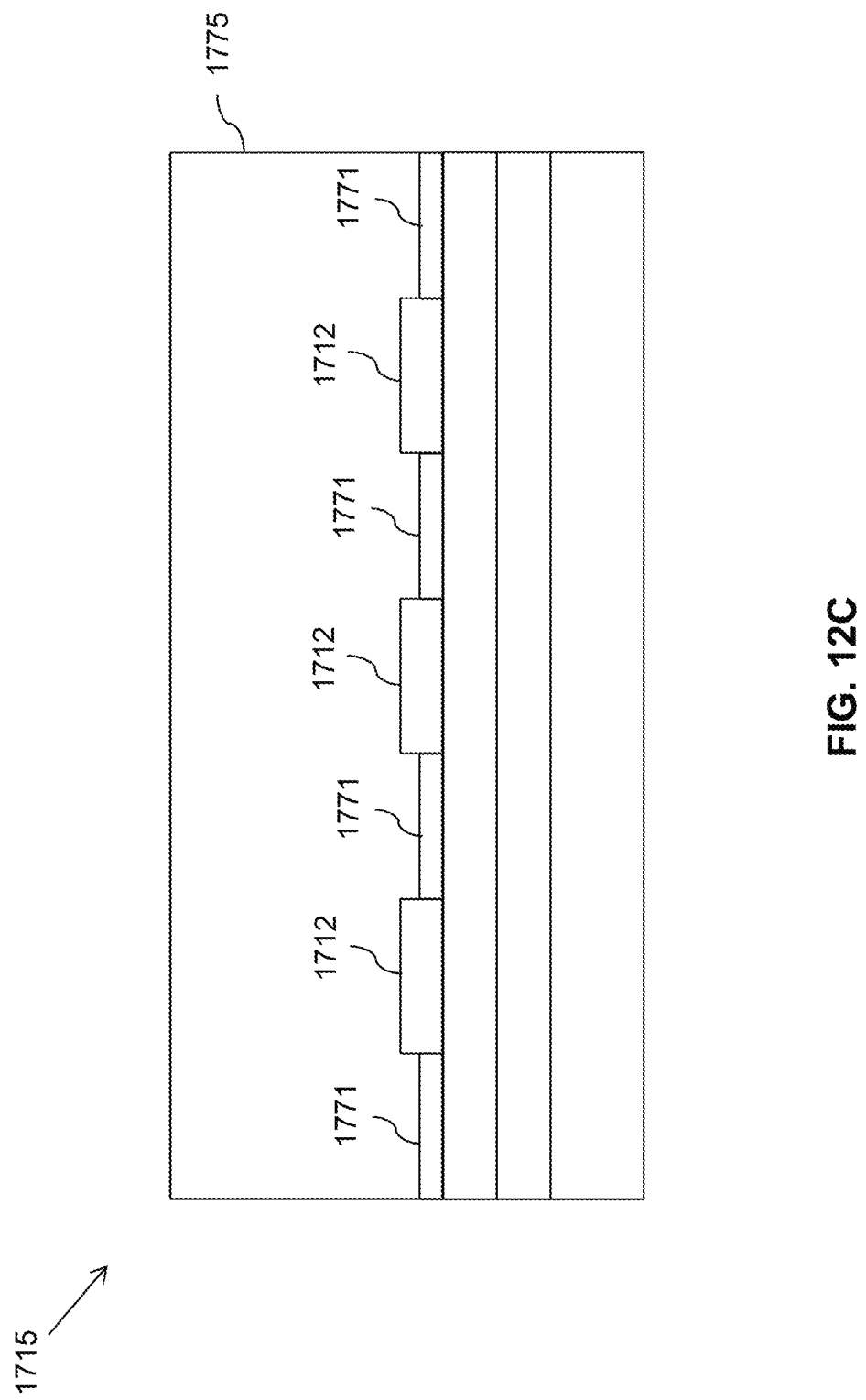
FIG. 12C is a schematic cross-sectional view of the passive matrix OLED device of FIG. 12B after encapsulation.

FIG. 12C illustrates the PMOLED device 1715 of FIG. 12B with a barrier coating 1775 applied over the cathode 1712 and the nucleation inhibiting coating 1771. As will be appreciated, the barrier coating 1775 is generally provided to inhibit the various device layers, including organic layers and the cathode 1712 which may be prone to oxidation, from being exposed to moisture and ambient air. For example, the barrier coating 1775 may be a thin film encapsulation formed by printing, CVD, sputtering, atomic-layer deposition (ALD), any combinations of the foregoing, or by any other suitable methods. The barrier coating 1775 may also be provided by laminating a pre-formed barrier film onto the device 1715 using an adhesive (not shown). For example, the barrier coating 1775 may be a multi-layer coating comprising organic materials, inorganic materials, or combination of both. The barrier coating 1775 may further comprise a getter material and/or a desiccant.

Figure 12D:
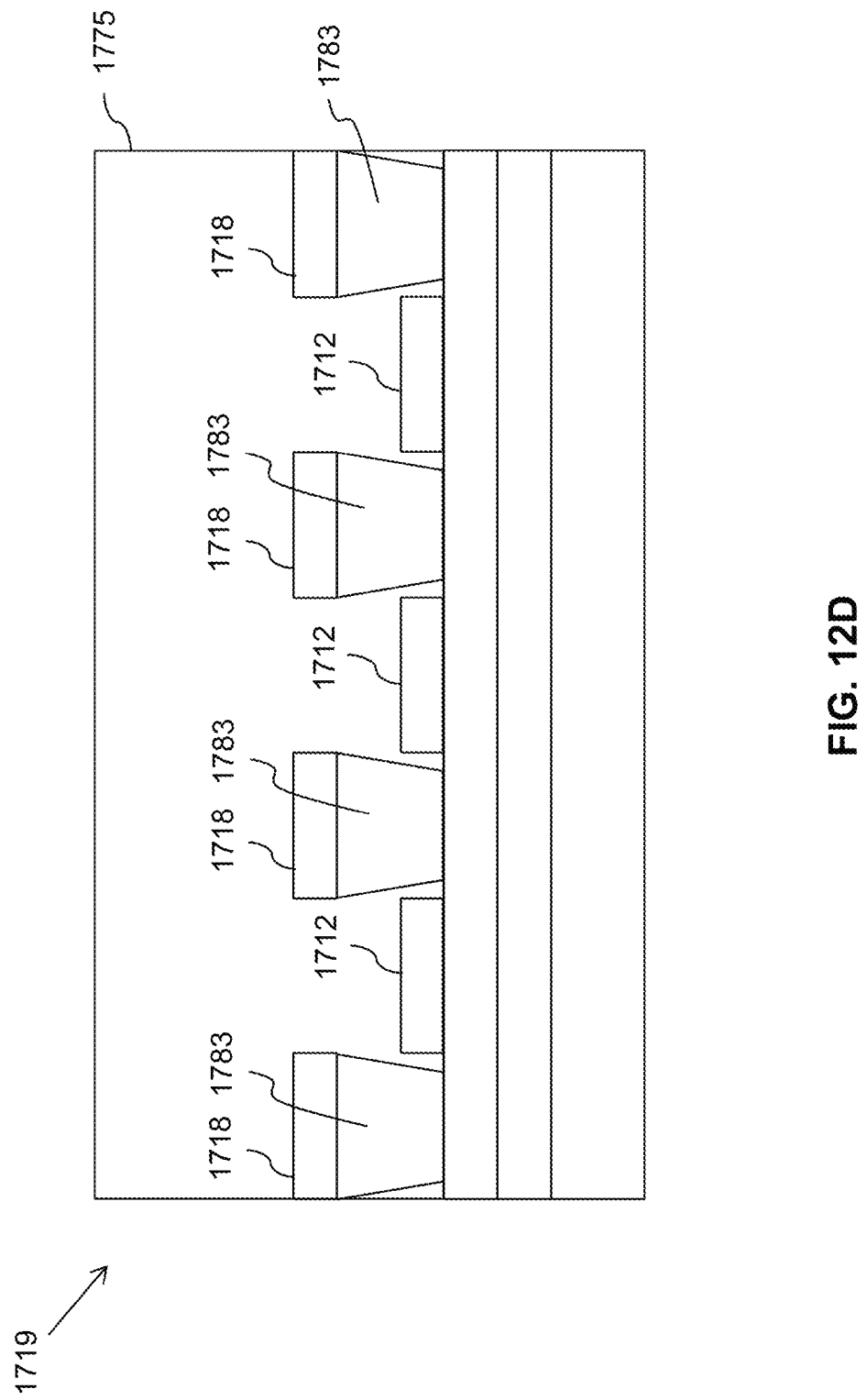
FIG. 12D is a schematic cross-sectional view of a comparative passive matrix OLED device.

For comparative purposes, an example of a comparative PMOLED device 1719 is illustrated in FIG. 12D. In the comparative example of FIG. 12D, a plurality of pixel definition structures 1783 are provided in non-emissive regions of the device 1719, such that when a conductive material is deposited using an open mask or a mask-free deposition process, the conductive material is deposited on both emissive regions located between neighboring pixel definition structures 1783 to form the cathode 1712, as well as on top of the pixel definition structures 1783 to form conductive strips 1718. However, in order to ensure that each segment of the cathode 1712 is electrically isolated from the conductive strips 1718, a thickness or height of the pixel definition structures 1783 are formed to be greater than a thickness of the cathode 1712. The pixel definition structures 1783 may also have an undercut profile to further decrease the likelihood of the cathode 1712 coming in electrical contact with the conductive strips 1718. The barrier coating 1775 is provided to cover the PMOLED device 1719 including the cathode 1712, the pixel definition structures 1783, and the conductive strips 1718.

In the comparative PMOLED device 1719 illustrated in FIG. 12D, the surface onto which the barrier coating 1775 is applied is non-uniform due to the presence of the pixel definition structures 1783. This makes the application of the barrier coating 1775 difficult, and even upon the application of the barrier coating 1775, the adhesion of the barrier coating 1775 to the underlying surface may be relatively poor. Poor adhesion increases the likelihood of the barrier coating 1775 peeling off the device 1719, particularly when the device 1719 is bent or flexed. Additionally, there is a relatively high probability of air pockets being trapped between the barrier coating 1775 and the underlying surface during the application procedure due to the non-uniform surface. The presence of air pockets and/or peeling of the barrier coating 1775 can cause or contribute to defects and partial or total device failure, and thus is highly undesirable. These factors are mitigated or reduced in the embodiment of FIG. 12C.

While the patterned cathode 1712 shown in FIG. 12A may be used to form a cathode of an OLED device, it is appreciated that a similar patterning or selective deposition technique may be used to form an auxiliary electrode for an OLED device. Specifically, such an OLED device may be provided with a common cathode, and an auxiliary electrode deposited on top of, or beneath, the common cathode such that the auxiliary electrode is in electrical communication with the common cathode. For example, such an auxiliary electrode may be implemented in an OLED device including a plurality of emissive regions (e.g., an active matrix OLED device) such that the auxiliary electrode is formed over non-emissive regions, and not over the emissive regions. In another example, an auxiliary electrode may be provided to cover non-emissive regions as well as at least some emissive regions of an OLED device.

Selective Deposition of an Auxiliary Electrode

FIG. 13A depicts a portion of an OLED device 1800 including a plurality of emissive regions 1810a-1810f and a non-emissive region 1820. For example, the OLED device 1800 may be an active matrix OLED (AMOLED) device, and each of the emissive regions 1810a-1810f may correspond to a pixel or a subpixel of such a device. For sake of simplicity, FIGS. 13B-13D depict a portion of the OLED device 1800. Specifically, FIGS. 13B-13D show a region surrounding a first emissive region 1810a and a second emissive region 1810b, which are two neighboring emissive regions. While not explicitly illustrated, a common cathode may be provided that substantially covers both emissive regions and non-emissive regions of the device 1800.

In FIG. 13B, an auxiliary electrode 1830 according to one embodiment is shown, in which the auxiliary electrode 1830 is disposed between the two neighboring emissive regions 1810a and 1810b. The auxiliary electrode 1830 is electrically connected to the common cathode (not shown). Specifically, the auxiliary electrode 1830 is illustrated as having a width (a), which is less than a separation distance (d) between the neighboring emissive regions 1810a and 1810b, thus creating a non-emissive gap region on each side of the auxiliary electrode 1830. For example, such an arrangement may be desirable in the device 1800 where the separation distance between the neighboring emissive regions 1810a and 1810b are sufficient to accommodate the auxiliary electrode 1830 of sufficient width, since the likelihood of the auxiliary electrode 1830 interfering with an optical output of the device 1800 can be reduced by providing the non-emissive gap regions. Furthermore, such an arrangement may be particularly beneficial in cases where the auxiliary electrode 1830 is relatively thick (e.g., greater than several hundred nanometers or on the order a few microns thick). For example, a ratio of a height or a thickness of the auxiliary electrode 1830 relative to its width (namely, an aspect ratio) may be greater than about 0.05, such as about 0.1 or greater, about 0.2 or greater, about 0.5 or greater, about 0.8 or greater, about 1 or greater, or about 2 or greater. For example, the height or the thickness of the auxiliary electrode 1830 may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater.

In FIG. 13C, an auxiliary electrode 1832 according to another embodiment is shown. The auxiliary electrode 1832 is electrically connected to the common cathode (not shown). As illustrated, the auxiliary electrode 1832 has substantially the same width as the separation distance between the two neighboring emissive regions 1810a and 1810b, such that the auxiliary electrode 1832 substantially fully occupies the entire non-emissive region provided between the neighboring emissive regions 1810a and 1810b. Such an arrangement may be desirable, for example, in cases where the separation distance between the two neighboring emissive regions 1810a and 1810b is relatively small, such as in a high pixel density display device.

In FIG. 13D, an auxiliary electrode 1834 according to yet another embodiment is illustrated. The auxiliary electrode 1834 is electrically connected to the common cathode (not shown). The auxiliary electrode 1834 is illustrated as having a width (a), which is greater than the separation distance (d) between the two neighboring emissive regions 1810a and 1810b. Accordingly, a portion of the auxiliary electrode 1834 overlaps a portion of the first emissive region 1810a and a portion of the second emissive region 1810b. Such an arrangement may be desirable, for example, in cases where the non-emissive region between the neighboring emissive regions 1810a and 1810b is not sufficient to fully accommodate the auxiliary electrode 1834 of the desired width. While the auxiliary electrode 1834 is illustrated in FIG. 13D as overlapping with the first emissive region 1810a to substantially the same degree as the second emissive region 1810b, the extent to which the auxiliary electrode 1834 overlaps with an adjacent emissive region may be modulated in other embodiments. For example, in other embodiments, the auxiliary electrode 1834 may overlap to a greater extent with the first emissive region 1810a than the second emissive region 1810b and vice versa. Furthermore, a profile of overlap between the auxiliary electrode 1834 and an emissive region can also be varied. For example, an overlapping portion of the auxiliary electrode 1834 may be shaped such that the auxiliary electrode 1834 overlaps with a portion of an emissive region to a greater extent than it does with another portion of the same emissive region to create a non-uniform overlapping region.

Figure 14:
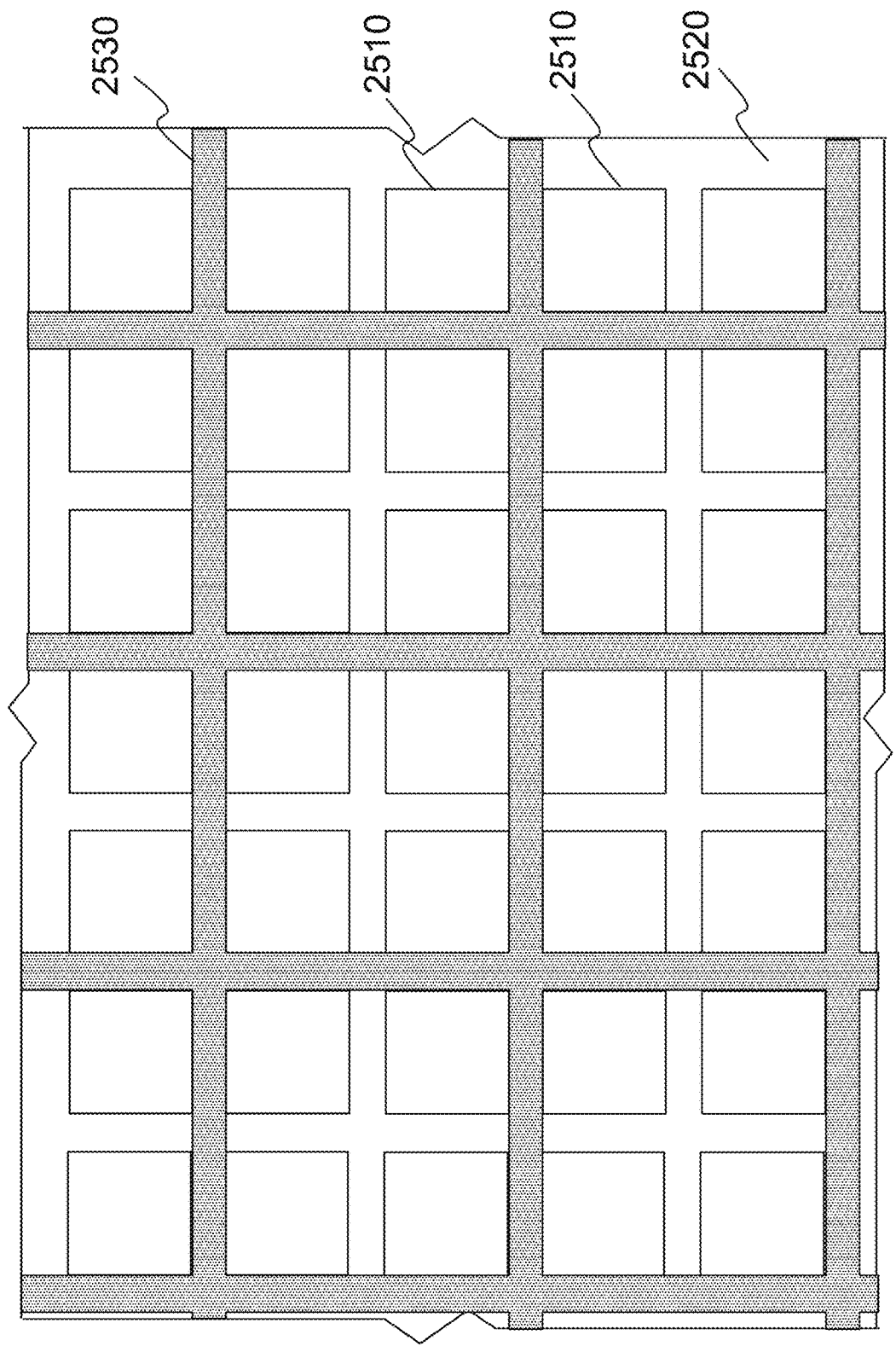
FIG. 14 illustrate an auxiliary electrode pattern formed on an OLED device according to one embodiment.

FIG. 14 illustrates an embodiment in which an auxiliary electrode 2530 is formed as a grid over an OLED device 2500. As illustrated, the auxiliary electrode is 2530 provided over a non-emissive region 2520 of the device 2500, such that it does not substantially cover any portion of emissive regions 2510.

While the auxiliary electrode has been illustrated as being formed as a connected and continuous structure in the embodiment of FIG. 14, it will be appreciated that in some embodiments, the auxiliary electrode may be provided in the form of discrete auxiliary electrode units wherein the discrete auxiliary electrode units are not physically connected to one another. However, even in such cases, the auxiliary electrode units may be nevertheless in electrical communication with one another via a common electrode. For example, providing discrete auxiliary electrode units, which are indirectly connected to one another via the common electrode, may still substantially lower a sheet resistance and thus increase an efficiency of an OLED device without substantially interfering with optical characteristics of the device.

Auxiliary electrodes may be used in display devices with various pixel or sub-pixel arrangements. For example, auxiliary electrodes may be provided on a display device in which a diamond pixel arrangement is used. Examples of such pixel arrangements are illustrated in FIGS. 15-17.

Figure 15:
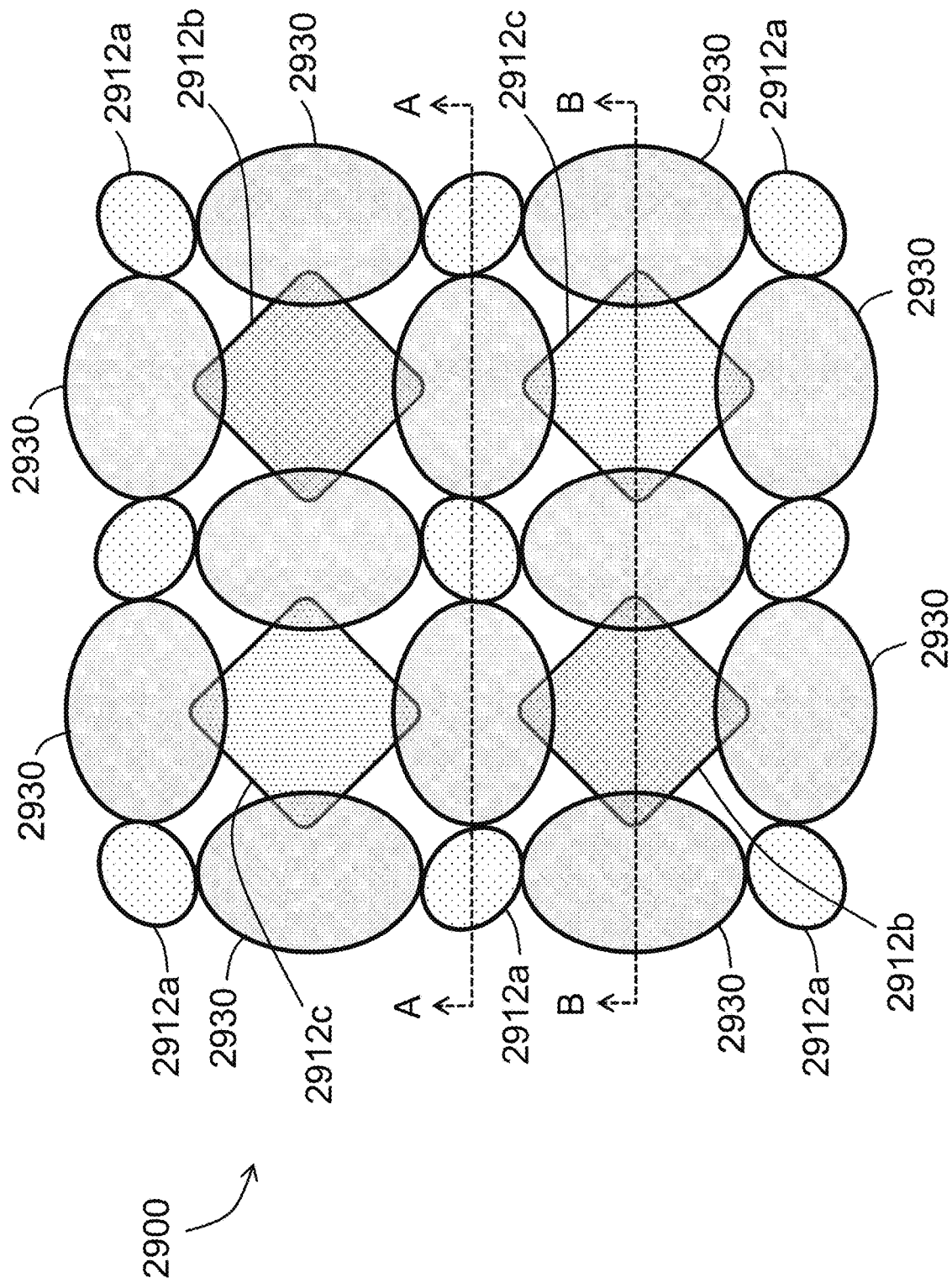
FIG. 15 illustrate a portion of a device with a pixel arrangement according to one embodiment.

FIG. 15 is a schematic illustration of an OLED device 2900 having a diamond pixel arrangement according to one embodiment. The OLED device 2900 includes a plurality of pixel definition layers (PDLs) 2930 and emissive regions 2912 (sub-pixels) disposed between neighboring PDLs 2930. The emissive regions 2912 include those corresponding to first sub-pixels 2912a, which may, for example, correspond to green sub-pixels, second sub-pixels 2912b, which may, for example, correspond to blue sub-pixels, and third sub-pixels 2912c, which may, for example, correspond to red sub-pixels.

Figure 16:
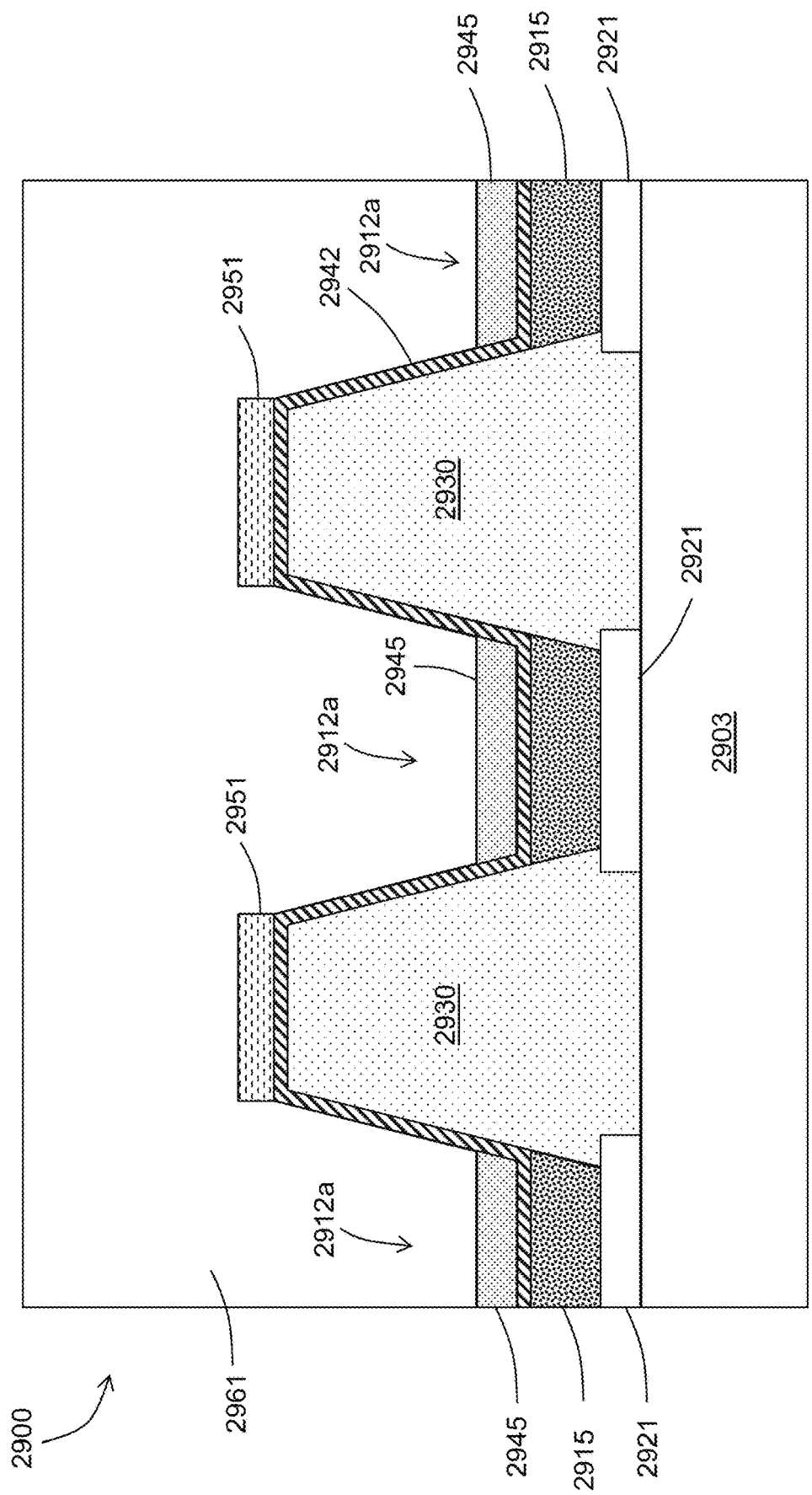
FIG. 16 is a cross-sectional diagram taken along line A-A of the device according to FIG. 15.

FIG. 16 is a schematic illustration of the OLED device 2900 taken along line A-A shown in FIG. 15. As more clearly illustrated in FIG. 16, the device 2900 includes a substrate 2903 and a plurality of anode units 2921 formed on a surface of the base substrate 2903. The substrate 2903 may further include a plurality of transistors and a base substrate, which have been omitted from the figure for sake of simplicity. An organic layer 2915 is provided on top of each anode unit 2921 in a region between neighboring PDLs 2930, and a common cathode 2942 is provided over the organic layer 2915 and the PDLs 2930 to form the first sub-pixels 2912a. The organic layer 2915 may include a plurality of organic and/or inorganic layers. For example, such layers may include a hole transport layer, a hole injection layer, an electroluminescence layer, an electron injection layer, and/or an electron transport layer. A nucleation inhibiting coating 2945 is provided over regions of the common cathode 2942 corresponding to the first sub-pixels 2912a to allow selective deposition of an auxiliary electrode 2951 over uncovered regions of the common cathode 2942 corresponding to substantially planar regions of the PDLs 2930. The nucleation inhibiting coating 2945 may also act as an index-matching coating. A thin film encapsulation layer 2961 may optionally be provided to encapsulate the device 2900.

Figure 17:
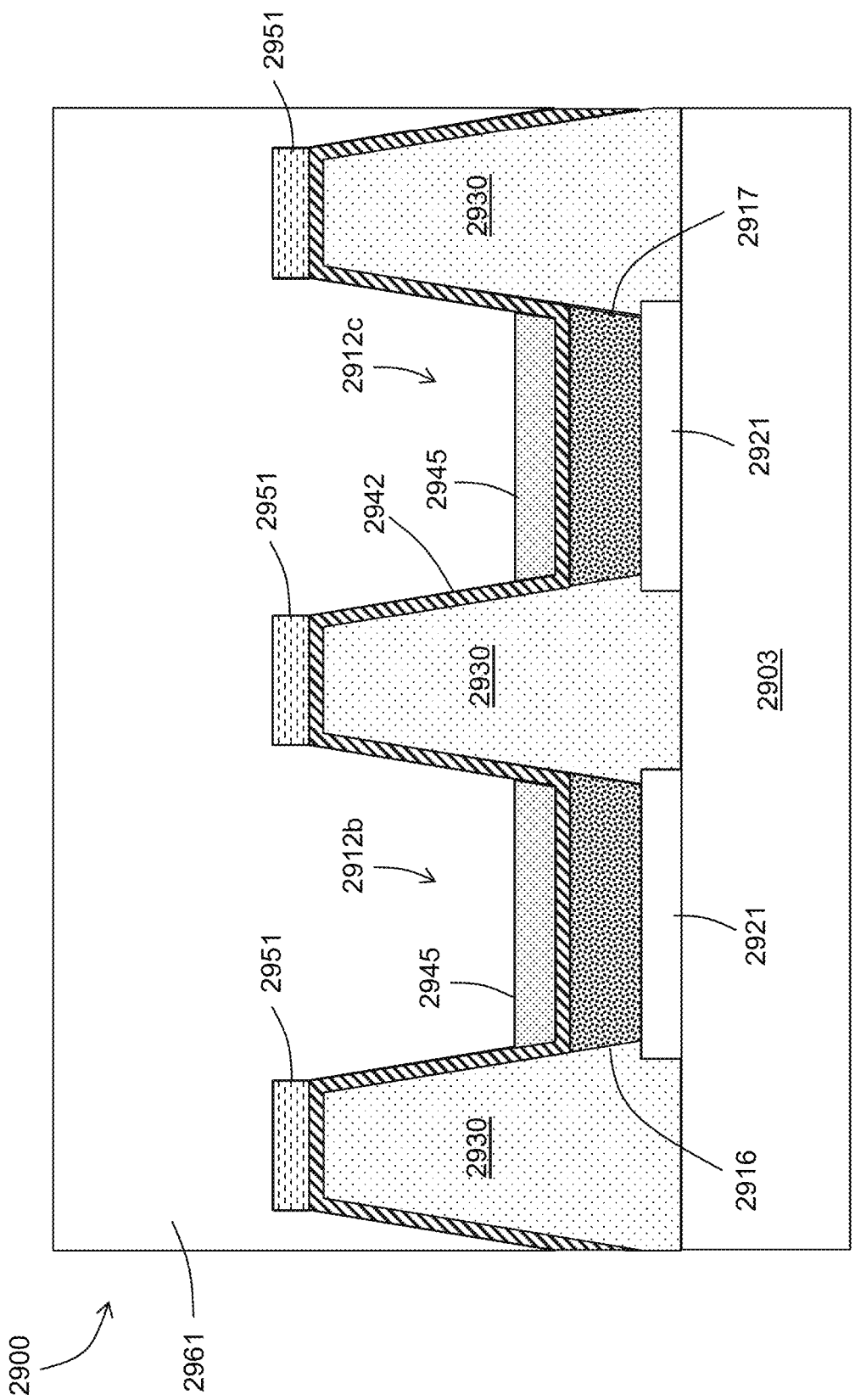
FIG. 17 is a cross-sectional diagram taken along line B-B of the device according to FIG. 15.

FIG. 17 shows a schematic illustration of the OLED device 2900 taken along line B-B indicated in FIG. 15. The device 2900 includes the plurality of anode units 2921 formed on the surface of the substrate 2903, and an organic layer 2916 or 2917 provided on top of each anode unit 2921 in a region between neighboring PDLs 2930. The common cathode 2942 is provided over the organic layers 2916 and 2917 and the PDLs 2930 to form the second sub-pixel 2912b and the third sub-pixel 2912c, respectively. The nucleation inhibiting coating 2945 is provided over regions of the common cathode 2942 corresponding to the sub-pixels 2912b and 2912c to allow selective deposition of the auxiliary electrode 2951 over uncovered regions of the common cathode 2942 corresponding to the substantially planar regions of the PDLs 2930. The nucleation inhibiting coating 2945 may also act as an index-matching coating. The thin film encapsulation layer 2961 may optionally be provided to encapsulate the device 2900.

In another aspect according to some embodiments, a device is provided. In some embodiments, the device is an opto-electronic device. In some embodiments, the device is another electronic device or other product. In some embodiments, the device includes a substrate, a nucleation inhibiting coating, and a conductive coating. The nucleation inhibiting coating covers a first region of the substrate. The conductive coating covers a second region of the substrate, and partially overlaps the nucleation inhibiting coating such that at least a portion of the nucleation inhibiting coating is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the nucleation inhibiting coating. In some embodiments, the second portion of the conductive coating is spaced from the nucleation inhibiting coating by a gap. In some embodiments, the nucleation inhibiting coating includes an organic material. In some embodiments, the first portion of the conductive coating and the second portion of the conductive coating are formed integral or continuous with one another to provide a single monolithic structure.

In another aspect according to some embodiments, a device is provided. In some embodiments, the device is an opto-electronic device. In some embodiments, the device is another electronic device or other product. In some embodiments, the device includes a substrate and a conductive coating. The substrate includes a first region and a second region. The conductive coating covers the second region of the substrate, and partially overlaps the first region of the substrate such that at least a portion of the first region of the substrate is exposed from, or is substantially free of or is substantially uncovered by, the conductive coating. In some embodiments, the conductive coating includes a first portion and a second portion, the first portion of the conductive coating covers the second region of the substrate, and the second portion of the conductive coating overlaps a portion of the first region of the substrate. In some embodiments, the second portion of the conductive coating is spaced from the first region of the substrate by a gap. In some embodiments, the first portion of the conductive coating and the second portion of the conductive coating are integrally formed with one another.

Figure 18:
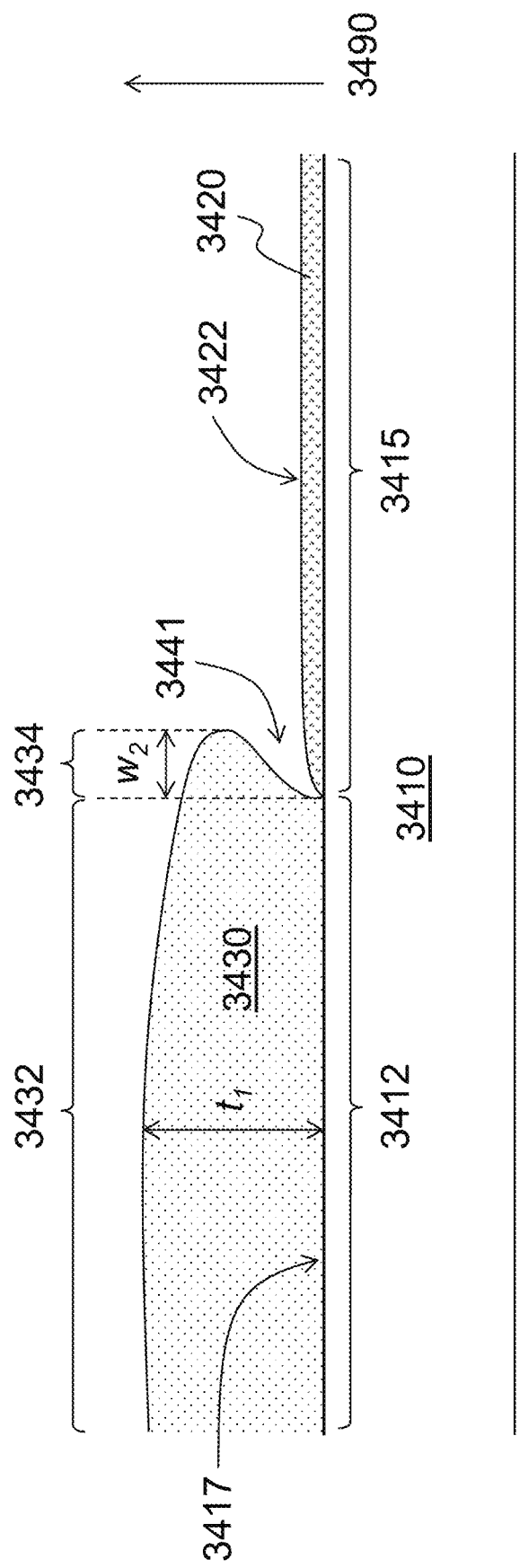
FIG. 18 is a diagram illustrating a cross-sectional profile around an interface of a conductive coating and a nucleation inhibiting coating according to one embodiment.

FIG. 18 illustrates a portion of a device according to one embodiment. The device includes a substrate 3410 having a surface 3417. A nucleation inhibiting coating 3420 covers a first region 3415 of the surface 3417 of the substrate 3410, and a conductive coating 3430 covers a second region 3412 of the surface 3417 of the substrate 3410. As illustrated in FIG. 18, the first region 3415 and the second region 3412 are distinct and non-overlapping regions of the surface 3417 of the substrate 3410. The conductive coating 3430 includes a first portion 3432 and a second portion 3434. As illustrated in the figure, the first portion 3432 of the conductive coating 3430 covers the second region 3412 of the substrate 3410, and the second portion 3434 of the conductive coating 3430 partially overlaps a portion of the nucleation inhibiting coating 3420. Specifically, the second portion 3434 is illustrated as overlapping the portion of the nucleation inhibiting coating 3420 in a direction that is perpendicular (or normal) to the underlying substrate surface 3417.

Particularly in the case where the nucleation inhibiting coating 3420 is formed such that its surface 3422 exhibits a relatively low affinity or initial sticking probability against a material used to form the conductive coating 3430, there is a gap 3441 formed between the overlapping, second portion 3434 of the conductive coating 3430 and the surface 3422 of the nucleation inhibiting coating 3420. Accordingly, the second portion 3434 of the conductive coating 3430 is not in direct physical contact with the nucleation inhibiting coating 3420, but is spaced from the nucleation inhibiting coating 3420 by the gap 3441 along the direction perpendicular to the surface 3417 of the substrate 3410 as indicated by arrow 3490. Nevertheless, the first portion 3432 of the conductive coating 3430 may be in direct physical contact with the nucleation inhibiting coating 3420 at an interface or a boundary between the first region 3415 and the second region 3412 of the substrate 3410.

In some embodiments, the overlapping, second portion 3434 of the conductive coating 3430 may laterally extend over the nucleation inhibiting coating 3420 by a comparable extent as a thickness of the conductive coating 3430. For example, in reference to FIG. 18, a width $w_2$ (or a dimension along a direction parallel to the surface 3417 of the substrate 3410) of the second portion 3434 may be comparable to a thickness $t_1$ (or a dimension along a direction perpendicular to the surface 3417 of the substrate 3410) of the first portion 3432 of the conductive coating 3430. For example, a ratio of $w_2:t_1$ may be in a range of about 1:1 to about 1:3, about 1:1 to about 1:1.5, or about 1:1 to about 1:2. While the thickness $t_1$ would generally be relatively uniform across the conductive coating 3430, the extent to which the second portion 3434 overlaps with the nucleation inhibiting coating 3420 (namely, $w_2$) may vary to some extent across different portions of the surface 3417.

Figure 19:
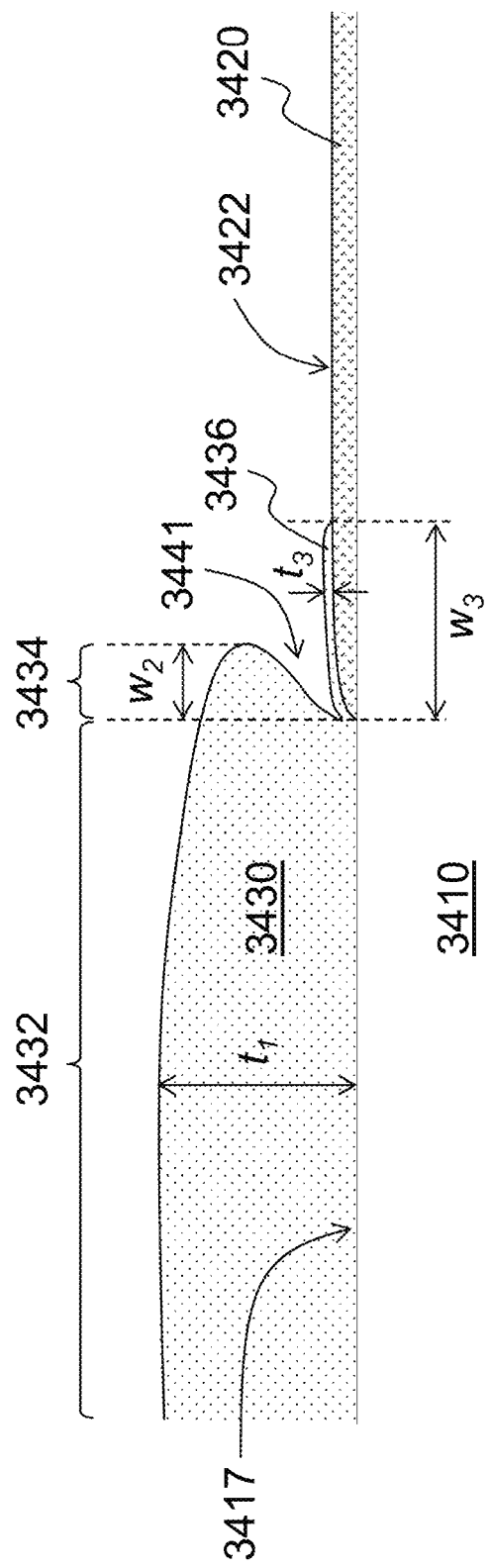
FIG. 19 is a diagram illustrating a cross-sectional profile around an interface of a conductive coating and a nucleation inhibiting coating according to another embodiment.

In another embodiment illustrated in FIG. 19, the conductive coating 3430 further includes a third portion 3436 disposed between the second portion 3434 and the nucleation inhibiting coating 3420. As illustrated, the second portion 3434 of the conductive coating 3430 laterally extends over and is spaced from the third portion 3436 of the conductive coating 3430, and the third portion 3436 may be in direct physical contact with the surface 3422 of the nucleation inhibiting coating 3420. A thickness $t_3$ of the third portion 3436 may be less, and, in some cases, substantially less than the thickness $t_1$ of the first portion 3432 of the conductive coating 3430. Furthermore, at least in some embodiments, a width $w_3$ of the third portion 3436 may be greater than the width $w_2$ of the second portion 3434. Accordingly, the third portion 3436 may extend laterally to overlap with the nucleation inhibiting coating 3420 to a greater extent than the second portion 3434. For example, a ratio of $w_3:t_1$ may be in a range of about 1:2 to about 3:1 or about 1:1.2 to about 2.5:1. While the thickness $t_1$ would generally be relatively uniform across the conductive coating 3430, the extent to which the third portion 3436 overlaps with the nucleation inhibiting coating 3420 (namely, $w_3$) may vary to some extent across different portions of the surface 3417. The thickness $t_3$ of the third portion 3436 may be no greater than or less than about 5% of the thickness $t_1$ of the first portion 3432. For example, $t_3$ may be no greater than or less than about 4%, no greater than or less than about 3%, no greater than or less than about 2%, no greater than or less than about 1%, or no greater than or less than about 0.5% of $t_1$. Instead of, or in addition to, the third portion 3436 being formed as a thin film as shown in FIG. 19, the material of the conductive coating 3430 may form as islands or disconnected clusters on a portion of the nucleation inhibiting coating 3420. For example, such islands or disconnected clusters may include features which are physically separated from one another, such that the islands or clusters are not formed as a continuous layer.

Figure 20A:
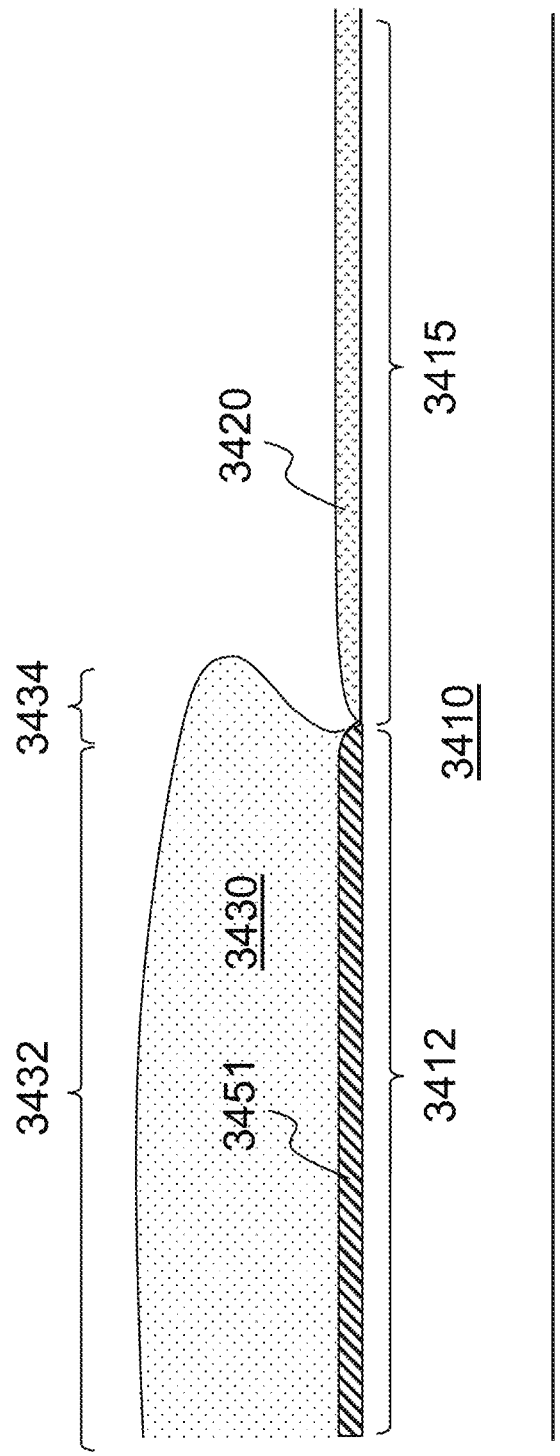
FIG. 20A is a diagram illustrating a cross-sectional profile around an interface of a conductive coating, a nucleation inhibiting coating, and a nucleation promoting coating according to one embodiment.

In yet another embodiment illustrated in FIG. 20A, a nucleation promoting coating 3451 is disposed between the substrate 3410 and the conductive coating 3430. Specifically, the nucleation promoting coating 3451 is disposed between the first portion 3432 of the conducting coating 3430 and the second region 3412 of the substrate 3410. The nucleation promoting coating 3451 is illustrated as being disposed on the second region 3412 of the substrate 3410, and not on the first region 3415 where the nucleation inhibiting coating 3420 is deposited. The nucleation promoting coating 3451 may be formed such that, at an interface or a boundary between the nucleation promoting coating 3451 and the conductive coating 3430, a surface of the nucleation promoting coating 3451 exhibits a relatively high affinity or initial sticking probability for the material of the conductive coating 3430. As such, the presence of the nucleation promoting coating 3451 may promote the formation and growth of the conductive coating 3430 during deposition. Various features of the conductive coating 3430 (including the dimensions of the first portion 3432 and the second portion 3434) and other coatings of FIG. 20A can be similar to those described above for FIG. 18-19 and are not repeated for brevity.

Figure 20B:
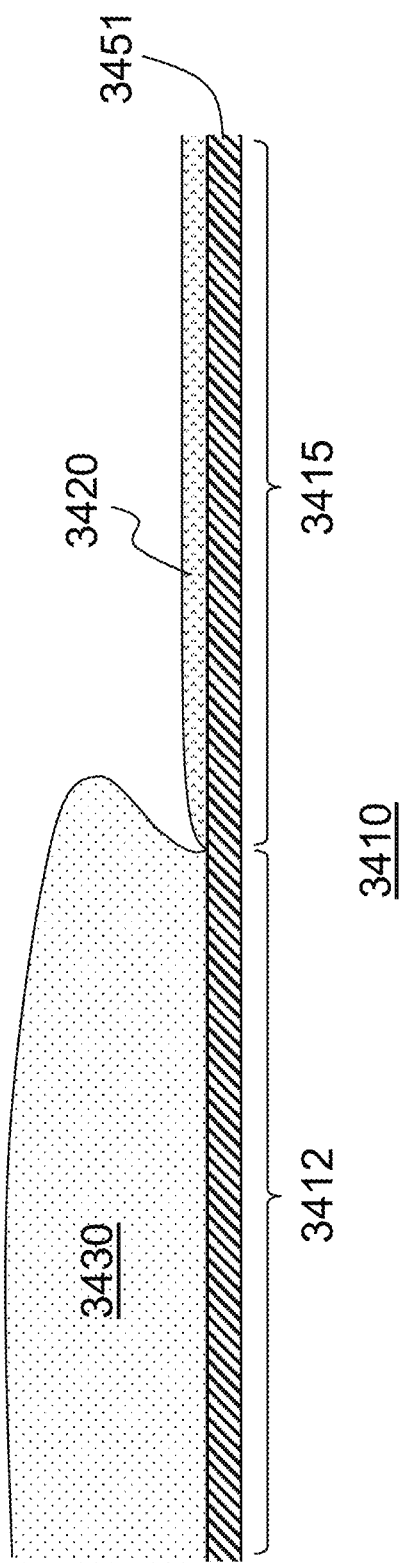
FIG. 20B is a diagram illustrating a cross-sectional profile around an interface of a conductive coating, a nucleation inhibiting coating, and a nucleation promoting coating according to another embodiment.

In yet another embodiment illustrated in FIG. 20B, the nucleation promoting coating 3451 is disposed on both the first region 3415 and the second region 3412 of the substrate 3410, and the nucleation inhibiting coating 3420 covers a portion of the nucleation promoting coating 3451 disposed on the first region 3415. Another portion of the nucleation promoting coating 3451 is exposed from, or is substantially free of or is substantially uncovered by, the nucleation inhibiting coating 3420, and the conductive coating 3430 covers the exposed portion of the nucleation promoting coating 3451. Various features of the conducting coating 3430 and other coatings of FIG. 20B can be similar to those described above for FIG. 18-19 and are not repeated for brevity.

Figure 21:
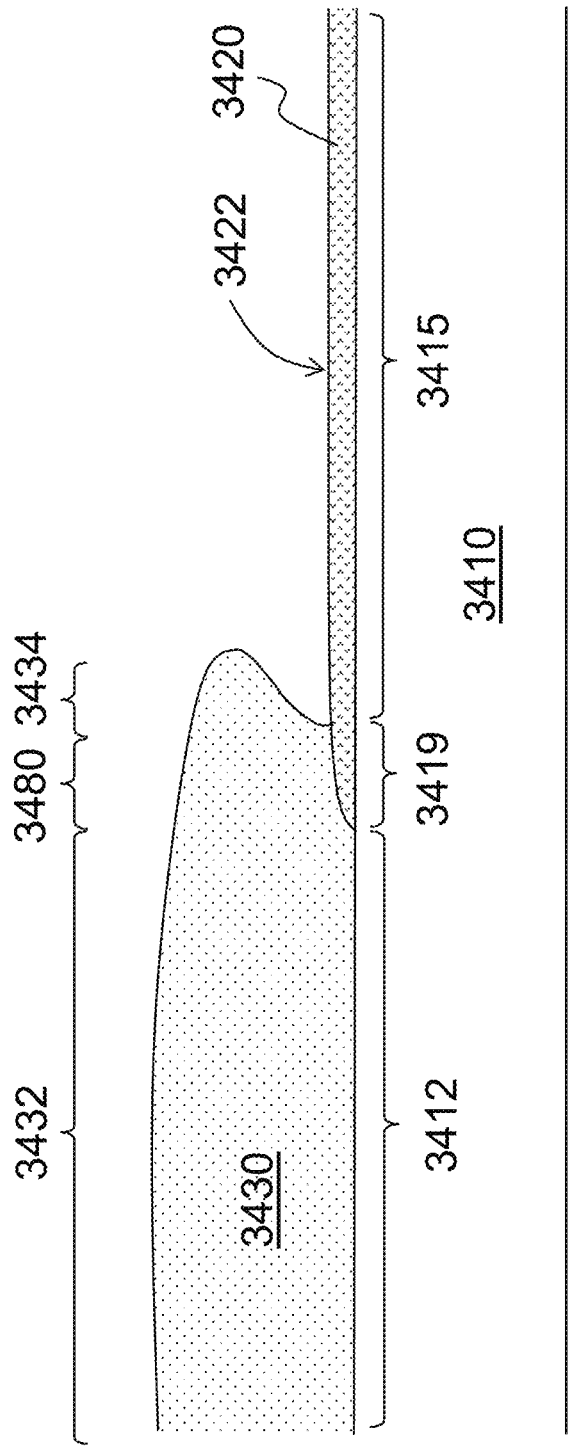
FIG. 21 is a diagram illustrating a cross-sectional profile around an interface of a conductive coating and a nucleation inhibiting coating according to yet another embodiment.

FIG. 21 illustrates a yet another embodiment in which the conductive coating 3430 partially overlaps a portion of the nucleation inhibiting coating 3420 in a third region 3419 of the substrate 3410. Specifically, in addition to the first portion 3432 and the second portion 3434, the conductive coating 3430 further includes a third portion 3480. As illustrated in the figure, the third portion 3480 of the conductive coating 3430 is disposed between the first portion 3432 and the second portion 3434 of the conductive coating 3430, and the third portion 3480 may be in direct physical contact with the surface 3422 of the nucleation inhibiting coating 3420. In this regard, the overlap in the third region 3419 may be formed as a result of lateral growth of the conductive coating 3430 during an open mask or mask-free deposition process. More specifically, while the surface 3422 of the nucleation inhibiting coating 3420 may exhibit a relatively low initial sticking probability for the material of the conductive coating 3430 and thus the probability of the material nucleating on the surface 3422 is low, as the conductive coating 3430 grows in thickness, the coating 3430 may also grow laterally and may cover a portion of the nucleation inhibiting coating 3420 as illustrated in FIG. 21.

While details regarding certain features of the device and the conductive coating 3430 have been omitted in the above description for the embodiments of FIGS. 20A-21, it will be appreciated that descriptions of various features including the gap 3441, the second portion 3434, and the third portion 3436 of the conductive coating 3430 described in relation to FIG. 18 and FIG. 19 would similarly apply to such embodiments.

Figure 22A:
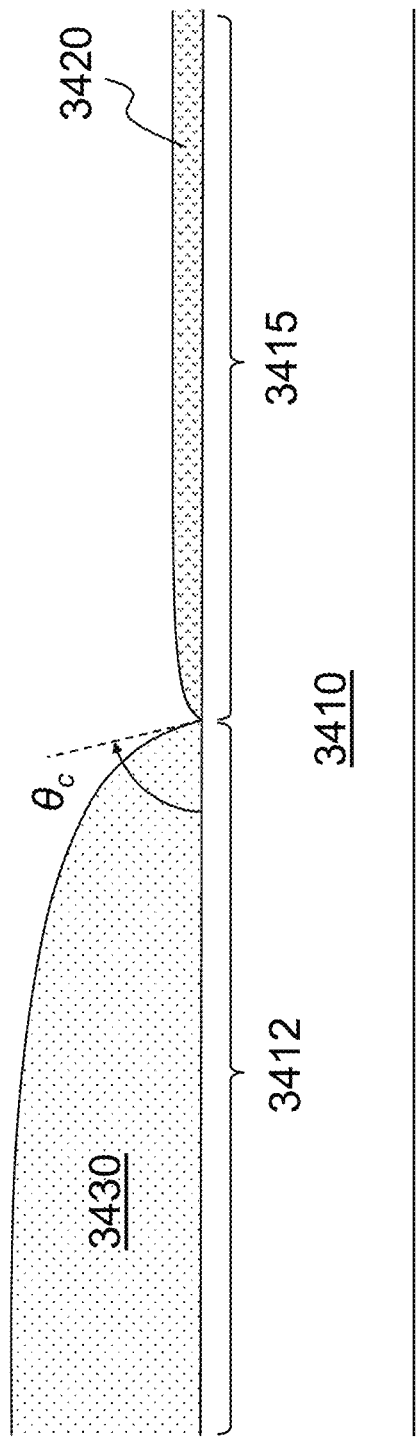
FIG. 22A is a diagram illustrating a cross-sectional profile around an interface of a conductive coating and a nucleation inhibiting coating according to yet another embodiment.

FIG. 22A illustrates a yet another embodiment wherein the first region 3415 of the substrate 3410 is coated with the nucleation inhibiting coating 3420, and the second region 3412 adjacent to the first region 3415 is coated with the conductive coating 3430.

It has been observed that, at least in some cases, conducting the open mask or mask-free deposition of the conductive coating 3430 over a substrate surface which has been partially coated with the nucleation inhibiting coating 3420 can result in the formation of the conductive coating 3430 exhibiting a tapered cross-sectional profile at or near the interface between the conductive coating 3430 and the nucleation inhibiting coating 3420.

FIG. 22A illustrates one embodiment in which the thickness of the conductive coating 3430 is reduced at, near, or adjacent to the interface between the conductive coating 3430 and the nucleation inhibiting coating 3420 due to the tapered profile of the conductive coating 3430. Specifically, the thickness of the conductive coating 3430 at or near the interface is less than the average thickness of the conductive coating 3430. While the tapered profile of the conductive coating 3430 is illustrated as being curved or arched (e.g., with a convex shape) in the embodiment of FIG. 22A, the profile may be substantially linear or non-linear (e.g., with a concave shape) in other embodiments. For example, the thickness of the conductive coating 3430 may decrease in substantially linear, exponential, quadratic, or other manner in the region proximal to the interface.

During the nucleation stage of a thin film formation process, molecules in a vapor phase condense onto a surface of a substrate to form nuclei. Without wishing to be bound by a particular theory, it is postulated that the shapes and sizes of these nuclei and the subsequent growth of these nuclei into islands and then into a thin film, depend on a number of factors, such as the interfacial tensions between the vapor, substrate, and the condensed film nuclei. It is further postulated that, during thin film nucleation and growth at or near the interface between an exposed surface of the substrate and a nucleation inhibiting coating, a relatively large contact angle between the edge of the film and the substrate would be observed due to "dewetting" of the solid surface of the thin film by the nucleation inhibiting coating. This dewetting property is driven by the minimization of surface energy between the substrate, thin film, vapor and nucleation inhibiting coating. Accordingly, it is postulated that the presence of the nucleation inhibiting coating and the properties of the nucleation inhibiting coating have a significant effect on the nuclei formation and the growth mode of the edge of the conductive coating.

It has been observed that a contact angle of the conductive coating 3430 at or near the interface between the conductive coating 3430 and the nucleation inhibiting coating 3420 can vary depending on properties of the nucleation inhibiting coating 3420, such as the relative affinity or the initial sticking probability. It is further postulated that the contact angle of the nuclei may dictate the thin film contact angle of the conductive coating 3430 formed by deposition. Referring to FIG. 22A for example, the contact angle, $\theta_c$, may be determined by measuring a slope of a tangent of an edge of the conductive coating 3430 at or near the interface between the conductive coating 3430 and the nucleation inhibiting coating 3420. In other examples where the cross-sectional taper profile of the conductive coating 3430 is substantially linear, the contact angle may be determined by measuring the slope of the conductive coating 3430 at or near the interface. As would be appreciated, the contact angle is generally measured relative to an angle of the underlying surface of the substrate 3410. For sake of simplicity, the embodiments provided herein have been illustrated to show the coatings deposited on a planar surface, however it will be appreciated that the coatings may be deposited on non-planar surfaces.

Figure 22B:
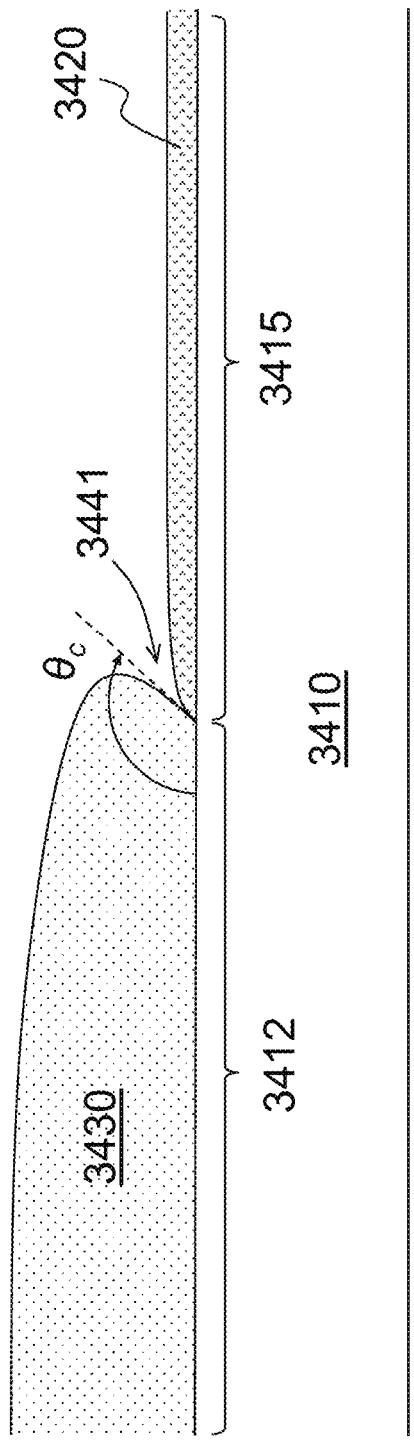
FIG. 22B is a diagram illustrating a cross-sectional profile around an interface of a conductive coating and a nucleation inhibiting coating according to yet another embodiment.

Referring to FIG. 22A, the contact angle of the conductive coating 3430 is shown as about 90 degrees or less. In some embodiments, the contact angle of the conductive coating 3430 may be greater than about 90 degrees. Referring now to FIG. 22B, an embodiment is illustrated wherein the conductive coating 3430 includes a portion extending past the interface between the nucleation inhibiting coating 3420 and the conductive coating 3430, and is spaced apart from the nucleation inhibiting coating 3420 by a gap 3441. In such embodiment, for example, the contact angle, $\theta_c$, may be greater than about 90 degrees.

In at least some applications, it may be particularly advantageous to form a conductive coating 3430 exhibiting a relatively large contact angle. For example, the contact angle may be at least or greater than about 10 degrees, at least or greater than about 15 degrees, at least or greater than about 20 degrees, at least or greater than about 25 degrees, at least or greater than about 30 degrees, at least or greater than about 35 degrees, at least or greater than about 40 degrees, at least or greater than about 50 degrees, at least or greater than about 60 degrees, at least or greater than about 70 degrees, at least or greater than about 75 degrees, or at least or greater than about 80 degrees. For example, conductive coating 3430 having a relatively large contact angle may be particularly advantageous for creating finely patterned features while maintaining a relatively high aspect ratio. In some applications, it may be advantageous to form the conductive coating 3430 exhibiting a contact angle greater than about 90 degrees. For example, the contact angle may be greater than about 90 degrees, at least or greater than about 95 degrees, at least or greater than about 100 degrees, at least or greater than about 105 degrees, at least or greater than about 110 degrees, at least or greater than about 120 degrees, at least or greater than about 130 degrees, at least or greater than about 135 degrees, at least or greater than about 140 degrees, at least or greater than about 145 degrees, at least or greater than about 150 degrees, or at least or greater than about 160 degrees.

As described above, it is postulated that a contact angle of a conductive coating is determined based at least partially on the properties (e.g., initial sticking probability) of a nucleation inhibiting coating disposed adjacent to an area onto which the conductive coating is formed. Accordingly, nucleation inhibiting coating materials which allow selective deposition of a conductive coating exhibiting a relatively large contact angle may be particularly useful in certain applications.

Figure 37:
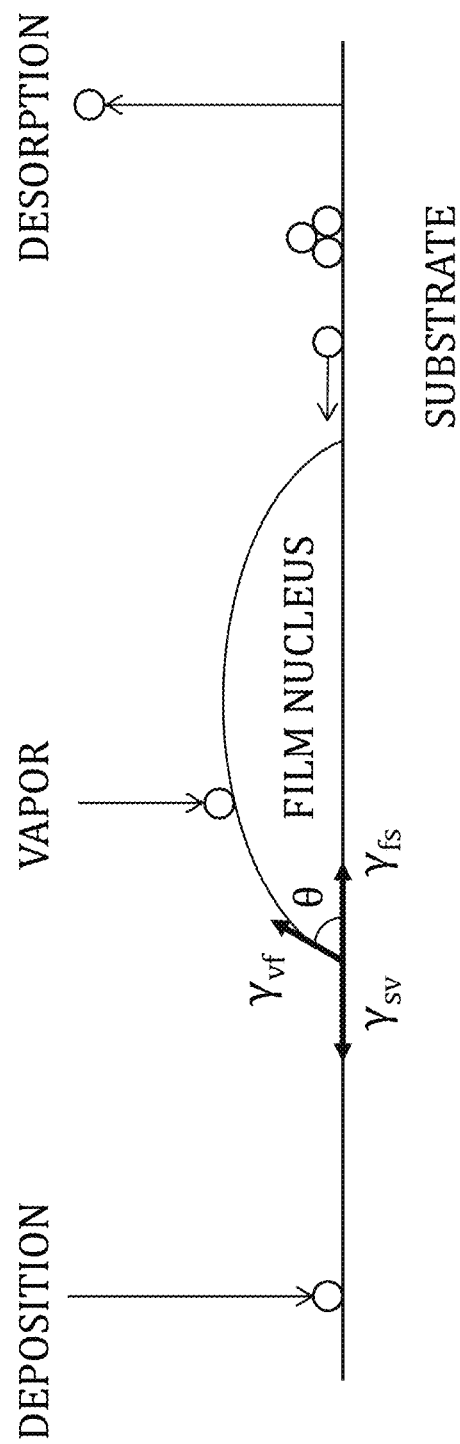
FIG. 37 is a schematic diagram illustrating the formation of a film nucleus.

Without wishing to be bound by a particular theory, it is postulated that the relationship among the various interfacial tensions present during nucleation and growth is dictated according to the following equation, which is also referred to as the Young's equation in capillarity theory:

$$\gamma_{sv} = \gamma_{fs} + \cos\theta$$

wherein $\gamma_{sv}$ corresponds to the interfacial tension between a substrate and a vapor, $\gamma_{fs}$ corresponds to the interfacial tension between a film and the substrate, $\gamma_{vf}$ corresponds to the interfacial tension between the vapor and the film, and $\theta$ is the film nucleus contact angle. FIG. 37 illustrates the relationship among the various parameters represented in Young's equation above.

On the basis of Young's equation, it can be derived that, for island growth, the film nucleus contact angle $\theta$ is greater than zero and therefore $\gamma_{sv} < \gamma_{fs} + \gamma_{vf}$.

For layer growth wherein the deposited film "wets" the substrate, the nucleus contact angle $\theta=0$ and therefore $\gamma_{sv} = \gamma_{fs} + \gamma_{vf}$.

For Stranski-Krastanov (S-K) growth, wherein the strain energy per unit area of the film overgrowth is large with respect to the interfacial tension between the vapor and the film, $\gamma_{sv} > \gamma_{fs} + \gamma_{vf}$.

It is postulated that the nucleation and growth mode of a conductive coating at an interface between a nucleation inhibiting coating and an exposed substrate surface follows the island growth model, wherein $\theta > 0$. Particularly in cases where the nucleation inhibiting coating exhibits a relatively low affinity or low initial sticking probability (e.g., dewetting) towards a material used to form the conductive coating, this low affinity results in a relatively large thin film contact angle of the conductive coating. On the contrary, when a conductive coating is selectively deposited on a surface without the use of a nucleation inhibiting coating, for example, by employing a shadow mask, the nucleation and growth mode of the conductive coating may differ. In particular, it has been observed that the conductive coating formed using a shadow mask patterning process may, at least in some cases, exhibit a relatively small thin film contact angle of less than about 10 degrees.

It will be appreciated that, while not explicitly illustrated, a material used to form the nucleation inhibiting coating 3420 may also be present to some extent at an interface between the conductive coating 3430 and an underlying surface (e.g., a surface of the nucleation promoting layer 3451 or the substrate 3410). Such material may be deposited as a result of a shadowing effect, in which a deposited pattern is not identical to a pattern of a mask and may result in some evaporated material being deposited on a masked portion of a target surface. For example, such material may form as islands or disconnected clusters, or as a thin film having a thickness that is substantially less than an average thickness of the nucleation inhibiting coating 3420.

Figure 22C:
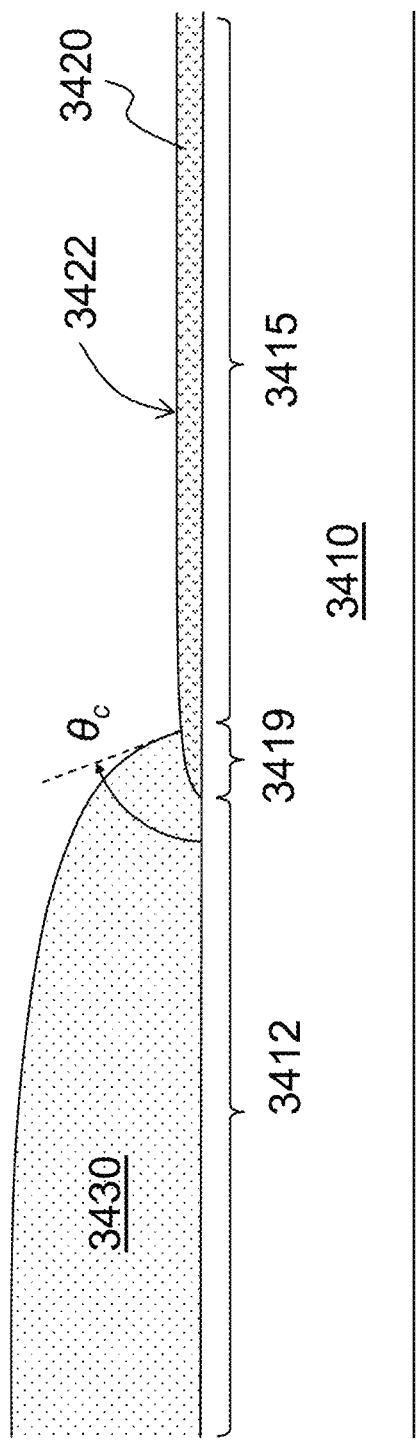
FIG. 22C is a diagram illustrating a cross-sectional profile around an interface of a conductive coating and a nucleation inhibiting coating according to yet another embodiment.
Figure 22D:
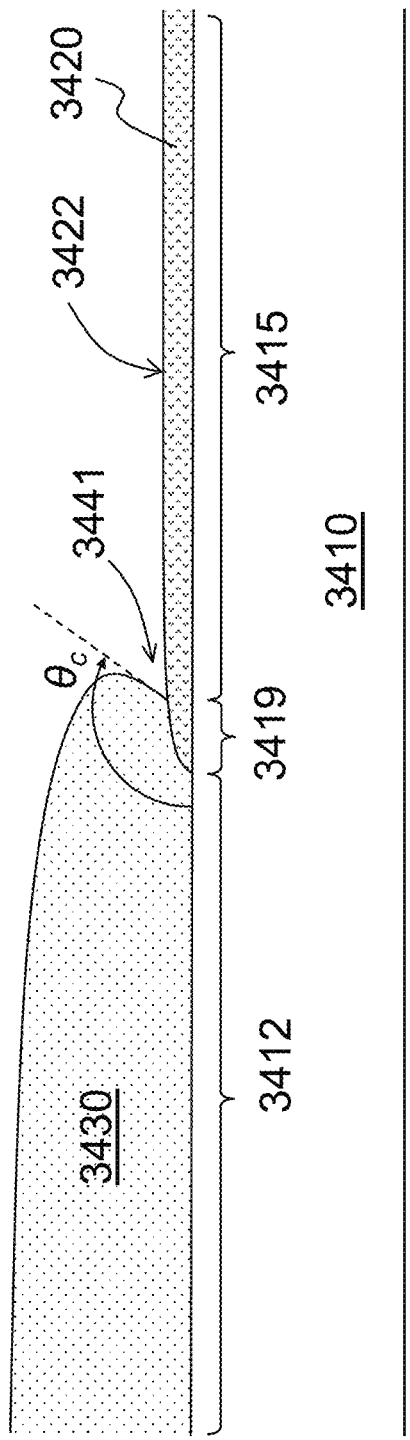
FIG. 22D is a diagram illustrating a cross-sectional profile around an interface of a conductive coating and a nucleation inhibiting coating according to yet another embodiment.

FIGS. 22C and 22D illustrate yet other embodiments in which the conductive coating 3430 partially overlaps a portion of the nucleation inhibiting coating 3420 in the third region 3419, which is disposed between the first region 3415 and the second region 3412. As illustrated in the figures, the portion of the conductive coating 3430 partially overlapping with a portion of the nucleation inhibiting coating 3420 may be in direct physical contact with the surface 3422 of the nucleation inhibiting coating 3420. In this regard, the overlap in the third region 3419 may be formed as a result of lateral growth of the conductive coating 3430 during an open mask or mask-free deposition process. More specifically, while the surface 3422 of the nucleation inhibiting coating 3420 may exhibit a relatively low affinity or initial sticking probability for the material of the conductive coating 3430 and thus the probability of the material nucleating on the surface 3422 is low, as the conductive coating 3430 grows in thickness, the coating 3430 may also grow laterally and may cover a portion of the nucleation inhibiting coating 3420.

In the case of FIGS. 22C and 22D, the contact angle $\theta_c$ of the conductive coating 3430 may be measured at an edge of the conductive coating 3430 near the interface between the conductive coating 3430 and the nucleation inhibiting coating 3420, as illustrated in the figures. Particularly with reference to FIG. 22D, the contact angle $\theta_c$ may be greater than about 90 degrees, which results in a portion of the conductive coating 3430 being spaced apart from the nucleation inhibiting coating 3420 by a gap 3441.

In some embodiments, the nucleation inhibiting coating 3420 may be removed subsequent to deposition of the conductive coating 3430, such that at least a portion of an underlying surface covered by the nucleation inhibiting coating 3420 in the embodiments of FIGS. 18-22D becomes exposed. For example, the nucleation inhibiting coating 3420 may be selectively removed by etching or dissolving the nucleation inhibiting coating 3420, or using plasma or solvent processing techniques without substantially affecting or eroding the conductive coating 3430.

Figure 23B:
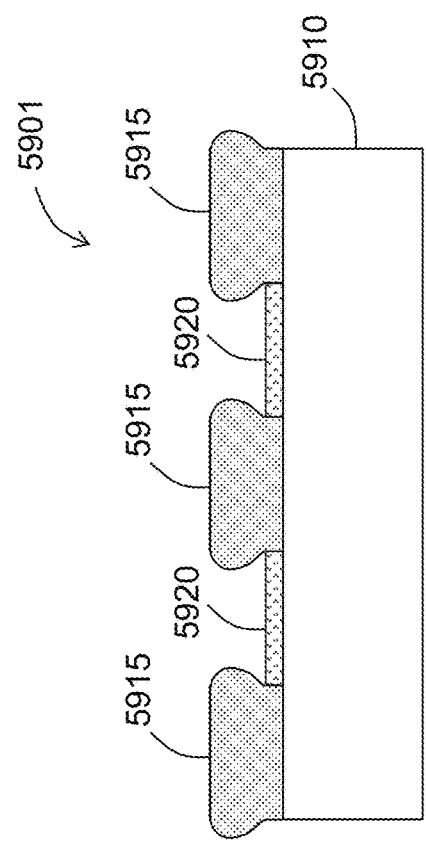
FIG. 23A and FIG. 23B illustrate a process for removing a nucleation inhibiting coating following deposition of a conductive coating according to one embodiment.
Figure 23A:
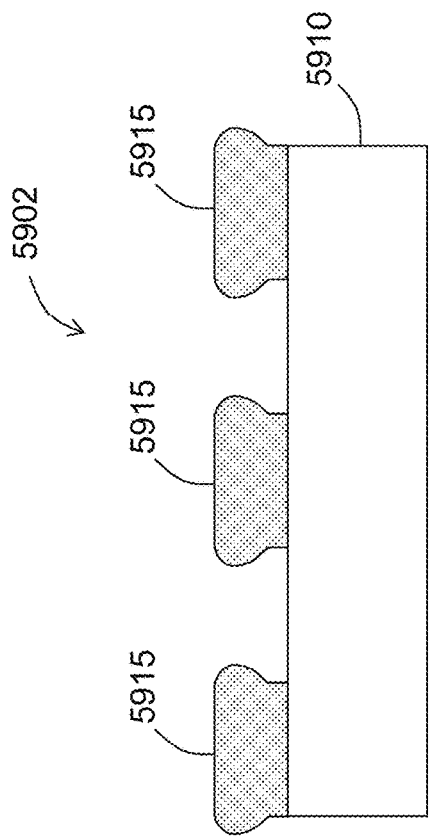

FIG. 23A illustrates a device 5901 according to one embodiment, which includes a substrate 5910 and a nucleation inhibiting coating 5920 and a conductive coating 5915 (e.g., a magnesium coating) deposited over respective regions of a surface of the substrate 5910.

FIG. 23B illustrates a device 5902 after the nucleation inhibiting coating 5920 present in the device 5901 has been removed from the surface of the substrate 5910, such that the conductive coating 5915 remains on the substrate 5910 and regions of the substrate 5910 which were covered by the nucleation inhibiting coating 5920 are now exposed or uncovered. For example, the nucleation inhibiting coating 5920 of the device 5901 may be removed by exposing the substrate 5910 to solvent or plasma which preferentially reacts and/or etches away the nucleation inhibiting coating 5920 without substantially affecting the conductive coating 5915.

A device of some embodiments may be an electronic device, and, more specifically, an opto-electronic device. An opto-electronic device generally encompasses any device that converts electrical signals into photons or vice versa. As such, an organic opto-electronic device can encompass any opto-electronic device where one or more active layers of the device are formed primarily of an organic material, and, more specifically, an organic semiconductor material. Examples of organic opto-electronic devices include, but are not limited to, OLED devices and OPV devices.

It will also be appreciated that organic opto-electronic devices may be formed on various types of base substrates. For example, a base substrate may be a flexible or rigid substrate. The base substrate may include, for example, silicon, glass, metal, polymer (e.g., polyimide), sapphire, or other materials suitable for use as the base substrate.

It will also be appreciated that various components of a device may be deposited using a wide variety of techniques, including vapor deposition, spin-coating, line coating, printing, and various other deposition techniques.

In some embodiments, an organic opto-electronic device is an OLED device, wherein an organic semiconductor layer includes an electroluminescent layer. In some embodiments, the organic semiconductor layer may include additional layers, such as an electron injection layer, an electron transport layer, a hole transport layer, and/or a hole injection layer. For example, the OLED device may be an AMOLED device, PMOLED device, or an OLED lighting panel or module. Furthermore, the opto-electronic device may be a part of an electronic device. For example, the opto-electronic device may be an OLED display module of a computing device, such as a smartphone, a tablet, a laptop, or other electronic device such as a monitor or a television set.

Figure 24:
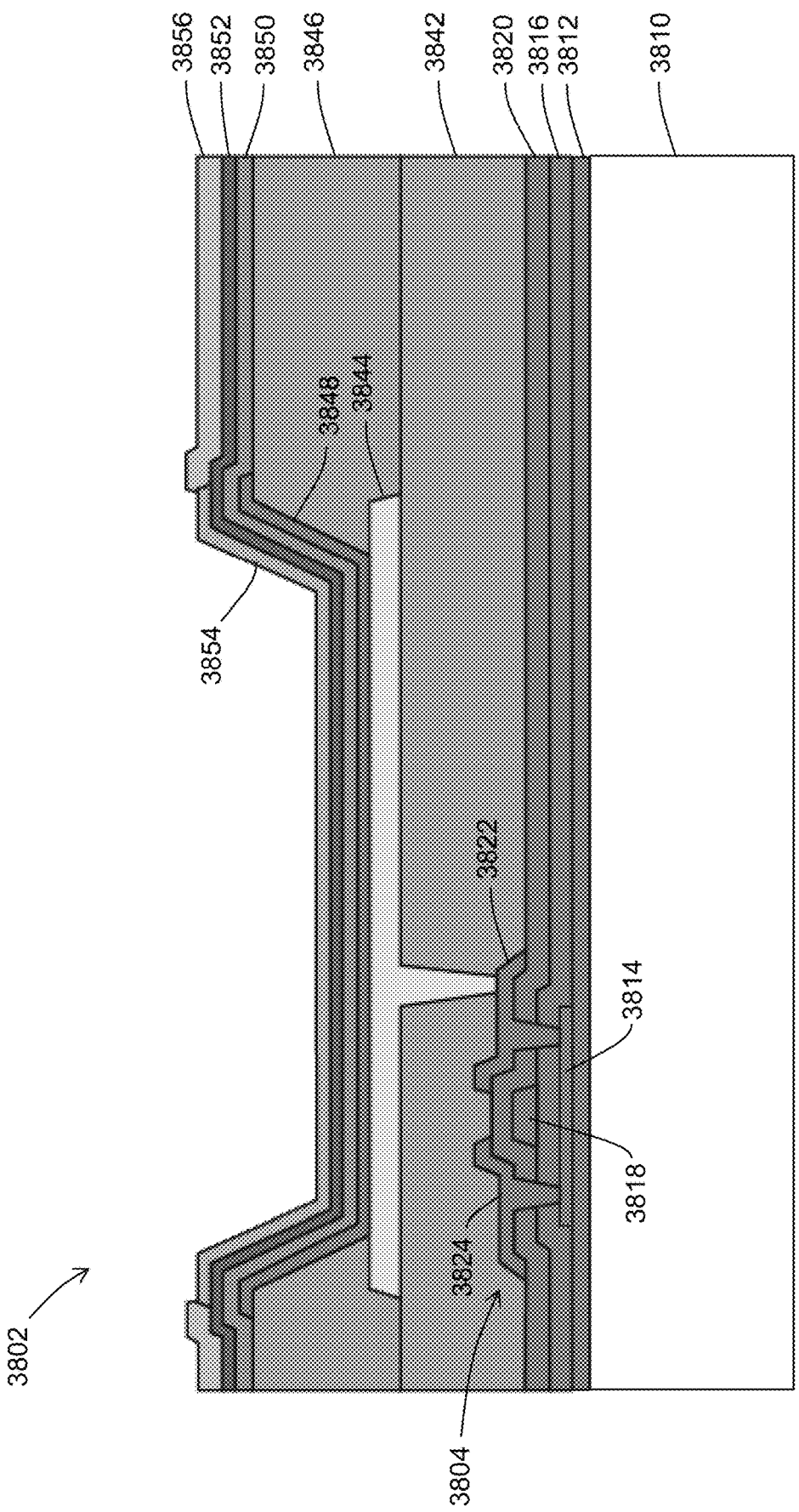
FIG. 24 is a diagram illustrating a cross-sectional profile of an active matrix OLED device according to one embodiment.
Figure 25:
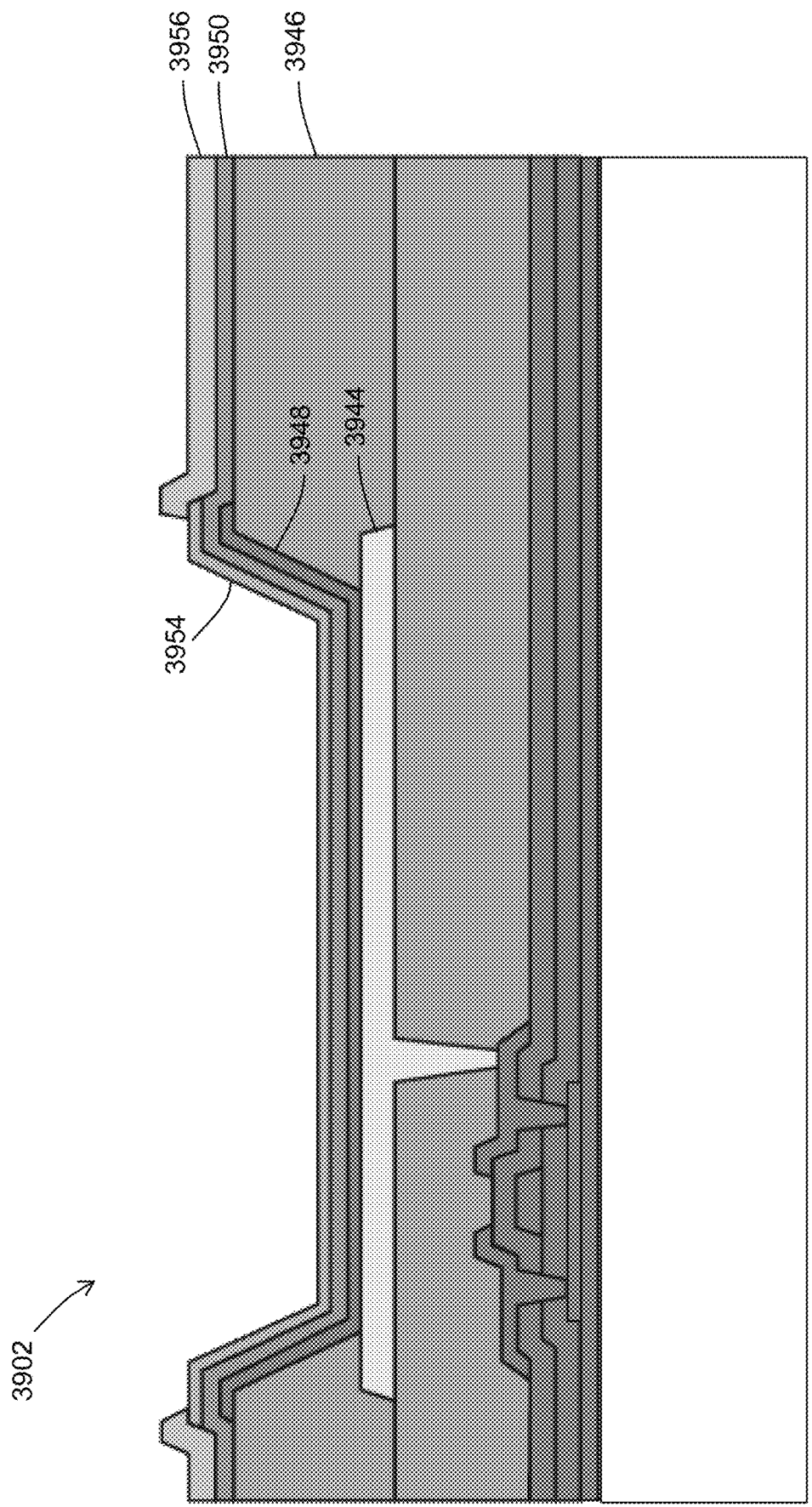
FIG. 25 is a diagram illustrating a cross-sectional profile of an active matrix OLED device according to another embodiment.
Figure 26:
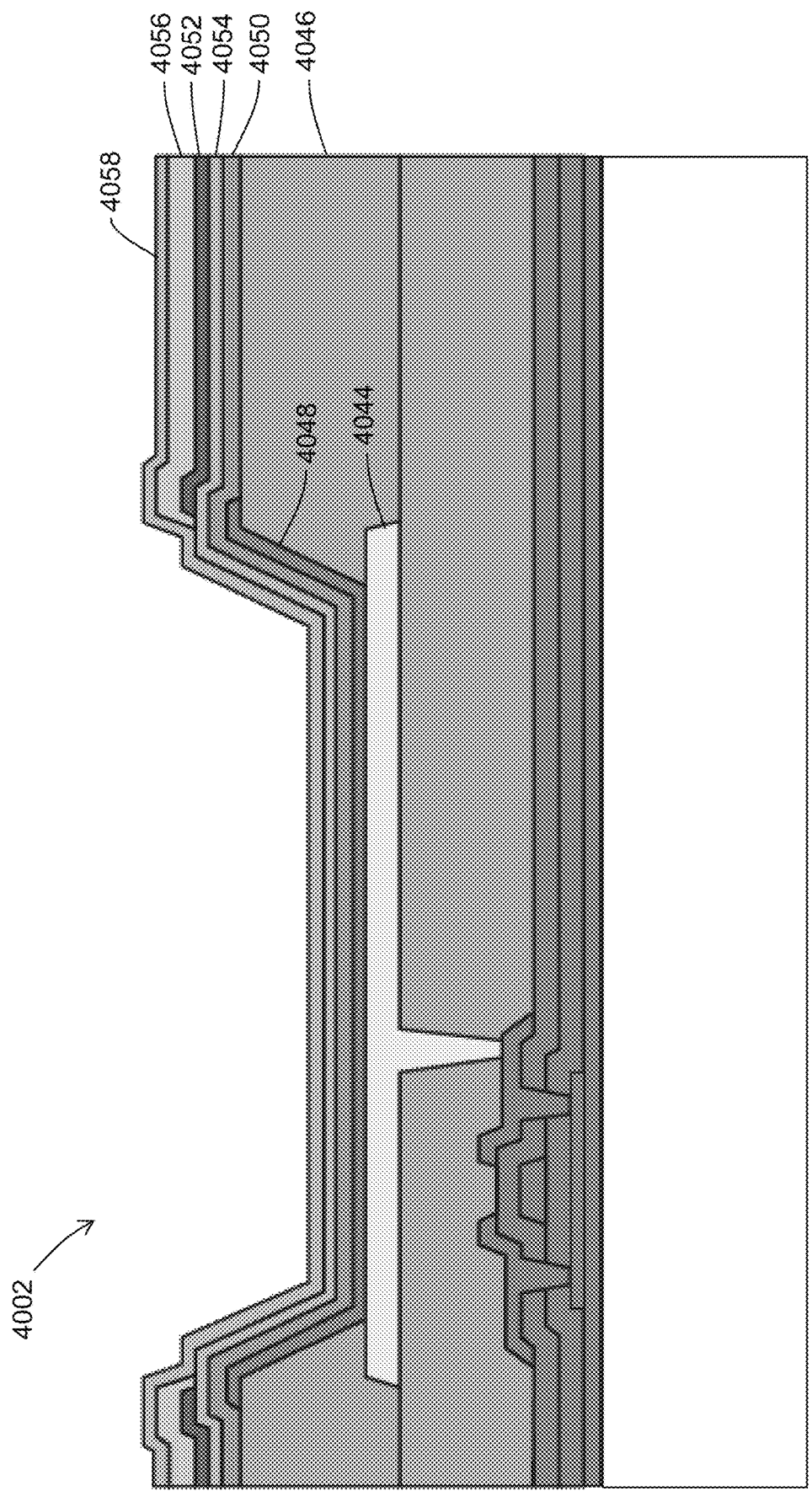
FIG. 26 is a diagram illustrating a cross-sectional profile of an active matrix OLED device according to yet another embodiment.

FIGS. 24-26 illustrate various embodiments of an AMOLED display device. For the sake of simplicity, various details and characteristics of a conductive coating at or near an interface between the conductive coating and a nucleation inhibiting coating described above in reference to FIGS. 18-22D have been omitted. However, it will be appreciated that the features described in reference to FIGS. 18-22D may also be applicable to the embodiments of FIGS. 24-26.

FIG. 24 is a schematic diagram illustrating a structure of an AMOLED device 3802 according to one embodiment.

The device 3802 includes a base substrate 3810, and a buffer layer 3812 deposited over a surface of the base substrate 3810. A TFT 3804 is then formed over the buffer layer 3812. Specifically, a semiconductor active area 3814 is formed over a portion of the buffer layer 3812, and a gate insulating layer 3816 is deposited to substantially cover the semiconductor active area 3814. Next, a gate electrode 3818 is formed on top of the gate insulating layer 3816, and an interlayer insulating layer 3820 is deposited. A source electrode 3824 and a drain electrode 3822 are formed such that they extend through openings formed through the interlayer insulating layer 3820 and the gate insulating layer 3816 to be in contact with the semiconductor active layer 3814. An insulating layer 3842 is then formed over the TFT 3804. A first electrode 3844 is then formed over a portion of the insulating layer 3842. As illustrated in FIG. 24, the first electrode 3844 extends through an opening of the insulating layer 3842 such that it is in electrical communication with the drain electrode 3822. PDLs 3846 are then formed to cover at least a portion of the first electrode 3844, including its outer edges. For example, the PDLs 3846 may include an insulating organic or inorganic material. An organic layer 3848 is then deposited over the first electrode 3844, particularly in regions between neighboring PDLs 3846. A second electrode 3850 is deposited to substantially cover both the organic layer 3848 and the PDLs 3846. A surface of the second electrode 3850 is then substantially covered with a nucleation promoting coating 3852. For example, the nucleation promoting coating 3852 may be deposited using an open mask or a mask-free deposition technique. A nucleation inhibiting coating 3854 is selectively deposited over a portion of the nucleation promoting coating 3852. For example, the nucleation inhibiting coating 3854 may be selectively deposited using a shadow mask. Accordingly, an auxiliary electrode 3856 is selectively deposited over an exposed surface of the nucleation promoting coating 3852 using an open mask or a mask-free deposition process. For further specificity, by conducting thermal deposition of the auxiliary electrode 3856 (e.g., including magnesium) using an open mask or with a mask, the auxiliary electrode 3856 is selectively deposited over the exposed surface of the nucleation promoting coating 3852, while leaving a surface of the nucleation inhibiting coating 3854 substantially free of a material of the auxiliary electrode 3856.

FIG. 25 illustrates a structure of an AMOLED device 3902 according to another embodiment in which a nucleation promoting coating has been omitted. For example, the nucleation promoting coating may be omitted in cases where a surface on which an auxiliary electrode is deposited has a relatively high initial sticking probability for a material of the auxiliary electrode. In other words, for surfaces with a relatively high initial sticking probability, the nucleation promoting coating may be omitted, and a conductive coating may still be deposited thereon. For sake of simplicity, certain details of a backplane including those regarding the TFT are omitted in describing the following embodiments.

In FIG. 25, an organic layer 3948 is deposited between a first electrode 3944 and a second electrode 3950. The organic layer 3948 may partially overlap with portions of PDLs 3946. A nucleation inhibiting coating 3954 is deposited over a portion (e.g., corresponding to an emissive region) of the second electrode 3950, thereby providing a surface with a relatively low initial sticking probability (e.g., a relatively low desorption energy) for a material used to form an auxiliary electrode 3956. Accordingly, the auxiliary electrode 3956 is selectively deposited over a portion of the second electrode 3950 that is exposed from the nucleation inhibiting coating 3954. As would be understood, the auxiliary electrode 3956 is in electrical communication with the underlying second electrode 3950 so as to reduce a sheet resistance of the second electrode 3950. For example, the second electrode 3950 and the auxiliary electrode 3956 may include substantially the same material to ensure a high initial sticking probability for the material of the auxiliary electrode 3956. Specifically, the second electrode 3950 may include substantially pure magnesium (Mg) or an alloy of magnesium and another metal, such as silver (Ag). For Mg:Ag alloy, an alloy composition may range from about 1:9 to about 9:1 by volume. The auxiliary electrode 3956 may include substantially pure magnesium.

FIG. 26 illustrates a structure of an AMOLED device 4002 according to yet another embodiment. In the illustrated embodiment, an organic layer 4048 is deposited between a first electrode 4044 and a second electrode 4050 such that it partially overlaps with portions of PDLs 4046. A nucleation inhibiting coating 4054 is deposited so as to substantially cover a surface of the second electrode 4050, and a nucleation promoting coating 4052 is selectively deposited on a portion of the nucleation inhibiting coating 4054. An auxiliary electrode 4056 is then formed over the nucleation promoting coating 4052. Optionally, a capping layer 4058 may be deposited to cover exposed surfaces of the nucleation inhibiting coating 4054 and the auxiliary electrode 4056.

While the auxiliary electrode 3856 or 4056 is illustrated as not being in direct physical contact with the second electrode 3850 or 4050 in the embodiments of FIGS. 24 and 26, it will be understood that the auxiliary electrode 3856 or 4056 and the second electrode 3850 or 4050 may nevertheless be in electrical communication. For example, the presence of a relatively thin film (e.g., up to about 100 nm) of a nucleation promoting material or a nucleation inhibiting material between the auxiliary electrode 3856 or 4056 and the second electrode 3850 or 4050 may still sufficiently allow a current to pass therethrough, thus allowing a sheet resistance of the second electrode 3850 or 4050 to be reduced.

Figure 27:
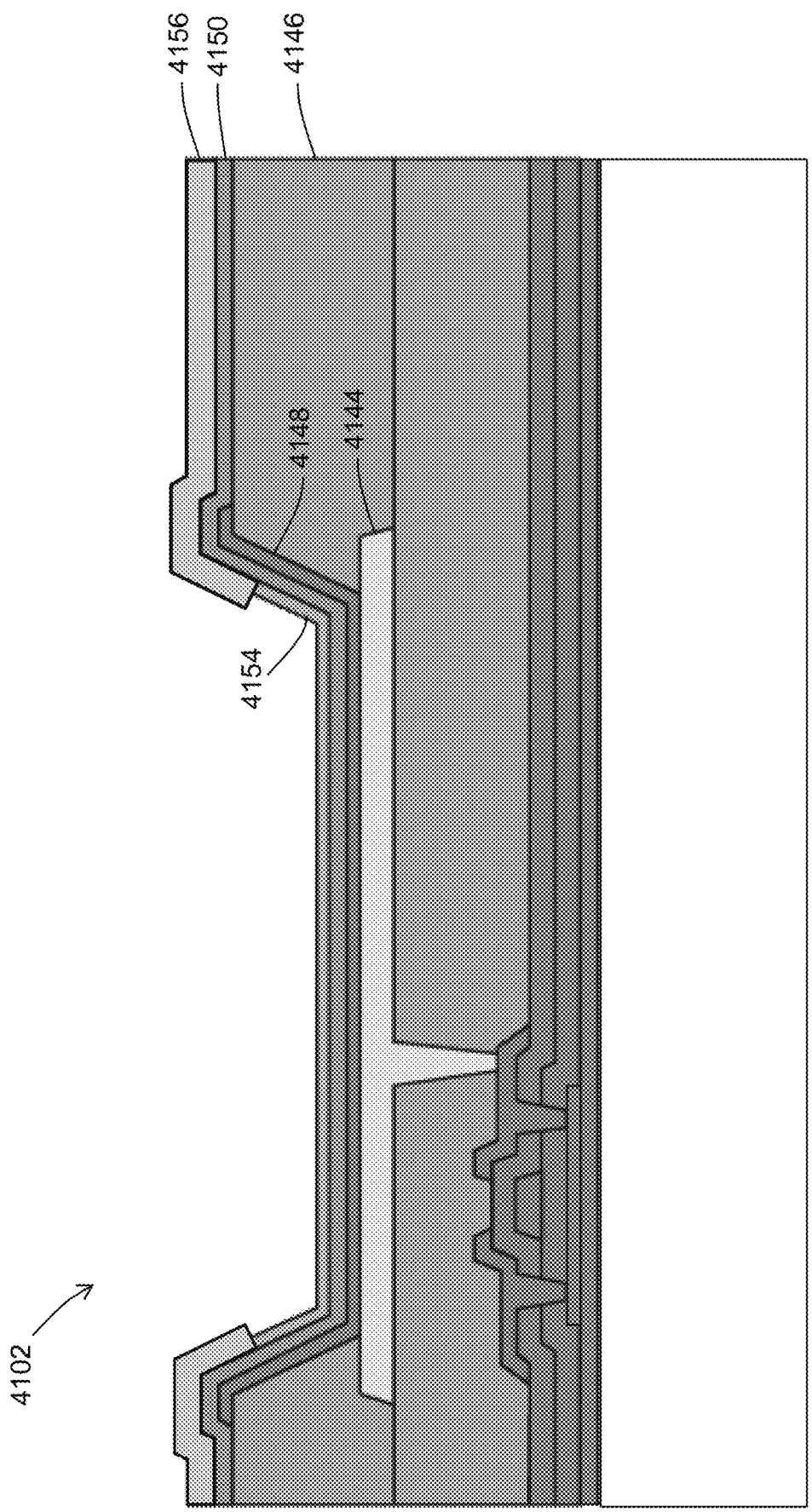
FIG. 27 is a diagram illustrating a cross-sectional profile of an active matrix OLED device according to yet another embodiment.

FIG. 27 illustrates a structure of an AMOLED device 4102 according to yet another embodiment in which an interface between a nucleation inhibiting coating 4154 and an auxiliary electrode 4156 is formed on a slanted surface created by PDLs 4146. The device 4102 includes an organic layer 4148 deposited between a first electrode 4144 and a second electrode 4150, and the nucleation inhibiting coating 4154 is deposited over a portion of the second electrode 4150 which corresponds to an emissive region of the device 4102. The auxiliary electrode 4156 is deposited over portions of the second electrode 4150 that are exposed from the nucleation inhibiting coating 4154.

While not shown, the AMOLED device 4102 of FIG. 27 may further include a nucleation promoting coating disposed between the auxiliary electrode 4156 and the second electrode 4150. The nucleation promoting coating may also be disposed between the nucleation inhibiting coating 4154 and the second electrode 4150, particularly in cases where the nucleation promoting coating is deposited using an open mask or a mask-free deposition process.

Figure 28A:
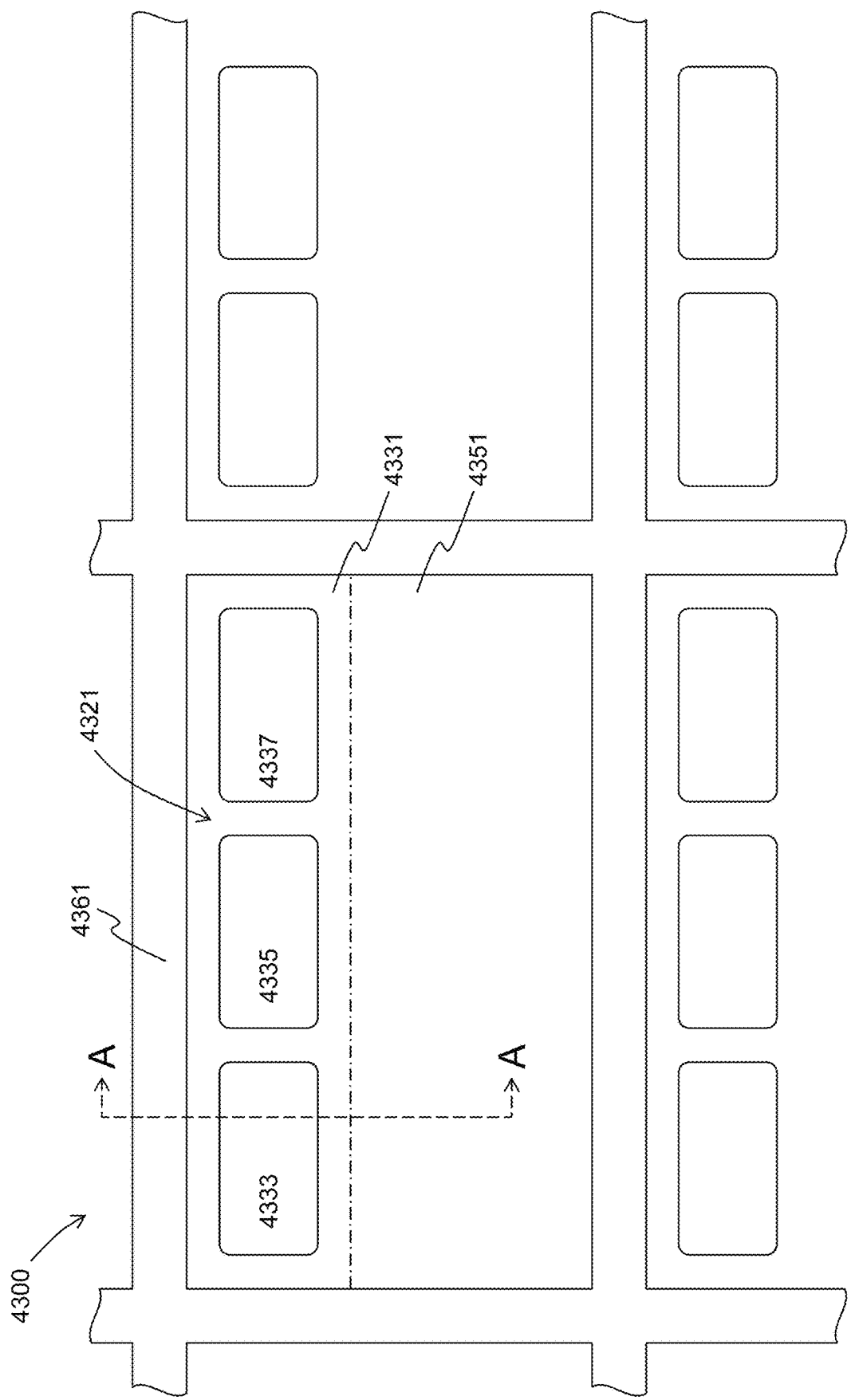
FIG. 28A is a diagram illustrating a transparent active matrix OLED device according to one embodiment.

FIG. 28A illustrates a portion of an AMOLED device 4300 according to yet another embodiment wherein the AMOLED device 4300 includes a plurality of light transmissive regions. As illustrated, the AMOLED device 4300 includes a plurality of pixels 4321 and an auxiliary electrode 4361 disposed between neighboring pixels 4321. Each pixel 4321 includes a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transparent to allow light to pass through the device 4300.

FIG. 28B illustrates a cross-sectional view of the device 4300 taken along line A-A as indicated in FIG. 28A. Briefly, the device 4300 includes a base substrate 4310, a TFT 4308, an insulating layer 4342, and an anode 4344 formed on the insulating layer 4342 and in electrical communication with the TFT 4308. A first PDL 4346a and a second PDL 4346b are formed over the insulating layer 4342 and cover edges of the anode 4344. One or more organic layers 4348 are deposited to cover an exposed region of the anode 4344 and portions of the PDLs 4346a, 4346b. A cathode 4350 is then deposited over the one or more organic layers 4348. Next, a nucleation inhibiting coating 4354 is deposited to cover portions of the device 4300 corresponding to the light transmissive region 4351 and the subpixel region 4331. The entire device surface is then exposed to magnesium vapor flux, thus causing selective deposition of magnesium over an uncoated region of the cathode 4350. In this way, the auxiliary electrode 4361, which is in electrical contact with the underlying cathode 4350, is formed.

In the device 4300, the light transmissive region 4351 is substantially free of any materials which may substantially affect the transmission of light therethrough. In particular, the TFT 4308, the anode 4344, and the auxiliary electrode 4361 are all positioned within the subpixel region 4331 such that these components do not attenuate or impede light from being transmitted through the light transmissive region 4351. Such arrangement allows a viewer viewing the device 4300 from a typical viewing distance to see through the device 4300 when the pixels are off or are non-emitting, thus creating a transparent AMOLED display.

While not shown, the AMOLED device 4300 of FIG. 28B may further include a nucleation promoting coating disposed between the auxiliary electrode 4361 and the cathode 4350. The nucleation promoting coating may also be disposed between the nucleation inhibiting coating 4354 and the cathode 4350.

In other embodiments, various layers or coatings, including the organic layers 4348 and the cathode 4350, may cover a portion of the light transmissive region 4351 if such layers or coatings are substantially transparent. Alternatively, the PDLs 4346a, 4346b may not be provided in the light transmissive region 4351, if desired.

It will be appreciated that pixel and subpixel arrangements other than the arrangement illustrated in FIGS. 28A and 28B may also be used, and the auxiliary electrode 4361 may be provided in other regions of a pixel. For example, the auxiliary electrode 4361 may be provided in the region between the subpixel region 4331 and the light transmissive region 4351, and/or be provided between neighbouring subpixels, if desired.

Figure 29A:
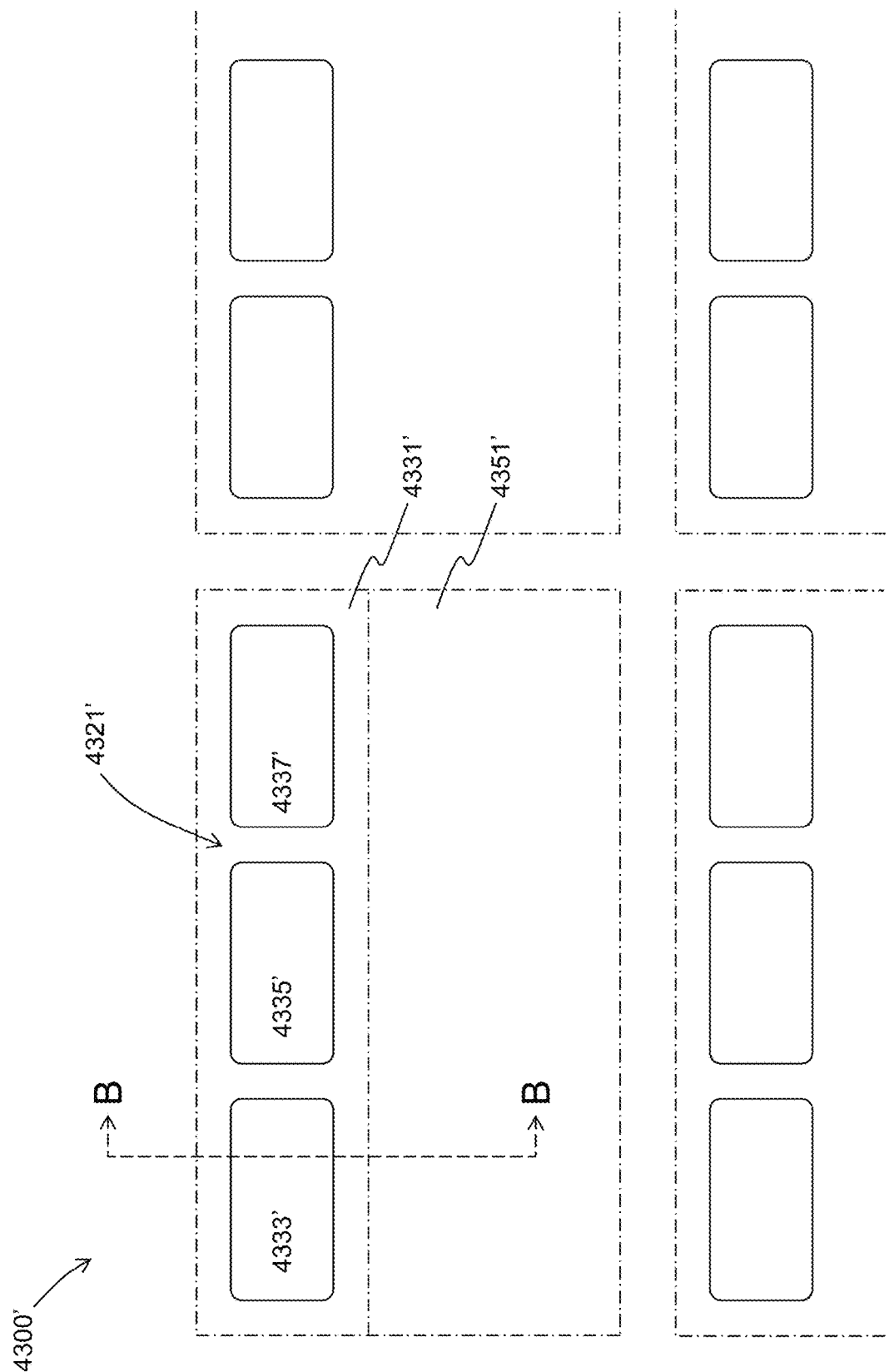
FIG. 29A is a diagram illustrating a transparent active matrix OLED device according to one embodiment.

FIG. 29A illustrates a portion of an AMOLED device 4300' according to yet another embodiment wherein the AMOLED device 4300' includes a plurality of light transmissive regions. As illustrated, the AMOLED device 4300' includes a plurality of pixels 4321'. Each pixel 4321' includes a subpixel region 4331', which further includes a plurality of subpixels 4333', 4335', 4337', and a light transmissive region 4351'. For example, the subpixel 4333' may correspond to a red subpixel, the subpixel 4335' may correspond to a green subpixel, and the subpixel 4337' may correspond to a blue subpixel. As will be explained, the light transmissive region 4351' is substantially transparent to allow light to pass through the device 4300'.

Figure 29B:
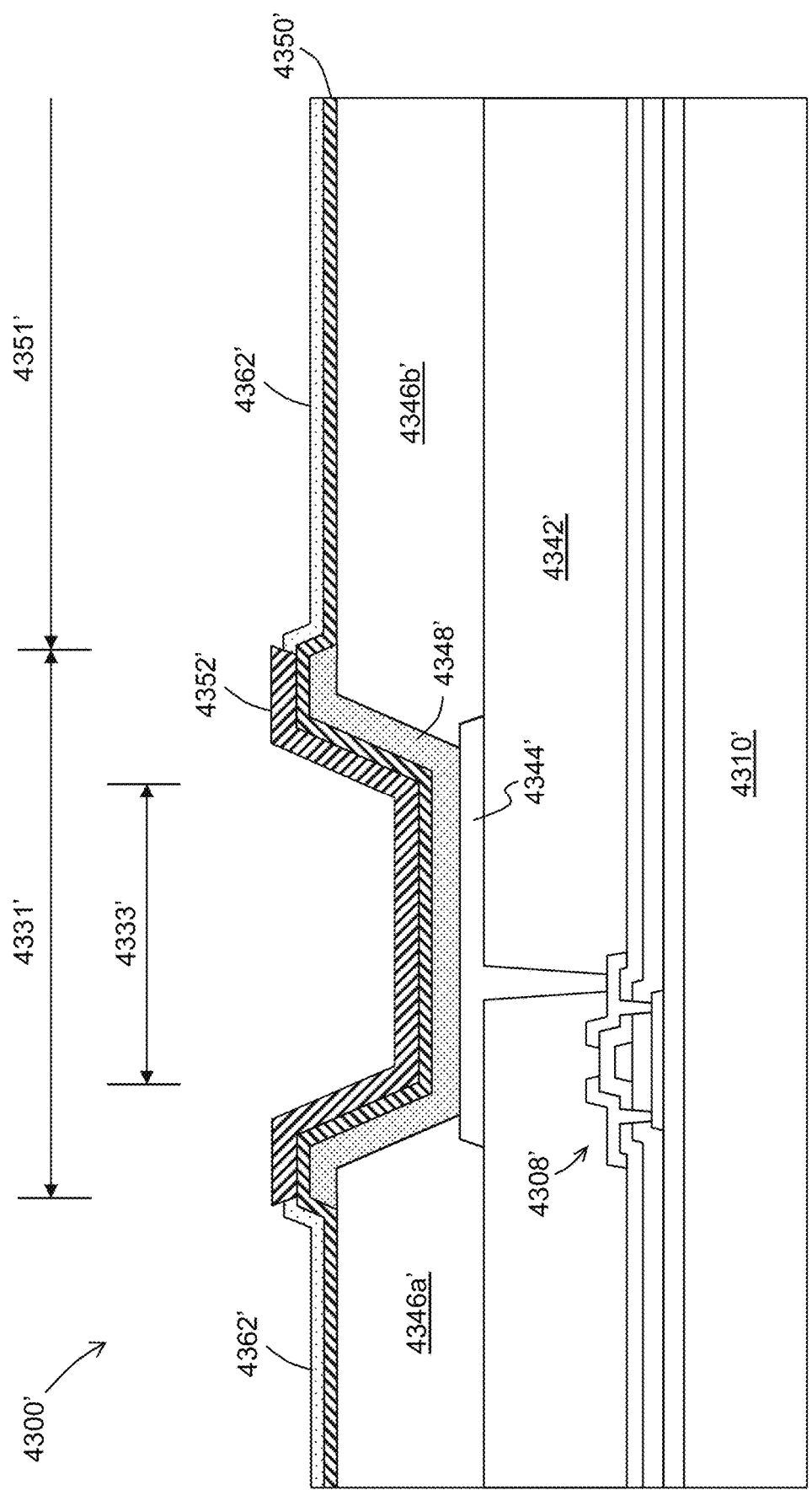
FIG. 29B is a diagram illustrating a cross-sectional profile of the device according to one embodiment of FIG. 29A.

FIG. 29B illustrates a cross-sectional view of the device 4300' taken along line B-B according to one embodiment. The device 4300' includes a base substrate 4310', a TFT 4308', an insulating layer 4342', and an anode 4344' formed on the insulating layer 4342' and in electrical communication with the TFT 4308'. A first PDL 4346a' and a second PDL 4346b' are formed over the insulating layer 4342' and cover the edges of the anode 4344'. One or more organic layers 4348' are deposited to cover an exposed region of the anode 4344' and portions of the PDLs 4346a', 4346b'. A first conductive coating 4350' is then deposited over the one or more organic layers 4348'. In the illustrated embodiment, the first conductive coating 4350' is disposed over both the subpixel region 4331' and the light transmissive region 4351'. In such embodiment, the first conductive coating 4350' may be substantially transparent or light-transmissive. For example, the thickness of the first conductive coating 4350' may be relatively thin such that the presence of the first conductive coating 4350' does not substantially attenuate transmission of light through the light transmissive region 4351'. The first conductive coating 4350' may, for example, be deposited using an open mask or mask-free deposition process. Next, a nucleation inhibiting coating 4362' is deposited to cover portions of the device 4300' corresponding to the light transmissive region 4351'. The entire device surface is then exposed to a vapor flux of material for forming the second conductive coating 4352', thus causing selective deposition of the second conductive coating 4352' over an uncoated region of the first conductive coating 4350'. Specifically, the second conductive coating 4352' is disposed over a portion of the device 4300' corresponding to the subpixel region 4331'. In this way, a cathode for the device 4300' is formed by the combination of the first conductive coating 4350' and the second conductive coating 4352'.

In some embodiments, the thickness of the first conductive coating 4350' is less than the thickness of the second conductive coating 4352'. In this way, relatively high light transmittance may be maintained in the light transmissive region 4351'. For example, the thickness of the first conductive coating 4350' may be up to or less than about 30 nm, up to or less than about 25 nm, up to or less than about 20 nm, up to or less than about 15 nm, up to or less than about 10 nm, up to or less than about 8 nm, or up to or less than about 5 nm, and the thickness of the second conductive coating 4352' may be up to or less than about 30 nm, up to or less than about 25 nm, up to or less than about 20 nm, up to or less than about 15 nm, up to or less than about 10 nm, or up to or less than about 8 nm. In other embodiments, the thickness of the first conductive coating 4350' is greater than the thickness of the second conductive coating 4352'. In yet another embodiment, the thickness of the first conductive coating 4350' and the thickness of the second conductive coating 4352' may be substantially the same.

The material(s) which may be used to form the first conductive coating 4350' and the second conductive coating 4352' may be substantially the same as those used to form conductive coatings in above-described embodiments. Since such materials have been described above in relation to other embodiments, descriptions of these materials are omitted for sake of brevity.

In the device 4300', the light transmissive region 4351' is substantially free of any materials which may substantially affect the transmission of light therethrough. In particular, the TFT 4308', the anode 4344', and the conductive coating 4352' are all positioned within the subpixel region 4331 such that these components do not attenuate or impede light from being transmitted through the light transmissive region 4351'. Such arrangement allows a viewer viewing the device 4300' from a typical viewing distance to see through the device 4300' when the pixels are off or are non-emitting, thus creating a transparent AMOLED display.

Figure 29C:
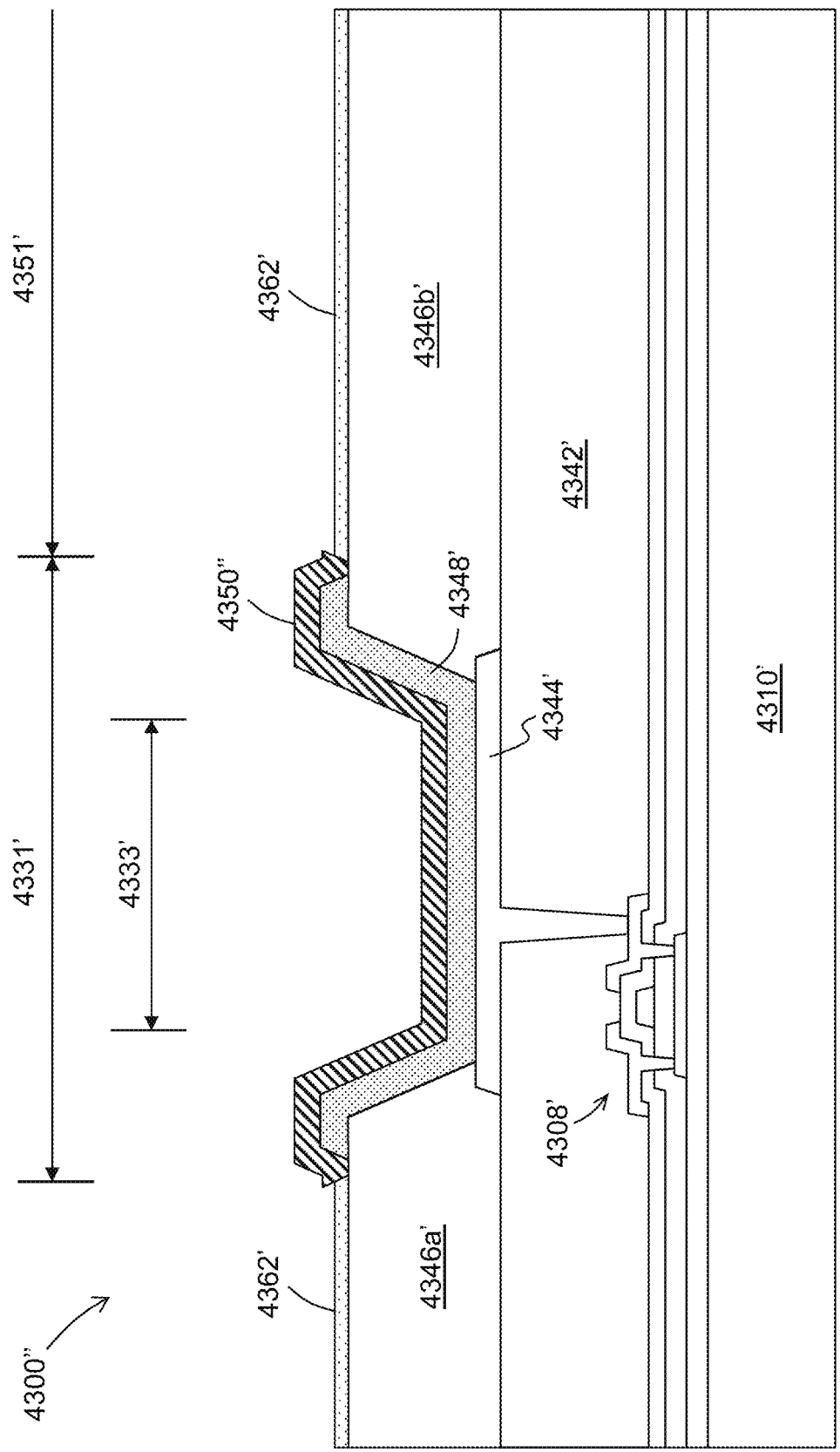
FIG. 29C is a diagram illustrating a cross-sectional profile of the device according to another embodiment of FIG. 29A.

FIG. 29C illustrates the cross-section of a device 4300" according to another embodiment, wherein a first conductive coating 4350" is selectively disposed in the subpixel region 4331' and the light transmissive region 4351' is substantially free of, or exposed from, the material used to form the first conductive coating 4350". For example, during fabrication of the device 4300", the nucleation inhibiting coating 4362' may be deposited in the light transmissive region 4351' prior to depositing the first conductive coating 4350". In this way, the first conductive coating 4350" may be selectively deposited in the subpixel region 4331' using an open mask or mask-free deposition process. As explained above, the material used to form the first conductive coating 4350" generally exhibits a relatively poor affinity (e.g., low initial sticking probability) towards being deposited onto the surface of the nucleation inhibiting coating 4362'. For example, the first conductive coating 4350" may comprise high vapor pressure materials, such as Yb, Zn, Cd and Mg. In some embodiments, the first conductive coating 4350" may comprise pure or substantially pure magnesium. By providing a light transmissive region 4351' that is free or substantially free of the first conductive coating 4350", the light transmittance in such region may be favorably enhanced in some cases, for example in comparison to the device 4300' of FIG. 29B.

While not shown, the AMOLED device 4300' of FIG. 29B and the AMOLED device 4300" of FIG. 29C may each further include a nucleation promoting coating disposed between the first conductive coating 4350' or 4350" and the underlying surfaces (e.g., the organic layer 4348'). Such nucleation promoting coating may also be disposed between the nucleation inhibiting coating 4362' and the underlying surfaces (e.g., the PDLs 4346a'-b').

In some embodiments, the nucleation inhibiting coating 4362' may be formed concurrently with at least one of the organic layers 4348'. For example, the material for forming the nucleation inhibiting coating 4362' may also be used to form at least one of the organic layers 4348'. In this way, the number of stages for fabricating the device 4300' or 4300" may be reduced.

In some embodiments, additional conductive coatings, including the second conductive coating 4352' and a third conductive coating may also be provided over subpixels 4333', 4335', and 4337'. Additionally, in some embodiments, an auxiliary electrode may also be provided in non-emissive regions of the device 4300', 4300". For example, such auxiliary electrode may be provided in the regions between neighboring pixels 4321' such that it does not substantially affect the light transmittance in the subpixel regions 4331' or the light transmissive regions 4351'. The auxiliary electrode may also be provided in the region between the subpixel region 4331' and the light transmissive region 4351', and/or be provided between neighboring subpixels, if desired. For example, referring to the embodiment of FIG. 29B, an additional nucleation inhibiting coating may be deposited over a portion of the second conductive coating 4352' corresponding to the subpixel 4333' region, while leaving a portion corresponding to the non-emissive region uncovered or exposed. In this way, an open mask or mask-free deposition of a conductive material may be conducted to result in an auxiliary electrode being formed over the non-emissive regions of the device 4300'.

In some embodiments, various layers or coatings, including the organic layers 4348', may cover a portion of the light transmissive region 4351' if such layers or coatings are substantially transparent. Alternatively, the PDLs 4346a', 4346b' may be omitted from the light transmissive region 4351', if desired.

It will be appreciated that pixel and subpixel arrangements other than the arrangement illustrated in FIG. 29A, FIG. 29B, and FIG. 29C may also be used.

In the foregoing embodiments, a nucleation inhibiting coating may, in addition to inhibiting nucleation and deposition of a conductive material (e.g., magnesium) thereon, act to enhance an out-coupling of light from a device. Specifically, the nucleation inhibiting coating may act as an index-matching coating and/or an anti-reflective coating.

A barrier coating (not shown) may be provided to encapsulate the devices illustrated in the foregoing embodiments depicting AMOLED display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, CVD, sputtering, ALD, any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

A sheet resistance specification for a common electrode of an AMOLED display device may vary according to a size of the display device (e.g., a panel size) and a tolerance for voltage variation. In general, the sheet resistance specification increases (e.g., a lower sheet resistance is specified) with larger panel sizes and lower tolerances for voltage variation across a panel.

The sheet resistance specification and an associated thickness of an auxiliary electrode to comply with the specification according to an embodiment were calculated for various panel sizes. The sheet resistances and the auxiliary electrode thicknesses were calculated for voltage tolerances of 0.1 V and 0.2 V. For the purpose of the calculation, an aperture ratio of 0.64 was assumed for all display panel sizes.

The specified thickness of the auxiliary electrode at example panel sizes are summarized in Table 2 below.

TABLE 2

| Specified thickness of auxiliary electrode for various panel sizes | | | | | | |
|---|---|---|---|---|---|---|
| Panel Size (inch) | | 9.7 | 12.9 | 15.4 | 27 | 65 |
| Specified Thickness (nm) | @0.1 V | 132 | 239 | 335 | 1100 | 6500 |
| | @0.2 V | 67 | 117 | 174 | 516 | 2800 |

As will be understood, various layers and portions of a backplane, including a TFT (e.g., TFT 3804 shown in FIG. 24) may be fabricated using a variety of suitable materials and processes. For example, the TFT may be fabricated using organic or inorganic materials, which may be deposited and/or processed using techniques such as CVD, PECVD, laser annealing, and PVD (including sputtering). As would be understood, such layers may be patterned using photolithography, which uses a photomask to expose selective portions of a photoresist covering an underlying device layer to UV light. Depending on the type of photoresist used, exposed or unexposed portions of the photomask may then be washed off to reveal desired portion(s) of the underlying device layer. A patterned surface may then be etched, chemically or physically, to effectively remove an exposed portion of the device layer.

Furthermore, while a top-gate TFT has been illustrated and described in certain embodiments above, it will be appreciated that other TFT structures may also be used. For example, the TFT may be a bottom-gate TFT. The TFT may be an n-type TFT or a p-type TFT. Examples of TFT structures include those utilizing a-Si, IGZO, and LTPS.

Various layers and portions of a frontplane, including electrodes, one or more organic layers, a PDL, and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink or vapor jet printing and reel-to-reel printing), OVPD, and LITI patterning.

Selective Deposition of a Conductive Coating over Emissive Regions

In one aspect, a method for selectively depositing a conductive coating over one or more emissive regions is provided. In some embodiments, the method includes depositing a first conductive coating on a substrate. The substrate may include a first emissive region and a second emissive region. The first conductive coating deposited on the substrate may include a first portion coating the first emissive region and a second portion coating the second emissive region of the substrate. The method may further include depositing a first nucleation inhibiting coating on the first portion of the first conductive coating, and then depositing a second conductive coating on the second portion of the first conductive coating.

Figure 30:
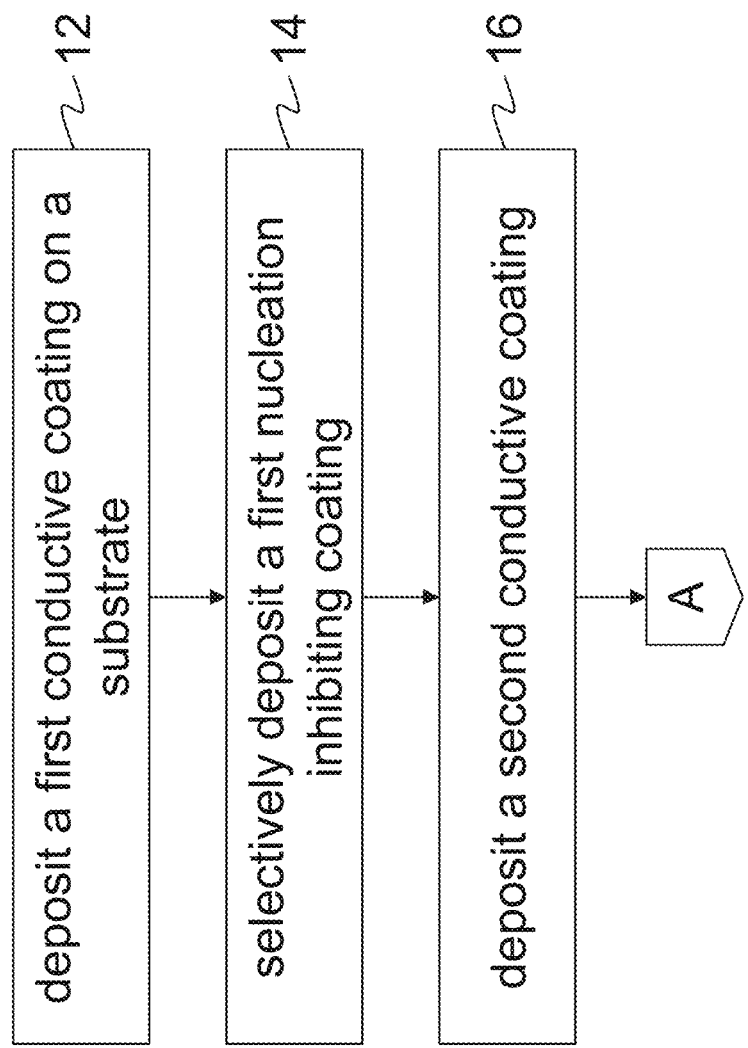
FIG. 30 is a flow diagram illustrating the stages for fabricating a device according to one embodiment.

FIG. 30 is a flow diagram outlining stages of manufacturing a device according to one embodiment. FIGS. 31A-31D are schematic diagrams illustrating the device at each stage of the process.

Figure 31A:
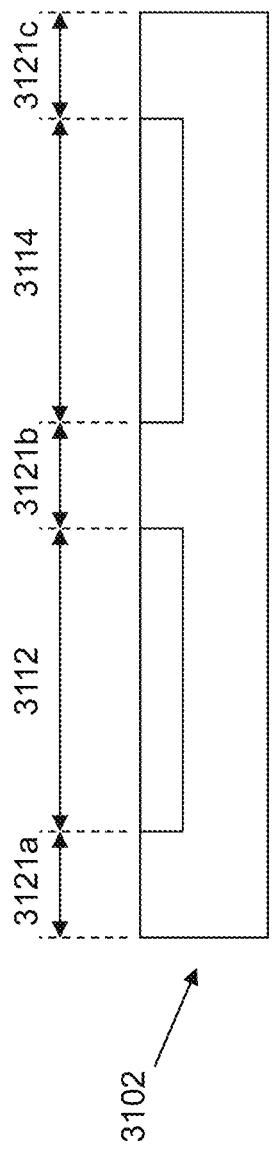
FIG. 31A, FIG. 31B, FIGS. 31C, and 31D are schematic diagrams illustrating the various stages of device fabrication according to the embodiment of FIG. 30.

As illustrated in FIG. 31A, a substrate 3102 is provided. The substrate 3102 includes a first emissive region 3112 and a second emissive region 3114. The substrate 3102 may further include one or more non-emissive regions 3121a-3121c. For example, the first emissive region 3112 and the second emissive region 3114 may correspond to pixel regions or subpixel regions of an electroluminescent device.

Figure 31B:
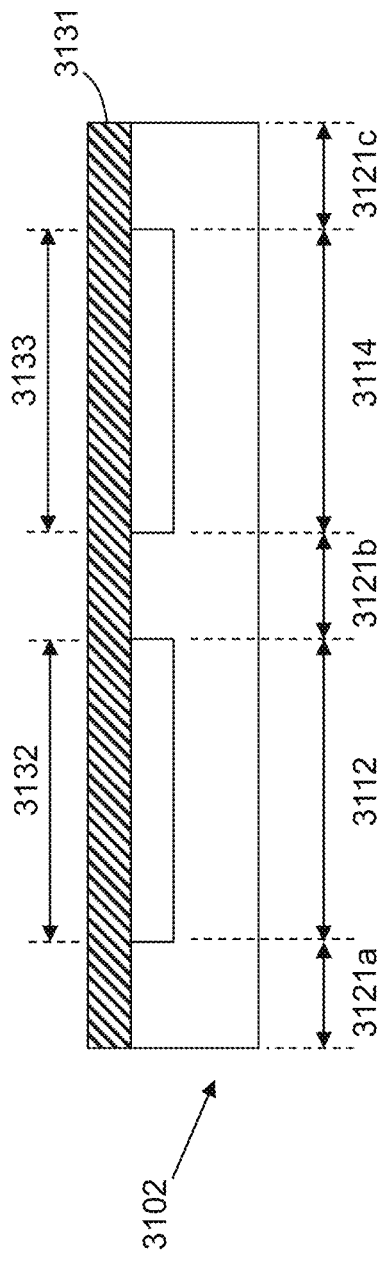
Figure 31C:
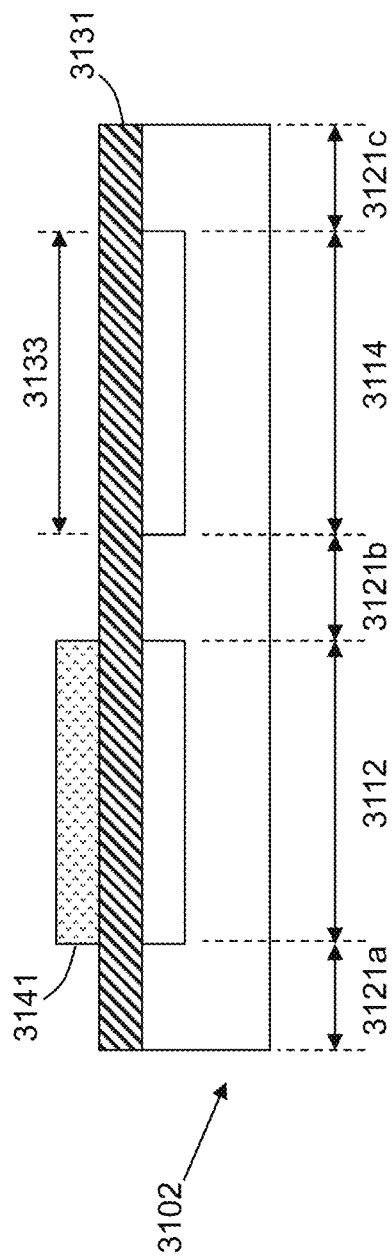

In stage 12, a first conductive coating 3131 is deposited over the substrate. As illustrated in FIG. 31B, the first conductive coating 3131 is deposited to coat the first emissive region 3112, the second emissive region 3114, and the non-emissive regions 3121a-3121c. The first conductive coating 3131 includes a first portion 3132 corresponding to the portion coating the first emissive region 3112, and a second portion 3133 corresponding to the portion coating the second emissive region 3114. For example, the first conductive coating 3131 may be deposited by evaporation, including thermal evaporation and electron beam evaporation. In some embodiments, the first conductive coating 3131 may be deposited using an open mask or without a mask (e.g., mask-free). The first conductive coating 3131 may be deposited using other methods including, but not limited to, sputtering, chemical vapor deposition, printing (including ink or vapor jet printing, reel-to-reel printing, and micro-contact transfer printing), OVPD, LITI patterning, and combinations thereof.

In stage 14, a first nucleation inhibiting coating 3141 is selectively deposited over a portion of the first conductive coating 3131. In the embodiment illustrated in FIG. 31C, the first nucleation inhibiting coating 3141 is deposited to coat the first portion 3132 of the first conductive coating 3131, which corresponds to the first emissive region 3112. In such embodiment, the second portion 3133 of the first conductive coating 3131 disposed over the second emissive region 3114 is substantially free of, or exposed from, the first nucleation inhibiting coating 3141. In some embodiments, the first nucleation inhibiting coating 3141 may optionally also coat portion(s) of the first conductive coating 3131 deposited over one or more non-emissive regions. For example, the first nucleation inhibiting coating 3141 may optionally also coat the portion(s) of the first conductive coating 3131 deposited over one or more non-emissive regions adjacent to the first emissive region 3112, such as the non-emissive region 3121a and/or 3121b. Various processes for selectively depositing a material on a surface may be used to deposit the first nucleation inhibiting coating 3141 including, but not limited to, evaporation (including thermal evaporation and electron beam evaporation), photolithography, printing (including ink or vapor jet printing, reel-to-reel printing, and micro-contact transfer printing), OVPD, LITI patterning, and combinations thereof.

Figure 31D:
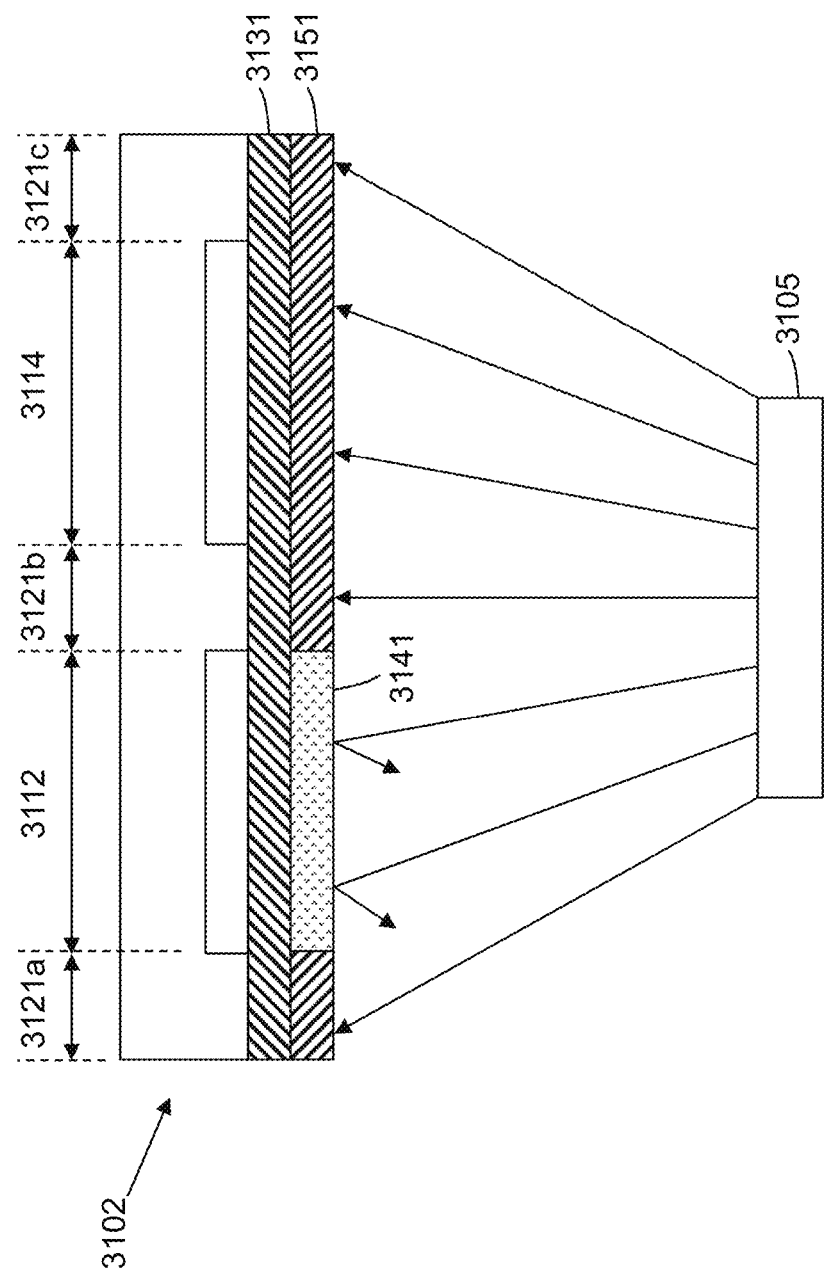

Once the first nucleation inhibiting coating 3141 has been deposited on a region of the surface of the first conductive coating 3131, a second conductive coating 3151 may be deposited on remaining uncovered region(s) of the surface where the nucleation inhibiting coating 3141 is not present. Turning to FIG. 31D, in stage 16, a conductive coating source 3105 is illustrated as directing an evaporated conductive material towards the surfaces of the first conductive coating 3131 and the first nucleation inhibiting coating 3141. As illustrated in FIG. 31D, the conducting coating source 3105 may direct the evaporated conductive material such that it is incident on both covered or treated areas (namely, region(s) of the first conductive coating 3131 with the nucleation inhibiting coating 3141 deposited thereon) and uncovered or untreated areas of the first conductive coating 3131. However, since a surface of the first nucleation inhibiting coating 3141 exhibits a relatively low initial sticking coefficient compared to that of the uncovered surface of the first conductive coating 3131, a second conductive coating 3151 selectively deposits onto the areas of the first conductive coating surface where the first nucleation inhibiting coating 3141 is not present. Accordingly, the second conductive coating 3151 may coat the second portion 3133 of the first conductive coating 3131, which corresponds to the portion of the first conductive coating 3131 coating the second emissive region 3114. As illustrated in FIG. 31D, the second conductive coating 3151 may also coat other portions or regions of the first conductive coating 3131, including the portions coating the non-emissive regions 3121a, 3121b, and 3121c. The second conductive coating 3151 may include, for example, pure or substantially pure magnesium. For example, the second conductive coating 3151 may be formed using materials which are identical to those used to form the first conductive coating 3131. The second conductive coating 3151 may be deposited using an open mask or without a mask (e.g., mask-free deposition process).

In some embodiments, the method may further include additional stages following stage 16. Such additional stages may include, for example, depositing one or more additional nucleation inhibiting coatings, depositing one or more additional conductive coatings, depositing an auxiliary electrode, depositing an outcoupling coating, and/or encapsulation of the device.

It will be appreciated that, while the method has been illustrated and described above in relation to a device having the first and second emissive regions, it can similarly be applied to devices having three or more emissive regions. For example, such method may be used to deposit a conductive coating of varying thickness according to the emission spectrum of each of the emissive regions.

The first conductive coating 3131 and the second conductive coating 3151 may be light transmissive or substantially transparent in at least a portion of the visible wavelength range of the electromagnetic spectrum. For further clarity, the first conductive coating 3131 and the second conductive coating 3151 may each be light transmissive or substantially transparent in at least a portion of the visible wavelength range of the electromagnetic spectrum. Thus when the second conductive coating 3151 (and any additional conductive coating) is disposed on top of the first conductive coating 3131 to form a multi-coating electrode, such electrode may also be light transmissive or substantially transparent in the visible wavelength portion of the electromagnetic spectrum. For example, the light transmittance of the first conductive coating 3131, the second conductive coating 3151, and/or the multi-coating electrode may be at least or greater than about 30%, at least or greater than about 40%, at least or greater than about 45%, at least or greater than about 50%, at least or greater than about 60%, at least or greater than 70%, at least or greater than about 75%, or at least or greater than about 80% in a visible portion of the electromagnetic spectrum.

In some embodiments, the thickness of the first conductive coating 3131 and the second conductive coating 3151 may be made relatively thin to maintain a relatively high light transmittance. For example, the thickness of the first conductive coating 3131 may be about 5 nm to about 30 nm, about 8 nm to about 25 nm, or about 10 nm to about 20 nm. The thickness of the second conductive coating 3151 may, for example, be about 1 nm to about 25 nm, about 1 nm to about 20 nm, about 1 nm to about 15 nm, about 1 nm to about 10 nm, or about 3 nm to about 6 nm. Accordingly, the thickness of a multi-coating electrode formed by the combination of the first conductive coating 3131, the second conductive coating 3151 and any additional conductive coating may, for example, be about 6 nm to about 35 nm, about 10 nm to about 30 nm, about 10 nm to about 25 nm, or about 12 nm to about 18 nm.

The first emissive region 3112 and the second emissive region 3114 may correspond to subpixel regions of an OLED display device in some embodiments. Accordingly, it will be appreciated that the substrate 3102 onto which various coatings are deposited may include one or more additional organic and/or inorganic layers not specifically illustrated or described in the foregoing embodiments. For example, the OLED display device may be an AMOLED display device. In such embodiments, the substrate 3102 may include an electrode and at least one organic layer deposited over the electrode in each emissive region (e.g., subpixel), such that the first conductive coating 3131 may be deposited over the at least one organic layer. For example, the electrode may be an anode, and the first conductive coating 3131, either by itself or in combination with the second conductive coating 3151 and any additional conductive coatings, may form a cathode. The at least one organic layer may include an emitter layer. The at least one organic layer may further include a hole injection layer, a hole transport layer, an electron blocking layer, a hole blocking layer, an electron transport layer, an electron injection layer, and/or any additional layers. The substrate 3102 may further include a plurality of TFTs. Each anode provided in the device may be electrically connected to at least one TFT. For example, the substrate 3102 may include one or more top-gate TFTs, one or more bottom-gate TFTs, and/or other TFT structures. A TFT may be an n-type TFT or a p-type TFT. Examples of TFT structures include those including a-Si, IGZO, and LTPS.

The substrate 3102 may also include a base substrate for supporting the above-identified additional organic and/or inorganic layers. For example, the base substrate may be a flexible or rigid substrate. The base substrate may include, for example, silicon, glass, metal, polymer (e.g., polyimide), sapphire, or other materials suitable for use as the base substrate.

The first emissive region 3112 and the second emissive region 3114 may be subpixels configured to emit light of different wavelength or emission spectrum from one another. The first emissive region 3112 may be configured to emit light having a first wavelength or first emission spectrum, and the second emissive region 3114 may be configured to emit light having a second wavelength or second emission spectrum. The first wavelength may be less than or greater than the second wavelength. The device may include any number of additional emissive regions, pixels, or subpixels. For instance, the device may include additional emissive regions which are configured to emit light having a third wavelength or third emissive spectrum, which is different from the wavelength or emissive spectrum of the first emissive region 3112 or the second emissive region 3114. The device may also include additional emissive regions which are configured to emit light having substantially identical wavelength or emissive spectrum as the first emissive region 3112, the second emissive region 3114, or other additional emissive regions.

In some embodiments, the first nucleation inhibiting coating 3141 may be selectively deposited using the same shadow mask used to deposit the at least one organic layer of the first emissive region 3112. In this way, an optical microcavity effect may be tuned for each subpixel in a cost-effective manner due to there being no additional mask requirements for depositing the nucleation inhibiting coating 3141.

Figure 32:
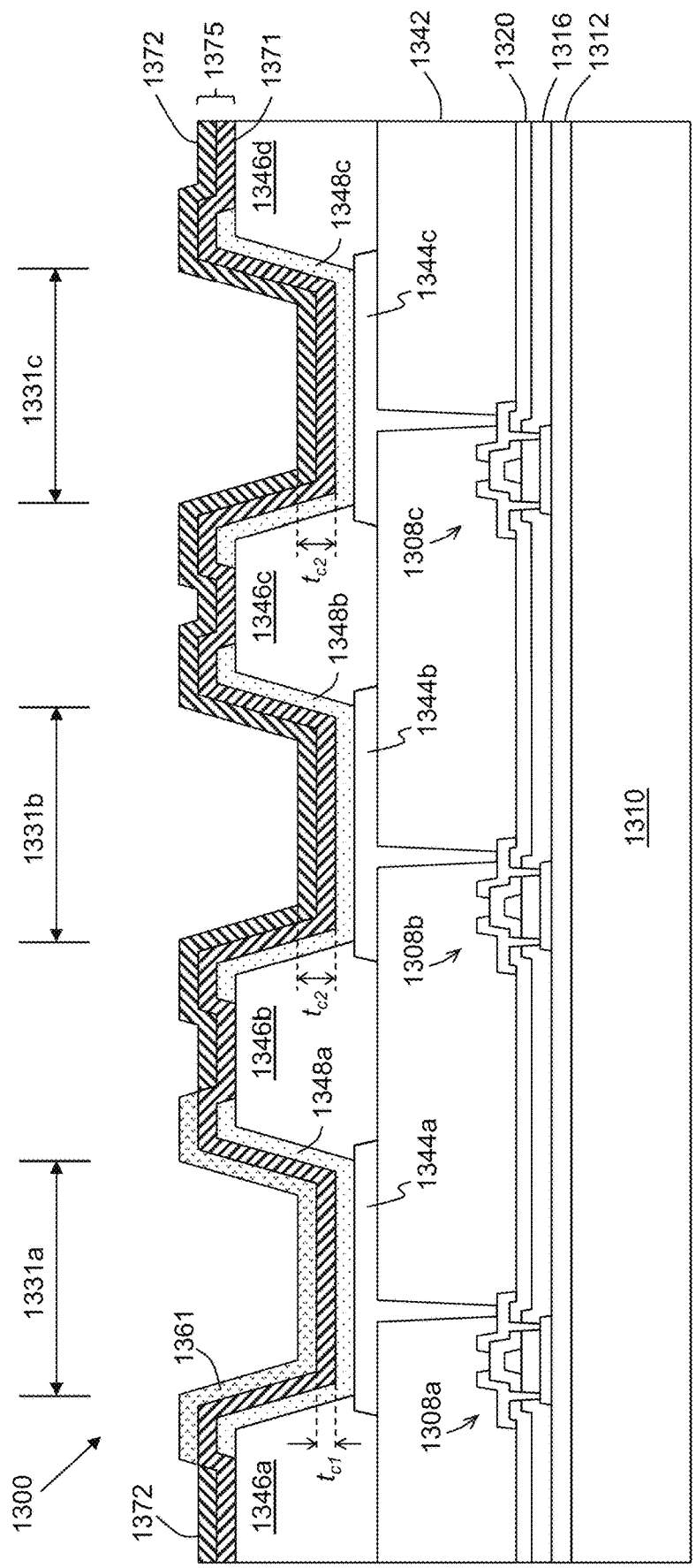
FIG. 32 is a schematic diagram illustrating a cross-section of an active matrix OLED device according to yet another embodiment.

FIG. 32 is a schematic cross-sectional diagram illustrating a portion of an AMOLED device 1300. For sake of simplicity, certain details of a backplane including those regarding the TFTs 1308a, 1308b, 1308c are omitted in describing the following embodiments.

In the embodiment of FIG. 32, the device 1300 includes a first emissive region 1331a, a second emissive region 1331b, and a third emissive region 1331c. For example, the emissive regions may correspond to the subpixels of the device 1300. In the device 1300, a first electrode 1344a, 1344b, 1344c is formed in each of the first emissive region 1331a, the second emissive region 1331b, and the third emissive region 1331c, respectively. As illustrated in FIG. 32, each of the first electrode 1344a, 1344b, 1344c extends through an opening of an insulating layer 1342 such that it is in electrical communication with the respective TFTs 1308a, 1308b. 1308c. PDLs 1346a-d are then formed to cover at least a portion of the first electrodes 1344a-c, including the outer edges of each electrode. For example, the PDLs 1346a-d may include an insulating organic or inorganic material. An organic layer 1348a, 1348b, 1348c is then deposited over the respective first electrode 1344a, 1344b, 1344c, particularly in regions between neighboring PDLs 1346a-d. A first conductive coating 1371 is deposited to substantially cover both the organic layers 1348a-d and the PDLs 1346a-d. For example, the first conductive coating 1371 may form a common cathode, or a portion thereof. A first nucleation inhibiting coating 1361 is selectively deposited over a portion of the first conductive coating 1371 disposed over the first emissive region 1331a. For example, the first nucleation inhibiting coating 1361 may be selectively deposited using a fine metal mask or a shadow mask. Accordingly, a second conductive coating 1372 is selectively deposited over an exposed surface of the first conductive coating 1371 using an open mask or a mask-free deposition process. For further specificity, by conducting thermal deposition of the second conductive coating 1372 (e.g., including magnesium) using an open mask or without a mask, the second conductive coating 1372 is selectively deposited over the exposed surface of the first conductive coating 1371, while leaving a surface of the first nucleation inhibiting coating 1361 substantially free of a material of the first conductive coating 1372. The second conductive coating 1372 may be deposited to coat the portions of the first conductive coating 1371 disposed over the second emissive region 1331b and the third emissive region 1331c.

In the device 1300 illustrated in FIG. 32, the first conductive coating 1371 and the second conductive coating 1372 may collectively form a common cathode 1375. Specifically, the common cathode 1375 may be formed by the combination of the first conductive coating 1371 and the second conductive coating 1372, wherein the second conductive coating 1372 is disposed directly over at least a portion of the first conductive coating 1371. The common cathode 1375 has a first thickness $t_{c1}$ in the first emissive region 1331a, and a second thickness $t_{c2}$ in the second emissive region 1335b and the third emissive region 1335c. The first thickness $t_{c1}$ may correspond to the thickness of the first conductive coating 1371, and the second thickness $tc_2$ may correspond to the combined thickness of the first conductive coating 1371 and the second conductive coating 1372. Accordingly, the second thickness $tc_2$ is greater than the first thickness $t_{c1}$.

Figure 33:
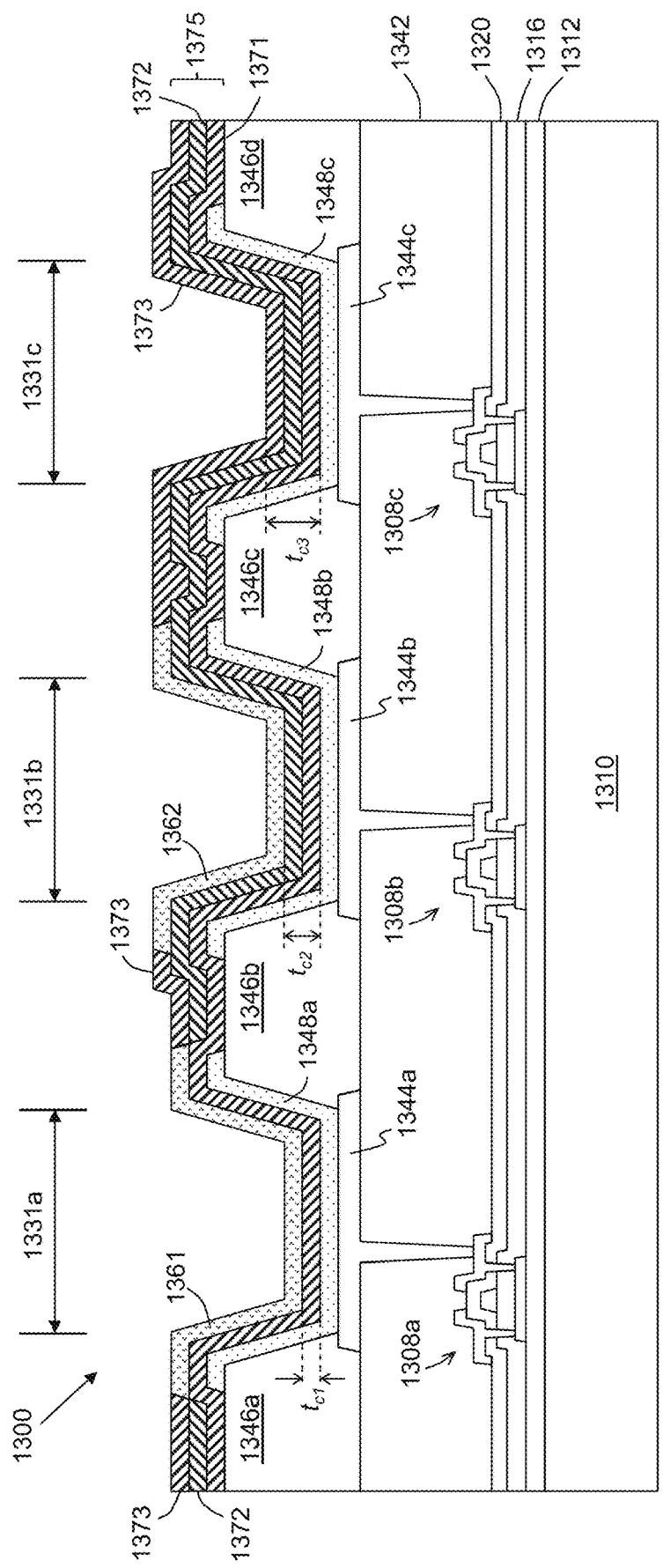
FIG. 33 is a schematic diagram illustrating a cross-section of an active matrix OLED device according to yet another embodiment.

FIG. 33 illustrates a further embodiment of the device 1300 wherein the common cathode 1375 further includes a third conductive coating 1373. Specifically in the embodiment of FIG. 33, the device 1300 includes a second nucleation inhibiting coating 1362 disposed over a portion of the second conductive coating 1372 provided over the second emissive region 1331b. A third conductive coating 1373 is then deposited over the exposed or untreated surface(s) of the second conductive coating 1372, including the portion of the second conductive coating 1372 disposed over the third emissive region 1331c. In this way, a common cathode 1375 having a first thickness $t_{c1}$ in the first emissive region 1331a, a second thickness $tc_2$ in the second emissive region 1331b, and a third thickness $t_{c3}$ in the third emissive region 1331c may be provided. As would be appreciated, the first thickness $t_{c1}$ corresponds to the thickness of the first conductive coating 1371, the second thickness $tc_2$ corresponds to the combined thickness of the first conductive coating 1371 and the second conductive coating 1372, and the third thickness $t_{c3}$ corresponds to the combined thickness of the first conductive coating 1371, the second conductive coating 1372, and the third conductive coating 1373. Accordingly, the first thickness $t_{c1}$ may be less than the second thickness $tc_2$, and the third thickness $t_{c3}$ may be greater than the second thickness $t_{c2}$.

Figure 34:
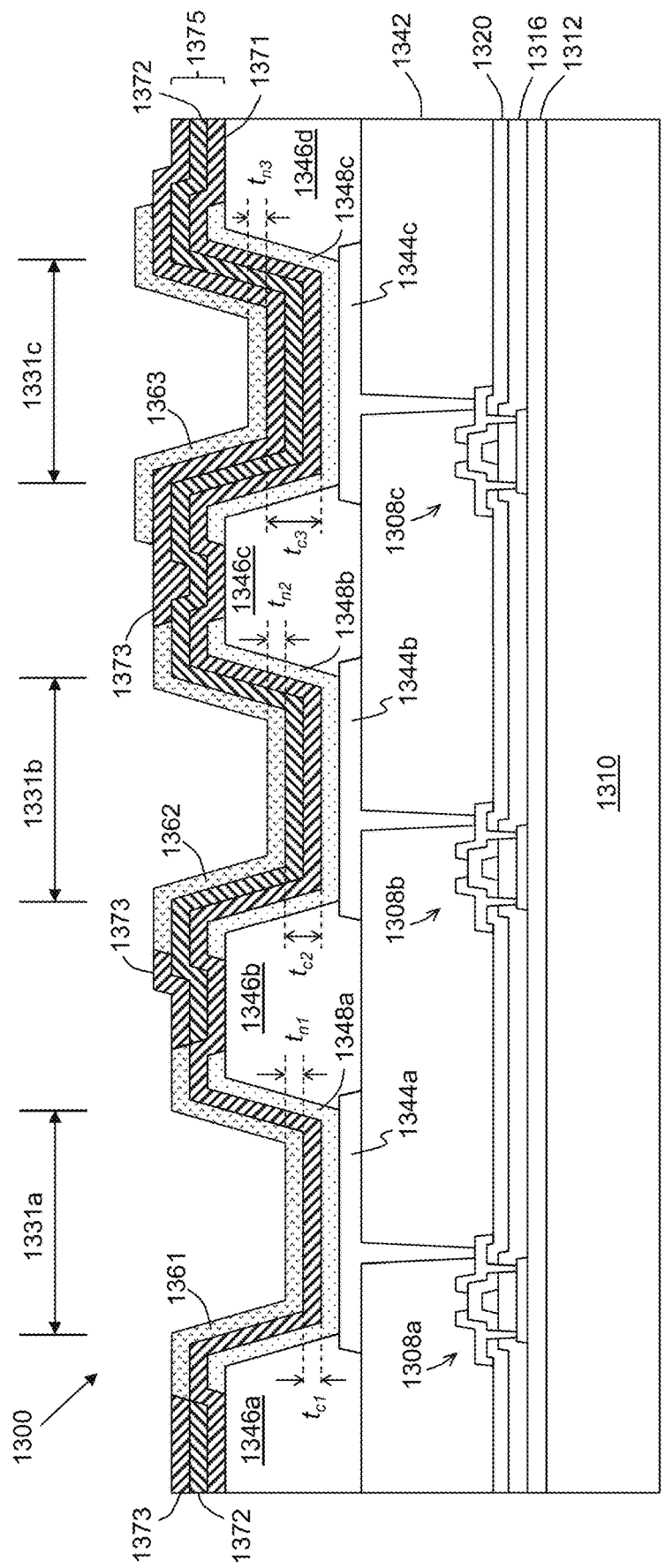
FIG. 34 is a schematic diagram illustrating a cross-section of an active matrix OLED device according to yet another embodiment.

In yet another embodiment illustrated in FIG. 34, the device 1300 may further include a third nucleation inhibiting coating 1363 disposed over the third emissive region 1331c. Specifically, the third nucleation inhibiting coating 1363 is illustrated as being deposited over a portion of the third conductive coating 1373 coating a portion of the device 1300 corresponding to the third emissive region 1331c.

Figure 35:
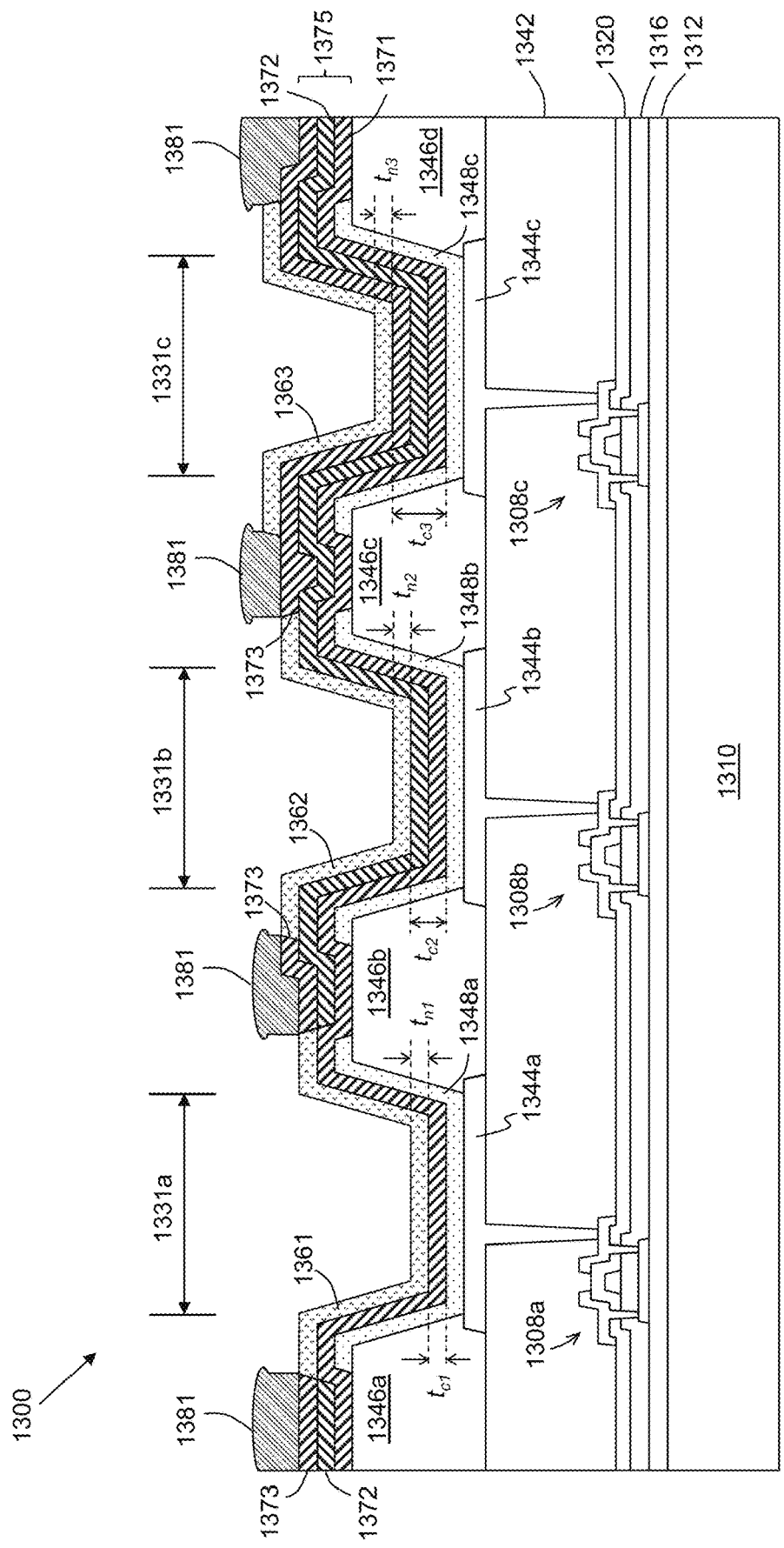
FIG. 35 is a schematic diagram illustrating a cross-section of an active matrix OLED device according to yet another embodiment.

In yet another embodiment illustrated in FIG. 35, the device 1300 further includes an auxiliary electrode 1381 disposed in the non-emissive regions of the device 1300. For example, the auxiliary electrode 1381 may be formed using substantially the same processes as those used to deposit the second conductive coating 1372 and/or the third conductive coating 1373. The auxiliary electrode 1381 is illustrated as being deposited over the PDLs 1346a-1346d, which correspond to the non-emissive regions of the device 1300. The emissive regions 1331a, 1331b, 1331c may be substantially free of the material used to form the auxiliary electrode 1381.

The first conductive coating 1371, the second conductive coating 1372, and the third conductive coating 1373 may be light transmissive or substantially transparent in the visible wavelength portion of the electromagnetic spectrum. For further clarity, the first conductive coating 1371, the second conductive coating 1372, and the third conductive coating 1373 may each be light transmissive or substantially transparent at least in a portion of the visible wavelength range of the electromagnetic spectrum. Thus, when the second conductive coating 1372 and/or the third conductive coating 1373 are disposed on top of the first conductive coating 1371 to form the common cathode 1375, such electrode may also be light transmissive or substantially transparent in the visible wavelength portion of the electromagnetic spectrum. For example, the light transmittance of the first conductive coating 1371, the second conductive coating 1372, the third conductive coating 1373, and/or the common cathode 1375 may be at least or greater than about 30%, at least or greater than about 40%, at least or greater than about 45%, at least or greater than about 50%, at least or greater than about 60%, at least or greater than 70%, at least or greater than about 75%, or at least or greater than about 80% in a visible portion of the electromagnetic spectrum.

In some embodiments, the thickness of the first conductive coating 1371, the second conductive coating 1372, and the third conductive coating 1373 may be made relatively thin to maintain a relatively high light transmittance. For example, the thickness of the first conductive coating 1371 may be about 5 nm to about 30 nm, about 8 nm to about 25 nm, or about 10 nm to about 20 nm. The thickness of the second conductive coating 1372 may, for example, be about 1 nm to about 25 nm, about 1 nm to about 20 nm, about 1 nm to about 15 nm, about 1 nm to about 10 nm, or about 3 nm to about 6 nm. The thickness of the third conductive coating 1373 may, for example, be about 1 nm to about 25 nm, about 1 nm to about 20 nm, about 1 nm to about 15 nm, about 1 nm to about 10 nm, or about 3 nm to about 6 nm. Accordingly, the thickness of a common cathode 1375 formed by the combination of the first conductive coating 1371 and the second conductive coating 1372 and/or the third conductive coating 1373 may, for example, be about 6 nm to about 35 nm, about 10 nm to about 30 nm, or about 10 nm to about 25 nm, or about 12 nm to about 18 nm.

The thickness of the auxiliary electrode 1381 may be greater than the thickness of the first conductive coating 1371, the second conductive coating 1372, the third conductive coating 1373, and/or the common cathode 1375. For example, the thickness of the auxiliary electrode 1381 may be at least or greater than about 50 nm, at least or greater than about 80 nm, at least or greater than about 100 nm, at least or greater than about 150 nm, at least or greater than about 200 nm, at least or greater than about 300 nm, at least or greater than about 400 nm, at least or greater than about 500 nm, at least or greater than about 700 nm, at least or greater than about 800 nm, at least or greater than about 1 µm, at least or greater than about 1.2 µm, at least or greater than about 1.5 µm, at least or greater than about 2 µm, at least or greater than about 2.5 µm, or at least or greater than about 3 µm. In some embodiments, the auxiliary electrode 1381 may be substantially non-transparent or opaque. However, since the auxiliary electrode 1381 is generally provided in the non-emissive region(s) of the device 1300, the auxiliary electrode 1381 may not cause significant optical interference. For example, the light transmittance of the auxiliary electrode 1381 may be less than about 50%, less than about 70%, less than about 80%, less than about 85%, less than about 90%, or less than about 95% in the visible portion of the electromagnetic spectrum. In some embodiments, the auxiliary electrode 1381 may absorb light in at least a portion of the visible wavelength range of the electromagnetic spectrum.

The first conductive coating 1371 may include various materials suitably used to form light transmissive conductive layers or coatings. For example, the first conductive coating 1371 may include TCOs, metallic or non-metallic thin films, and any combination thereof. The first conductive coating 1371 may further include two or more layers or coatings. For example, such layers or coatings may be distinct layers or coatings disposed on top of one another. The first conductive coating 1371 may include various materials including, for example, ITO, fluorine tin oxide (FTO), Mg, Al, Yb, Ag, Zn, Cd and any combinations thereof, including alloys containing any of the foregoing materials. For example, the first conductive coating 1371 may include a Mg:Ag alloy, a Mg:Yb alloy, or a combination thereof. For a Mg:Ag alloy or a Mg:Yb alloy, the alloy composition may range from about 1:9 to about 9:1 by volume.

The second conductive coating 1372 and the third conductive coating 1373 may include high vapor pressure materials, such as Yb, Zn, Cd and Mg. In some embodiments, the second conductive coating 1372 and the third conductive coating 1373 may include pure or substantially pure magnesium.

The auxiliary electrode 1381 may include substantially the same material(s) as the second conductive coating 1372 and/or the third conductive coating 1373. In some embodiments, the auxiliary electrode 1381 may include magnesium. For example, the auxiliary electrode 1381 may include pure or substantially pure magnesium. In other examples, the auxiliary electrode 1381 may include Yb, Cd, and/or Zn.

In some embodiments, the thickness of the nucleation inhibiting coating 1361, 1362, 1363 disposed in the emissive regions 1331a, 1331b, 1331c may be varied according to the color or emission spectrum of the light emitted by each emissive region. As illustrated in FIGS. 34-35, the first nucleation inhibiting coating 1361 may have a first nucleation inhibiting coating thickness $t_{n1}$, the second nucleation inhibiting coating 1362 may have a second nucleation inhibiting coating thickness $t_{n2}$, and the third nucleation inhibiting coating 1363 may have a third nucleation inhibiting coating thickness $t_{n3}$. The first nucleation inhibiting coating thickness hit, the second nucleation inhibiting coating thickness $t_{n2}$, and/or the third nucleation inhibiting coating thickness $t_{n3}$ may be substantially the same as one another. Alternatively, the first nucleation inhibiting coating thickness $t_{n1}$, the second nucleation inhibiting coating thickness $t_{n2}$, and/or the third nucleation inhibiting coating thickness $tn_3$ may be different from one another.

By modulating the thickness of a nucleation inhibiting coating disposed in each emissive region or subpixel independently of one another, optical microcavity effects in each emissive region or subpixel can be further controlled. For example, the thickness of the nucleation inhibiting coating disposed over a blue subpixel may be less than the thickness of the nucleation inhibiting coating disposed over a green subpixel, and the thickness of the nucleation inhibiting coating disposed over a green subpixel may be less than the thickness of the nucleation inhibiting coating disposed over a red subpixel. As would be appreciated, the optical microcavity effect in each emissive region or subpixel may be controlled to an even greater extent by modulating both the nucleation inhibiting coating thickness and the conductive coating thickness for each emissive region or subpixel independent of other emissive regions or subpixels.

Optical microcavity effects arise due to the presence of optical interfaces created by numerous thin-film layers and coatings with different refractive indices, which are used to construct opto-electronic devices such as OLEDs. Some factors which affect the optical microcavity effect observed in a device include the total path length (e.g., the total thickness of the device through which light emitted from the device travels before being out-coupled) and the refractive indices of various layers and coatings. It has now been found that, by modulating the thickness of a cathode in an emissive region (e.g., subpixel), the optical microcavity effect in the emissive region may be varied. Such effect may generally be attributed to the change in the total optical path length. It is further postulated that, particularly in the case of light-transmissive cathode formed by thin coating(s), the change in the cathode thickness may also change the refractive index of the cathode in addition to the total optical path length. Furthermore, the optical path length, and thus the optical microcavity effect, may also be modulated by changing the thickness of a nucleation inhibiting coating disposed in the emissive region.

The optical properties of a device which may be affected by modulating the optical microcavity effects include the emission spectrum, intensity (e.g., luminous intensity), and angular distribution of the output light, including the angular dependence of the brightness and color shift of the output light.

While various embodiments have been described with 2 or 3 emissive regions or subpixels, it will be appreciated devices may include any number of emissive regions or subpixels. For example, a device may include a plurality of pixels, wherein each pixel includes 2, 3, or more subpixels. Furthermore, the specific arrangement of the pixels or subpixels with respect to other pixels or subpixels may be varied depending on the device design. For example, the subpixels may be arranged according to suitable arrangement schemes such as RGB side-by-side, diamond, or PenTile®.

Selective Deposition of Optical Coating

In one aspect according to some embodiments, a device is provided. The device may be an opto-electronic device. In some embodiments, the device includes a substrate, a nucleation inhibiting coating, and an optical coating. The nucleation inhibiting coating covers a first region of the substrate. The optical coating covers a second region of the substrate, and at least a portion of the nucleation inhibiting coating is exposed from, or is substantially free of or is substantially uncovered by, the optical coating.

The optical coating may be used to modulate optical properties of light being transmitted, emitted, or absorbed by the device, including plasmon modes. For example, the optical coating may be used as an optical filter, index-matching coating, optical out-coupling coating, scattering layer, diffraction grating, or portions thereof. In another example, the optical coating may be used to modulate the microcavity effects in an opto-electronic device by tuning, for example, the total optical path length and/or the refractive index. The optical properties of the device which may be affected by modulating the optical microcavity effects include the emission spectrum, intensity (e.g., luminous intensity), and angular distribution of the output light, including the angular dependence of the brightness and color shift of the output light. In some embodiments, the optical coating may be a non-electrical component. In other words, the optical coating may not be configured to conduct or transmit electrical current during normal device operation in such embodiments.

For example, the optical coating may be formed using any of the various embodiments of methods for depositing a conductive coating described above. The optical coating may include high vapor pressure materials, such as Yb, Zn, Cd and Mg. In some embodiments, the optical coating may include pure or substantially pure magnesium.

Thin Film Formation

The formation of thin films during vapor deposition on a surface of a substrate involves processes of nucleation and growth. During initial stages of film formation, a sufficient number of vapor monomers (e.g., atoms or molecules) typically condense from a vapor phase to form initial nuclei on the surface. As vapor monomers continue to impinge upon the surface, a size and density of these initial nuclei increase to form small clusters or islands. After reaching a saturation island density, adjacent islands typically will start to coalesce, increasing an average island size, while decreasing an island density. Coalescence of adjacent islands continues until a substantially closed film is formed.

There can be three basic growth modes for the formation of thin films: 1) island (Volmer-Weber), 2) layer-by-layer (Frank-van der Merwe), and 3) Stranski-Krastanov. Island growth typically occurs when stable clusters of monomers nucleate on a surface and grow to form discrete islands. This growth mode occurs when the interactions between the monomers is stronger than that between the monomers and the surface.

The nucleation rate describes how many nuclei of a critical size form on a surface per unit time. During initial stages of film formation, it is unlikely that nuclei will grow from direct impingement of monomers on the surface, since the density of nuclei is low, and thus the nuclei cover a relatively small fraction of the surface (e.g., there are large gaps/spaces between neighboring nuclei). Therefore, the rate at which critical nuclei grow typically depends on the rate at which adsorbed monomers (e.g., adatoms) on the surface migrate and attach to nearby nuclei.

After adsorption of an adatom on a surface, the adatom may either desorb from the surface, or may migrate some distance on the surface before either desorbing, interacting with other adatoms to form a small cluster, or attach to a growing nuclei. An average amount of time that an adatom remains on the surface after initial adsorption is given by:

$$\tau_s = \frac{1}{v}\exp\left(\frac{E_{des}}{kT}\right)$$

In the above equation, v is a vibrational frequency of the adatom on the surface, k is the Boltzmann constant, T is temperature, and $E_{des}$ is an energy involved to desorb the adatom from the surface. From this equation it is noted that the lower the value of $E_{des}$ the easier it is for the adatom to desorb from the surface, and hence the shorter the time the adatom will remain on the surface. A mean distance an adatom can diffuse is given by, $$X = a_0 \exp\left(\frac{E_{des} - E_s}{2kT}\right)$$

where $a_0$ is a lattice constant and $E_s$ is an activation energy for surface diffusion. For low values of $E_{des}$ and/or high values of $E_s$ the adatom will diffuse a shorter distance before desorbing, and hence is less likely to attach to a growing nuclei or interact with another adatom or cluster of adatoms.

During initial stages of film formation, adsorbed adatoms may interact to form clusters, with a critical concentration of clusters per unit area being given by, $$\frac{N_i}{n_0} = \left|\frac{N_1}{n_0}\right|^i \exp\left(\frac{E_i}{kT}\right)$$

where $E_i$ is an energy involved to dissociate a critical cluster containing i adatoms into separate adatoms, $n_0$ is a total density of adsorption sites, and $N_1$ is a monomer density given by:

$$N_1 = \dot{R}\tau_s$$

where $\dot{R}$ is a vapor impingement rate. Typically i will depend on a crystal structure of a material being deposited and will determine the critical cluster size to form a stable nucleus.

A critical monomer supply rate for growing clusters is given by the rate of vapor impingement and an average area over which an adatom can diffuse before desorbing:

$$\dot{R}X^2 = a_0^2 \exp\left(\frac{E_{des} - E_s}{kT}\right)$$

The critical nucleation rate is thus given by the combination of the above equations:

$$\dot{N}_i = \dot{R}a_0^2 n_0 \left|\frac{\dot{R}}{vn_0}\right|^i \exp\left(\frac{(i+1)E_{des} - E_s + E_i}{kT}\right)$$

From the above equation it is noted that the critical nucleation rate will be suppressed for surfaces that have a low desorption energy for adsorbed adatoms, a high activation energy for diffusion of an adatom, are at high temperatures, or are subjected to low vapor impingement rates.

Sites of substrate heterogeneities, such as defects, ledges or step edges, may increase $E_{des}$, leading to a higher density of nuclei observed at such sites. Also, impurities or contamination on a surface may also increase $E_{des}$, leading to a higher density of nuclei. For vapor deposition processes conducted under high vacuum conditions, the type and density of contaminates on a surface are affected by a vacuum pressure and a composition of residual gases that make up that pressure.

Under high vacuum conditions, a flux of molecules that impinge on a surface (per $cm^2$-sec) is given by:

$$\Phi = 3.513 \times 10^{22} \frac{P}{MT}$$

where P is pressure, and M is molecular weight. Therefore, a higher partial pressure of a reactive gas, such as $H_2O$, can lead to a higher density of contamination on a surface during vapor deposition, leading to an increase in $E_{des}$ and hence a higher density of nuclei.

A useful parameter for characterizing nucleation and growth of thin films is the sticking probability given by:

$$S = \frac{N_{ads}}{N_{total}}$$

where $N_{ads}$ is a number of adsorbed monomers that remain on a surface (e.g., are incorporated into a film) and $N_{total}$ is a total number of impinging monomers on the surface. A sticking probability equal to 1 indicates that all monomers that impinge the surface are adsorbed and subsequently incorporated into a growing film. A sticking probability equal to 0 indicates that all monomers that impinge the surface are desorbed and subsequently no film is formed on the surface. A sticking probability of metals on various surfaces can be evaluated using various techniques of measuring the sticking probability, such as a dual quartz crystal microbalance (QCM) technique as described by Walker et al., J. Phys. Chem. C 2007, 111, 765 (2006).

As the density of islands increases (e.g., increasing average film thickness), a sticking probability may change. For example, a low initial sticking probability may increase with increasing average film thickness. This can be understood based on a difference in sticking probability between an area of a surface with no islands (bare substrate) and an area with a high density of islands. For example, a monomer that impinges a surface of an island may have a sticking probability close to 1.

An initial sticking probability $S_0$ can therefore be specified as a sticking probability of a surface prior to the formation of any significant number of critical nuclei. One measure of an initial sticking probability can involve a sticking probability of a surface for a material during an initial stage of deposition of the material, where an average thickness of the deposited material across the surface is at or below a threshold value. In the description of some embodiments, a threshold value for an initial sticking probability can be specified as 1 nm. An average sticking probability is then given by:

$$\bar{S} = S_0(1 - A_{nuc}) + S_{nuc}(A_{nuc})$$

where $S_{nuc}$ is a sticking probability of an area covered by islands, and $A_{nuc}$ is a percentage of an area of a substrate surface covered by islands.

Figure 38:
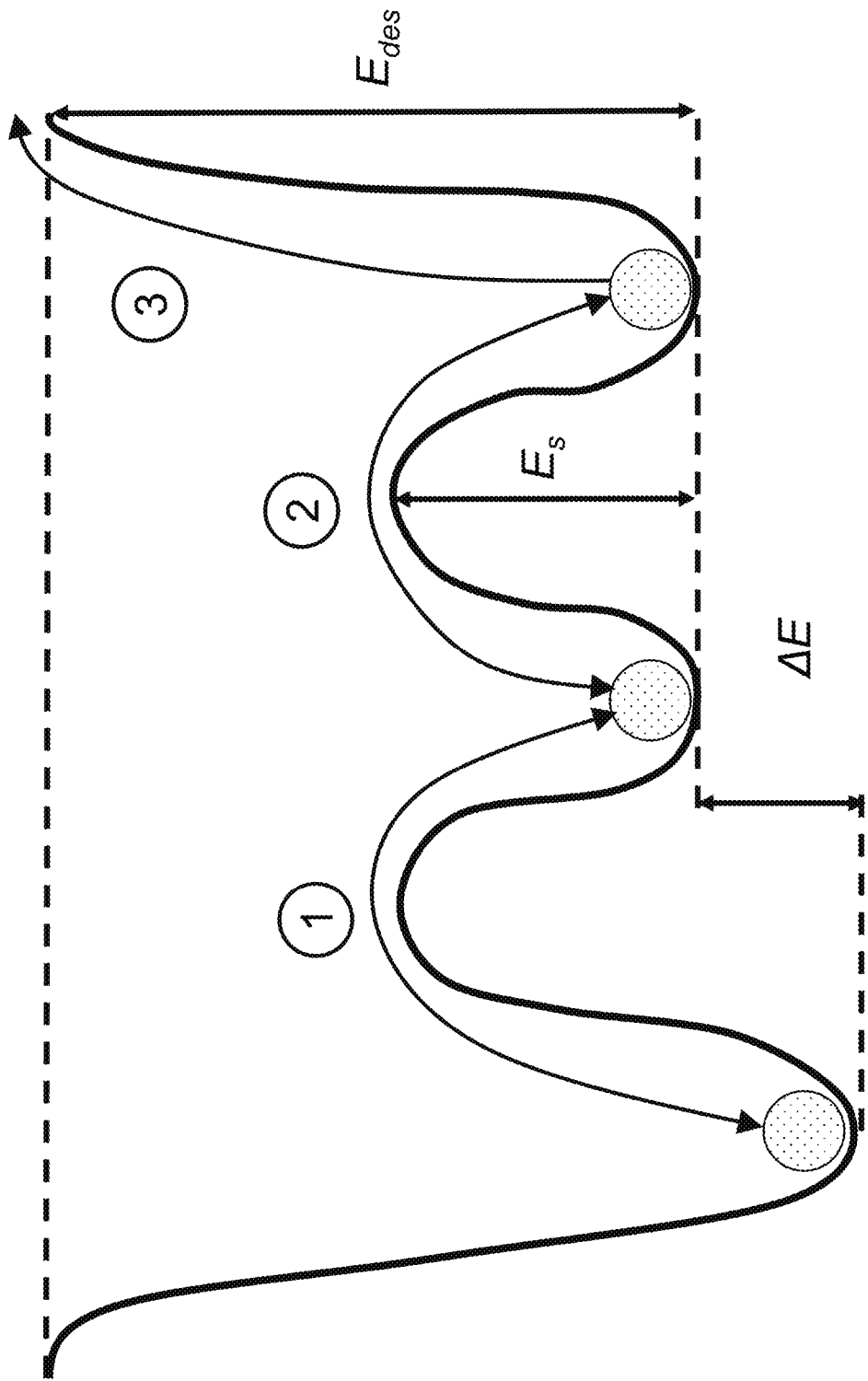
FIG. 38 is a schematic diagram illustrating the relative energy states of an adatom.

An example of an energy profile of an adatom adsorbed onto a substrate surface is illustrated in FIG. 38. Specifically, FIG. 38 illustrates the energy profiles corresponding to: (1) an adatom escaping from a local low energy site; (2) diffusion of the adatom on the surface; and (3) desorption of the adatom.

In (1), the local low energy site may be any site on the substrate surface onto which the adatom will be at a lower energy. Typically, the nucleation site may be a defect or anomaly on the surface substrate, such as for example, step edges, chemical impurities, bonding sites, or kinks. Once the adatom is trapped at the local low energy site, there is typically an energy barrier before surface diffusion can take place. This energy barrier is represented as ΔE in the diagram of FIG. 38. If the energy barrier to escape the local low energy site is large enough, the site may act as a nucleation site.

In (2), the adatom may diffuse on the substrate surface. For example, in the case of localized absorbates, the adatom tends to oscillate near the minima of the surface potential and migrates to various neighboring sites until the adatom is either desorbed, or is incorporated into a growing film or growing islands formed by a cluster of adatoms. In the diagram of FIG. 38, the activation energy associated with surface diffusion of the adatom is represented as $E_s$.

In (3), the activation energy associated with desorption of the adatom from the surface is represented as $E_{des}$. It will be appreciated that any adatoms that are not desorbed would remain on the substrate surface. For example, such adatoms may diffuse on the surface, be incorporated as part of a growing film or coating, or become part of a cluster of adatoms that form islands on the surface.

Based on energy profile shown in FIG. 38, it can be postulated that nucleation inhibiting coating materials exhibiting a relatively low activation energy for desorption ($E_{des}$) and/or a relatively high activation energy for surface diffusion ($E_s$) may be particularly advantageous for use in various applications. For example, it may be particularly advantageous in some embodiments for the activation energy for desorption ($E_{des}$) to be less than about 2 times the thermal energy ($k_BT$), less than about 1.5 times the thermal energy, less than about 1.3 times the thermal energy, less than about 1.2 times the thermal energy, less than the thermal energy, less than about 0.8 times the thermal energy, or less than about 0.5 times the thermal energy. In some embodiments, it may be particularly advantageous for the activation energy for surface diffusion ($E_s$) to be greater than the thermal energy, greater than about 1.5 times the thermal energy, greater than about 1.8 times the thermal energy, greater than about 2 times the thermal energy, greater than about 3 times the thermal energy, greater than about 5 times the thermal energy, greater than about 7 times the thermal energy, or greater than about 10 times the thermal energy.

While certain embodiments have been described above with reference to selectively depositing a conductive coating to form a cathode or an auxiliary electrode for a common cathode, it will be understood that similar materials and processes may be used to form an anode or an auxiliary electrode for an anode in other embodiments.

Nucleation Inhibiting Coating

Suitable materials for use to form a nucleation inhibiting coating include those exhibiting or characterized as having an initial sticking probability for a material of a conductive coating of no greater than or less than about 0.1 (or 10%) or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001. Suitable materials for use to form a nucleation promoting coating include those exhibiting or characterized as having an initial sticking probability for a material of a conductive coating of at least about 0.6 (or 60%), at least about 0.7, at least about 0.75, at least about 0.8, at least about 0.9, at least about 0.93, at least about 0.95, at least about 0.98, or at least about 0.99.

Examples of nucleation inhibiting coatings suitable for use in at least in some applications include, but are not limited to, those formed by depositing PBD, PBD2, mCP, TAZ, β-NPB, NTAZ, tBUP-TAZ, BND, TBADN, CBP, BAlq, m-BPC, Ir(ppy)$_3$, or combination thereof.

Suitable nucleation inhibiting materials include organic materials, such as small molecule organic materials and organic polymers. Examples of suitable organic materials include polycyclic aromatic compounds including organic molecules which may optionally include one or more heteroatoms, such as nitrogen (N), sulfur (S), oxygen (O), phosphorus (P), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety. In some embodiments, at least one terminal moiety is, or includes, a biphenylyl moiety represented by one of the chemical structures (I-a), (I-b), and (Ic) as follows:

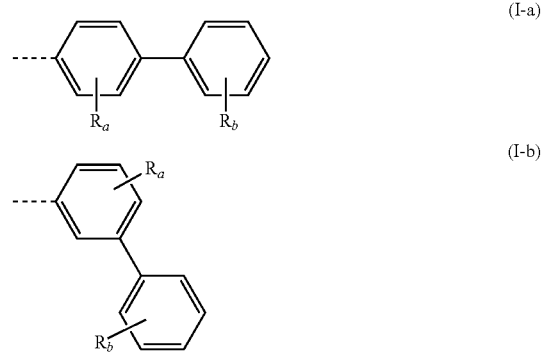

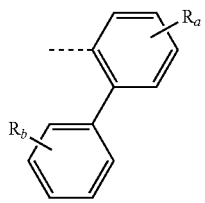

(I-c)

wherein the dotted line indicates a bond formed between the biphenylyl moiety and the core moiety. In general, the biphenylyl moiety represented by (I-a), (I-b) and (I-c) may be unsubstituted or may be substituted by having one or more of its hydrogen atoms replaced by one or more substituent groups. In the moiety represented by (I-a), (I-b), and (I-c), $R_a$ and $R_b$ independently represent the optional presence of one or more substituent groups, wherein $R_a$ may represent mono, di, tri, or tetra substitution, and $R_b$ may represent mono, di, tri, tetra, or penta substitution. For example, one or more substituent groups, $R_a$ and $R_b$, may independently be selected from: deutero, fluoro, alkyl including $C_1$-$C_4$ alkyl, cycloalkyl, arylalkyl, silyl, aryl, heteroaryl, fluoroalkyl, and any combinations thereof. Particularly, one or more substituent groups, $R_a$ and $R_b$, may be independently selected from: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl. Without wishing to be bound by a particular theory, the presence of an exposed biphenylyl moiety on a surface may serve to adjust or tune a surface energy (e.g., a desorption energy) to lower an affinity of the surface towards deposition of a conductive material such as magnesium. Other moieties and materials that yield a similar tuning of a surface energy to inhibit deposition of magnesium may be used to form a nucleation inhibiting coating.

In another embodiment, at least one terminal moiety is, or includes, a phenyl moiety represented by the structure (I-d) as follows:

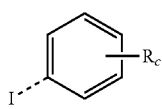

(I-d)

wherein the dotted line indicates a bond formed between the phenyl moiety and the core moiety. In general, the phenyl moiety represented by (I-d) may be unsubstituted or may be substituted by having one or more of its hydrogen atoms replaced by one or more substituent groups. In the moiety represented by (I-d), Itc represents the optional presence of one or more substituent groups, wherein $R_c$ may represent mono, di, tri, tetra, or penta substitution. One or more substituent groups, $R_c$, may be independently selected from: deutero, fluoro, alkyl including $C_1$-$C_4$ alkyl, cycloalkyl, silyl, fluoroalkyl, and any combinations thereof. Particularly, one or more substituent groups, $R_c$, may be independently selected from: methyl, ethyl, t-butyl, fluoromethyl, bifluoromethyl, trifluoromethyl, fluoroethyl, and polyfluoroethyl.

In yet another embodiment, at least one terminal moiety is, or includes, a tert-butylphenyl moiety represented by one of the structures (I-e), (I-f), or (I-g) as follows:

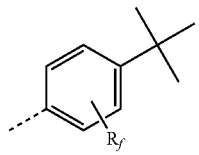

(I-e)

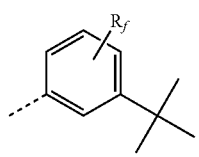

(I-f)

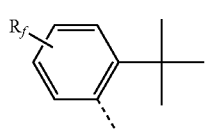

(I-g)

wherein the dotted line indicates a bond formed between the t-butylphenyl moiety and the core moiety. In general, the t-butylphenyl moiety represented by (I-e), (I-f) and (I-g) may be unsubstituted or may be substituted by having one or more of its hydrogen atoms replaced by one or more substituent groups. In the moiety represented by (I-e), (I-f) and (I-g), $R_f$ represents the optional presence of one or more substituent groups, wherein $R_f$ may represent mono, di, tri, or tetra substitution. For example, one or more substituent groups, $R_f$, may independently be selected from: deutero, fluoro, alkyl including $C_1$-$C_4$ alkyl, cycloalkyl, arylalkyl, silyl, aryl, heteroaryl, fluoroalkyl, and any combinations thereof. Particularly, one or more substituent groups, $R_f$, may be independently selected from: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl. In addition to the above, any of the methyl groups of the t-butyl group may optionally be substituted by deuterated methyl or fluorine. Without wishing to be bound by any particular theory, it is postulated that, among the t-butylphenyl moieties (I-e), (I-f) and (I-g) shown above, the structure (I-e) may be particularly desirable in some applications. It is further postulated that the structure (I-e), in which the t-butyl group is substituted onto the phenyl moiety in the para position, is generally more readily synthesized in comparison to structures (I-f) and (I-g) due to the t-butyl group experiencing the least steric hindrance caused by the presence of the core and other terminal moieties which may be present during synthesis paths.

In yet another embodiment, at least one terminal moiety is, or includes, a moiety represented by the structure (I-h) as follows:

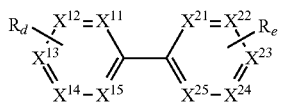
(I-h)

wherein $X_{11}$ to $X_{15}$ and $X_{21}$ to $X_{25}$ are independently selected from C (including CH) or N. In some embodiments, a bond, including a covalent bond or a dative bond for example, may be formed between any one of $X_{11}$ to $X_{15}$ and the core moiety. In other embodiments, a bond, including a covalent bond or a dative bond for example, may be formed between any one of $X_{21}$ to $X_{25}$ and the core moiety. In yet another embodiment, a bond may be formed between any one of $X_{11}$ to $X_{15}$ and the core moiety, and an additional bond may be formed between any one of $X_{21}$ to $X_{25}$ and the core moiety. For example, in the case of complexes such as metal complexes, two or more bonds may be formed between the moiety (I-h) and the core moiety. In general, the moiety represented by (I-h) may be unsubstituted or may be substituted by having one or more of its hydrogen atoms replaced by one or more substituent groups. In the moiety represented by (I-h), $R_d$ and $R_e$ independently represent the optional presence of one or more substituent groups, wherein $R_d$ may represent mono, di, tri, tetra, or penta substitution, and $R_e$ may represent mono, di, tri, tetra, or penta substitution. For example, one or more substituent groups, $R_d$ and $R_e$, may independently be selected from: deutero, fluoro, alkyl including $C_1$-$C_4$ alkyl, cycloalkyl, arylalkyl, silyl, aryl, heteroaryl, fluoroalkyl, and any combinations thereof. Particularly, one or more substituent groups, $R_d$ and $R_e$, may be independently selected from: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl.

In yet another embodiment, at least one terminal moiety is, or includes, a polycyclic aromatic moiety including fused ring structures, such as fluorene moieties or phenylene moieties (including those containing multiple (e.g., 3, 4, or more) fused benzene rings). Examples of such moieties include spirobifluorene moiety, triphenylene moiety, diphenylfluorene moiety, dimethylfluorene moiety, difluorofluorene moiety, and any combinations thereof.

In some embodiments, a polycyclic aromatic compound includes organic molecules represented by at least one of chemical structures (II), (III), and (IV) as follows:

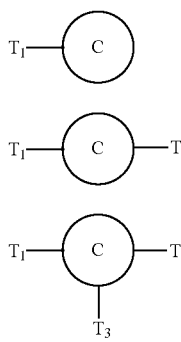

In (II), (III), and (IV), C represents a core moiety, and $T_1$, $T_2$, and $T_3$ represent terminal moieties bonded to the core moiety. Although 1, 2, and 3 terminal moieties are depicted in (II), (III), and (IV), it should be understood that more than 3 terminal moieties also may be included.

In some embodiments, C is, or includes, a heterocyclic moiety, such as a heterocyclic moiety including one or more nitrogen atoms, for which an example is a triazole moiety. In some embodiments, C is, or includes, a metal atom (including transition and post-transition atoms), such as an aluminum atom, a copper atom, an iridium atom, and/or a platinum atom. In some embodiments, C is, or includes, a nitrogen atom, an oxygen atom, and/or a phosphorus atom. In some embodiments, C is, or includes, a cyclic hydrocarbon moiety, which may be aromatic. In some embodiments, C is, or includes, a substituted or unsubstituted alkyl, which may be branched or unbranched, a cycloalkynyl (including those containing between 1 and 7 carbon atoms), an alkenyl, an alkynyl, an aryl (including phenyl, naphthyl, thienyl, and indolyl), an arylalkyl, a heterocyclic moiety (including cyclic amines such as morpholino, piperdino and pyrolidino), a cyclic ether moiety (such as tetrahydrofuran and tetrahydropyran moieties), a heteroaryl (including pyrrole, furan, thiophene, imidazole, oxazole, thiazole, triazole, pyrazole, pyridine, pyrazine, pyrimidine, polycyclic heteroaromatic moieties, and dibenzylthiophenyl), fluorene moieties, silyl, and any combinations thereof. In some embodiments, C is, or includes a complex, such as a metal coordination complex. Examples of such complexes are described further below. In such embodiments, for example, the one or more terminal moieties may be bonded to one or more ligands that surround the complex center.

In (II), (III), and (IV), $T_1$ is, or includes, a moiety represented by (I-a), (I-b), (I-c), (I-d), (I-e), (I-f), (I-g), or (I-h), or a polycyclic aromatic moiety including fused ring structures as described above. The moiety, $T_1$, may be directly bonded to the core moiety, or may be bonded to the core moiety via a linker moiety. Examples of a linker moiety include —O— (where O denotes an oxygen atom), —S— (where S denotes a sulfur atom), and cyclic or acyclic hydrocarbon moieties including 1, 2, 3, 4, or more carbon atoms, and which may be unsubstituted or substituted, and which may optionally include one or more heteroatoms. The bond between the core moiety and one or more terminal moieties may be a covalent bond or a bond formed between a metallic element and an organic element, particularly in the case of organometallic compounds.

In (III), $T_1$ and $T_2$ may be the same or different, as long as at least $T_1$ is, or includes, a moiety represented by (I-a), (I-b), (I-c), (I-d), (I-e), (I-g), or (I-h), or a polycyclic aromatic moiety including fused ring structures as described above. For example, each of $T_1$ and $T_2$ may be, or may include, a moiety represented by (I-a), (I-b), (I-c), (I-d), (I-e), (I-f), (I-g), or (I-h) or a polycyclic aromatic moiety including fused ring structures as described above. As another example, $T_1$ is, or includes, a moiety represented by (I-a), (I-b), (I-c), (I-d), (I-e), (I-f), (I-g), or (I-h), or a polycyclic aromatic moiety including fused ring structures as described above, while $T_2$ may lack such a moiety. In some embodiments, $T_2$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, $T_2$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, $T_2$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$ and $T_2$ are different, $T_2$ may be selected from moieties having sizes comparable to $T_1$. Specifically, $T_2$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moiety $T_2$ is included which is different from or lacks a moiety represented by (I-a), (I-b), (I-c), (I-d), (I-e), (I-g), or (I-h), or a polycyclic aromatic moiety including fused ring structures as described above, a comparable size of $T_2$ with respect to $T_1$ may promote exposure of $T_1$ on a surface, in contrast to bulky terminal groups that may hinder exposure of $T_1$ due to molecular stacking, steric hindrance, or a combination of such effects.

In (IV), $T_1$, $T_2$, and $T_3$ may be the same or different, as long as at least $T_1$ is, or includes, a moiety represented by (I-a), (I-b), (I-c), (I-d), (I-e), (I-g), or (I-h), or a polycyclic aromatic moiety including fused ring structures as described above. For example, each of $T_1$, $T_2$, and $T_3$ may be, or may include, a moiety represented by (I-a), (I-b), (I-c), (I-d), (I-e), (I-f), (I-g), or (I-h), or a polycyclic aromatic moiety including fused ring structures as described above. As another example, each of $T_1$ and $T_2$ may be, or may include, a moiety represented by (I-a), (I-b), (I-c), (I-d), (I-e), (I-f), (I-g), or (I-h), or a polycyclic aromatic moiety including fused ring structures as described above, while $T_3$ may lack such a moiety. As another example, each of $T_1$ and $T_3$ may be, or may include, a moiety represented by (I-a), (I-b), (I-c), (I-d), (I-e), (I-g), or (I-h), or a polycyclic aromatic moiety including fused ring structures as described above, while $T_2$ may lack such a moiety. As a further example, $T_1$ is, or includes, a moiety represented by (I-a), (I-b), (I-c), (I-d), (I-e), (I-f), (I-g), or (I-h), or a polycyclic aromatic moiety including fused ring structures as described above, while both $T_2$ and $T_3$ may lack such a moiety. In some embodiments, at least one $T_2$ and $T_3$ is, or includes, a cyclic hydrocarbon moiety, which may be aromatic, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, a heterocyclic moiety, such as a heterocyclic moiety including one or more nitrogen atoms, which may include a single ring structure or may be polycyclic, which may be substituted or unsubstituted, and which may be directly bonded to the core moiety, or may be bonded to the core moiety via a linker moiety. In some embodiments, at least one $T_2$ and $T_3$ is, or includes, an acyclic hydrocarbon moiety, which may be unsubstituted or substituted, which may optionally include one or more heteroatoms, and which may be directly bonded to the core moiety, or may be bonded to the core moiety via a linker moiety. In some embodiments where $T_1$, $T_2$, and $T_3$ are different, $T_2$ and $T_3$ may be selected from moieties having sizes comparable to $T_1$. Specifically, Ta and $T_3$ may be selected from the above-listed moieties having molecular weights no greater than about 2 times, no greater than about 1.9 times, no greater than about 1.7 times, no greater than about 1.5 times, no greater than about 1.2 times, or no greater than about 1.1 times a molecular weight of $T_1$. Without wishing to be bound by a particular theory, it is postulated that, when the terminal moieties $T_2$ and $T_3$ are included which are different from or lacks a moiety represented by (I-a), (I-b), (I-c), (I-d), (I-e), (I-f), (I-g), or (I-h), or a polycyclic aromatic moiety including fused ring structures as described above, a comparable size of $T_2$ and $T_3$ with respect to $T_1$ may promote exposure of $T_1$ on a surface, in contrast to bulky terminal groups that may hinder exposure of $T_1$ due to molecular stacking, steric hindrance, or a combination of such effects.

Suitable nucleation inhibiting materials include polymeric materials. Examples of such polymeric materials include: fluoropolymers, including but not limited to perfluorinated polymers and polytetrafluoroethylene (PTFE); polyvinylbiphenyl; polyvinylcarbazole (PVK); and polymers formed by polymerizing a plurality of the polycyclic aromatic compounds as described above. In another example, polymeric materials include polymers formed by polymerizing a plurality of monomers, wherein at least one of the monomers includes a terminal moiety that is, or includes, a moiety represented by (I-a), (I-b), (I-c), (I-d), (I-e), (I-f), (I-g), or (I-h), or a polycyclic aromatic moiety including fused ring structures as described above.

Suitable nucleation inhibiting materials also include complexes, such as organo-metallic complexes or metal coordination complexes. Examples of such complexes include those formed by a metallic coordination center and ligands surrounding the coordination center. Examples of an atom or ion which may form the coordination center include, but are not limited to, iridium (Ir), Zn, rhodium (Rh), Al, beryllium (Be), rhenium (Re), ruthenium (Ru), boron (B), P, Cu, osmium (Os), gold (Au), and platinum (Pt). In complexes or metal coordination complexes, a dative bond may be formed between the coordination center and one or more atoms of the surrounding ligands. Examples of bonds which may be formed between the coordination center and one or more atoms of the surrounding ligands include, but are not limited to, those formed between a metallic atom of the coordination center and carbon, nitrogen, or oxygen. Specifically, examples of such bonds include those formed between Al and O, Al and N, Zn and O, Zn and N, Zn and C, Be and O, Be and N, Ir and N, Ir and C, Ir and O, Cu and N, B and C, Pt and N, Pt and O, Os and N, Ru and N, Re and N, Re and O, Re and C, Cu and P, Au and N, and Os and C.

An example of a ligand which may be present in a metal coordination complex includes a phenylpyridine ligand, which is illustrated below as being bonded to a coordination center, M.

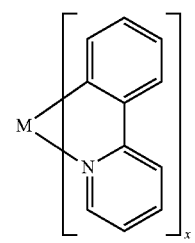

For example, M may be a metal center such as Ir. It will be appreciated that such complex may include one or more phenylpyridine ligands. For example, 1, 2, or 3 phenylpyridine ligands may be bonded to the coordination center, M. In other examples, the complex may include other ligands in addition to one or more phenylpyridine ligands.

EXAMPLES

Aspects of some embodiments will now be illustrated and described with reference to the following examples, which are not intended to limit the scope of the present disclosure in any way.

As used in the examples herein, a reference to a layer thickness of a material refers to an amount of the material deposited on a target surface (or target region(s) of the surface in the case of selective deposition), which corresponds to an amount of the material to cover the target surface with an uniformly thick layer of the material having the layer thickness. By way of example, depositing a layer thickness of 10 nm indicates that an amount of the material deposited on the surface corresponds to an amount of the material to form an uniformly thick layer of the material that is 10 nm thick. It will be appreciated that, for example, due to possible stacking or clustering of molecules or atoms, an actual thickness of the deposited material may be non-uniform. For example, depositing a layer thickness of 10 nm may yield some portions of the deposited material having an actual thickness greater than 10 nm, or other portions of the deposited material having an actual thickness less than 10 nm. A certain layer thickness of a material deposited on a surface can correspond to an average thickness of the deposited material across the surface.

Molecular structures of certain materials used in the illustrative examples are provided below.

-continued

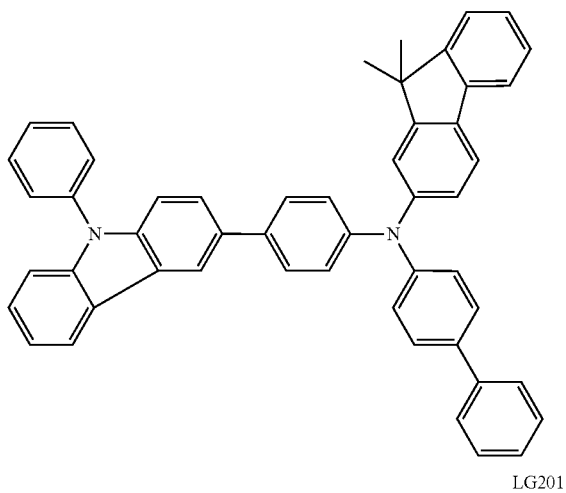

HT211

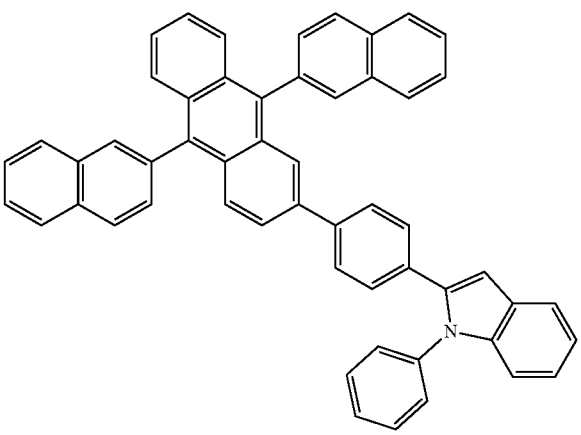

LG201

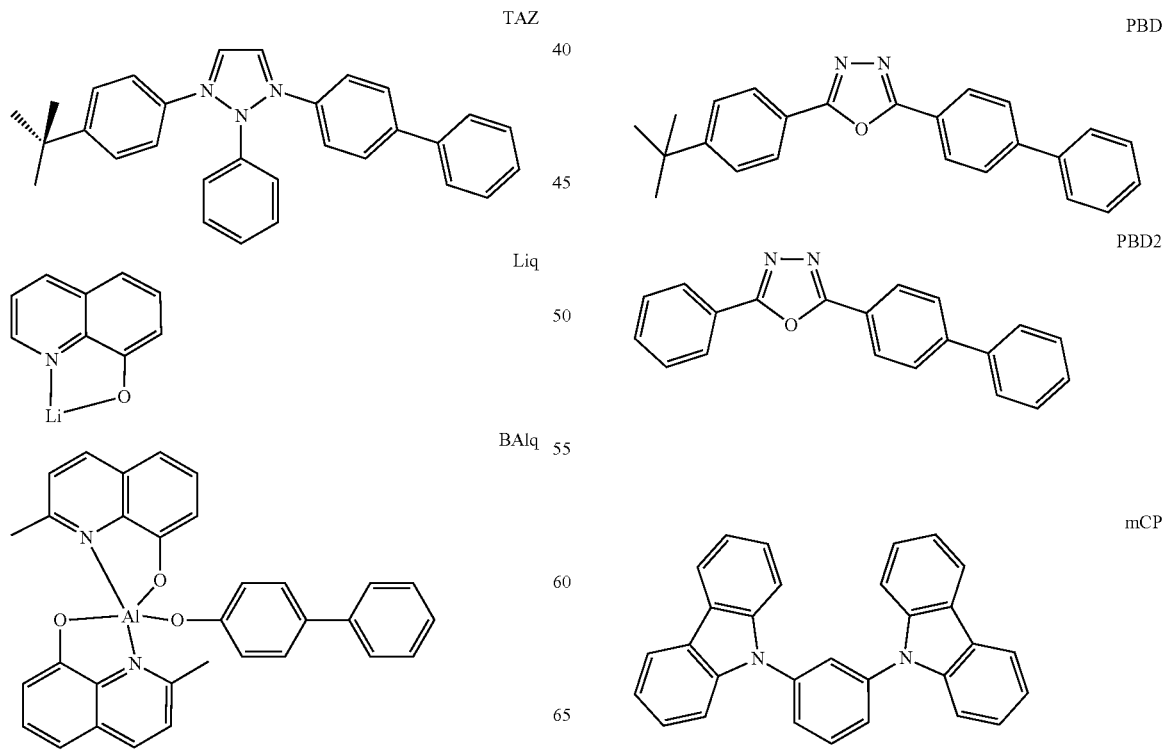

TAZ

PBD

PBD2

Liq

BAlq mCP

-continued

NPB

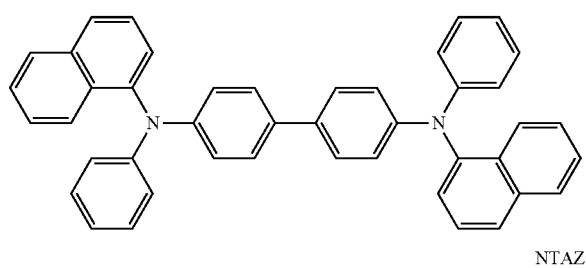

NTAZ

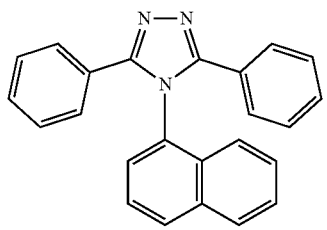

tBuP-TAZ

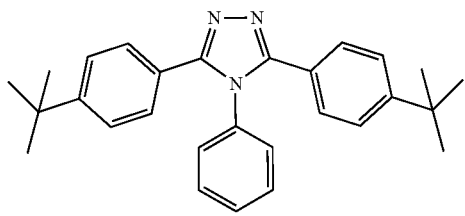

BND

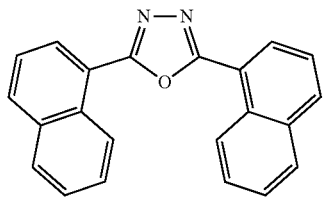

TBADN

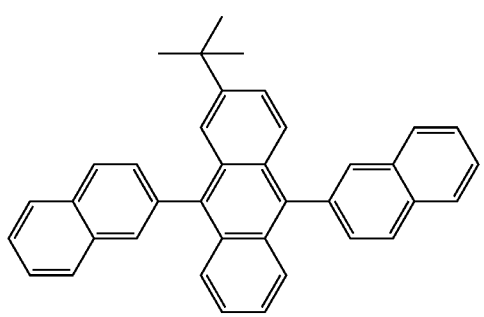

CBP

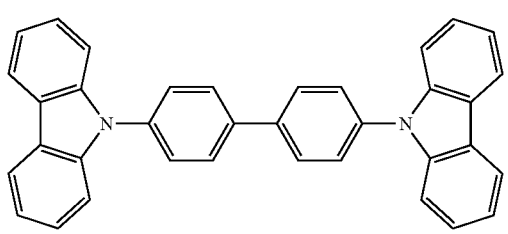

-continued

β-NPB

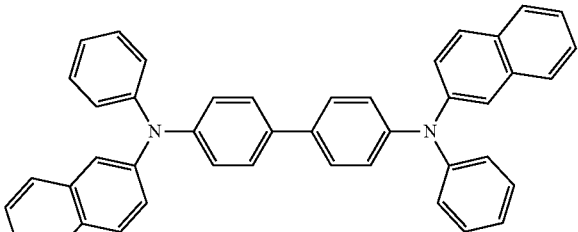

m-BPC

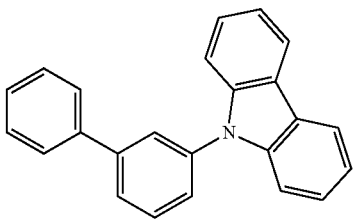

Ir(ppy)₃

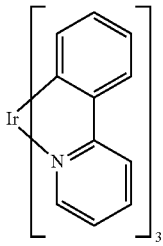

As used herein, TAZ refers to 3-(4-biphenyl)-4-phenyl-5-tert-butylphenyl-1,2,4-triazole, Liq refers to 8-hydroxyquinolinato lithium, BAlq refers to Bis(2-methyl-8-quinolinolate)-4-(phenylphenolato)aluminum, $HT_{211}$ refers to N-[1,1'-Biphenyl]-4-yl-9,9-dimethyl-N-[4-(9-phenyl-9H-carbazol-3-yl)phenyl]-9H-fluoren-2-amine, LG201 refers to 2-(4-(9,10-Di(naphthalen-2-yl)anthracene-2-yl)phenyl)-1-phenyl-1H-benzo[d]imidazole, PBD refers to 2-(4-tert-Butylphenyl)-5-(4-biphenylyl)-1,3,4-oxadiazole, PBD2 refers to 2-(4-Biphenylyl)-5-phenyl-1,3,4-oxadiazole, mCP refers to 1,3-Bis(N-carbazolyl)benzene. NPB Example 1

In order to characterize an effect of using various materials to form a nucleation inhibiting coating, a series of samples were prepared using different materials to form the nucleation inhibiting coating.

Specifically, the samples were fabricated by depositing a nucleation inhibiting coating having various thicknesses over a glass substrate, followed by open mask deposition of magnesium. An average evaporation rate of about 2 Å/s was used to deposit a magnesium coating for each of the samples. In conducting the deposition of the magnesium coating, a deposition time of about 5000 seconds was used in order to obtain a reference layer thickness of magnesium of about 1 μm.

Once the samples were fabricated, optical transmission measurements were taken to determine the relative amount of magnesium deposited on the surface of the nucleation inhibiting coating. As will be appreciated, relatively thin magnesium coatings having, for example, thickness of less than 10 nm are substantially transparent. However, light transmission decreases as the thickness of the magnesium coating is increased. Accordingly, the relative performance of various nucleation inhibiting coating materials may be assessed by measuring the light transmission through the samples, which directly correlates to the amount or thickness of magnesium coating deposited thereon from the magnesium deposition process. The thickness of the nucleation inhibiting coating and the optical transmission measurement for each sample is summarized in Table 3 below. In calculating the optical transmission measurement, any loss or absorption of light caused by the presence of the glass substrate and the nucleation inhibiting coating was subtracted from the measured transmittance. As such, the optical transmission value provided in Table 3 reflects solely the transmission of light (taken at a wavelength of about 550 nm) through any magnesium coating which may be present on the surface of the nucleation inhibiting coating.

TABLE 3

Table of Optical Transmission Measurement Data

| Nucleation Inhibiting Coating Material | Nucleation Inhibiting Coating Thickness (nm) | Optical Transmission (%) |
|---|---|---|
| PBD | 29 | 92 |
| PBD2 | 56 | 100 |
| mCP | 31 | 98 |
| LG201 | 200 | 5 |
| TAX | 18 | 100 |
| β-NPB | 63 | 99 |
| NTAZ | 50 | 100 |
| Liq | 27 | 23 |
| tBup-TAZ | 43 | 100 |
| BND | 24 | 100 |
| TBADN | 66 | 99 |
| CBP | 33 | 100 |
| HT211 | 32 | 5 |
| BAlq | 58 | 95 |
| M-BPC | 15 | 100 |
| Ir(ppy) | 9 | 96 |

Based on the above, it can be seen that relatively high optical transmission of above 90% was measured for samples fabricated using PBD, PBD2, mCP, TAZ, β-NPB, NTAZ, tBUP-TAZ, BND, TBADN, CBP, BAlq, m-BPC, or Ir(ppy)3 as the nucleation inhibiting coating material. As explained above, high optical transmission can be directly attributed to a relatively small amount of magnesium coating, if any, being present on the surface of the nucleation inhibiting coating to absorb the light being transmitted through the sample. Accordingly, these nucleation inhibiting coating materials generally exhibit relatively low affinity or initial sticking probability to magnesium and thus may be particularly useful for achieving selective deposition and patterning of magnesium coating in certain applications.

On the other hand, samples fabricated using LG201, Liq, and HT211 exhibited relatively low optical transmission. In particular, the sample fabricated using Liq exhibited a relatively low optical transmission of less than about 25%, and the samples fabricated using LG201 and HT211 exhibited even lower optical transmission of about 5%. This is indicative of a relatively large amount or thick layer of magnesium coating being deposited on the surface of the coating of these materials, which results in significant absorption of light. Accordingly, these materials generally exhibit relatively high affinity or initial sticking probability and thus may be undesirable for use in achieving selective deposition of magnesium coating, particularly in applications specifying selective deposition of a relatively thick magnesium coating of several hundred nanometers, a micron, or more.

As used in this and other examples described herein, a reference layer thickness refers to a layer thickness of magnesium that is deposited on a reference surface exhibiting a high initial sticking coefficient (e.g., a surface with an initial sticking coefficient of about or close to 1.0). Specifically for these examples, the reference surface was a surface of a quartz crystal positioned inside a deposition chamber for monitoring a deposition rate and the reference layer thickness. In other words, the reference layer thickness does not indicate an actual thickness of magnesium deposited on a target surface (e.g., a surface of the nucleation inhibiting coating). Rather, the reference layer thickness refers to the layer thickness of magnesium that would be deposited on the reference surface upon subjecting the target surface and reference surface to identical magnesium vapor flux for the same deposition period (e.g., the surface of the quartz crystal). As would be appreciated, in the event that the target surface and reference surface are not subjected to identical vapor flux simultaneously during deposition, an appropriate tooling factor may be used to determine and monitor the reference layer thickness.

Example 2

In order to determine what effects a magnesium evaporation rate may have on the nucleation inhibiting properties of various materials, a series of samples were prepared using different materials to form a nucleation inhibiting coating and then exposed to relatively high magnesium vapor flux. Specifically, the samples were fabricated by depositing a nucleation inhibiting coating having various thicknesses over a glass substrate, followed by open mask evaporation of magnesium over the nucleation inhibiting coating. The samples were subjected to a magnesium flux having an average deposition rate of about 10 Å/s, as measured using the reference surface. In conducting the deposition of the magnesium coating, a deposition time of about 1000 seconds was used in order to obtain a reference layer thickness of magnesium of about 1 μm.

Once the samples were fabricated, optical transmission measurements were taken to determine the relative amount of magnesium deposited on the surface of the nucleation inhibiting coating. The thickness of the nucleation inhibiting coating and the optical transmission measurement for each sample is summarized in Table 4 below. In calculating the optical transmission measurement, any loss or absorption of light caused by the presence of the glass substrate and the nucleation inhibiting coating was subtracted from the measured transmittance. As such, the optical transmission value provided in Table 4 reflects solely the transmission of light (taken at a wavelength of about 550 nm) through any magnesium coating which may be present on the surface of the nucleation inhibiting coating.

TABLE 4

Table of Optical Transmission Measurement Data

| Nucleation Inhibiting Coating Material | Nucleation Inhibiting Coating Thickness (nm) | Optical Transmission (%) |
|---|---|---|
| PBD | 50 | 8 |
| mCP | 66 | 72 |
| TAZ | 33 | 100 |
| β-NPB | 25 | 0 |
| NTAZ | 50 | 98 |
| tBuP-TAZ | 52 | 100 |

TABLE 4-continued

Table of Optical Transmission Measurement Data

| Nucleation Inhibiting Coating Material | Nucleation Inhibiting Coating Thickness (nm) | Optical Transmission (%) |
|---|---|---|
| CBP | 45 | 20 |
| BAlq | 47 | 94 |

Based on the above, it can be seen that relatively high optical transmission of above 90% was measured for samples fabricated using TAZ, NTAZ, tBuP-TAZ, or BAlq as the nucleation inhibiting coating material. As explained above, high optical transmission can be directly attributed to a relatively small amount of magnesium coating, if any, being present on the surface of the nucleation inhibiting coating. Accordingly, these nucleation inhibiting coating materials may be particularly useful for achieving selective deposition and patterning of magnesium coating in certain applications. For example, these materials may be particularly suitable for applications in which the deposition rate of magnesium coating is higher than about 2 Å/s.

The sample fabricated using mCP as the nucleation inhibiting coating material exhibited optical transmission of about 72%. While it is generally more favorable to use a material exhibiting higher optical transmission and thus superior nucleation inhibiting properties (e.g., low initial sticking probability) for applications specifying highly selective deposition of magnesium coating, materials such as mCP may nevertheless be useful in forming the nucleation inhibiting coating for certain applications.

Samples fabricated using PBD, β-NPB, and CBP all exhibited relatively low optical transmission. In particular, the sample fabricated using CBP exhibited a relatively low optical transmission of about 20%, and the samples fabricated using PBD and β-NPB exhibited even lower optical transmission of about 8% and 0%, respectively. This is indicative of a relatively large amount or thick layer of magnesium coating being deposited on the surface of the nucleation inhibiting coating, which results in significant absorption of light. Accordingly, these materials may be less desirable for use in achieving selective deposition of magnesium coating, particularly in applications specifying selective deposition of a relatively thick magnesium coating at a high deposition rate greater than about 2 Å/s (e.g., deposition rate of about 10 Å/s).

By comparing the results of Example 2 to those of Example 1, it has been determined, somewhat surprisingly, that some materials substantially inhibit deposition of magnesium thereon when subjected to magnesium vapor flux at a relatively low deposition rate or evaporation rate, but the degree to which magnesium deposition is inhibited is substantially decreased when a relatively high deposition rate or evaporation rate of magnesium is used. In other words, it has been observed that selective deposition of magnesium coating may be successfully achieved using certain nucleation inhibiting coating materials (such as, for example, PBD, β-NPB, and CBP) at a relatively low magnesium deposition rate of about 2 Å/s. However, at a relatively high deposition rate of about 10 Å/s, highly selective deposition of magnesium coating could be less adequately achieved using the same nucleation inhibiting coating materials.

It has also been observed that some nucleation inhibiting coating materials appear to be effective at inhibiting deposition of magnesium thereon, irrespective of the magnesium deposition rate used in these examples. Based on the experimental results, materials such as TAZ, NTAZ, tBuP-TAZ, and BAlq may be used to form an effective nucleation inhibiting coating for achieving highly selective deposition of magnesium coating at magnesium deposition rate of at least up to about 10 Å/s or greater.

Without wishing to be bound by a particular theory, it is postulated, based on the theory of nucleation and growth discussed above, that surfaces formed by depositing materials such as TAZ, NTAZ, tBuP-TAZ, and BAlq generally exhibit a relatively low desorption energy ($E_{des}$) for adsorbed magnesium adatoms, a high activation energy ($E_s$) for diffusion of magnesium adatoms, or both. In this way, the critical nucleation rate ($\dot{N}_i$), which is determined according to the equation below, remains relatively low even when the vapor impingement rate of magnesium (P) is increased, thus substantially inhibiting deposition of magnesium.

$$\dot{N}_i = R a_0^2 n_0 \left(\frac{R}{v n_0}\right)^i \exp\left(\frac{(i+1)E_{des} - E_S + E_i}{kT}\right)$$

In addition, it can readily be observed, based on the equation above, that the critical nucleation rate is increased at higher vapor impingement rate. Accordingly, nucleation inhibiting coatings formed by materials such as LG201, Liq, and HT211, which were found to lack sufficient selectivity even at relatively low magnesium deposition rate of 2 Å/s based on the results of Example 1, would be expected to exhibit even lower selectivity when higher magnesium deposition rate is used.

It is postulated that the temperature of the substrate may be increased when the vapor impingement rate (e.g., the evaporation rate) is increased. For example, the evaporation source is typically operated at a higher temperature when the evaporation rate is increased. Accordingly, at higher evaporation rate, the substrate may be subjected to higher level of thermal radiation, which can heat up the substrate. Other factors, which may result in increased substrate temperature, include heating of the substrate caused by energy transfer from greater number of evaporated molecules being incident on the substrate surface, as well as increased rate of condensation or desublimation of molecules on the substrate surface releasing energy in the process and causing heating.

For further clarity, the term "selectivity" when used in the context of a nucleation inhibiting coating should be understood to refer to the degree to which the nucleation inhibiting coating inhibits or prevents deposition of a conductive coating thereon, upon being subjected to a vapor flux of a material used to form the conductive coating. For example, a nucleation inhibiting coating exhibiting a relatively high selectivity for magnesium would generally better inhibit or prevent deposition of magnesium coating thereon compared to a nucleation inhibiting coating having a relatively low selectivity. In general, it has been observed that a nucleation inhibiting coating exhibiting a relatively high selectivity would also exhibit a relatively low initial sticking probability, and a nucleation inhibiting coating exhibiting a relatively low selectivity would exhibit a relatively high initial sticking probability.

Example 3

A series of samples were fabricated to analyze the features and characteristics of a conductive coating at or near an interface between the conductive coating and a nucleation inhibiting coating.

Specifically, each sample was prepared by depositing an about 30 nm thick coating of substantially pure silver (Ag) over a silicon substrate. A nucleation inhibiting coating was then deposited over a portion of the silver-coated substrate surface, such that a portion of the silver-coated substrate surface remained exposed, or substantially free of the nucleation inhibiting coating. Once the nucleation inhibiting coating was deposited, substantially pure magnesium (about 99.99% purity) was deposited using an open mask deposition, such that both the exposed silver-coated substrate surface and the nucleation inhibiting coating surface were subjected to an evaporated magnesium flux during the open mask deposition. All depositions were conducted under vacuum (about $10^{-4}$ Pa to about $10^{-6}$ Pa). The magnesium coating was deposited by evaporation, using a deposition rate of about 2 Å/s.

Figure 36A:
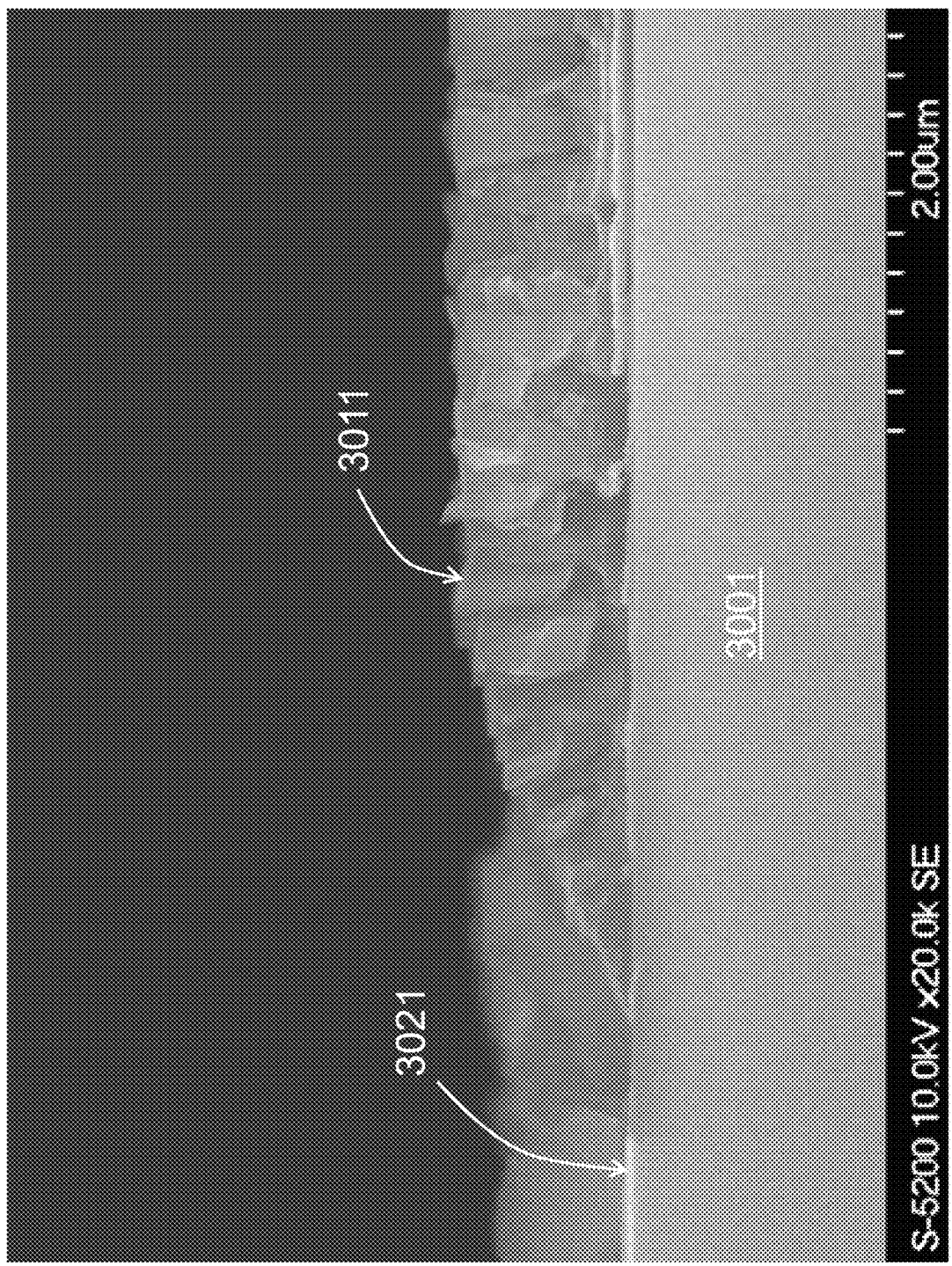
FIG. 36A, FIG. 36B, FIG. 36C, FIG. 36D, FIG. 36E, FIG. 36F, FIG. 36G, and FIG. 36H are scanning electron microscopy (SEM) micrographs of samples of Example 3.

FIG. 36A is an SEM micrograph showing a portion of the sample fabricated using CBP as the nucleation inhibiting coating material.

Figure 36B:
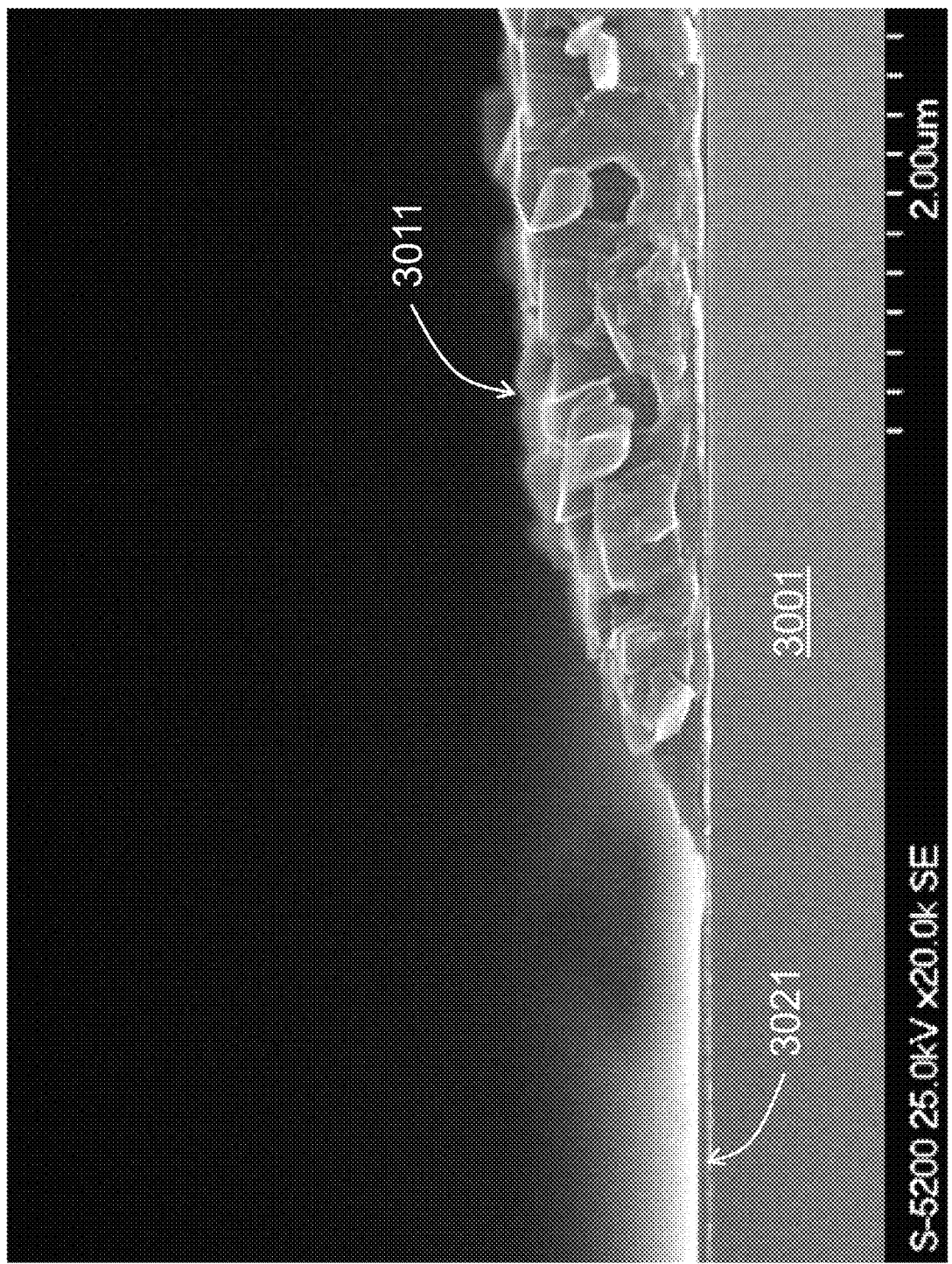

FIG. 36B is an SEM micrograph showing a portion of the sample fabricated using mCP as the nucleation inhibiting coating material.

Figure 36C:
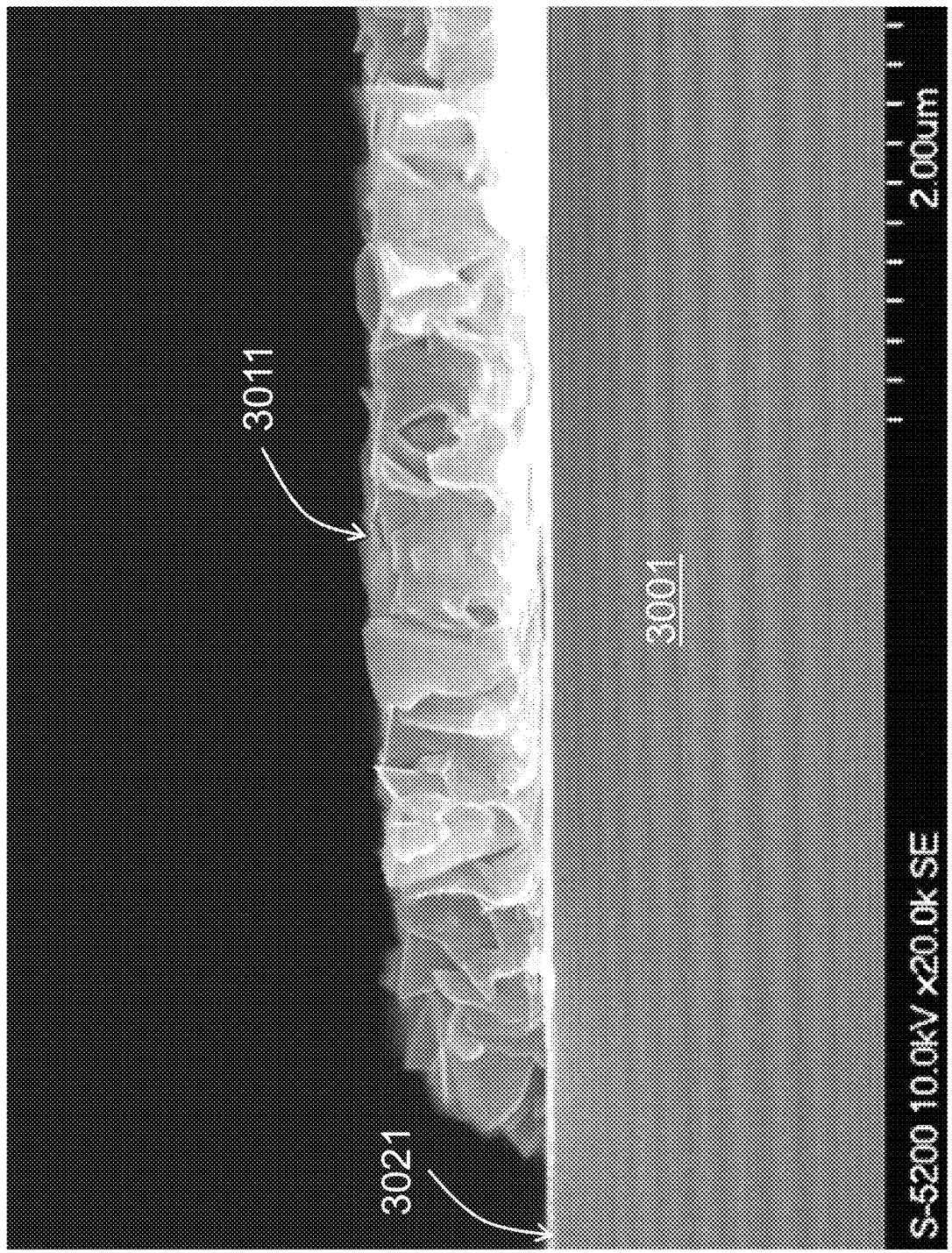

FIG. 36C is an SEM micrograph showing a portion of the sample fabricated using TAZ as the nucleation inhibiting coating material.

Figure 36D:
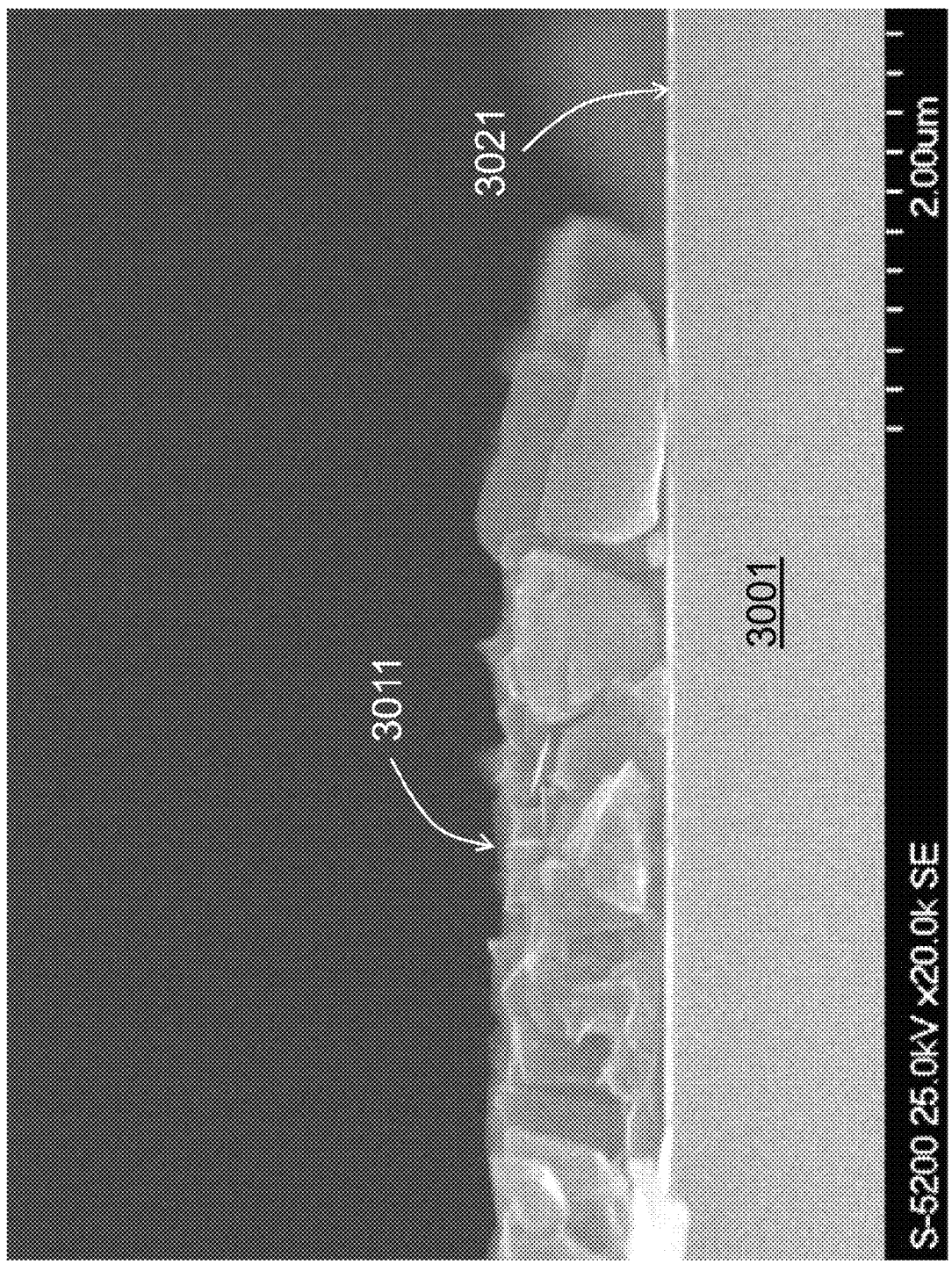

FIG. 36D is an SEM micrograph showing a portion of the sample fabricated using BAlq as the nucleation inhibiting coating material.

Figure 36E:
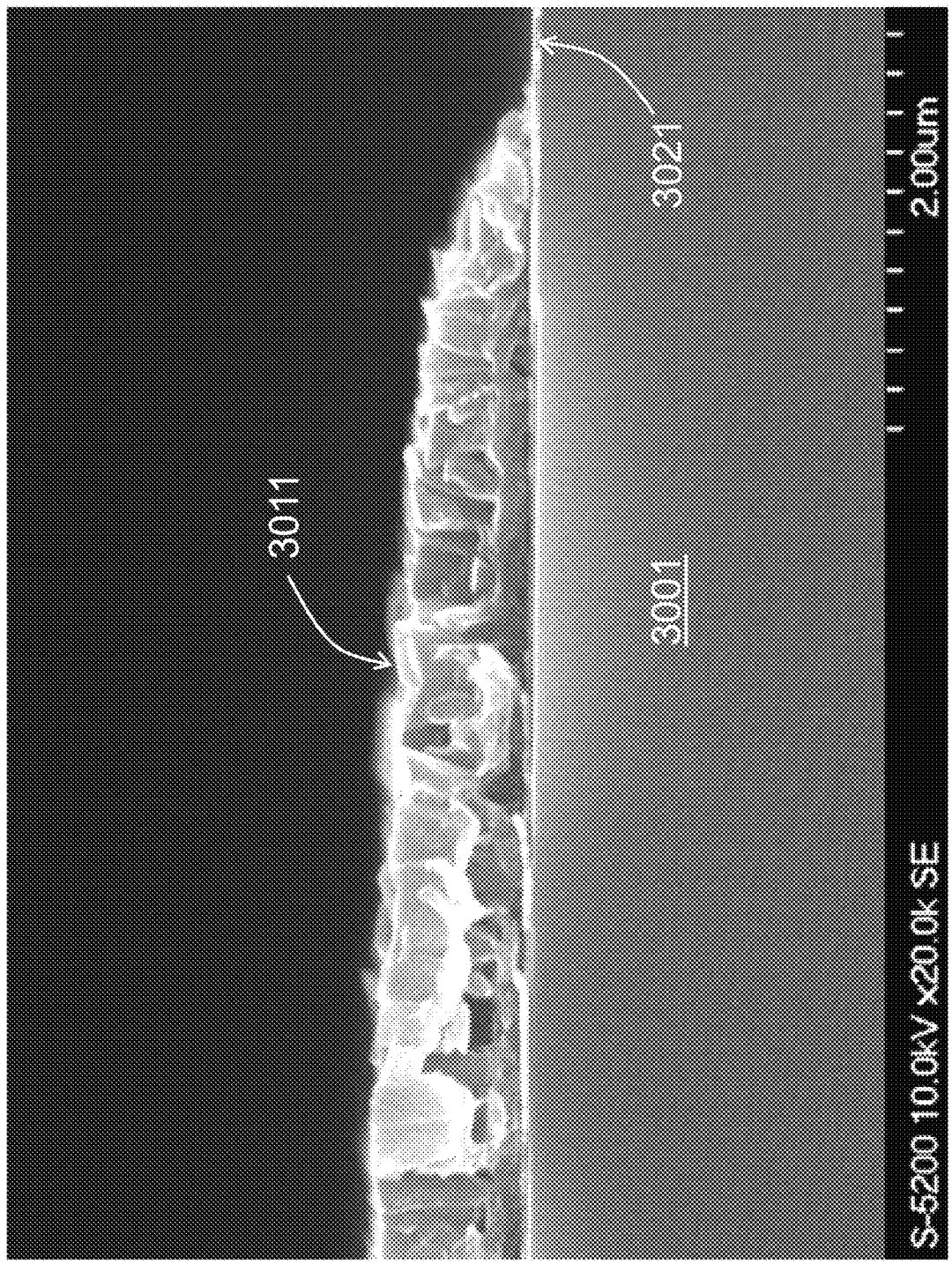

FIG. 36E is an SEM micrograph showing a portion of the sample fabricated using tBuP-TAZ as the nucleation inhibiting coating material.

Figure 36F:
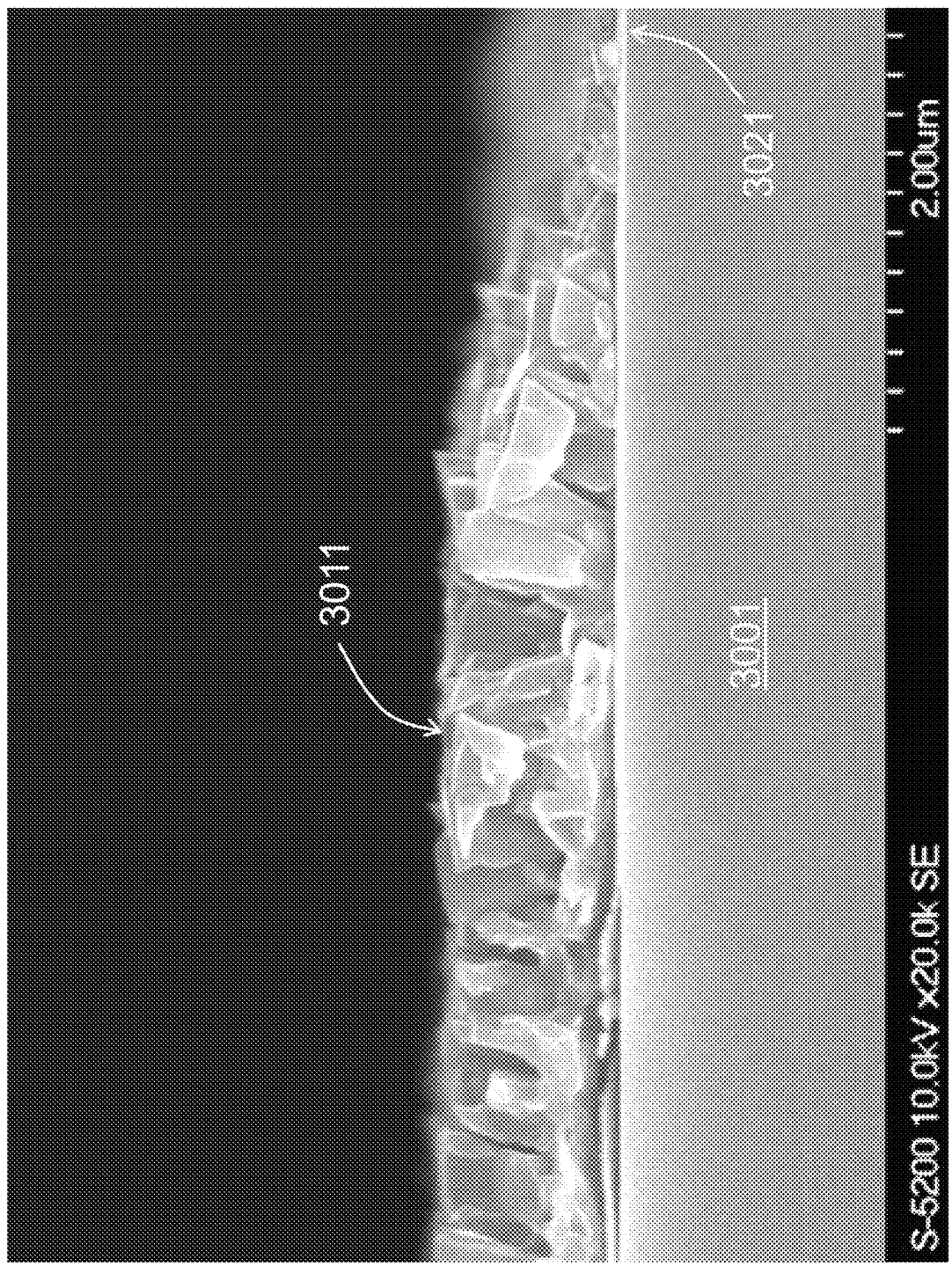

FIG. 36F is an SEM micrograph showing a portion of the sample fabricated using PBD as the nucleation inhibiting coating material.

In each of FIGS. 36A-36F, the conductive coating 3011 is deposited on a portion of the silicon base substrate 3001. The portion of the silicon base substrate 3001 that has been treated by depositing the nucleation inhibiting coating is indicated using the reference numeral 3021.

For reference, a comparative sample was prepared to determine a profile of a magnesium coating deposited on a surface using a shadow mask technique.

The comparative sample was fabricated by depositing about 30 nm layer thickness of silver on top of a silicon wafer, followed by shadow mask deposition of about 800 nm layer thickness of magnesium. Specifically, the shadow mask deposition was configured to allow certain regions of the silver surface to be exposed to a magnesium flux through a shadow mask aperture while masking other regions of the silver surface. Magnesium was deposited at a rate of about 2 Å/s.

Figure 36G:
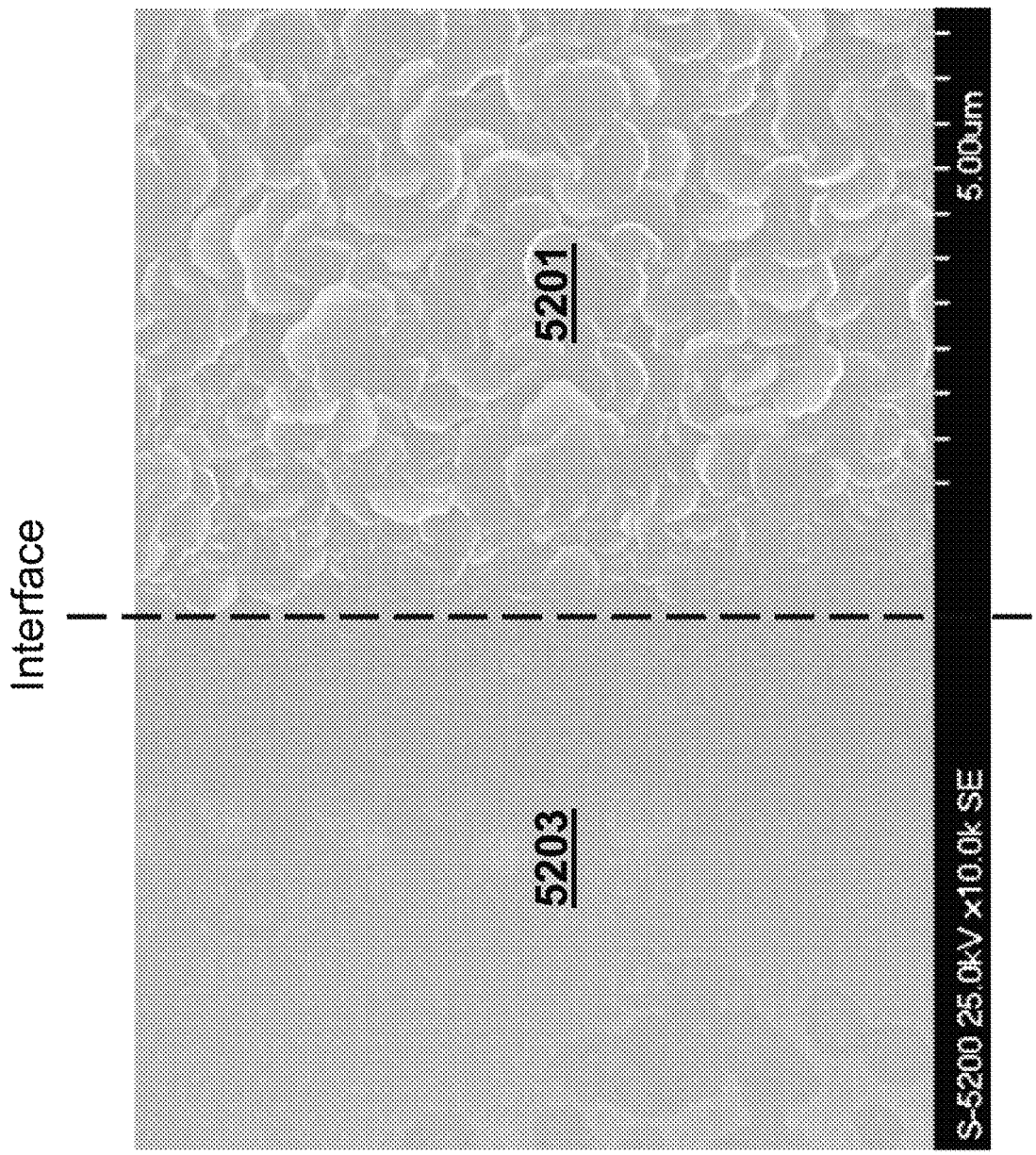

FIG. 36G is a top view of an SEM image of the comparative sample. An approximate interface is shown using a dotted line in FIG. 36G. A first region 5203 corresponds to the masked region, and a second region 5201 corresponds to the exposed region over which a magnesium coating was deposited.

Figure 36H:
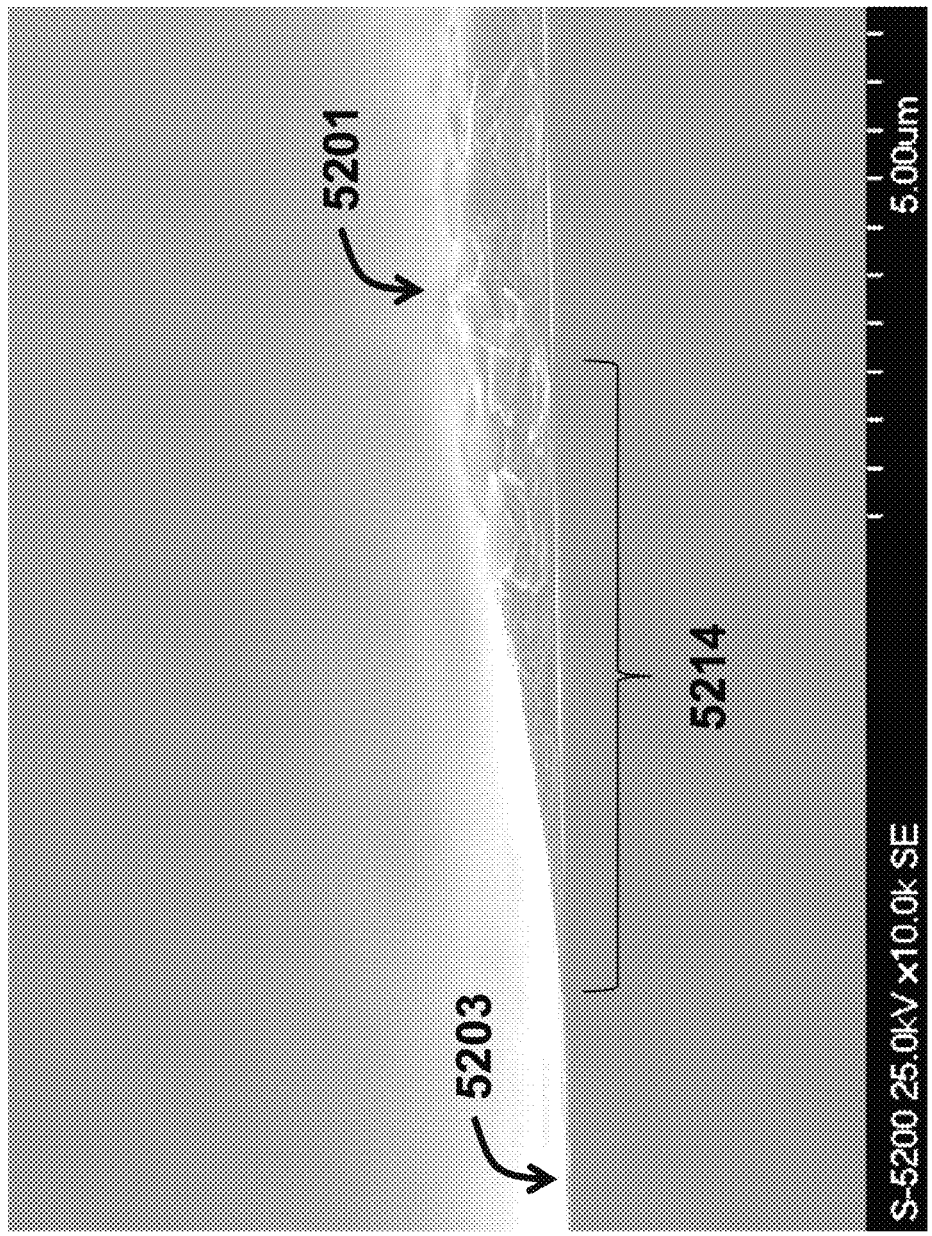

FIG. 36H is a cross-sectional SEM image of the comparative sample. As can be seen in FIG. 36H, the magnesium coating deposited over the second region 5201 includes a relatively long (about 6 μm) "tail" portion 5214 where the thickness of the portion 5214 gradually decreases. It is observed that the tail portion 5214 extends for approximately 6 μm or more in the sample of FIGS. 36G and 36H, which may be undesirable for certain applications specifying selective patterning of fine features or features of relatively high aspect ratio.

Example 4

In one example, a fine mesh mask having a plurality of apertures was used to demonstrate selective deposition of a metallic coating including magnesium at high resolution.

Figure 40B:
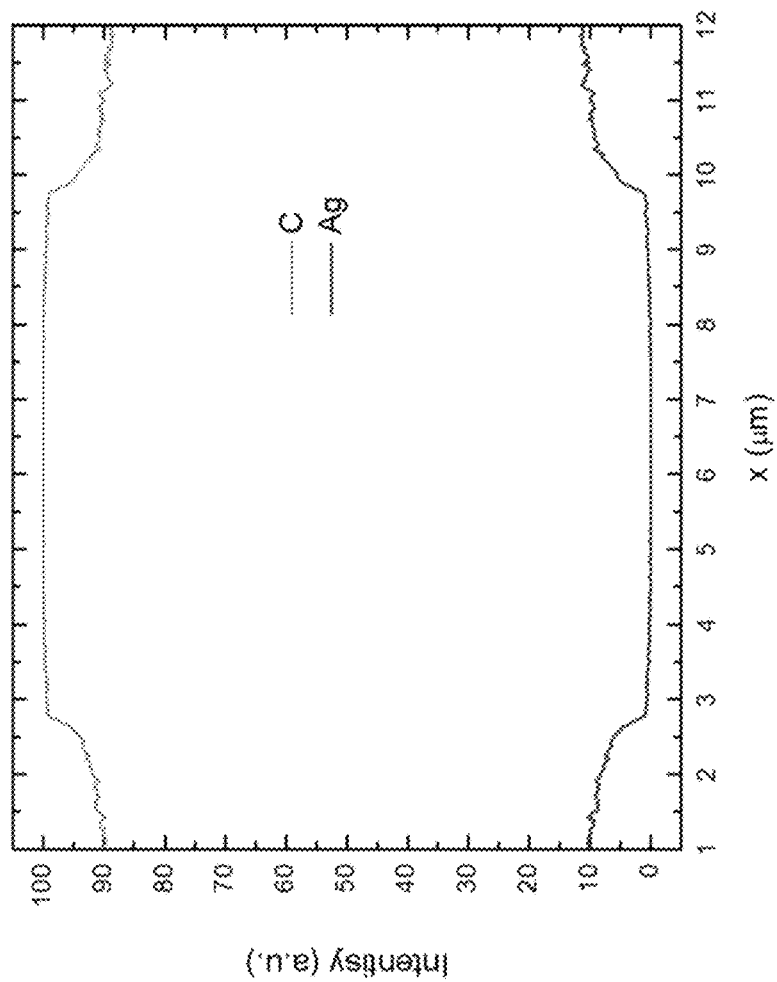
FIG. 40B is an Auger electron microscopy plot showing the spectra taken from the sample area of FIG. 40A.
Figure 40A:
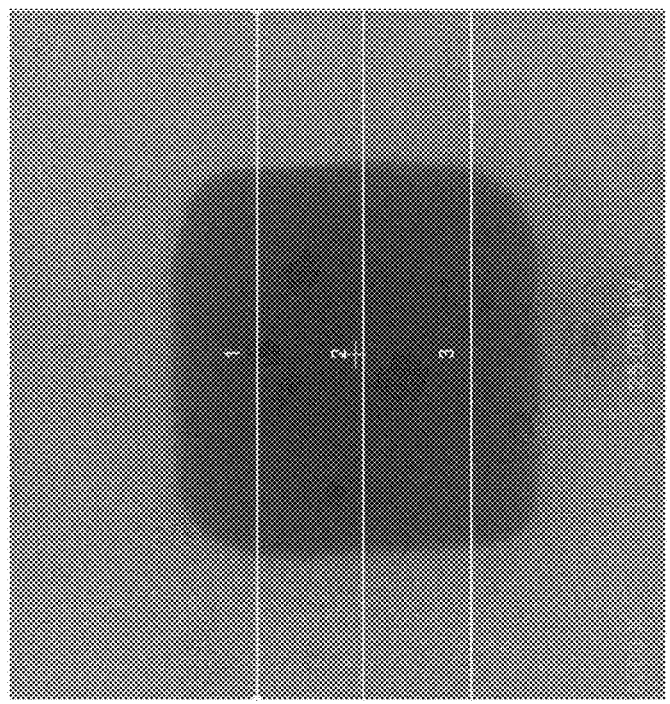
FIG. 40A is an SEM micrograph of a sample area over which a nucleation inhibiting coating has been deposited.

A substrate was prepared by depositing an approximately 20 nm thick silver coating on its surface. The fine mesh mask was then used to selectively deposit a nucleation inhibiting coating including TAZ over portions of the silver-coated surface. Specifically, during deposition of the nucleation inhibiting coating, the fine mesh mask was positioned immediately adjacent to the silver-coated surface, such that portions of the evaporated nucleation inhibiting material flux were selectively transmitted through the apertures of the fine mesh mask to be deposited onto the silver-coated surface. In this way, multiple regions covered by the nucleation inhibiting coating were formed over the silver-coated surface. Each region covered a square area of approximately 7 μm in width, and neighboring regions were separated by a distance of approximately 5.5 μm from one another. The thickness of the nucleation inhibiting coating was approximately 50 nm, and was deposited at approximately 0.16 angstroms/s. FIG. 40A is an SEM micrograph showing an example region covered with the nucleation inhibiting coating. FIG. 40B is an Auger electron spectroscopy plot showing the spectra corresponding to carbon and silver, which were obtained from scanning the area surrounding the region covered by the nucleation inhibiting coating.

Figure 41B:
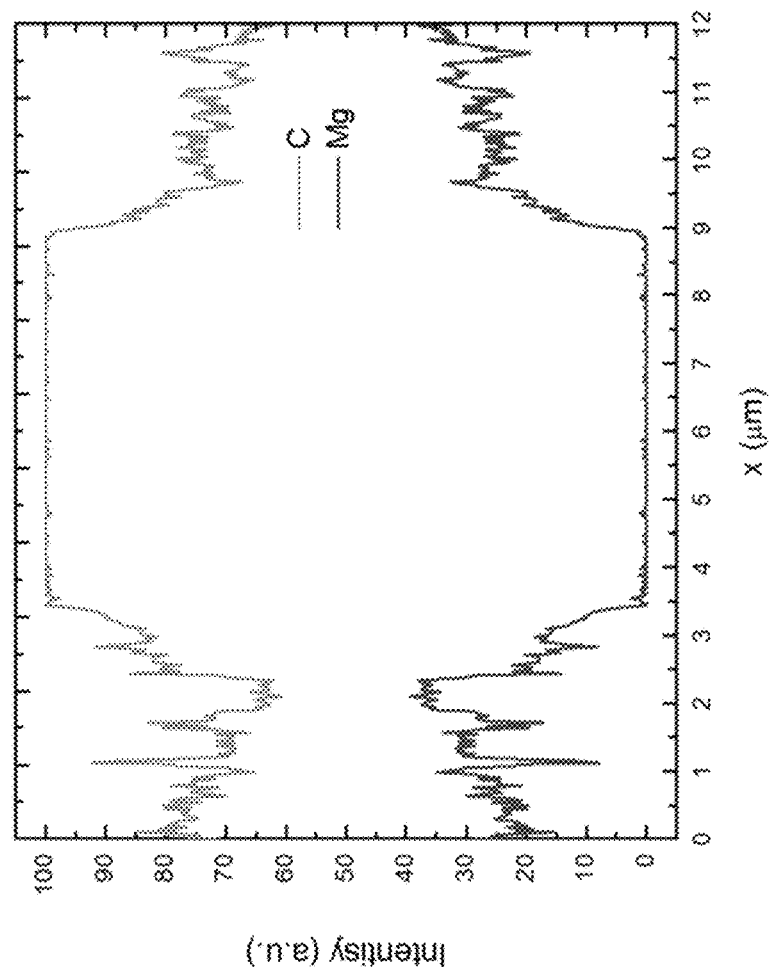
FIG. 41B is an Auger electron microscopy plot showing the spectra taken from the sample area of FIG. 41A.
Figure 41A:
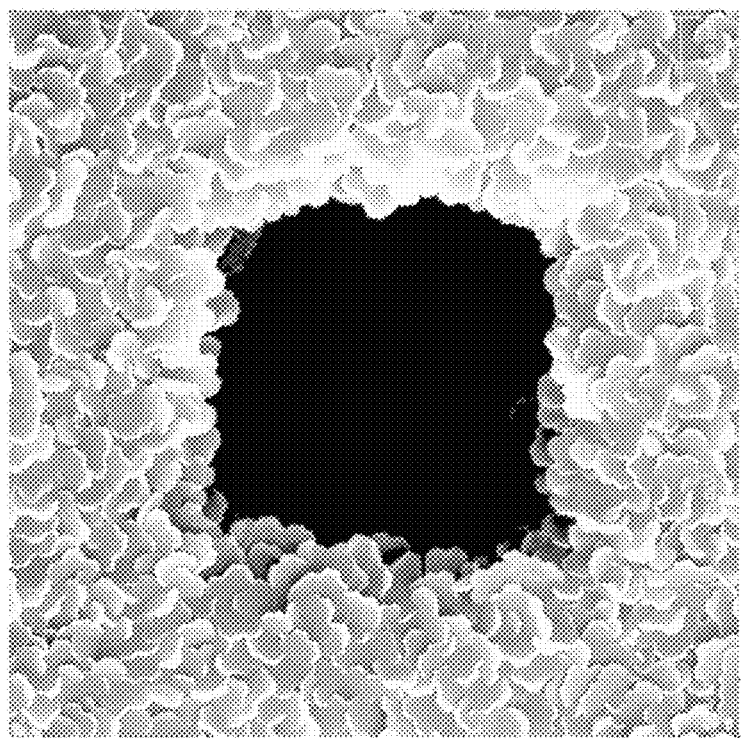
FIG. 41A is an SEM micrograph of a sample area following deposition of a magnesium coating.

The substrate treated with the nucleation inhibiting coating was then subjected to an evaporated magnesium flux through an open mask, such that the evaporated magnesium was incident on both the regions covered by the nucleation inhibiting coating and the silver-coated surface. FIG. 41A is an SEM micrograph showing a portion of the sample following the deposition of magnesium. The thickness of the magnesium coating was approximately 500 nm. FIG. 41B is an Auger electron spectroscopy plot showing the spectra corresponding to carbon and magnesium, which were obtained from conducting a linear scan across the imaged area of FIG. 41A.

As can be seen based on FIGS. 41A and 41B, at least the majority of the region covered by the nucleation inhibiting coating remained substantially free of, or exposed from, the magnesium coating. It was observed, however, that the size of the area which is substantially free of, or exposed from, the magnesium coating may, at least in some cases, be smaller than the size of the region over which the nucleation inhibiting coating is provided. It is postulated that this is due to the lateral growth of the magnesium coating causing formation of an "overhang" feature which partially overlaps or extends above the nucleation inhibiting coating, particularly at or near the interface between the nucleation inhibiting coating and the magnesium coating. Specifically, it can be observed that the approximate size of the region that is substantially free of magnesium in the example of FIGS. 41A and 41B is about 5.5 μm in width.

Figure 42B:
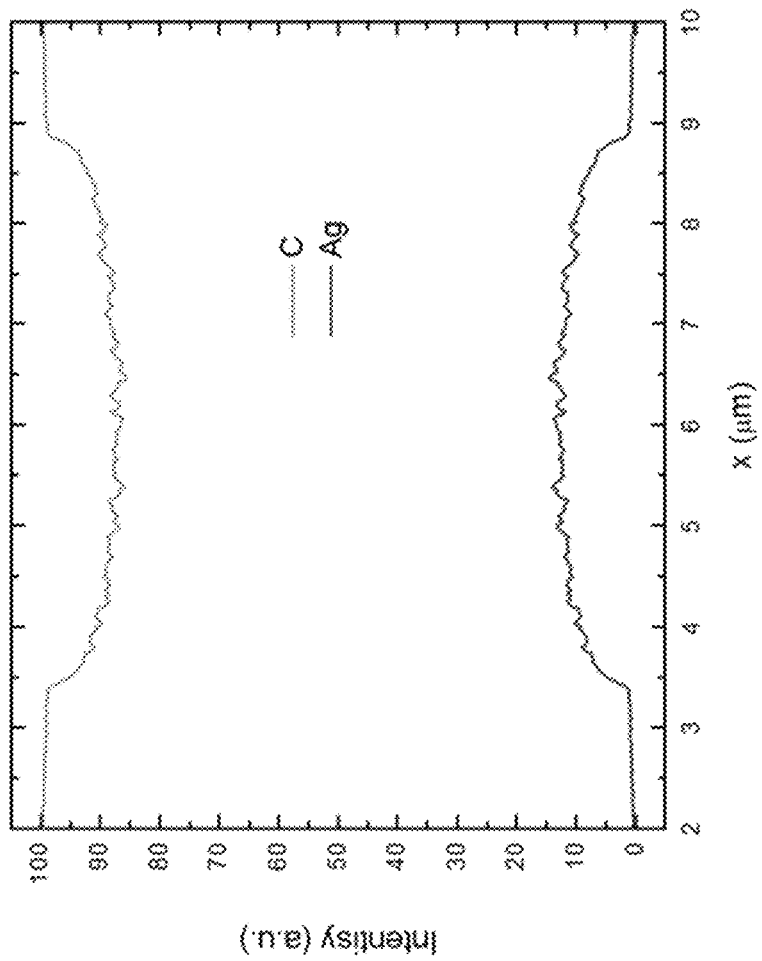
FIG. 42B is an Auger electron microscopy plot showing the spectra taken from the sample area of FIG. 42A.
Figure 42A:
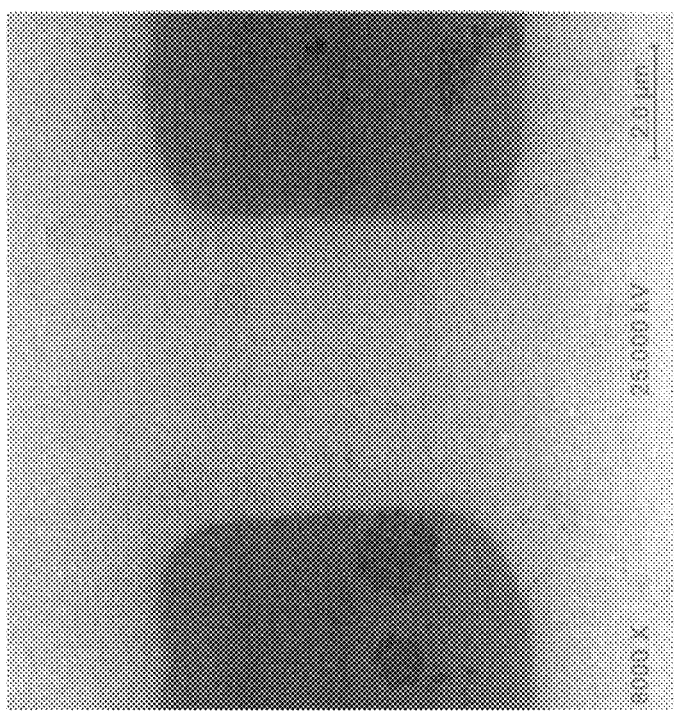
FIG. 42A is an SEM micrograph of a sample area in an untreated region disposed between neighboring regions coated with a nucleation inhibiting coating.
Figure 43B:
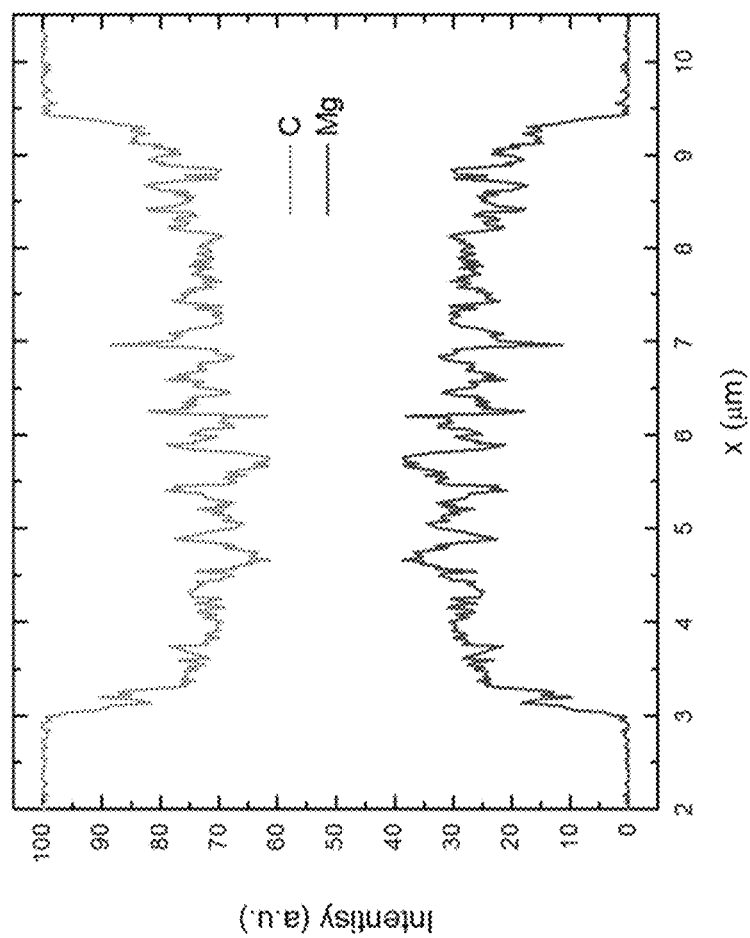
FIG. 43B is an Auger electron microscopy plot showing the spectra taken from the sample area of FIG. 43A.
Figure 43A:
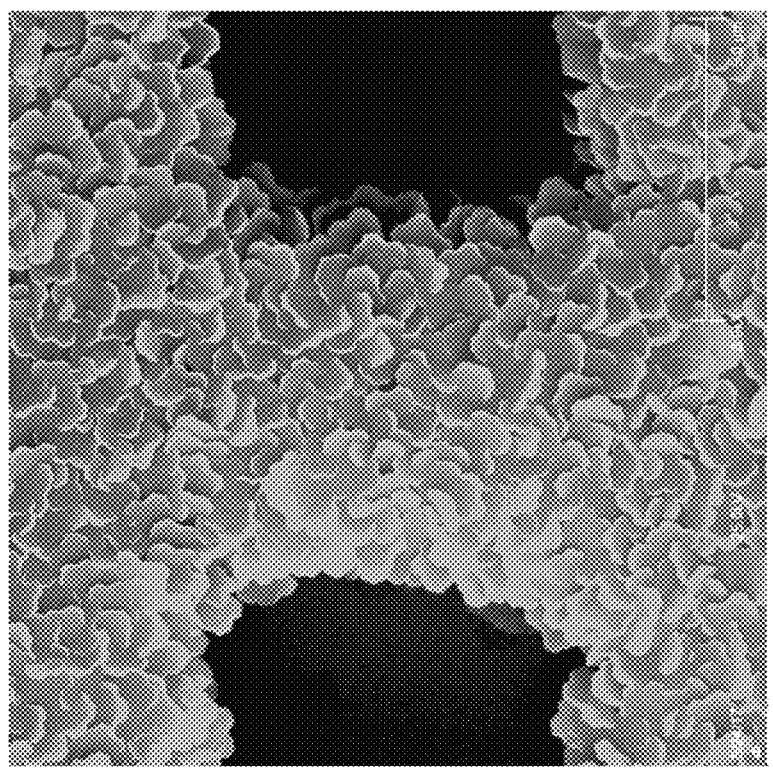
FIG. 43A is an SEM micrograph of a sample area following deposition of a magnesium coating.

This is further shown in SEM micrographs of FIGS. 42A and 43A, which show the region between neighboring regions coated by the nucleation inhibiting coating, before and after the sample was subjected to magnesium deposition, respectively. As can be seen, the edge-to-edge distance between neighboring regions coated by the nucleation inhibiting coating was approximately 5.5 μm in FIG. 42A, while the edge-to-edge distance between the neighboring regions which are substantially free from the magnesium coating in FIG. 43A was found to be approximately 6.4 μm. FIGS. 42B and 43B are Auger electron spectroscopy plots taken from areas corresponding to the images of FIGS. 42A and 43A, respectively.

Example 5

Figure 39:
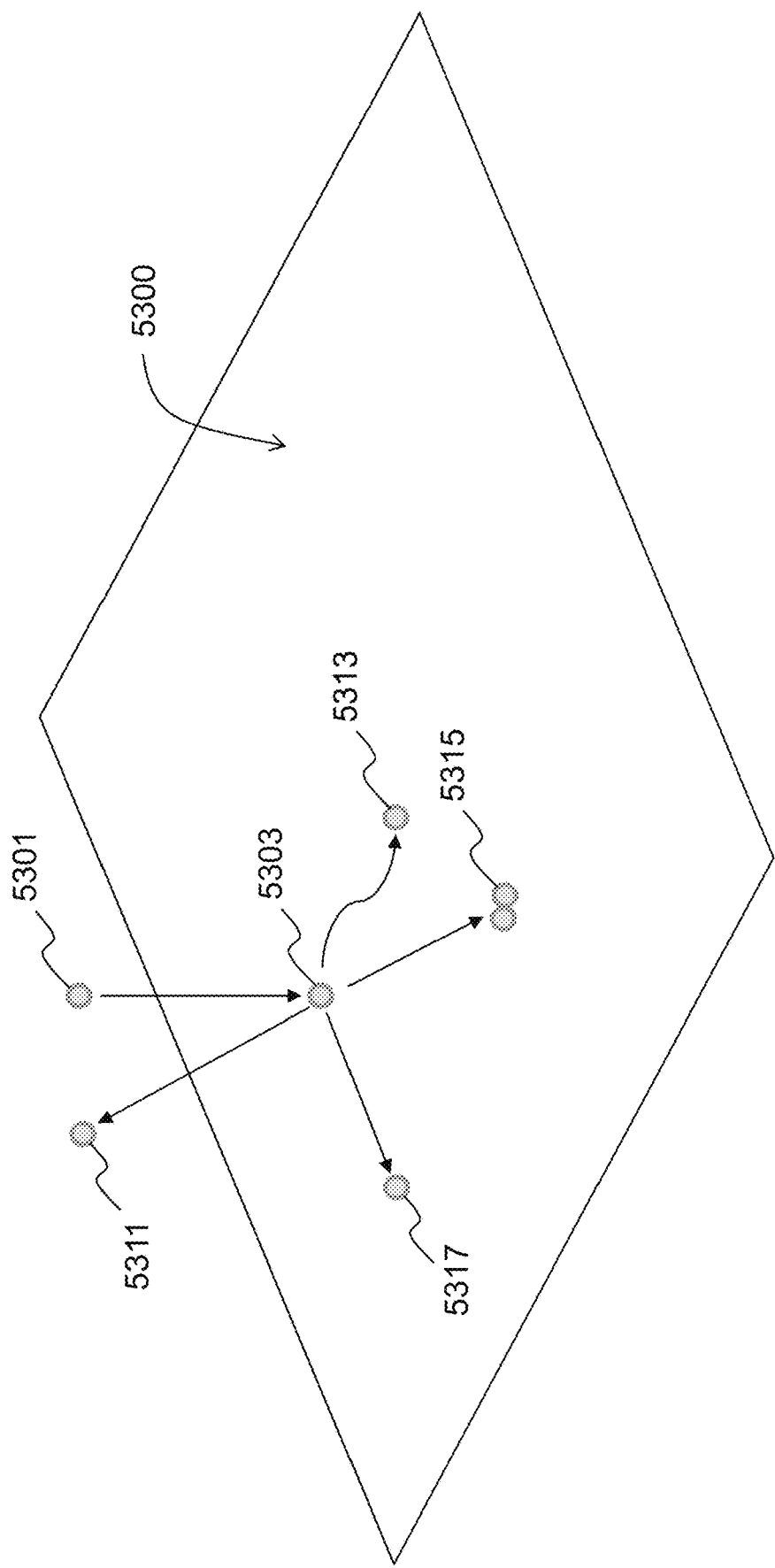
FIG. 39 is a schematic diagram illustrating various events taken into consideration under an example simulation model.

A series of kinetic Monte Carlo (KMC) calculations were conducted to simulate the deposition of metallic adatoms on surfaces exhibiting various activation energies. Specifically, the calculations were conducted to simulate the deposition of metallic adatoms, such as magnesium adatoms, on surfaces having varying activation energy levels associated with desorption ($E_{des}$), diffusion ($E_s$), dissociation ($E_i$), and reaction to the surface ($E_b$) by subjecting such surfaces to evaporated vapor flux at a constant rate of monomer flux. FIG. 39 is a schematic illustration of the various "events" taken into consideration for the current example. In FIG. 39, an atom 5301 in the vapor phase is illustrated as being incident onto a surface 5300. Once the atom 5301 is adsorbed onto the surface 5300, it becomes an adatom 5303. The adatom 5303 may undergo various events including: (i) desorption, upon which a desorbed atom 5311 is created; (ii) diffusion, which gives rise to an adatom 5313 diffusing on the surface 5300; (iii) nucleation, in which a critical number of adatoms 5315 cluster to form a nucleus; and (iv) reaction to the surface, in which an adatom 5317 is reacted and becomes bound to the surface 5300.

The rate (R) at which desorption, diffusion, or dissociation occurs is calculated from the frequency of attempt ($\Omega$), activation energy of the respective event (E), the Boltzmann constant ($k_B$), and the temperature of the system (T), in accordance with the equation provided below:

$$R = \omega \exp\left(\frac{-E}{k_B T}\right)$$

For the purpose of the above calculations, i, the critical cluster size (e.g., critical number of adatoms to form a stable nucleus) was selected to be 2. The activation energy of diffusion for adatom-adatom interaction was selected to be greater than about 0.6 eV, the activation energy of desorption for adatom-adatom interaction was selected to be greater than about 1.5 eV, and the activation energy of desorption for adatom-adatom interaction was selected to be greater than about 1.25 times the activation energy of desorption for surface-adatom interaction. The above values and conditions were selected based on the values reported for magnesium-magnesium interactions. For the purpose of the simulations, a temperature (T) of 300 K was used. The calculations were repeated using values reported for other metal adatom-metal adatom activation interactions, such as that of tungsten-tungsten. The above referenced values have been reported, for example, in Neugbauer, C. A., 1964, *Physics of Thin Films*, 2, 1, *Structural Disorder Phenomena in Thin Metal Films*.

Based on the results of the simulations, a cumulative sticking probability was determined by calculating the fraction of the number of adsorbed monomers which remain on a surface ($N_{ads}$) out of the total number of monomers which impinged on the surface ($N_{total}$) over a simulated period, in accordance with the equation provided below:

$$S = \frac{N_{ads}}{N_{total}}$$

The simulations were conducted to simulate depositions using a vapor flux rate corresponding to about 2 Å/s over a deposition period greater than about 8 minutes, which corresponded to a time period for depositing a film having a reference thickness greater than about 96 nm.

For typical surfaces, the desorption activation energy ($E_{des}$) is generally greater than or equal to the diffusion activation energy ($E_s$). Based on the simulations, it has now been found, at least in some cases, that surfaces exhibiting a relatively small difference between the desorption activation energy ($E_{des}$) and the diffusion activation energy ($E_s$) may be particularly useful in acting as surfaces of nucleation inhibiting coatings. In some embodiments, the desorption activation energy of a surface is greater than or equal to the diffusion activation energy of the surface and is less than or equal to about 1.1 times, less than or equal to about 1.3 times, less than or equal to about 1.5 times, less than or equal to about 1.6 times, less than or equal to about 1.75 times, less than or equal to about 1.8 times, less than or equal to about 1.9 times, less than or equal to about 2 times, or less than or equal to about 2.5 times the diffusion activation energy of the surface. In some embodiments, the difference (e.g., in terms of absolute value) between the desorption activation energy and the diffusion activation energy is less than about or equal to about 0.5 eV, less than or equal to about 0.4 eV, less than or equal to about 0.35 eV, less than or equal to about 0.3 eV, or less than or equal to about 0.2 eV. In some embodiments, the difference between the desorption activation energy and the diffusion activation energy is between about 0.05 eV and about 0.4 eV, between about 0.1 eV and about 0.3 eV, or between about 0.1 eV and about 0.2 eV. Suitable materials satisfying the foregoing relationships can be identified and selected for depositing a nucleation inhibiting coating.

It has also now been found, at least in some cases, that surfaces exhibiting a relatively small difference between the desorption activation energy ($E_{des}$) and the dissociation activation energy ($E_i$) may be particularly useful in acting as surfaces of nucleation inhibiting coatings. In some embodiments, the desorption activation energy ($E_{des}$) of a surface is less than or equal to a multiplier times the dissociation activation energy ($E_i$) of the surface. In some embodiments, the desorption activation energy is less than or equal to about 1.5 times, less than or equal to about 2 times, less than or equal to about 2.5 times, less than or equal to about 2.8 times, less than or equal to about 3 times, less than or equal to about 3.2 times, less than or equal to about 3.5 times, less than or equal to about 4 times, or less than or equal to about 5 times the dissociation activation energy of the surface. Suitable materials satisfying the foregoing relationships can be identified and selected for depositing a nucleation inhibiting coating.

It has also now been found, at least in some cases, that surfaces exhibiting a relatively small difference between the diffusion activation energy ($E_s$) and the dissociation activation energy ($E_i$) may be particularly useful in acting as surfaces of nucleation inhibiting coatings. In some embodiments, the diffusion activation energy ($E_s$) of a surface is less than or equal to a multiplier times the dissociation activation energy ($E_i$) of the surface. In some embodiments, the diffusion activation energy is less than or equal to about 2 times, less than or equal to about 2.5 times, less than or equal to about 2.8 times, less than or equal to about 3 times, less than or equal to about 3.2 times, less than or equal to about 3.5 times, less than or equal to about 4 times, or less than or equal to about 5 times the dissociation activation energy of the surface. Suitable materials satisfying the foregoing relationships can be identified and selected for depositing a nucleation inhibiting coating.

In some embodiments, the relationship between the desorption activation energy ($E_{des}$), the diffusion activation energy ($E_s$), and the dissociation activation energy ($E_i$) of a surface of a nucleation inhibiting coating may be represented as follows:

$$E_{des} \leq \alpha * E_s \leq \beta * E_i$$

wherein α may be any number selected from a range of between about 1.1 and about 2.5, and β may be any number selected from a range of between about 2 and about 5. In some further embodiments, α may be any number selected from a range of between about 1.5 and about 2, and β may be any number selected from a range of between about 2.5 and about 3.5. In another further embodiment, α is selected to be about 1.75 and β is selected to be about 3. Suitable materials satisfying the foregoing relationships can be identified and selected for depositing a nucleation inhibiting coating.

It has now been found that surfaces having the following relationship may, at least in certain cases, exhibit a cumulative sticking probability of less than about 0.1 for magnesium vapor:

$$E_{des} \leq 1.75 * E_s \leq 3 * E_i$$

Accordingly, surfaces having the above activation energy relationship may be particularly advantageous for use as surfaces of nucleation inhibiting coatings in some embodiments. Suitable materials satisfying the foregoing relationship can be identified and selected for depositing a nucleation inhibiting coating.

It has also now been found that surfaces which, in addition to the above activation energy relationships, exhibit a relatively small difference of less than or equal to about 0.3 eV between the diffusion activation energy and the dissociation activation energy may be particularly useful in certain applications, in which a cumulative sticking probability less than about 0.1 is desired. The energy difference ($\Delta E_{s-i}$) between the diffusion activation energy ($E_s$) and the dissociation activation energy ($E_i$) may be calculated according to the following equation:

$$\Delta E_{s-i} = E_s - E_i$$

For example, it has now been found that, at least in some cases, surfaces wherein the energy difference between the diffusion activation energy and the dissociation activation energy is less than or equal to about 0.25 eV exhibits a cumulative sticking probability of less than or equal to about 0.07 for magnesium vapor. In other examples, $\Delta E_{s-i}$ less than or equal to about 0.2 eV results in a cumulative sticking probability of less than or equal to about 0.05, $\Delta E_{s-i}$ less than or equal to about 0.1 eV results in a cumulative sticking probability of less than or equal to about 0.04, and $\Delta E_{s-i}$ less than or equal to about 0.05 eV results in a cumulative sticking probability of less than or equal to about 0.025.

Accordingly in some embodiments, surfaces are characterized by: α is any number selected from a range of between about 1.1 and about 2.5, or a range of between about 1.5 and about 2, such as for example about 1.75, and β is any number selected from a range of between about 2 and about 5, or a range of between about 2.5 and about 3.5, such as for example about 3, in the following inequality relationship:

$$E_{des} \leq \alpha * E_s - E_i$$

and wherein $\Delta E_{s-i}$ calculated according to the following equation is less than or equal to about 0.3 eV, less than or equal to about 0.25 eV, less than or equal to about 0.2 eV, less than or equal to about 0.15 eV, less than or equal to about 0.1 eV, or less than or equal to about 0.05 eV in the following equation:

$$\Delta E_{s-i} = E_s - E_i$$

The results of the calculations were also analyzed to determine the simulated initial sticking probability, which, in the present example, was specified to be the sticking probability of magnesium on a surface upon depositing onto such surface that yields a magnesium coating having an average thickness of about 1 nm. Based on the analysis of the results, it has now been found that, at least in some cases, surfaces wherein the desorption activation energy ($E_{des}$) is less than about 2 times the diffusion activation energy ($E_s$), and the diffusion activation energy ($E_s$) is less than about 3 times the dissociation activation energy ($E_i$) generally exhibits a relatively low initial sticking probability of less than about 0.1.

Without wishing to be bound by any particular theory, it is postulated that the activation energies of various events and the respective relationships between these activation energies as described above would generally apply to surfaces where the activation energy of adatom reaction to the surface ($E_b$) is greater than the desorption activation energy ($E_{des}$). For surfaces where the activation energy of adatom reaction to the surface ($E_b$) is less than the desorption activation energy ($E_{des}$), it is postulated the initial sticking probability of adatoms on such surfaces would generally be greater than about 0.1.

It would be appreciated that various activation energies described above are treated as non-negative values measured in any unit of energy, such as in electron volt (eV). In such cases, the various inequalities and equations relating to activation energies discussed above may be generally applicable across various units of energy.

While simulated values of various activation energies have been discussed above, it will be appreciated that these activation energies may also be experimentally measured and/or derived using various techniques. Examples of techniques and instruments which may be used for such purpose include, but are not limited to, thermal desorption spectroscopy, field ion microscopy (FIM), scanning tunneling microscopy (STM), transmission electron microscopy (TEM), and neutron activation-tracer scanning (NATS).

Generally, various activation energies described herein may be derived by conducting quantum chemistry simulations if the general composition and structure of a surface and adatoms are specified (e.g., through experimental measurements and analysis). For simulations, quantum chemistry simulations using methods such as, for example, single energy points, transition states, energy surface scan, and local/global energy minima may be used. Various theories such as, for example, Density Functional Theory (DFT), Hartree-Fock (HF), Self Consistent Field (SCF), and Full Configuration Interaction (FCI) may be used in conjunction with such simulation methods. As would be appreciated, various events such as diffusion, desorption and nucleation may be simulated by examining the relative energies of the initial state, the transition state and the final state. For example, the relative energy difference between the transition state and the initial state may generally provide a relatively accurate estimate of the activation energy associated with various events.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

What is claimed is:

1. An opto-electronic device comprising:
a nucleation inhibiting coating (NIC) disposed in a first portion of a lateral aspect of the device; and
a conductive coating comprising a deposited material and disposed in a second portion of the lateral aspect of the device, wherein the second portion is substantially devoid of the NIC;
wherein:
the first portion is substantially devoid of a closed coating of the deposited material, and
the NIC comprises a compound comprising at least one of: fluorine, and a fluorine-containing group.

2. The opto-electronic device of claim 1, wherein the fluorine-containing group is a fluoroalkyl group.

3. The opto-electronic device of claim 2, wherein the fluoroalkyl group is selected from at least one of: fluoromethyl, bifluoromethyl, trifluoromethyl, fluoroethyl, and polyfluoroethyl.

4. The opto-electronic device of claim 1, wherein the fluorine-containing group is selected from at least one of: fluorophenyl, difluorophenyl, trifluorophenyl, polyfluorophenyl, fluorobiphenylyl, difluorobiphenylyl, trifluorobiphenylyl, and polyfluorobiphenyly.

5. The opto-electronic device of claim 1, wherein the compound comprises a core moiety and at least one terminal moiety bonded to the core moiety.

6. The opto-electronic device of claim 5, wherein the core moiety comprises at least one of: a heterocyclic moiety, a metal atom, a nitrogen atom, an oxygen atom, a phosphorus atom, a cyclic hydrocarbon moiety, a substituted alkyl, an unsubstituted alkyl, a cycloalkynyl, an alkenyl, an alkynyl, an aryl, an arylalkyl, a heterocyclic moiety, a cyclic ether moiety, a heteroaryl, a fluorene moiety, and silyl.

7. The opto-electronic device of claim 5, wherein the terminal moiety comprises at least one substituent group replacing at least one hydrogen atom thereof, and at least one of the at least one substituent group comprises the at least one of: fluorine, and the fluorine-containing group.

8. The opto-electronic device of claim 5, wherein the terminal moiety comprises a biphenylyl moiety.

9. The opto-electronic device of claim 8, wherein the biphenylyl moiety is represented by a structure selected from at least one of: (I-a), (I-b), and (I-c):

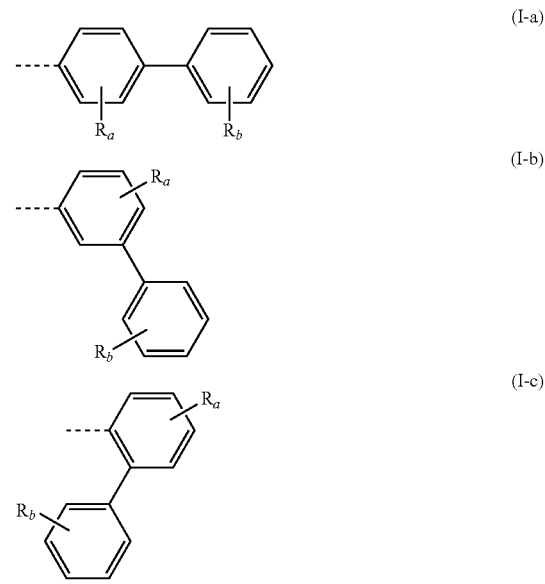

and wherein:
at least one of $R_a$ and $R_b$ is present in the structure;
the at least one of $R_a$ and $R_b$ represents at least one substituent group, the at least one substituent group being independently selected from at least one of: deutero, fluoro, alkyl, $C_1$-$C_4$ alkyl, cycloalkyl, arylalkyl, silyl, aryl, heteroaryl, and fluoroalkyl;
$R_a$, if present, represents a substitution selected from: mono, di, tri, and tetra substitution, and
$R_b$, if present, represents a substitution selected from: mono, di, tri, tetra, and penta substitution.

10. The opto-electronic device of claim 9, wherein the at least one substituent group is independently selected from at least one of: methyl, ethyl, t-butyl, trifluoromethyl, phenyl, methylphenyl, dimethylphenyl, trimethylphenyl, t-butylphenyl, biphenylyl, metylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trfluorobiphenylyl, and polyfluorobiphenylyl.

11. The opto-electronic device of claim 5, wherein the terminal moiety comprises a phenyl moiety.

12. The opto-electronic device of claim 11, wherein the phenyl moiety is represented by a structure (I-d):

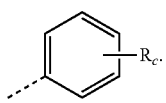

(I-d)

and wherein:
R$_c$, if present, represents at least one substituent group, with a substitution selected from: mono, di, tri, tetra, and penta substitution, the at least one substituent group being selected from at least one of: deutero, fluoro, alkyl, C$_1$-C$_4$ alkyl, cycloalkyl, silyl, and fluoroalkyl.

13. The opto-electronic device of claim 12, wherein the at least one substituent group is selected from at least one of: methyl, ethyl, t-butyl, fluoromethyl, bifluoromethyl, trifluoromethyl, fluoroethyl, and polyfluoroethyl.

14. The opto-electronic device of claim 12, wherein the compound comprises two terminal moieties each represented by the structure (I-d), each of which is substituted by at least one fluoroalkyl group, and wherein the core moiety is an arylene moiety.

15. The opto-electronic device of claim 14, wherein the compound comprises a third terminal moiety comprising one of: an alkyl moiety, a fluorene moiety, a phenylene moiety, and a heterocyclic moiety.

16. The opto-electronic device of claim 5, wherein the terminal moiety comprises a tert-butylphenyl moiety.

17. The opto-electronic device of claim 16, wherein the tert-butylphenyl moiety is represented by a structure selected from at least one of: (I-e), (I-f), and (I-g):

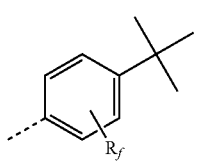

(I-e)

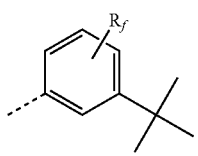

(I-f)

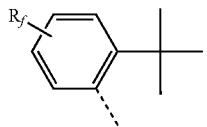

(I-g)

and wherein:
R$_f$, if present, represents at least one substituent group, with a substitution selected from mono, di, tri, and tetra substitution, the at least one substituent group being selected from at least one of: deutero, fluoro, alkyl, C$_1$-C$_4$ alkyl, cycloalkyl, arylalkyl, silyl, aryl, heteroaryl, and fluoroalkyl.

18. The opto-electronic device of claim 17, wherein the at least one substituent group is selected from at least one of: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl.

19. The opto-electronic device of claim 18, wherein a methyl group of any of: t-butyl, t-butylphenyl, and t-butyl biphenylyl is replaced by one of: deuterated methyl, and fluorine.

20. The opto-electronic device of claim 5, wherein the terminal moiety comprises a moiety represented by a structure (I-h):

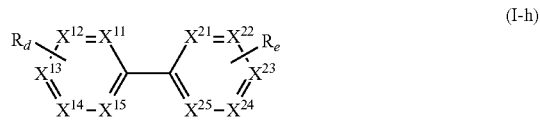

(I-h)

and wherein:
X$^{11}$ to X$^{15}$ and X$^{21}$ to X$^{25}$ are independently selected from C, CH, and N,
at least one of: R$_d$, and R$_e$ is present in the structure;
the at least one of: R$_d$, and R$_e$ represents at least one substituent group, the at least one substituent group being independently selected from at least one of: deutero, fluoro, alkyl, C$_1$-C$_4$ alkyl, cycloalkyl, arylalkyl, silyl, aryl, heteroaryl, and fluoroalkyl,
R$_d$, if present, represents a substitution selected from: mono, di, tri, tetra, and penta substitution, and
R$_e$, if present, represents a substitution selected from: mono, di, tri, and tetra substitution.

21. The opto-electronic device of claim 20, wherein the at least one substituent group is independently selected from at least one of: methyl, ethyl, t-butyl, trifluoromethyl, phenyl, methylphenyl, dimethylphenyl, trimethylphenyl, t-butylphenyl, biphenylyl, methylbiphenylyl, dimethylbiphenylyl, trimethylbiphenylyl, t-butylbiphenylyl, fluorophenyl, difluorophenyl, trifluorophenyl, polyfluorophenyl, fluorobiphenylyl, difluorobiphenylyl, trifluorobiphenylyl, and polyfluorobiphenylyl.

22. The opto-electronic device of claim 5, wherein the terminal moiety comprises a polycyclic aromatic moiety selected from at least one of: a fluorene moiety, and a phenylene moiety.

23. The opto-electronic device of claim 22, wherein the polycyclic aromatic moiety is selected from at least one of: a spirobifluorene moiety, a triphenylene moiety, a diphenylfluorene moiety, a dimethylfluorene moiety, and a difluorofluorene moiety.

24. The opto-electronic device of claim 5, wherein the at least one terminal moiety is bonded to the core moiety via a linker group.

25. The opto-electronic device of claim 24, wherein the linker group is selected from at least one of: an oxygen atom, a sulfur atom, a cyclic hydrocarbon moiety and an acyclic hydrocarbon moiety.

26. The opto-electronic device of claim 1, wherein the nucleation inhibiting coating comprises a polymeric material.

27. The opto-electronic device of claim 26, wherein the polymeric material is a fluoropolymer.

28. The opto-electronic device of claim 27, wherein the fluoropolymer is selected from at least one of: a perfluorinated polymer, polytetrafluoroethylene (PTFE), polyvinylbiphenyl, polyvinylcarbazole (PVK), and at least one polymerized polycyclic aromatic compound.

29. The opto-electronic device of claim 1, wherein an edge of the conductive coating adjacent to the first portion has a contact angle that is one of at least about: 20°, 50°, 90°, and 100°.

30. The opto-electronic device of claim 1, wherein a thickness of the conductive coating tapers towards an edge of the conductive coating adjacent to the first portion.

31. The opto-electronic device of claim 30, wherein the conductive coating tapers with one of: a convex, and concave, profile adjacent to the edge of the conductive coating.

* * * * *